(12) United States Patent  
Gomes et al.

(10) Patent No.: US 11,756,886 B2
(45) Date of Patent: *Sep. 12, 2023

(54) HYBRID MANUFACTURING OF MICROELETRONIC ASSEMBLIES WITH FIRST AND SECOND INTEGRATED CIRCUIT STRUCTURES

(71) Applicant: Intel Corporation, Santa Clara, CA (US)

(72) Inventors: Wilfred Gomes, Portland, OR (US); Abhishek A. Sharma, Hillsboro, OR (US); Mauro J. Kobrinsky, Portland, OR (US); Doug B. Ingerly, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/114,537

(22) Filed: Dec. 8, 2020

(65) Prior Publication Data

US 2022/0181256 A1 Jun. 9, 2022

(51) Int. Cl.
*H01L 23/528* (2006.01)
*H01L 23/522* (2006.01)
(Continued)

(52) U.S. Cl.
CPC ........ *H01L 23/5283* (2013.01); *H01L 23/481* (2013.01); *H01L 23/5226* (2013.01);
(Continued)

(58) Field of Classification Search
CPC ............... H01L 23/5283; H01L 23/481; H01L 23/5226; H01L 24/08; H01L 24/16;
(Continued)

(56) References Cited

U.S. PATENT DOCUMENTS 8,841,777 B2 9/2014 Farooq et al.
9,640,509 B1 5/2017 Yang
(Continued)

FOREIGN PATENT DOCUMENTS

DE 10047963 A1 3/2001
JP 2007250618 A 9/2007
(Continued)

OTHER PUBLICATIONS

International Search Report and Written Opinion in International Patent Application No. PCT/US2021/051882 dated Jan. 11, 2022, 9 pages.
(Continued)

*Primary Examiner* — Khiem D Nguyen
(74) *Attorney, Agent, or Firm* — Akona IP

(57) ABSTRACT

Microelectronic assemblies fabricated using hybrid manufacturing, as well as related devices and methods, are disclosed herein. As used herein, "hybrid manufacturing" refers to fabricating a microelectronic assembly by arranging together at least two IC structures fabricated by different manufacturers, using different materials, or different manufacturing techniques. For example, a microelectronic assembly may include a first IC structure that includes first interconnects and a second IC structure that includes second interconnects, where at least some of the first and second interconnects may include a liner and an electrically conductive fill material, and where a material composition of the liner/electrically conductive fill material of the first interconnects may be different from a material composition of the liner/electrically conductive fill material of the second interconnects.

26 Claims, 60 Drawing Sheets

(51) Int. Cl.
*H01L 25/18* (2023.01)
*H01L 23/00* (2006.01)
*H01L 23/48* (2006.01)
*H01L 23/532* (2006.01)

(52) U.S. Cl.
CPC .............. *H01L 24/08* (2013.01); *H01L 24/16* (2013.01); *H01L 24/32* (2013.01); *H01L 25/18* (2013.01); *H01L 23/53223* (2013.01); *H01L 23/53238* (2013.01); *H01L 23/53266* (2013.01); *H01L 2224/08145* (2013.01); *H01L 2224/08501* (2013.01); *H01L 2224/16145* (2013.01); *H01L 2224/32145* (2013.01); *H01L 2224/32501* (2013.01); *H01L 2924/01006* (2013.01); *H01L 2924/01007* (2013.01); *H01L 2924/01014* (2013.01)

(58) Field of Classification Search
CPC ........... H01L 24/32; H01L 2224/08145; H01L 2224/08501; H01L 2224/16145; H01L 2224/32145; H01L 2224/32501; H01L 2924/01006; H01L 2924/01007; H01L 2924/01014; H01L 2224/085501; H01L 2224/80894; H01L 2224/80895; H01L 2224/80891; H01L 21/187; H01L 23/53223; H01L 23/53238; H01L 23/53266
USPC ........................................................ 257/621
See application file for complete search history.

(56) References Cited

U.S. PATENT DOCUMENTS

| | | | | |
|---|---|---|---|---|
| 10,224,318 | B2* | 3/2019 | Kurita | H01L 23/5226 |
| 11,018,264 | B1 | 5/2021 | Gomes et al. | |
| 11,044,812 | B2* | 6/2021 | Voraberger | H01L 21/4846 |
| 11,239,208 | B2* | 2/2022 | Chuang | H01L 29/0673 |
| 11,239,238 | B2 | 2/2022 | Gomes et al. | |
| 2004/0000722 | A1* | 1/2004 | Powers | H01L 23/5222 257/774 |
| 2005/0230682 | A1 | 10/2005 | Hara | |
| 2006/0012966 | A1 | 1/2006 | Chakravorty | |
| 2009/0108457 | A1 | 4/2009 | Christensen et al. | |
| 2009/0111214 | A1 | 4/2009 | Christensen et al. | |
| 2009/0142888 | A1 | 6/2009 | Tsuchiya | |
| 2010/0059898 | A1 | 3/2010 | Keeth et al. | |
| 2012/0248621 | A1* | 10/2012 | Sadaka | H01L 25/50 438/455 |
| 2013/0140680 | A1* | 6/2013 | Harada | H01L 29/78 257/621 |
| 2014/0001604 | A1 | 1/2014 | Sadaka | |
| 2014/0239458 | A1* | 8/2014 | Farooq | H01L 23/481 257/621 |
| 2015/0021771 | A1 | 1/2015 | Lin | |
| 2015/0162185 | A1 | 6/2015 | Pore | |
| 2015/0228551 | A1* | 8/2015 | Oi | H01L 23/49811 257/737 |
| 2016/0240503 | A1 | 8/2016 | Shu et al. | |
| 2016/0318757 | A1* | 11/2016 | Chou | B81C 1/00595 |
| 2016/0343762 | A1* | 11/2016 | Kagawa | H01L 27/1464 |
| 2017/0025381 | A1 | 1/2017 | Tsai et al. | |
| 2017/0110494 | A1* | 4/2017 | Tsai | H01L 27/1464 |
| 2017/0179153 | A1 | 6/2017 | Ogawa et al. | |
| 2017/0200700 | A1* | 7/2017 | Das | H01L 23/5386 |
| 2018/0277517 | A1 | 9/2018 | Kim et al. | |
| 2018/0366456 | A1 | 12/2018 | Jeong et al. | |
| 2019/0221557 | A1 | 7/2019 | Kim et al. | |
| 2020/0075497 | A1 | 3/2020 | Dabral et al. | |
| 2020/0090990 | A1* | 3/2020 | Fan | H01L 23/5226 |
| 2020/0098719 | A1 | 3/2020 | Park et al. | |
| 2020/0135617 | A1 | 4/2020 | Shen et al. | |
| 2020/0135683 | A1 | 4/2020 | Kim et al. | |
| 2020/0135719 | A1 | 4/2020 | Brewer | |
| 2020/0144242 | A1 | 5/2020 | Park | |
| 2020/0203329 | A1 | 6/2020 | Kanamori et al. | |
| 2020/0211970 | A1 | 7/2020 | Gomes et al. | |
| 2020/0303301 | A1* | 9/2020 | Chen | H01L 23/5226 |
| 2020/0303361 | A1 | 9/2020 | Shih | |
| 2020/0365514 | A1* | 11/2020 | Yang | H01L 21/76802 |
| 2020/0381512 | A1* | 12/2020 | Kao | H01L 25/0657 |
| 2020/0411428 | A1 | 12/2020 | Lilak et al. | |
| 2021/0020596 | A1* | 1/2021 | Yi | H01L 24/94 |
| 2021/0057309 | A1 | 2/2021 | Hu et al. | |
| 2021/0125990 | A1 | 4/2021 | Gomes et al. | |
| 2021/0134802 | A1 | 5/2021 | Gomes et al. | |
| 2021/0151438 | A1 | 5/2021 | Gomes et al. | |
| 2021/0159229 | A1 | 5/2021 | Gomes et al. | |
| 2021/0193666 | A1 | 6/2021 | Gomes et al. | |
| 2021/0366855 | A1* | 11/2021 | Okina | H01L 24/05 |
| 2021/0375790 | A1 | 12/2021 | Oda et al. | |
| 2022/0173090 | A1 | 6/2022 | Gomes et al. | |
| 2022/0344320 | A1 | 10/2022 | Juengling | |
| 2022/0415841 | A1 | 12/2022 | Sharma et al. | |

FOREIGN PATENT DOCUMENTS

| | | |
|---|---|---|
| WO | 2016025451 A1 | 2/2016 |
| WO | 2022119621 A1 | 6/2022 |
| WO | 2022125166 A1 | 6/2022 |

OTHER PUBLICATIONS

International Search Report and Written Opinion in International Patent Application No. PCT/US2021/051887 dated Jan. 10, 2022, 10 pages.

Non Final Office Action in U.S. Appl. No. 17/114,700 dated Jan. 12, 2022, 9 pages.

Barroso, Luiz A., "Impact of Chip-Level Integration on Performance of OLTP Workloads," Sixth International Symposium on High-Performance Computer Architecture (HPCA), Jan. 2000, 12 pages.

Fujun B. et al., "A Stacked Embedded DRAM Array for LPDDR4/4X using Hybrid Bonding 3D Integration with 34GB/s/1Gb 0.88 pJ/b Logic-to-Memory Interface," 2020 IEEE International Electron Devices Meeting (IEDM) Dec. 12, 2020 (pp. 6-6); 4 pages.

Sinha, Saurabh, et al., "Stack up your chips: Betting on 3D integration to augment Moores Law scaling," IEEE Smart City Summit (SCS) Conference, Nov. 1, 2019, San Jose, CA; 5 pages.

U.S. Appl. No. 16/806,283, dated Mar. 2, 2020, Three-Dimensional Nanoribbon-Based Static Random-Access Memory.

U.S. Appl. No. 16/884,524, dated May 27, 2020, Three-Dimensional Nano Ribbon-Based Two-Transistor Memory Cells.

U.S. Appl. No. 17/114,700, dated Dec. 8, 2020, Hybrid Manufacturing for Integrated Circuit Devices and Assemblies.

U.S. Appl. No. 17/123,787, dated Dec. 16, 2020, Hybrid Manufacturing for Integrating Photonic and Electronic Components.

U.S. Appl. No. 17/210,836, dated Mar. 24, 2021, Integrated Circuit Assemblies.

U.S. Appl. No. 17/197,659, dated Mar. 10, 2021, Stacked Vias With Bottom Portions Formed Using Selective Growth.

U.S. Appl. No. 17/210,682, dated Mar. 24, 2021, Integrated Circuit Assemblies With Direct Chip Attach to Circuit Boards.

U.S. Appl. No. 17/241,374, dated Apr. 27, 2021, Back-Side Power Delivery With Glass Support At the Front.

U.S. Appl. No. 17/323,425, dated May 18, 2021, Three-Dimensional Monolithically Integrated Nanoribbon-Based Memory and Compute.

U.S. Appl. No. 17/325,617, dated May 20, 2021, Thin-Film Transistor Memory With Glass Support At the Back.

U.S. Appl. No. 17/342,144, dated Jun. 8, 2021, Stacked Backend Memory With Resistive Switching Devices.

U.S. Appl. No. 17/345,369, dated Jun. 11, 2021, Hybrid Manufacturing With Modified Via-Last Process.

U.S. Appl. No. 17/347,735, dated Jun. 15, 2021, Three-Dimensional Transistor Arrangements With Recessed Gates.

(56) References Cited

OTHER PUBLICATIONS

U.S. Appl. No. 17/350,074, dated Jun. 17, 2021, Layer Transfer on Non-Semiconductor Support Structures.
U.S. Appl. No. 17/351,301, dated Jun. 18, 2021, Backend Memory With Air Gaps in Upper Metal Layers.
U.S. Appl. No. 17/355,449, dated Jun. 23, 2021, Back-Side Reveal for Power Delivery to Backend Memory.
U.S. Appl. No. 17/355,384, dated Jun. 23, 2021, Transistor With Front-Side and Back-Side Contacts and Routing.
U.S. Appl. No. 17/355,793, dated Jun. 23, 2021, Vertically Stacked and Bonded Memory Arrays.
U.S. Appl. No. 17/358,073, dated Jun. 25, 2021, Stacked Two-Level Backend Memory.
U.S. Appl. No. 17/358,207, dated Jun. 25, 2021, Integrated Circuit Devices With Backend Memory and Electrical Feedthrough Network of Interconnects.
U.S. Appl. No. 17/357,385, dated Jun. 24, 2021, Three-Dimensional Capacitors With Double Metal Electrodes.
European Extended Search Report in European Application No. 22162574.2 dated Sep. 15, 2022, 7 pages.
Extended European Search Report from European Application No. 22174054.1 dated Nov. 15, 2022, 7 page.
Tallis, Billy, "Micron 3D Nand Status Update," AnandTech, retrieved from the internet on Jun. 10, 2019, https://www.anandtech.com/show/10028/micron-3d-nand-status-update, 6 pages.

\* cited by examiner

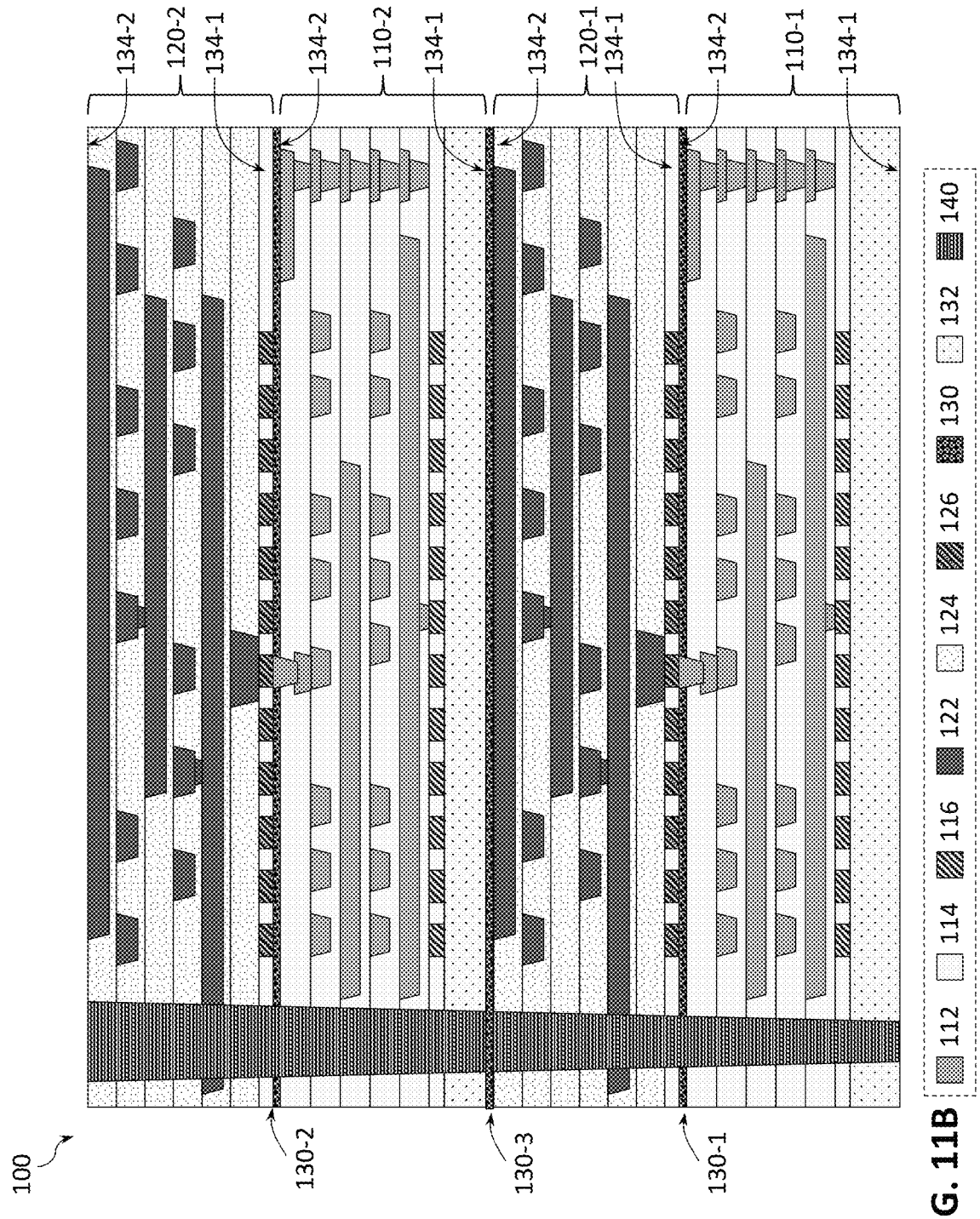

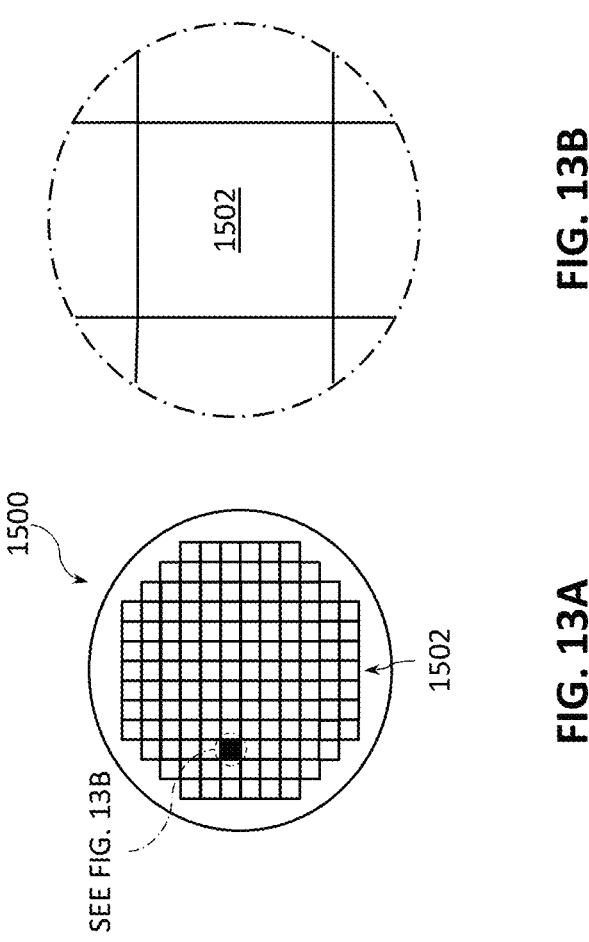

US 11,756,886 B2

HYBRID MANUFACTURING OF MICROELETRONIC ASSEMBLIES WITH FIRST AND SECOND INTEGRATED CIRCUIT STRUCTURES

TECHNICAL FIELD

This disclosure relates generally to the field of semiconductor devices, and more specifically, to microelectronic assemblies, as well as related devices and methods, fabricated using hybrid manufacturing.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each integrated circuit (IC) die and each IC package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 11A-11C illustrate cross-sectional side views of a microelectronic assembly with an after-bonding via extending through a plurality of pairs of bonded IC structures, in accordance with some embodiments.

FIGS. 13A and 13B are top views of, respectively, a wafer and dies that may include one or more microelectronic assemblies fabricated using hybrid manufacturing, in accordance with various embodiments.

DETAILED DESCRIPTION

Overview

Figure 1A:
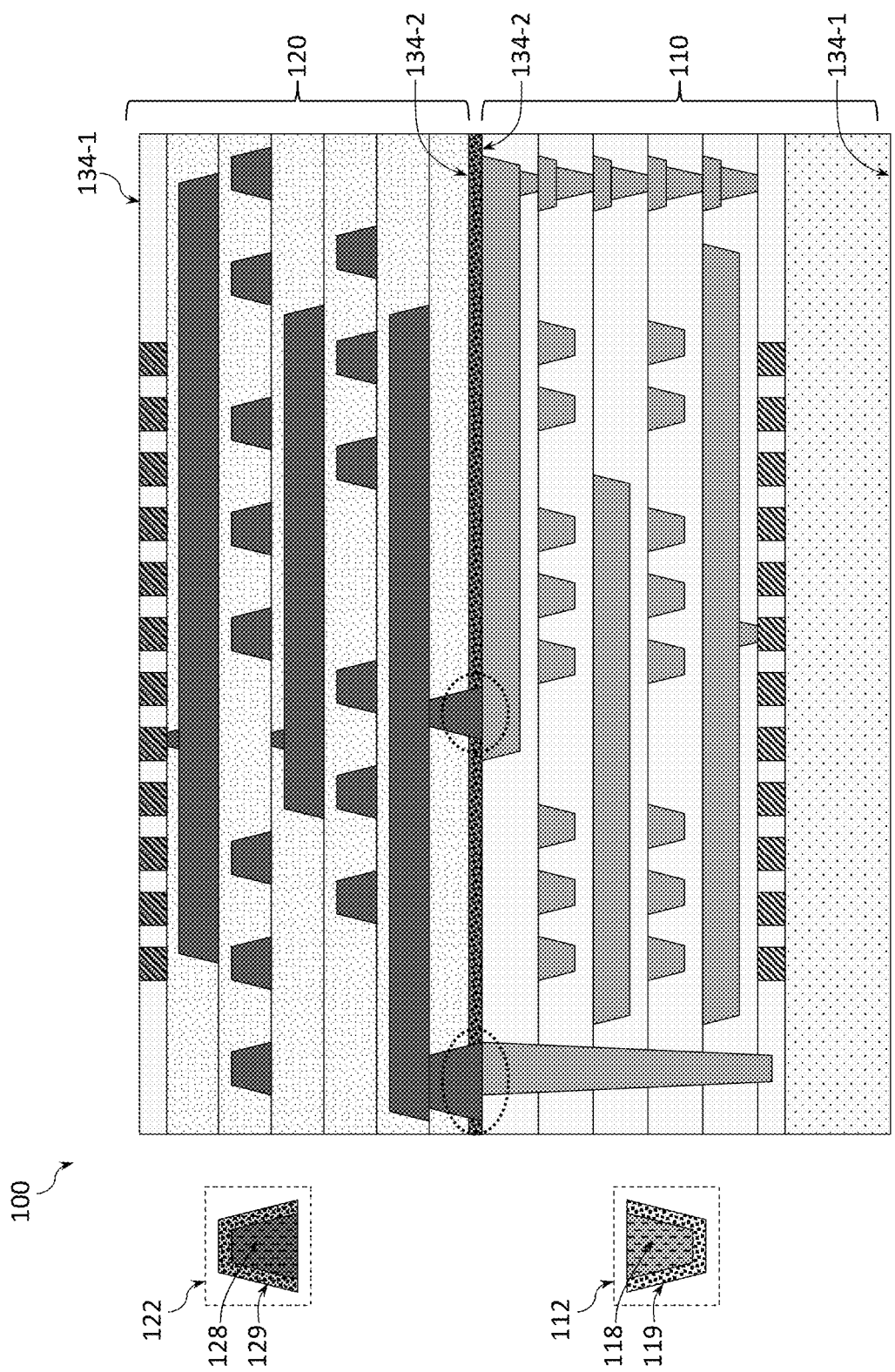
FIGS. 1A-1D illustrate cross-sectional side views of a microelectronic assembly with a first and a second IC structures bonded using front-to-front (f2f) bonding, in accordance with some embodiments.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating hybrid manufacturing for IC devices and assemblies as described herein it might be useful to first understand phenomena that may come into play during IC fabrication. The following foundational information may be viewed as a basis from which the present disclosure may be properly explained. Such information is offered for purposes of explanation only and, accordingly, should not be construed in any way to limit the broad scope of the present disclosure and its potential applications.

IC dies are conventionally coupled to a package substrate for mechanical stability and to facilitate connection to other components, such as circuit boards. The performance that can be realized by such conventional IC packages is constrained by the performance of the die, manufacturing, materials, and thermal consideration, among others. Furthermore, communicating large numbers of signals between two or more dies in a multi-die IC package is challenging due to the increasingly small size of such dies, thermal constraints, and power delivery constraints, among others.

Microelectronic assemblies fabricated using hybrid manufacturing, as well as related devices and methods, are disclosed herein. As used herein, "hybrid manufacturing" refers to fabricating a microelectronic assembly by arranging together at least two IC structures fabricated by different manufacturers, using different materials, or different manufacturing techniques. For example, in some embodiments, a microelectronic assembly may include a first IC structure that includes first interconnects and a second IC structure that includes second interconnects, where at least some of the first and second interconnects may include a liner and an electrically conductive fill material, and where a material composition of the liner/electrically conductive fill material of the first interconnects may be different from a material composition of the liner/electrically conductive fill material of the second interconnects. In another example, in some embodiments, an IC package may include a package substrate having a first face and an opposing second face, and further include a microelectronic assembly, coupled to the package substrate by package interconnects. The microelectronic assembly of such an IC package may include a first IC structure having a first face and an opposing second face, wherein the first face of the first IC structure is at least partially between the second face of the package substrate and the second face of the first IC structure, and the first face of the first IC structure is coupled to the second face of the package substrate by the package interconnects. The microelectronic assembly may further include a second IC structure having a first face and an opposing second face, wherein the first face of the second IC structure is at least partially between the second face of the first IC structure and the second face of the second IC structure. The microelectronic assembly may also include a bonding material, bonding the second face of the first IC structure to the first face of the second IC structure, and an electrically conductive via having at least a portion in the first IC structure, at least a portion in the second IC structure, and extending through the bonding material.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 1A-1D, such a collection may be referred to herein without the letters, e.g., as "FIG. 1."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of interconnects in the first and second IC structures of the microelectronic assemblies illustrated in some drawings, a certain number of dies in the IC packages illustrated in other drawings, etc.), this is simply for ease of illustration, and more, or less, than that number may be included in microelectronic assemblies and related devices according to various embodiments of the present disclosure. Still further, various views shown in some of the drawings are intended to show relative arrangements of various elements therein. In other embodiments, various microelectronic assemblies fabricated using hybrid manufacturing, or portions thereof, may include other elements or components that are not illustrated (e.g., transistor portions, various components that may be in electrical contact with any of the illustrated components of the microelectronic assemblies fabricated using hybrid manufacturing, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more microelectronic assemblies fabricated using hybrid manufacturing as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. Although certain elements may be referred to in the singular herein, such elements may include multiple sub-elements. For example, "an electrically conductive material" may include one or more electrically conductive materials.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, the term "interconnect" may be used to describe any element formed of an electrically conductive material for providing electrical connectivity to one or more components associated with an IC or/and between various such components. In general, the "interconnect" may refer to both conductive traces (also sometimes referred to as "lines" or "trench contacts") and conductive vias. In general, in context of interconnects, the term "conductive trace" may be used to describe an electrically conductive element isolated by an insulator material (e.g., a low-k dielectric material) that is provided within the plane of an IC die. Such traces are typically stacked into several levels, or several layers, of metallization stacks. On the other hand, the term "via" may be used to describe an electrically conductive element that interconnects two or more traces of different levels. To that end, a via may be provided substantially perpendicularly to the plane of an IC die and may interconnect two traces in adjacent levels or two traces in not adjacent levels. A term "metallization stack" may be used to refer to a stack of one or more interconnects for providing connectivity to different circuit components of an IC chip. Sometimes, traces and vias may be referred to as "conductive traces" and "conductive vias", respectively, to highlight the fact that these elements include electrically conductive materials such as metals.

Interconnects as described herein, in particular interconnects of the IC structures of microelectronic assemblies fabricated using hybrid manufacturing as described herein, may be used for providing electrical connectivity to one or more components associated with an IC or/and between various such components, where, in various embodiments, components associated with an IC may include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

In another example, the terms "package" and "IC package" are synonymous, as are the terms "die" and "IC die," the term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

In yet another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

Example Microelectronic Assemblies Fabricated Using Hybrid Manufacturing

In general, hybrid manufacturing is described herein with reference to a first IC structure 110 and a second IC structure 120 bonded to one another using a bonding material 130. The IC structures 110 and 120 may be fabricated by different manufacturers, using different materials, or different manufacturing techniques. Various examples of microelectronic assemblies that include the IC structures 110 and 120 will now be described with reference to FIGS. 1-11.

A number of elements referred to in the description of FIGS. 1-11 with reference numerals are illustrated in these figures with different patterns, with a legend showing the correspondence between the reference numerals and patterns being provided at the bottom of each drawing page containing FIGS. 1-11. For example, the legend illustrates that FIGS. 1-11 use different patterns to show first interconnects 112, second interconnects 122, a bonding material 130, etc.

A number of elements are illustrated in FIGS. 1-11 as included in various embodiments of the microelectronic assembly 100, but a number of these elements may not be present in other embodiments of the microelectronic assembly 100. For example, while FIGS. 1 and 2 illustrate a substrate 132 of the first IC structure 110, in other embodiments, the substrate 132 may not be included. Further, unless stated otherwise, any features of any embodiments of the microelectronic assemblies described with reference to one of the FIGS. 1-11 may be combined with any features of any embodiments of the microelectronic assemblies described with reference to another one or more of the FIGS. 1-11. In some embodiments, individual ones of the microelectronic assemblies 100 disclosed herein may serve as a system-in-package (SiP) in which multiple IC structures 110, 120, or multiple pairs of such IC structures, having different functionality are included. In such embodiments, the microelectronic assembly 100 may be referred to as a SiP.

FIGS. 1A-1D illustrate cross-sectional side views of a microelectronic assembly 100 with a first IC structure 110 and a second IC structure 120 bonded using f2f bonding, in accordance with some embodiments.

FIG. 1A illustrates a cross-sectional side view of a microelectronic assembly 100 according to some embodiments of the present disclosure. Many of the elements of the microelectronic assembly 100 of FIG. 1A are included in other ones of the accompanying figures; the discussion of these elements is not repeated when discussing these figures, and any of these elements may take any of the forms disclosed herein.

As shown in FIG. 1A, the IC structure 110 may include one or more, typically a plurality, of interconnects 112, while the IC structure 110 may include one or more, typically a plurality, of interconnects 122. In the IC structure 110, the interconnects 112 may be arranged in one or more, typically a plurality, of layers of a metallization stack, where each layer may include an insulating material 114 (e.g., a dielectric material formed in multiple layers, as known in the art). The interconnects 112 may include one or more conductive traces and conductive vias, providing one or more conductive pathways through the insulating material 114. Similarly, in the IC structure 120, the interconnects 122 may be arranged in one or more, typically a plurality, of layers of a metallization stack, where each layer may include an insulating material 124 (e.g., a dielectric material formed in multiple layers, as known in the art). The interconnects 122 may include one or more conductive traces and conductive vias, providing one or more conductive pathways through the insulating material 124. Any of the conductive pathways disclosed herein (e.g., conductive traces and/or conductive vias) may be formed of any appropriate conductive material, such as copper, silver, nickel, gold, aluminum, or other metals or alloys, for example.

In some embodiments, at least one of the insulating material 114 and the insulating material 124 may include a dielectric material, such as silicon dioxide, silicon nitride, oxynitride, polyimide materials, glass reinforced epoxy matrix materials, or a low-k or ultra-low-k dielectric (e.g., carbon-doped dielectrics, fluorine-doped dielectrics, porous dielectrics, organic polymeric dielectrics, photo-imagable dielectrics, and/or benzocyclobutene-based polymers). In some embodiments, at least one of the insulating materials 114 and the insulating material 124 may include a semiconductor material, such as silicon, germanium, or a III-V material (e.g., gallium nitride), and one or more additional materials. For example, at least one of the insulating materials 114 and the insulating material 124 may include silicon oxide or silicon nitride. The conductive pathways formed by the interconnects 112 may include conductive traces and/or conductive vias and may be connected to one another in any suitable manner. Similarly, the conductive pathways formed by the interconnects 122 may include conductive traces and/or conductive vias and may be connected to one another in any suitable manner. Although FIGS. 1-11 illustrate a specific number and arrangement of conductive pathways formed by the interconnects 112 and by the interconnects 122, these are simply illustrative, and any suitable number and arrangement may be used.

In some embodiments, any of the interconnects 112 and the interconnects 122 may include conductive pathways to route power, ground, and/or signals to/from various components of the IC structure 110 and the IC structure 120. For example, any of the IC structure 110 and the IC structure 120 may include through-substrate vias (TSVs), including a conductive material via, such as a conductive via, isolated from the surrounding silicon or other semiconductor material by a barrier oxide) or other conductive pathways through which power, ground, and/or signals may be transmitted between a package substrate to which the microelectronic assembly 100 may be coupled (e.g., a package substrate 202, shown in FIG. 12) and one or more dies or IC structures "on top" or "at the bottom of" the microelectronic assembly 100. For example, if an IC package is such that the IC structure 110 is at the bottom and is coupled to a package substrate and the IC structure 120 is at the top, then the IC structure 110 may include conductive pathways to route power, ground, and/or signals between the package substrate and the IC structure 120 and/or between the package substrate and different ones of the dies or IC structures that may be "on top" of the IC structure 120. In another example, if an IC package is such that the IC structure 120 is at the bottom and is coupled to a package substrate and the IC structure 110 is at the top (i.e., the microelectronic assembly 100 is flipped upside down compared to what is shown in FIG. 1A), then the IC structure 120 may include conductive pathways to route power, ground, and/or signals between the package substrate and the IC structure 110 and/or between the package substrate and different ones of the dies or IC structures that may be "on top" of the IC structure 110. In some embodiments, the IC structure 110 or the IC structure 120 may be the source and/or destination of signals communicated between the package substrate and the other IC structure and/or other dies or IC structures included in an IC package. In some embodiments, the IC structure 110 may not route power and/or ground to the IC structure 120; instead, IC structure 120 may couple directly to power and/or ground lines in a package substrate of an IC package. By allowing the IC structure 120 to couple directly to power and/or ground lines in the package substrate, such power and/or ground lines need not be routed through the IC structure 110, allowing the IC structure 110 to be made smaller or to include more active circuitry or signal pathways.

In some embodiments, any of the IC structure 110 and IC structure 120 may only include conductive pathways formed by the interconnects 112, 114, respectively, and may not contain active or passive circuitry. In other embodiments, any of the IC structure 110 and IC structure 120 may include active or passive circuitry (e.g., transistors, diodes, resistors, inductors, and capacitors, among others), schematically illustrated in the example of FIG. 1A as device circuitry 116 that may be included in the IC structure 110 and device circuitry 126 that may be included in the IC structure 120. For example, if an IC package is such that the IC structure 110 is at the bottom and is coupled to a package substrate and the IC structure 120 is at the top and include the device circuitry 126, power and/or ground signals may be routed from/through the package substrate and to the device circuitry 126 of the IC structure 120 through the interconnects 112 and the interconnects 122. In various such embodiments, the IC structure 110 may or may not include the device circuitry 116. In another example, if an IC package is such that the IC structure 120 is at the bottom and is coupled to a package substrate and the IC structure 110 is at the top and include the device circuitry 116, power and/or ground signals may be routed from/through the package substrate and to the device circuitry 116 of the IC structure 110 through the interconnects 122 and the interconnects 112. In various such embodiments, the IC structure 120 may or may not include the device circuitry 126. In general, the microelectronic assembly 100 may include the device circuitry 116 in some embodiments while exclude it in others and, similarly, the microelectronic assembly 100 may include the device circuitry 126 in some embodiments while exclude it in others.

The device circuitry 116 and 126 may include semiconductor material systems including, for example, N-type or P-type materials systems, as active materials (e.g., as channel materials of transistors).

In some embodiments, active materials of the device circuitry 116 and/or 126 may include substantially monocrystalline semiconductors, such as silicon or germanium.

In some embodiments, active materials of the device circuitry 116 and/or 126 may include compound semiconductors, e.g., compound semiconductors with a first sub-lattice of at least one element from group III of the periodic table (e.g., Al, Ga, In), and a second sub-lattice of at least one element of group V of the periodic table (e.g., P, As, Sb). In some embodiments, active materials of the device circuitry 116 and/or 126 may include a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

In some embodiments, active materials of the device circuitry 116 and/or 126 may be/include an intrinsic IV or III-V semiconductor material or alloy, not intentionally doped with any electrically active impurity. In alternate embodiments, nominal impurity dopant levels may be present within the active materials of the device circuitry 116 and/or 126, for example to set a threshold voltage Vt, or to provide halo pocket implants, etc. In such impurity-doped embodiments however, impurity dopant level within the active materials may be relatively low, for example below about $10^{15}$ cm$^{-3}$, and advantageously below $10^{13}$ cm$^{-3}$.

For exemplary P-type transistor embodiments, active materials of the device circuitry 116 and/or 126 may advantageously be group IV materials having a high hole mobility, such as, but not limited to, Ge or a Ge-rich SiGe alloy. For some exemplary embodiments, such active materials may have a Ge content between 0.6 and 0.9, and advantageously is at least 0.7.

For exemplary N-type transistor embodiments, active materials of the device circuitry 116 and/or 126 may advantageously be a III-V material having a high electron mobility, such as, but not limited to InGaAs, InP, InSb, and InAs. For some such embodiments, the active material may be a ternary III-V alloy, such as InGaAs or GaAsSb. For some $In_xGa_{1-x}As$ fin embodiments, In content in the such active material may be between 0.6 and 0.9, and advantageously at least 0.7 (e.g., $In_{0.7}Ga_{0.3}As$).

In some embodiments, active materials of the device circuitry 116 and/or 126 may be thin-film materials, in which embodiments the devices 116 and/or 126 could be thin-film transistors (TFTs). A TFT is a special kind of a field-effect transistor (FET), made by depositing a thin film of an active semiconductor material, as well as a dielectric layer and metallic contacts, over a support structure that may be a non-conducting (and non-semiconducting) support structure. During operation of a TFT, at least a portion of the active semiconductor material forms a channel of the TFT, and, therefore, the thin film of such active semiconductor material is referred to herein as a "TFT channel material." This is different from conventional, non-TFT, transistors where the active semiconductor channel material is typically a part of a semiconductor substrate, e.g., a part of a silicon wafer. In various such embodiments, active materials of the device circuitry 116 and/or 126 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide.

In general, active materials of the device circuitry 116 and/or 126 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

Although FIG. 1A illustrates the device circuitry 116 and 126 as front-end-of-line (FEOL, or simply "front-end") devices in the IC structures 110, 120, respectively, in general, the device circuitry 116 and/or 126 may include any combination of FEOL devices, back-end-of-line (BEOL) devices (also referred to as "back-end devices"), TFTs, etc. Furthermore, although FIG. 1A illustrates the interconnects 112 and 122 provided over the top faces of the IC structures 110 and 120, respectively, in other embodiments, the IC structure 110 and/or the IC structure 120 may also include backside interconnects, as, e.g., described below with reference to FIG. 2C.

FIG. 1A illustrates that the device circuitry 116 may be provided over a support structure 132, so that the device circuitry 116 is between the support structure 132 and at least some of the interconnects 112. In general, the support structure 132 may include any material that may serve as a foundation upon which the IC structures are described herein may be formed. In some embodiments, the support structure 132 may be a semiconductor substrate, composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials.

Although not shown in FIG. 1A, the device circuitry 126 may also be provided over a support structure similar to the support structure 132, so that the device circuitry 126 is between such a support structure and at least some of the interconnects 122. FIG. 1A does not illustrate a support structure of the IC structure 120 in order to illustrate that, in some embodiments, after the IC structure 120 has been bonded, in an f2f bonding, with the IC structure 130, the support structure of the IC structure 120 may no longer be needed (e.g., because the support structure 132 may provide sufficient mechanical stability to the microelectronic assembly 100) and may be removed, e.g., using a suitable thinning/polishing process. Such embodiments may advantageously decrease the overall height of the microelectronic assembly 100 (i.e., the dimension measured along a vertical axis for the examples shown in the present drawing). In other embodiments, the IC structure 120 may be provided over the IC structure 110 using layer transfer, in which case as the IC structure 120 is placed over the IC structure 110 for bonding, its' support structure has already been substantially removed.

Although not specifically shown in the present drawings, in some embodiments, one or both of the IC structures 110, 120 may include, or be a part of, one or more of a central processing unit, a memory device, e.g., a high-bandwidth memory device, a logic circuit, input/output circuitry, a transceiver such as a field programmable gate array transceiver, a gate array logic such as a field programmable gate array logic, of a power delivery circuitry, a III-V or a III-N device such as a Ill-N or III-N amplifier (e.g., GaN amplifier), Peripheral Component Interconnect Express circuitry, or Double Data Rate transfer circuitry.

The microelectronic assembly 100 may be fabricated as follows. First, the IC structures 110 and 120 may be fabricated individually, e.g., at different manufacturing facilities, by different companies, etc. After that, faces of the IC structures 110 and 120 may be bonded. In some embodiments, bonding of the faces of the IC structures 110 and 120 may be performing using insulator-insulator bonding, e.g., as oxide-oxide bonding, where the insulating material 114 is bonded to the insulating material 124. In some embodiments, the bonding material 130 may be present in between the faces of the IC structures 110 and 120 that are bonded together. To that end, the bonding material 130 may be applied to the one or both faces of the IC structures 110 and 120 that should be bonded and then the IC structures 110 and 120 are put together, possibly while applying a suitable pressure and heating up the assembly to a suitable temperature (e.g., to moderately high temperatures, e.g., between about 50 and 200 degrees Celsius) for a duration of time. In some embodiments, the bonding material 130 may be an adhesive material that ensures attachment of the IC structures 110 and 120 to one another. In some embodiments, the bonding material 130 may be an etch-stop material. In some embodiments, the bonding material may be both an etch-stop material and have suitable adhesive properties to ensure attachment of the IC structures 110 and 120 to one another. In some embodiments, no bonding material 130 may be used, in which case the layer labeled "130" in FIG. 1A represents a bonding interface resulting from the bonding of the IC structures 110 and 120 to one another. Such a bonding interface may be recognizable as a seam or a thin layer in the microelectronic assembly 100, using, e.g., selective area diffraction (SED), even when the specific materials of the insulators of the IC structures 110 and 120 that are bonded together may be the same, in which case the bonding interface would still be noticeable as a seam or a thin layer in what otherwise appears as a bulk insulator (e.g., bulk oxide) layer. As used herein, unless specified otherwise, references to the "bonding material 130" are applicable to a "bonding interface" for the embodiments where no deliberately added adhesive material is used to bond the IC structures 110 and 120.

For each IC structure, the terms "bottom face" or "backside" of the structure may refer to the back of the IC structure, e.g., bottom of the support structure 132 for the IC structure 110, while the terms "top face" or "frontside" of the structure may refer to the opposing other face. FIG. 1A indicates a backside 134-1 and a frontside 134-2 for each of the IC structures 110 and 120. As can be seen in FIG. 1A, the microelectronic assembly 100 is an f2f-bonded assembly because the frontside 134-2 of the IC structure 120 is bonded to the frontside 134-2 of the IC structure 110. Thus, in an f2f-bonded assembly, one of the IC structures 110, 120 is filled upside down for bonding so that the top face of the flipped IC structure is facing and is bonded to the top face of the IC structure that is not flipped.

FIG. 1A illustrates an embodiment of the microelectronic assembly 100 where portions of at least some of the interconnects 112 at the top face of the IC structure 110 may be in contact with portions of at least some of the interconnects 122 at the top face of the IC structure 120, thus providing electrical continuity/connection between the interconnects 112 and the interconnects 122. Dotted oval contours are provided in FIG. 1A to point out two examples of such electrical connections between the interconnects 112 and 122. In some embodiments, the overlap between the electrically conductive fill materials of the interconnects 112 and 122 may be substantially 100% of the surface area (at the bonding interface) of the smallest one of the interconnects 112 and 122, as is shown in FIG. 1A for the example of an electrical connection between the interconnects 112 and 122 within the right dotted oval contour. In some embodiments, the overlap between the electrically conductive fill materials of the interconnects 112 and 122 may be partial (i.e., less than 100%) of the surface area (at the bonding interface) of the smallest one of the interconnects 112 and 122, as is shown in FIG. 1A for the example of an electrical connection between the interconnects 112 and 122 within the left dotted oval contour. Thus, in some embodiments, the IC structures 110 and 120 may be bonded so that an electrical connection may be made between at least one of the interconnects 112 and at least one of the interconnects 122 by virtue of at least a portion of the electrically conductive fill material 118 of at least one of the interconnects 112 being in contact with at least a portion of the electrically conductive fill material 128 of at least one of the interconnects 122.

It should be noted that FIG. 1A, as well as similar subsequent drawings of the microelectronic assembly 100, illustrates that, when an electrical connection is made between one of the interconnects 112 and one of the interconnects 122, either the interconnect 112 or 122 penetrates through the bonding material/interface 130. For example, examination of the electrical connection within the dotted oval contours in FIG. 1A reveals that the interconnects 122 seem to penetrate through the bonding material/interface 130 to contact the respective interconnects 112. This is to illustrate that the electrically conductive materials of the interconnects 112, 122 can penetrate through the bonding material/interface 130 to make an electrical connection because the bonding material/interface 130 may be relatively thin (e.g., on the order of a few nanometers). While, in a given drawing, one of the interconnects may be shown to penetrate through the bonding material/interface 130 (e.g., in FIG. 1A—only the interconnects 122), in other embodiments, the other one of the interconnects (for FIG. 1A—the interconnects 112) may penetrate through the bonding material/interface 130, or both of the interconnects from the bonded IC structures may penetrate the bonding material/interface 130 (for FIG. 1A—both the interconnects 112 and 122).

As a result of the hybrid bonding of the IC structures 110 and 120, the microelectronic assembly 100 may exhibit several characteristic features.

One such feature is that, for the f2f bonding as shown in FIG. 1A, the cross-sectional shapes of the interconnects 112 may be inverted with respect to those of the interconnects 122, which can be seen in FIG. 1A. The cross-section of FIG. 1A is a cross-section in a plane that is substantially perpendicular to the bonding interface (e.g., substantially perpendicular to the plane of the bonding material 130 which is also the plane of the bonding interface). For certain manufacturing processes, cross-sectional shapes of interconnects in the plane such as that of FIG. 1A may be trapezoidal, i.e., a cross-section of an interconnect may have two parallel sides, one of which is a short side and another one of which is a long side, with the long side being closer to the top face of an IC structure than the short side (i.e., the long side faces the front of the IC structure, while the short side faces the back of the IC structure). For example, dual-Damascene or single-Damascene processes for manufacturing interconnects could result in such trapezoidal cross-sections. This is illustrated in FIG. 1A with the long sides of the trapezoidal cross-sections of the interconnects 112 being closer to the front of the IC structure 110, and, therefore, to the bonding interface to the IC structure 120, than their short sides. Such manufacturing processes used in manufacturing the IC structure 120 would, similarly, result in that the long sides of the trapezoidal cross-sections of the interconnects 122 are closer to the front of the IC structure 120 than their short sides. Because in an f2f bonding arrangement, the IC structure 120 is flipped over, this means that the long sides of the trapezoidal cross-sections of the interconnects 122 are closer to the bonding interface to the IC structure 110 than the short sides, as is shown in FIG. 1A.

Another characteristic feature of the hybrid bonding of the IC structures 110 and 120 may be revealed by examining the material composition of the interconnects 112 and 122. In general, each of the interconnects 112 and 122 may include a liner and an electrically conductive fill material. If included, the liner may be an adhesion liner and/or a barrier liner. FIG. 1A illustrates an embodiment in which at least some of the interconnects 112 may include an electrically conductive fill material 118 and a liner 119, while at least some of the interconnects 122 may include an electrically conductive fill material 128 and a liner 129 (insets within the dashed contours on the left side of FIG. 1A illustrate such examples of one of the interconnects 112 and one of the interconnects 122). In some such embodiments, the material composition of the liners 119 and 129 may be different. For example, the liner 119 of the interconnects 112 may be a liner having one or more of tantalum, tantalum nitride, titanium nitride, and tungsten carbide, while the liner 129 of the interconnects 122 may be a liner having one or more of tantalum, tantalum nitride, and cobalt, or vice versa. In the liners 119 and 129, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. Thus, any differences in the material composition of the liners 119 and 129 that are beyond the unintentional doping and/or impurities levels of about 0.1% of a given material could be indicative of the hybrid bonding used to provide the microelectronic assembly 100. Similarly, in some embodiments, material composition of the electrically conductive fill materials 118 and 128 may be different. For example, the electrically conductive fill material 118 of the interconnects 112 may include copper (Cu), while the electrically conductive fill material 128 of the interconnects 122 may include tungsten (W), aluminum (Al), ruthenium (Ru), cobalt (Co), or AlCu (e.g., in proportions of between 1:1 to 1:100), or vice versa. In the electrically conductive fill materials 118 and 128, any of the individual materials (e.g., any of the examples listed above) may be included in the amount of between about 1% and 75%, e.g., between about 5% and 50%, indicating that these materials are included by intentional alloying of materials, in contrast to potential accidental doping or impurities being included, which would be less than about 0.1% for any of these metals. Thus, any differences in the material composition of the electrically conductive fill materials 118 and 128 that are beyond the unintentional doping/impurities levels of about 0.1% of a given material could be indicative of the hybrid bonding used to provide the microelectronic assembly 100.

Figure 1B:
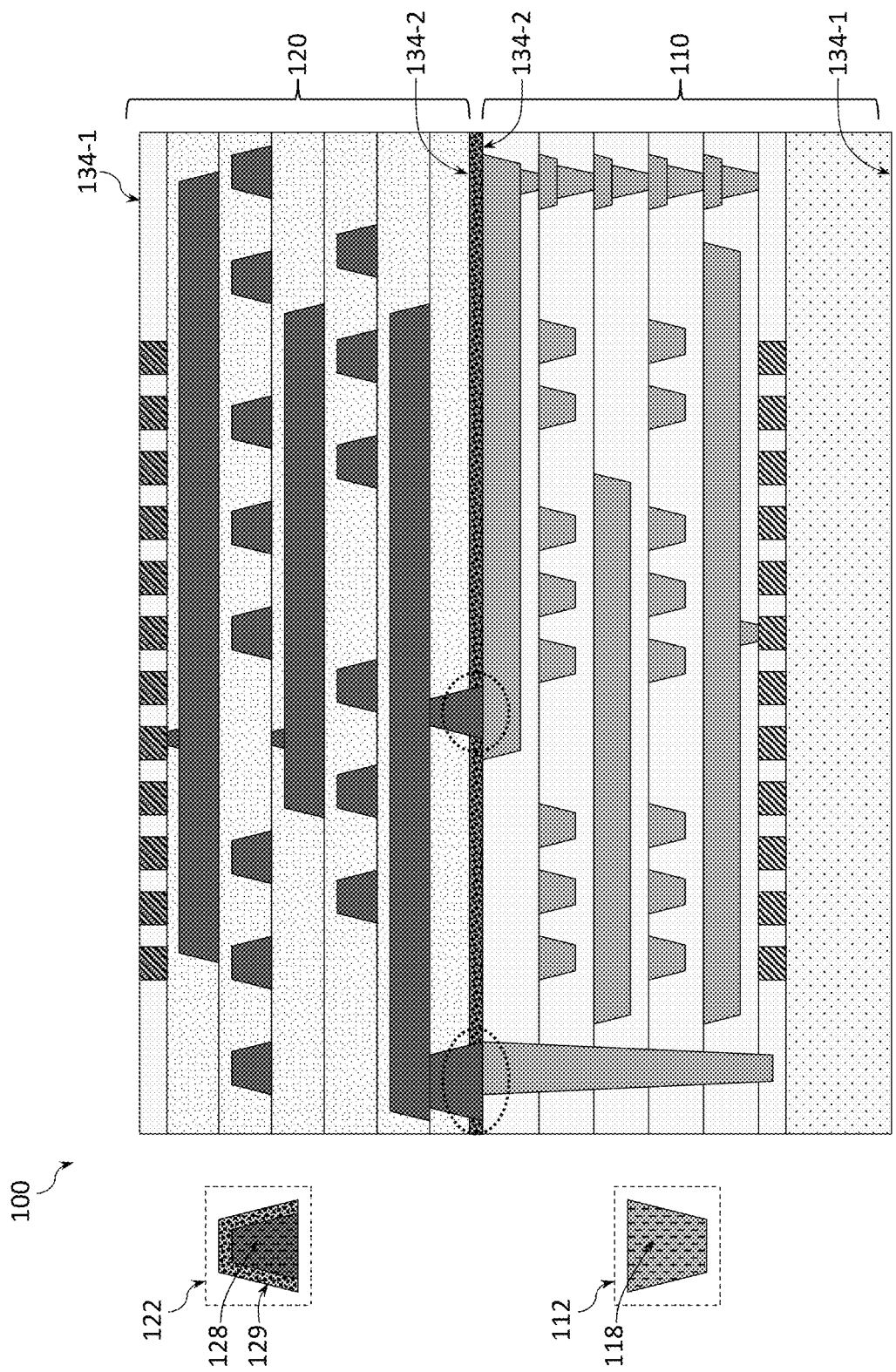
Figure 1C:
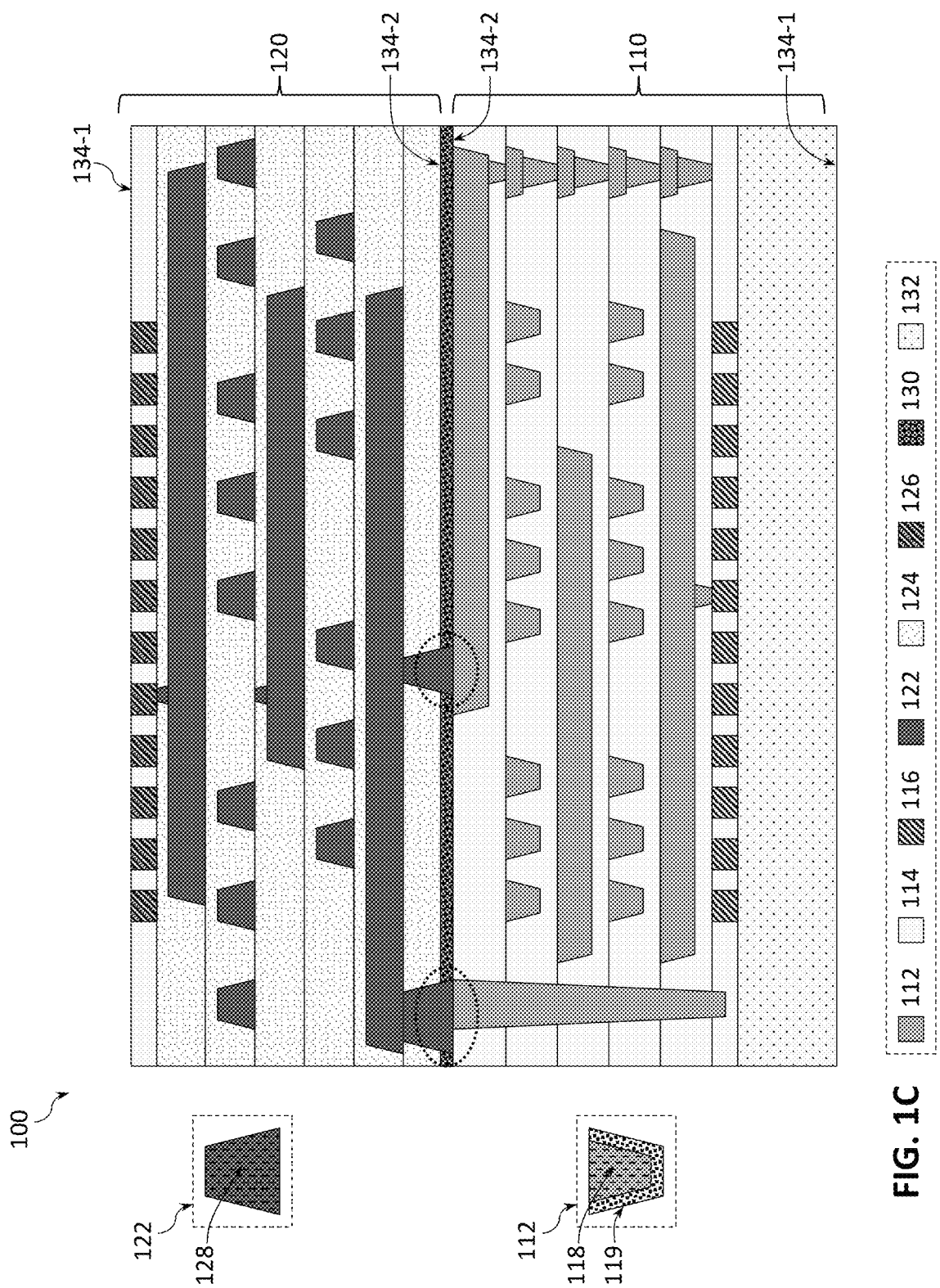
Figure 1D:
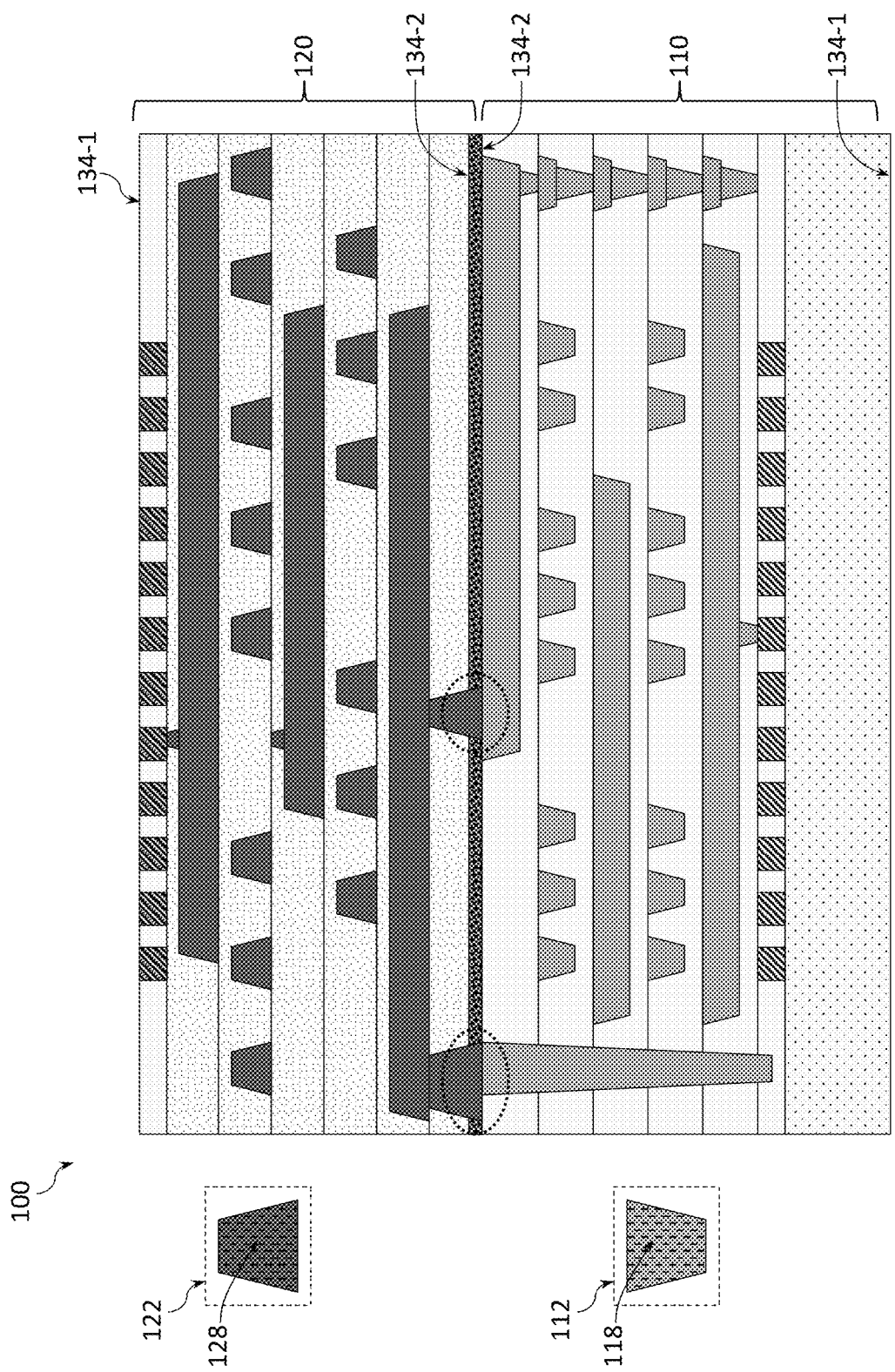

In some embodiments, the liners 119 and/or 129 may be excluded and the interconnects 112, 122 may only include the electrically conductive materials 118, 128. While FIG. 1A illustrates an embodiment of the microelectronic assembly 100 where both the liner 119 and the liner 129 are present in some or all of the interconnects 112, 122, respectively, FIG. 1B illustrates an embodiment of the microelectronic assembly 100 where the liner 119 is absent while the liner 129 is present (as shown in the insets within the dashed contours on the left side of FIG. 1B), FIG. 1C illustrates an embodiment of the microelectronic assembly 100 where the liner 129 is absent while the liner 119 is present (as shown in the insets within the dashed contours on the left side of FIG. 1C), and FIG. 1D illustrates an embodiment of the microelectronic assembly 100 where both the liner 119 and the liner 129 are absent (as shown in the insets within the dashed contours on the left side of FIG. 1D). The rest of the description of the microelectronic assembly 100 that are provided for FIG. 1A is applicable to FIGS. 1B-1D.

Yet another characteristic feature of the hybrid bonding of the IC structures 110 and 120 may be revealed by examining the geometry of the cross-sections of the interconnects 112 and 122. For example, in some embodiments, a thickness of the liner 119 may be different from a thickness of the liner 129, e.g., at least about 5% different, at least about 10% different, or at least 5-50% different. For example, the liner 119 may have a thickness between about 1 and 6 nanometers, including all values and ranges therein, while the liner 129 may have a thickness between about 4 and 10 nanometers, including all values and ranges therein, or vice versa.

In some embodiments, other differences in the geometry of the cross-sections of the interconnects 112 and 122 may be present. For example, in some embodiments, when comparing the conductive traces of the interconnects 112 and 122, the heights of the trapezoids of the conductive traces of the interconnects 112 and 122 may be different, e.g., at least about 5% different, at least about 10% different, or at least 5-50% different. In some embodiments, the angles of the trapezoidal cross-sections of the interconnects 112 and 122 may be different (e.g., the angles between the long sides and one of the sidewalls of the trapezoids) e.g., at least about 5% different, at least about 10% different, or at least 5-50% different. In some embodiments, a pitch of at least some of the interconnects 112 may be different from a pitch of at least some of the interconnects 122, e.g., at least about 5% different, or at least about 10% different.

Still another characteristic feature of the hybrid bonding of the IC structures 110 and 120 may be revealed by examining the material composition of the insulating materials 114 and 124 in that, in some such embodiments, the material composition of the insulating materials 114 and 124 may be different. For example, any of the individual materials of the insulating materials 114 and 124 may be included in the amount of between about 1% and 75%, e.g., between about 5% and 50%, indicating that these materials are included intentional, in contrast to potential accidental doping or impurities being included, which would be less than about 0.1% for any of the materials. Thus, any differences in the material composition of the insulating materials 114 and 124 that are beyond the unintentional doping/impurities levels of about 0.1% of a given material could be indicative of the hybrid bonding used to provide the microelectronic assembly 100.

Figure 2A:
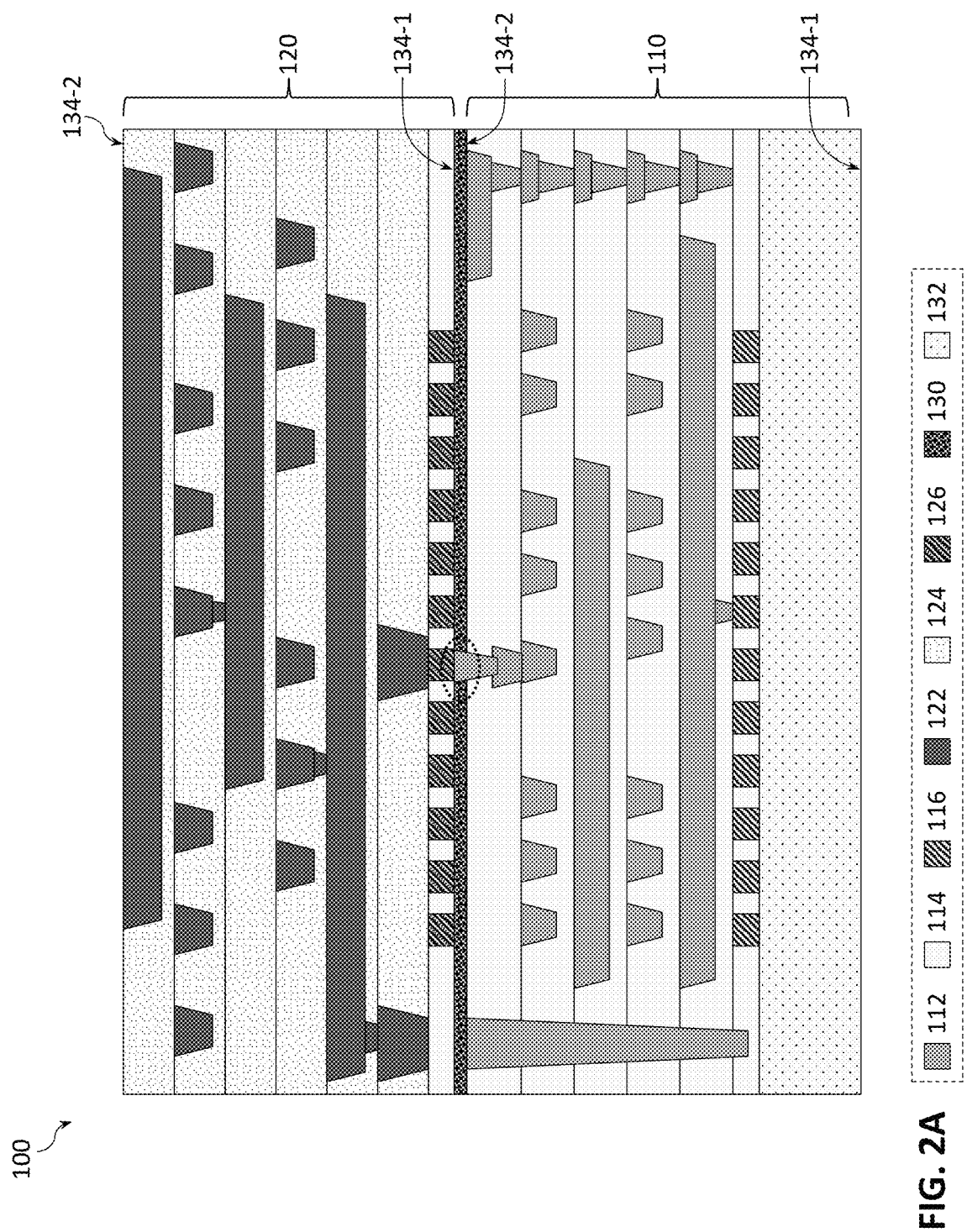
FIGS. 2A-2C illustrate cross-sectional side views of a microelectronic assembly with a first and a second IC structures bonded using front-to-back (f2b) bonding, in accordance with some embodiments.
Figure 2B:
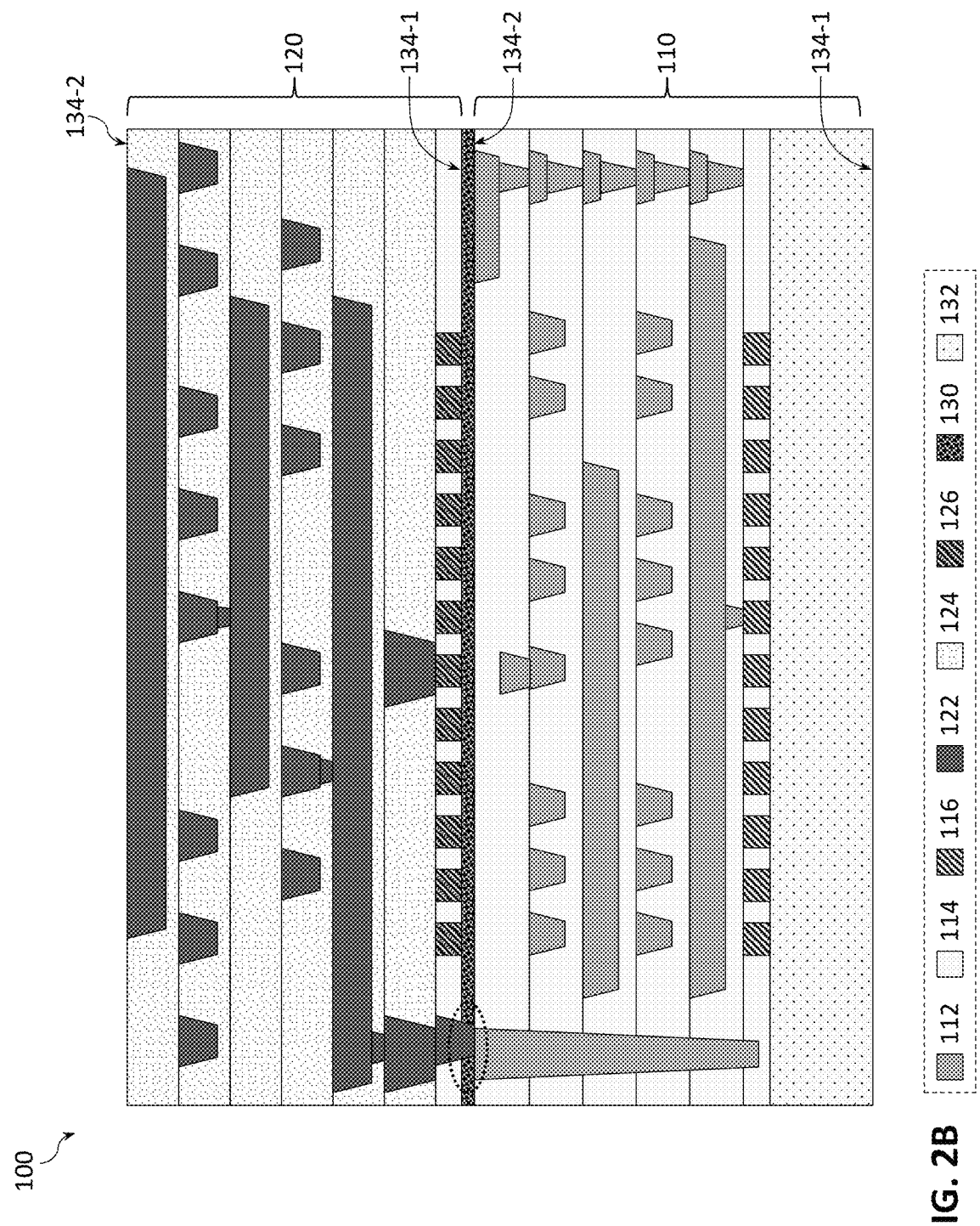
Figure 2C:
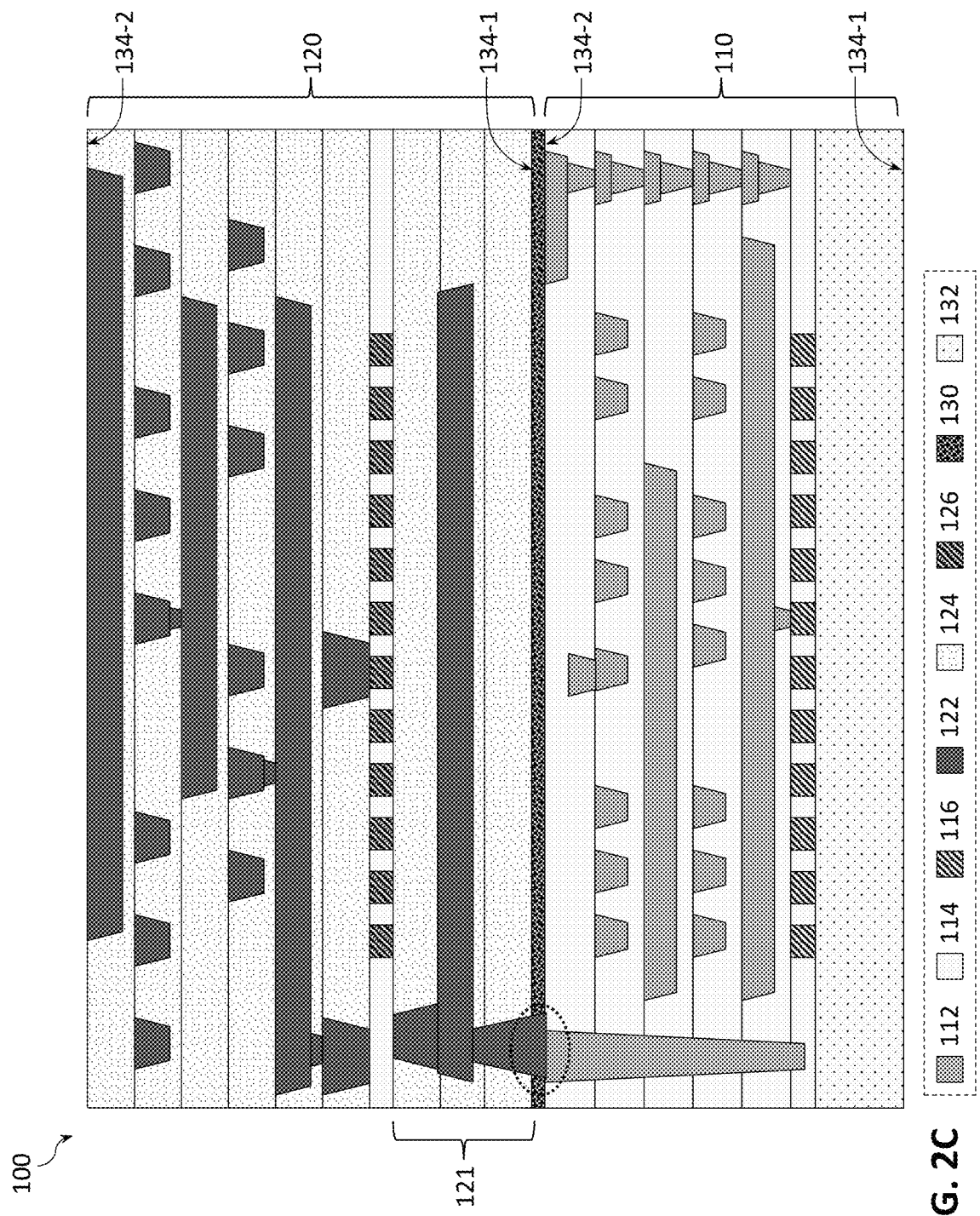

FIGS. 2A-2C illustrate cross-sectional side views of a microelectronic assembly 100 with the first and second IC structures 110, 120 bonded using f2b bonding, in accordance with some embodiments. The microelectronic assembly 100 shown in FIGS. 2A-2C is similar to that described above, except that neither one of the IC structures 110, 120 is flipped upside down for bonding, so that the bottom face of the IC structure 120 is facing and is bonded to the top face of the IC structure 110. Similar to FIGS. 1A-1D, FIGS. 2A-2C indicate a backside 134-1 and a frontside 134-2 for each of the IC structures 110 and 120. In contrast to FIGS. 1A-1D, because the microelectronic assembly 100 shown in FIGS. 2A-2C an f2b-bonded assembly, it is the backside 134-1 of the IC structure 120 that is bonded to the frontside 134-2 of the IC structure 110.

Dotted oval contours are provided in FIGS. 2A-2C to point out examples of electrical connections that could be made in an f2b-bonded microelectronic assembly. In particular, FIG. 2A illustrates an embodiment of the microelectronic assembly 100 where the f2b bonding enables a direct electrical connection between one or more of the interconnects 112 of the IC structure 110 and the device circuitry 126 of the IC structure 120. In various embodiments, the overlap between the electrically conductive fill materials of the interconnect 112 and a portion of the device circuitry 126 that should be contacted may either be substantially 100% of the surface area (at the bonding interface) or be a partial overlap. On the other hand, FIG. 2B illustrates an embodiment of the microelectronic assembly 100 where the f2b bonding enables an electrical connection between one or more of the interconnects 112 of the IC structure 110 and one or more of the interconnects 122 of the IC structure 120, similar to the electrical connections between the interconnects 112 and 122 that were described above with reference to FIG. 1. Similar to FIG. 2B, FIG. 2C also illustrates an embodiment of the microelectronic assembly 100 where the f2b bonding enables an electrical connection between one or more of the interconnects 112 of the IC structure 110 and one or more of the interconnects 122 of the IC structure 120, except that FIG. 2C illustrates an embodiment where the interconnects 122 included in a backside portion 121 of the IC structure 120 are backside interconnects. In some embodiments, backside interconnects may be formed by flipping the IC structure 120 upside down and forming the backside interconnects from the back side of the IC structure 120. Therefore, as can be seen in FIG. 2C, in such embodiments, the trapezoids of the cross-sectional side views of the interconnects 122 that are backside interconnects (i.e., those in the portion 121) are inverted with respect to those of the interconnects 122 which are not backside interconnects (i.e., frontside interconnects 122, those of the interconnects 122 that are outside of the portion 121). Otherwise, electrical connection between one or more of the interconnects 112 of the IC structure 110 and one or more of the backside interconnects 122 of the IC structure 120 is similar to the electrical connections between the interconnects 112 and 122 that were described above with reference to FIG. 1. In various other embodiments, an f2b-bonded microelectronic assembly 100 may include any combination of electrical connections as shown in FIGS. 2A-2C.

It should be noted that while FIG. 2C illustrates the backside interconnects 122 to be included in layers of the insulating material 124, in other embodiments, the backside interconnects 122 may be included in layers of an insulating material having a material composition different from the insulating material 124 used to surround the frontside interconnects 122, while yet in other embodiments, the backside interconnects 122 may be provided within a substrate or a support structure of the IC structure 120, e.g., a support structure similar to the support structure 132, described above.

One characteristic feature that is specific to the f2b bonding as shown in FIGS. 2A-2C is that the cross-sectional trapezoidal shapes of the interconnects 112 and of the frontside interconnects 122 may be oriented in the same manner (i.e., not inverted with respect to one another). This is illustrated in FIGS. 2A-2C with the long sides of the trapezoidal cross-sections of the interconnects 112 being closer to the front of the IC structure 110, and, therefore, to the bonding interface to the IC structure 120, than their short sides, and with the short sides of the trapezoidal cross-sections of the frontside interconnects 122 being closer to the bonding interface to the IC structure 110 than their long sides. For the backside interconnects 122, the cross-sectional trapezoidal shapes of the interconnects 112 may be inverted with respect to those of the backside interconnects 122, which can be seen in FIG. 2C. As shown in FIG. 2C, the long sides of the trapezoidal cross-sections of the interconnects 112 are closer to the front of the IC structure 110, and, therefore, to the bonding interface to the IC structure 120, than their short sides, and the long sides of the trapezoidal cross-sections of the backside interconnects 122 are closer to the bonding interface to the IC structure 110 than their short sides.

Characteristic features of the hybrid bonding described with reference to FIG. 1 besides the feature specific to the f2f bonding of FIG. 1 are applicable to various embodiments of the microelectronic assembly of FIG. 2 and, therefore, in the interests of brevity, are not repeated for FIG. 2.

FIGS. 3A-3K illustrate cross-sectional side views of a microelectronic assembly 100 with the first and second IC structures 110, 120 bonded using b2b bonding, in accordance with some embodiments. The microelectronic assembly 100 shown in FIGS. 3A-3K is similar to that of FIG. 2, except that the IC structure 110 is flipped upside down for bonding, so that the bottom face of the IC structure 120 is facing and is bonded to the bottom face of the IC structure 110. Similar to FIGS. 1 and 2, FIGS. 3A-3K indicate a backside 134-1 and a frontside 134-2 for each of the IC structures 110 and 120. In contrast to the f2b-bonded embodiments of FIG. 2, because the microelectronic assembly 100 shown in FIGS. 3A-3K a b2b-bonded assembly, it is the backside 134-1 of the IC structure 110 that is bonded to the backside 134-1 of the IC structure 120.

Dotted oval contours are provided in FIGS. 3A-3K to point out examples of electrical connections that could be made in a b2b-bonded microelectronic assembly.

Figure 3A:
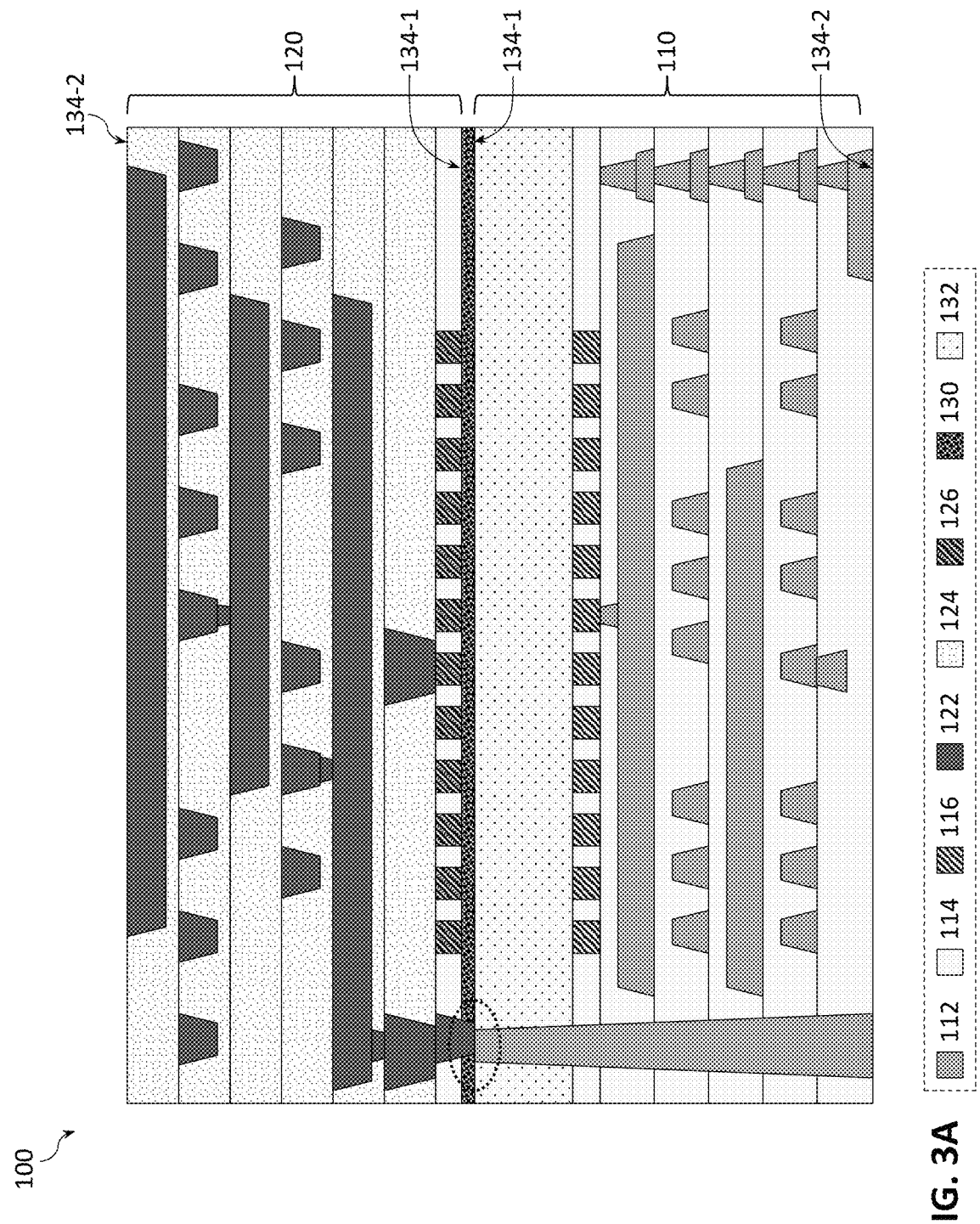
FIGS. 3A-3K illustrate cross-sectional side views of a microelectronic assembly with a first and a second IC structures bonded using back-to-back (b2b) bonding, in accordance with some embodiments.

FIG. 3A illustrates an embodiment of the b2b-bonded microelectronic assembly 100 where the IC structure 110 may include the support structure 132 as described above, while a support structure of the IC structure 120 may be removed prior to bonding. In such embodiments, the bonding interface (e.g., the bonding material 130) may be between the backside 134-1 of the support structure 132 of the IC structure 110 and the backside 134-1 of the IC structure 120. The dotted oval contour shown in FIG. 3A indicates that such an embodiment may include an electrical connection between one or more of the interconnects 112 of the IC structure 110 and one or more of the interconnects 122 of the IC structure 120, similar to the electrical connections between the interconnects 112 and 122 that were described above with reference to FIG. 1.

Figure 3B:
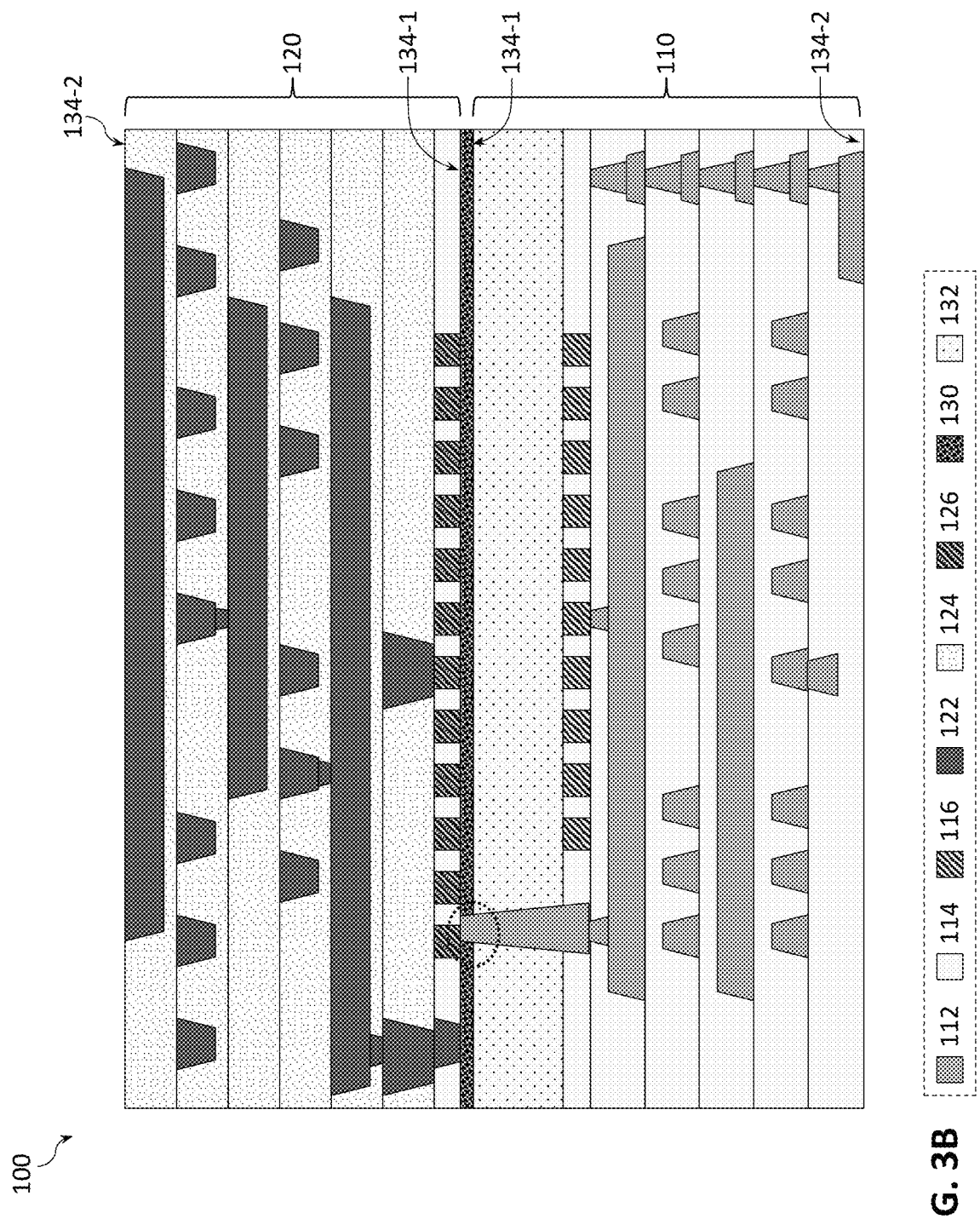

FIG. 3B illustrates an embodiment of the b2b-bonded microelectronic assembly 100 similar to that shown in FIG.

3A, except that the dotted oval contour shown in FIG. 3B indicates that such an embodiment may include one or more direct electrical connections between one or more of the interconnects 112 of the IC structure 110 and one or more devices of the device circuitry 126 of the IC structure 120, similar to the electrical connection that was described above with reference to FIG. 2A.

Figure 3C:
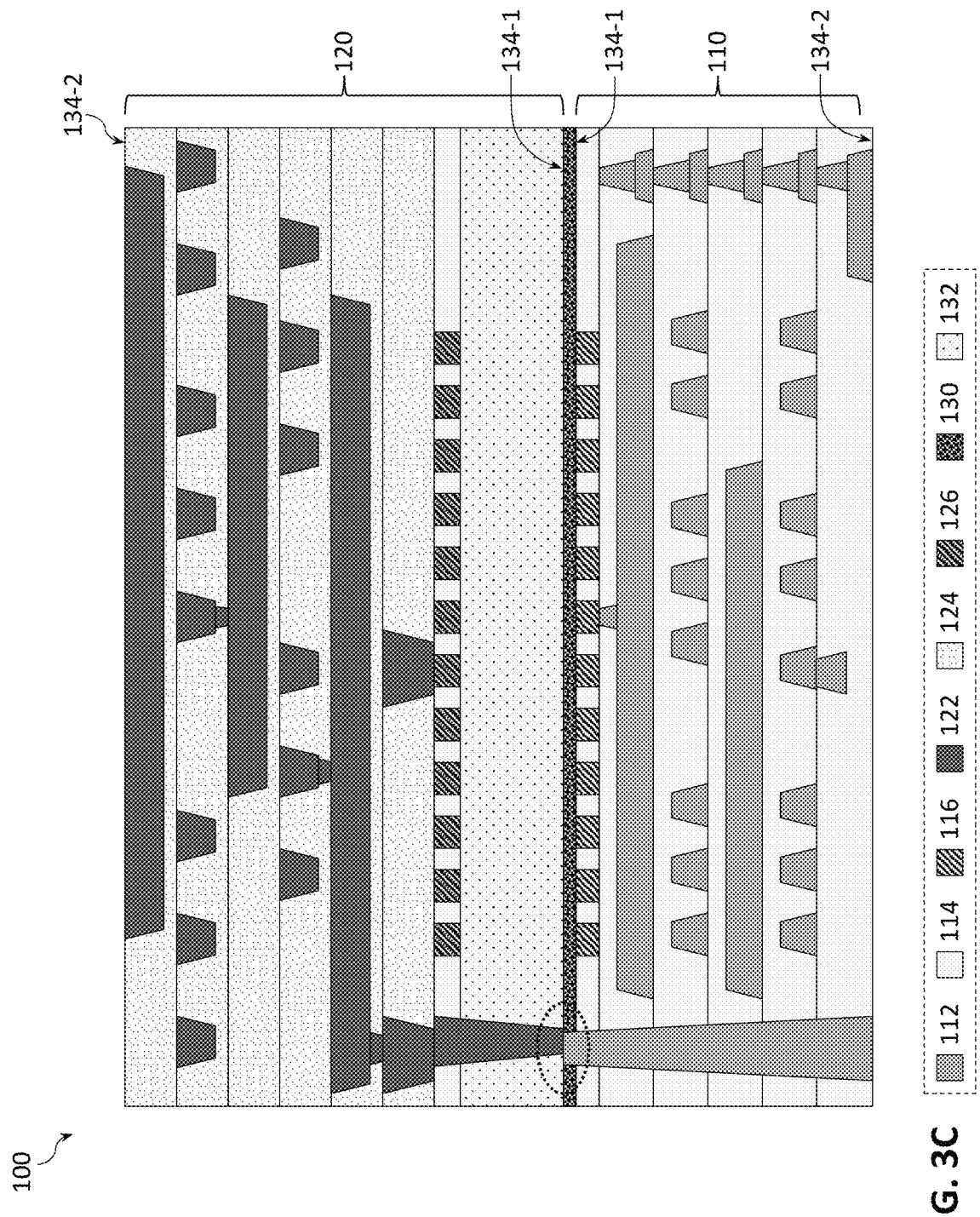

FIG. 3C illustrates an embodiment of the b2b-bonded microelectronic assembly 100 where the IC structure 120 may include the support structure 132 as described above, while a support structure of the IC structure 110 may be removed prior to bonding. In such embodiments, the bonding interface (e.g., the bonding material 130) may be between the backside 134-1 of the support structure 132 of the IC structure 120 and the backside 134-1 of the IC structure 110. The dotted oval contour shown in FIG. 3C indicates that such an embodiment may include an electrical connection between one or more of the interconnects 112 of the IC structure 110 and one or more of the interconnects 122 of the IC structure 120, similar to the electrical connections between the interconnects 112 and 122 that were described above with reference to FIG. 1.

Figure 3D:
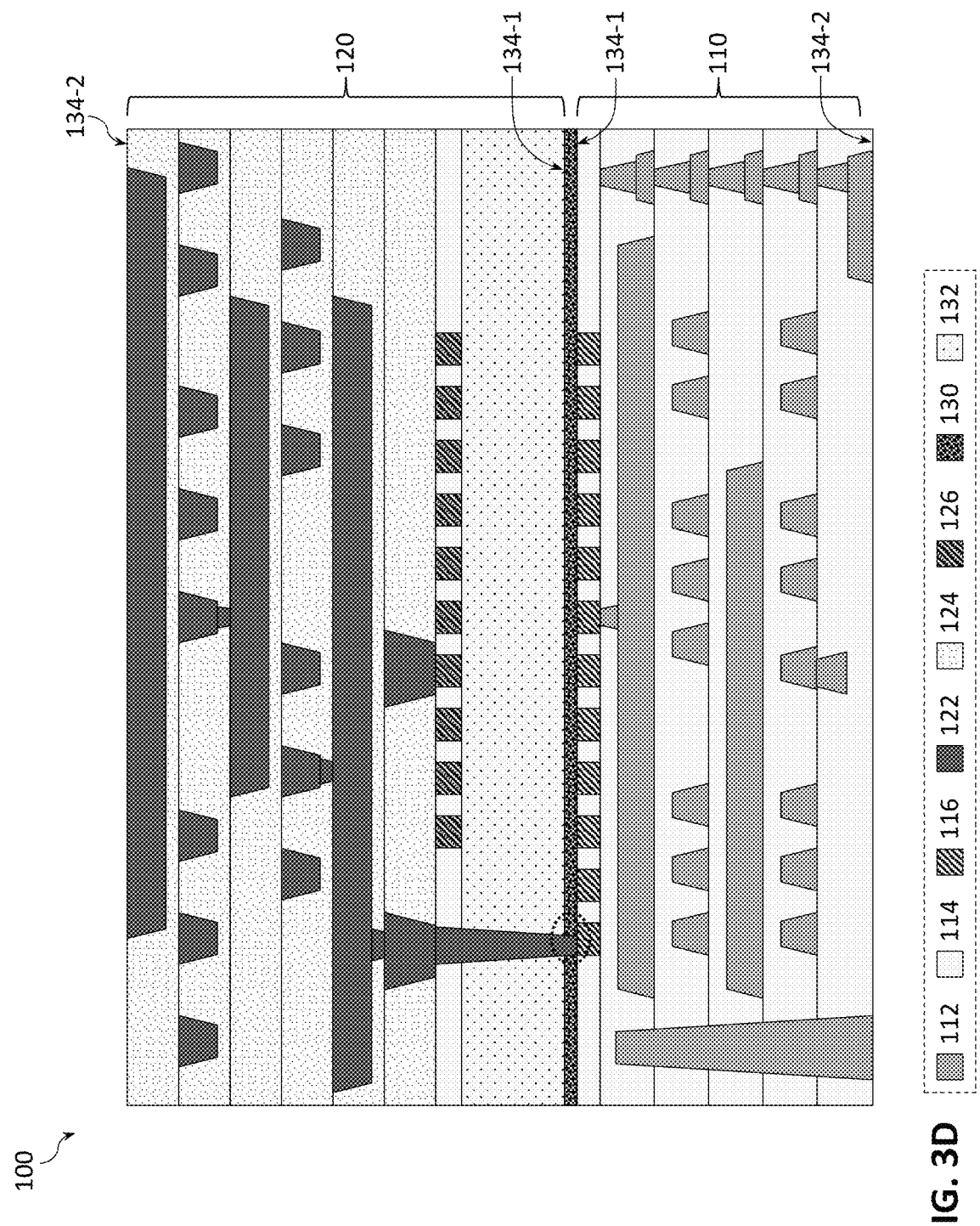

FIG. 3D illustrates an embodiment of the b2b-bonded microelectronic assembly 100 similar to that shown in FIG. 3C, except that the dotted oval contour shown in FIG. 3D indicates that such an embodiment may include one or more direct electrical connections between one or more of the interconnects 122 of the IC structure 120 and one or more devices of the device circuitry 116 of the IC structure 110, similar to the electrical connection that was described above with reference to FIG. 2A.

Figure 3E:
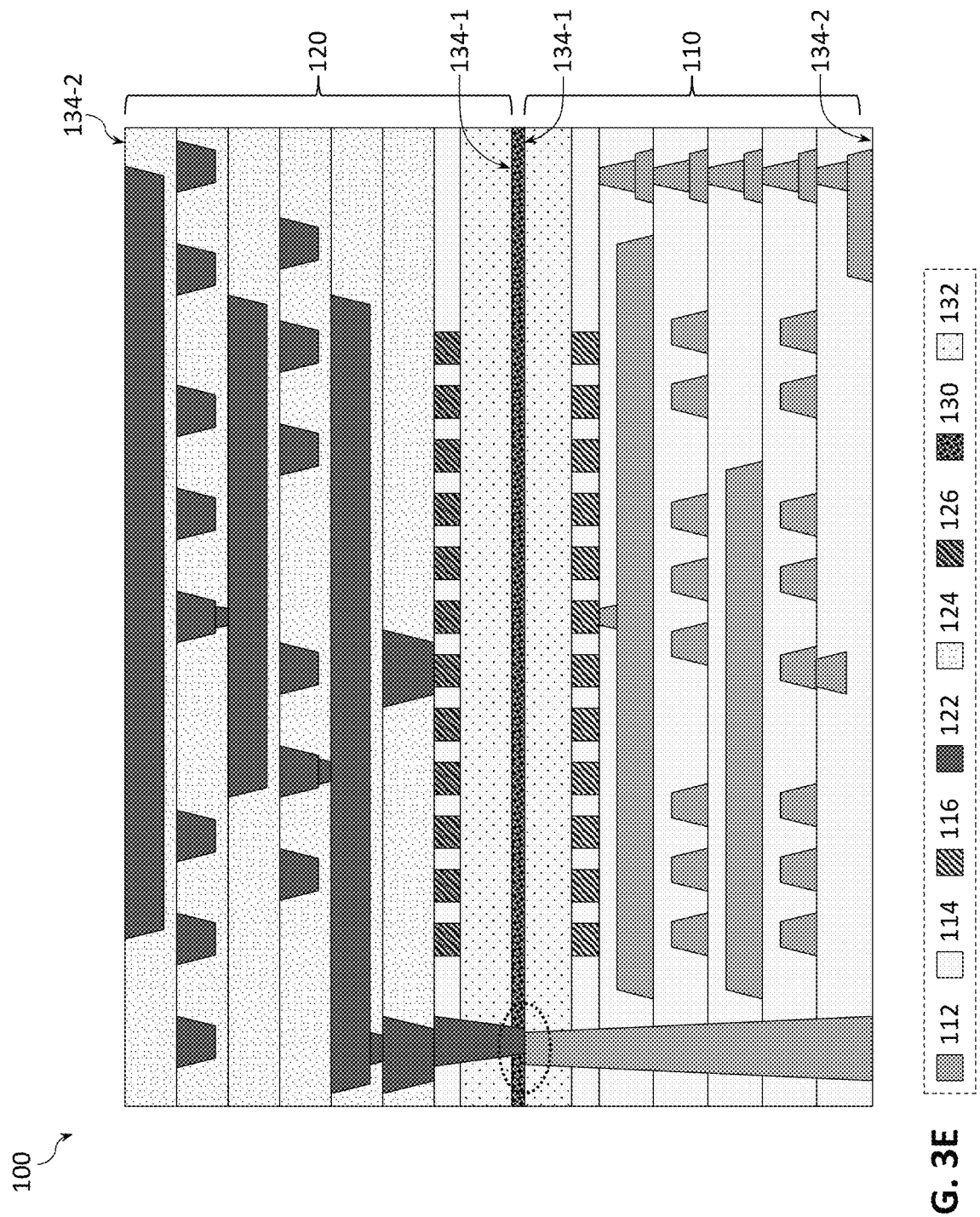

FIG. 3E illustrates an embodiment of the b2b-bonded microelectronic assembly 100 where each of the IC structure 110 and the IC structure 120 may include a respective support structure 132 as described above. In such embodiments, the bonding interface (e.g., the bonding material 130) may be between the backside 134-1 of the support structure 132 of the IC structure 120 and the backside 134-1 of the support structure 132 of the IC structure 110. The dotted oval contour shown in FIG. 3E indicates that such an embodiment may include an electrical connection between one or more of the interconnects 112 of the IC structure 110 and one or more of the interconnects 122 of the IC structure 120, similar to the electrical connections between the interconnects 112 and 122 that were described above with reference to FIG. 1.

Figure 3F:
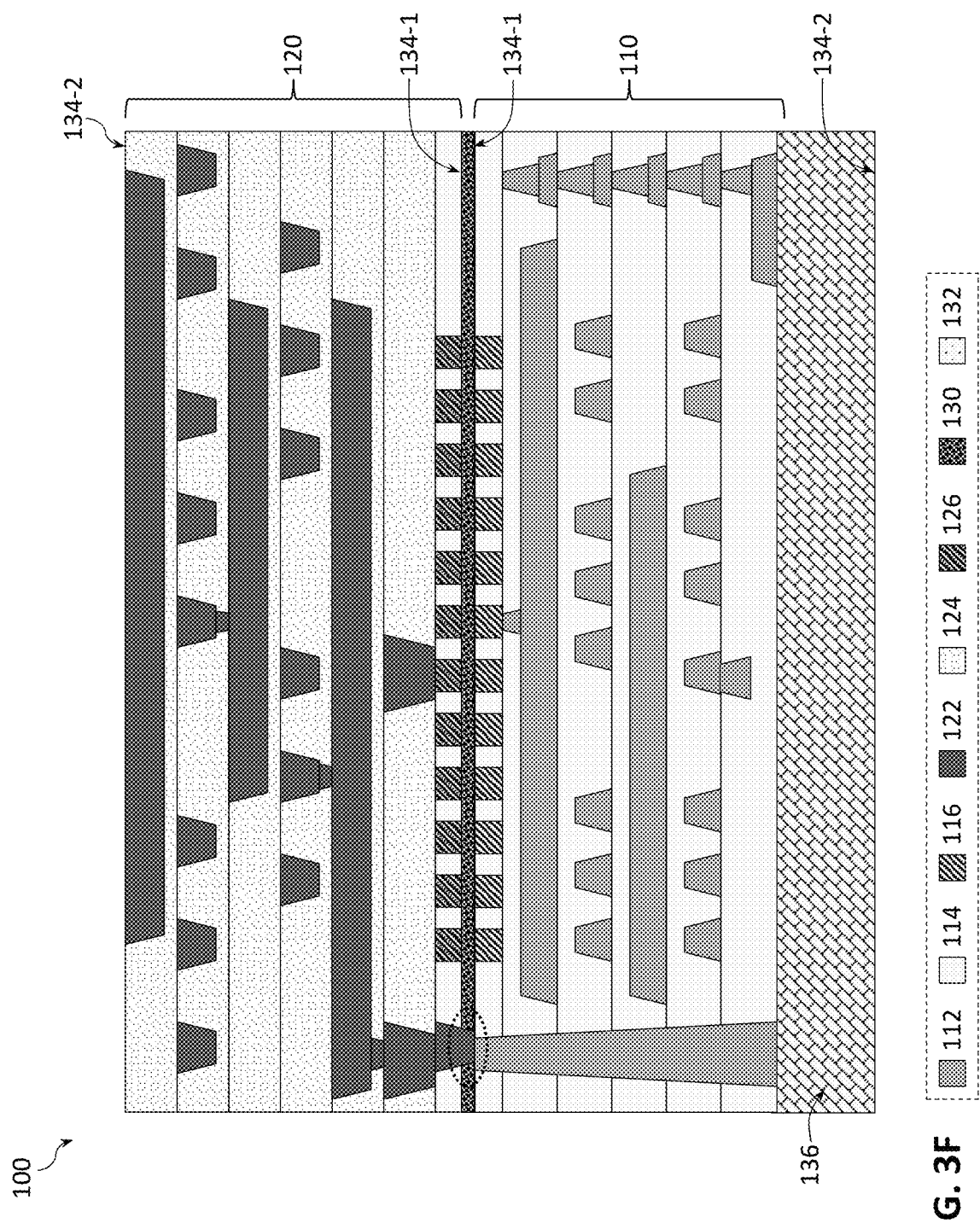

FIG. 3F illustrates an embodiment of the b2b-bonded microelectronic assembly 100 where neither the IC structure 120 nor the IC structure 110 includes the support structure 132 (i.e., both of the support structures may be removed prior to bonding) but a carrier support structure 136 may be attached to the IC structure 110 to provide mechanical stability to the microelectronic assembly 100. In other embodiments, the carrier support structure 136 may be attached to the IC structure 120, and/or one carrier support structure 136 may be attached to the IC structure 110 and another carrier support structure 136 may be attached to the IC structure 120. The dotted oval contour shown in FIG. 3F indicates that such an embodiment may include an electrical connection between one or more of the interconnects 112 of the IC structure 110 and one or more of the interconnects 122 of the IC structure 120, similar to the electrical connections between the interconnects 112 and 122 that were described above with reference to FIG. 1.

Figure 3G:
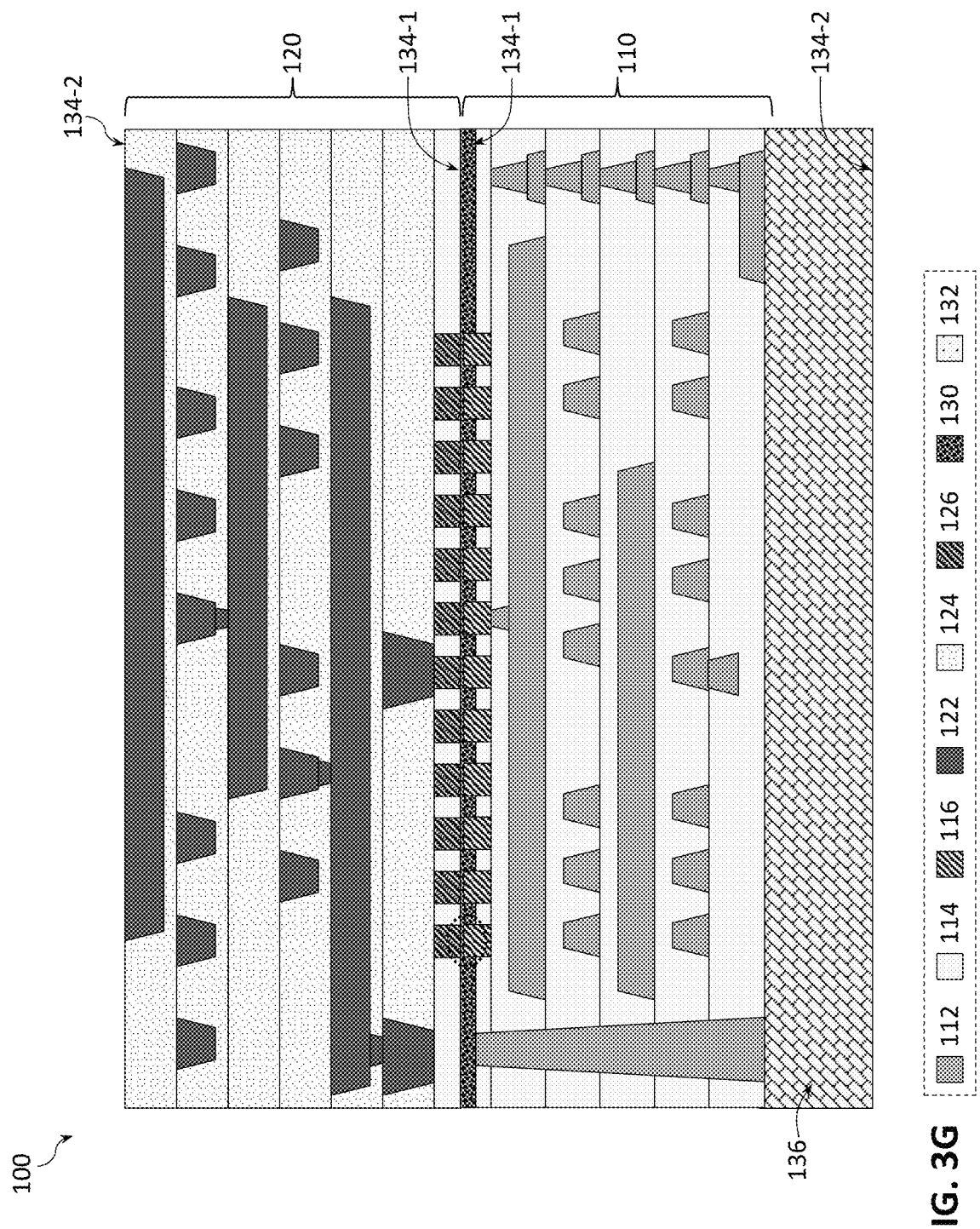

FIG. 3G illustrates an embodiment of the b2b-bonded microelectronic assembly 100 similar to that shown in FIG. 3F, except that the dotted oval contour shown in FIG. 3G indicates that such an embodiment may include one or more direct electrical connections between one or more devices of the device circuitry 126 of the IC structure 120 and one or more devices of the device circuitry 116 of the IC structure 110. In various embodiments, the overlap between a portion of the device circuitry 116 that should be contacted and a portion of the device circuitry 126 that should be contacted may either be substantially 100% of the surface area (at the bonding interface) or be a partial overlap.

Figure 3H:
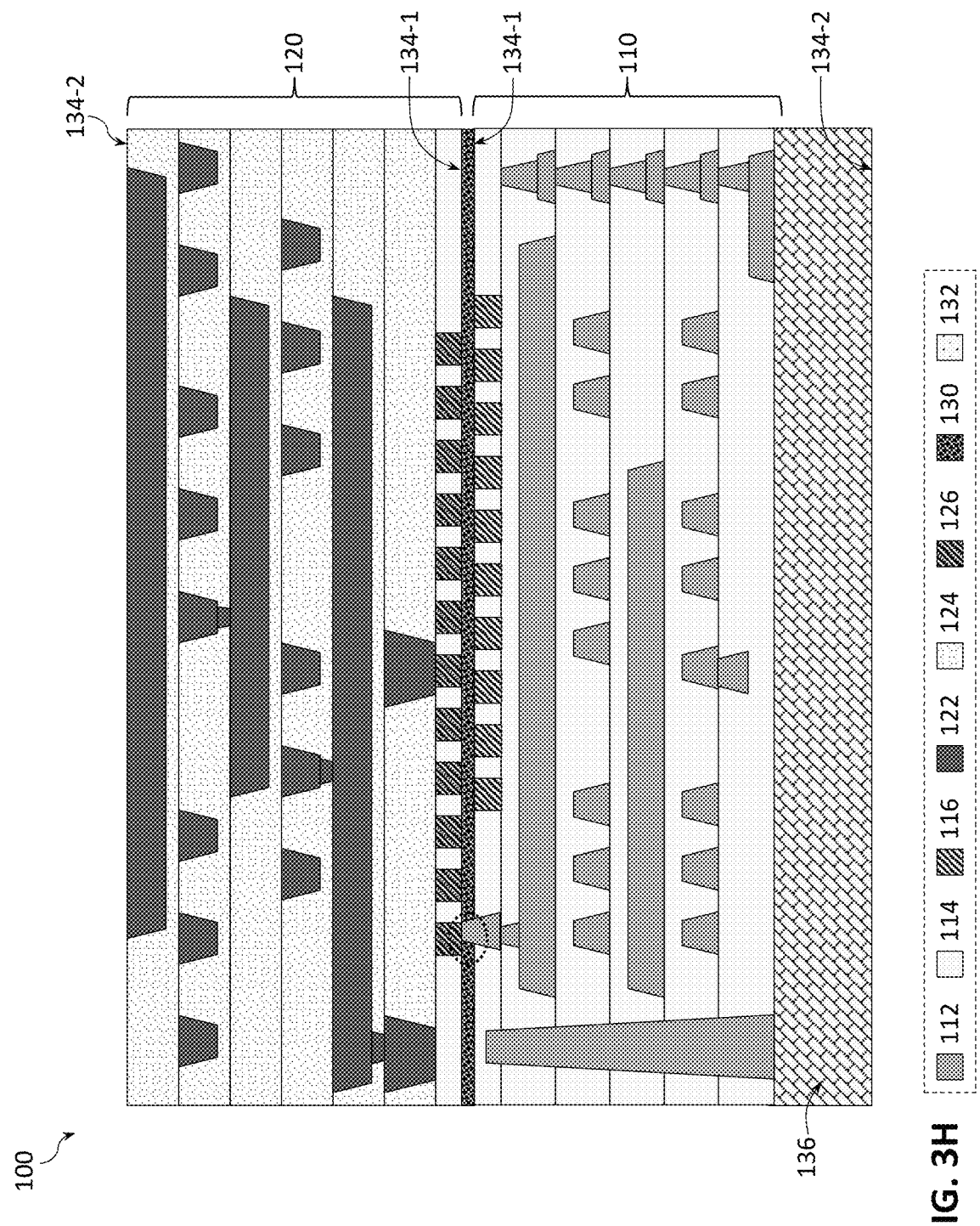

FIG. 3H illustrates an embodiment of the b2b-bonded microelectronic assembly 100 similar to that shown in FIG. 3F or 3G, except that the dotted oval contour shown in FIG. 3H indicates that such an embodiment may include one or more direct electrical connections between one or more of the interconnects 112 of the IC structure 110 and one or more devices of the device circuitry 126 of the IC structure 120, similar to the electrical connection that was described above with reference to FIG. 2A. Although not specifically shown, other embodiments of the b2b-bonded microelectronic assembly 100 similar to that shown in FIG. 3F or 3G may include one or more direct electrical connections between one or more of the interconnects 122 of the IC structure 120 and one or more devices of the device circuitry 116 of the IC structure 110, similar to the electrical connection that was described above with reference to FIG. 2A.

Figure 3I:
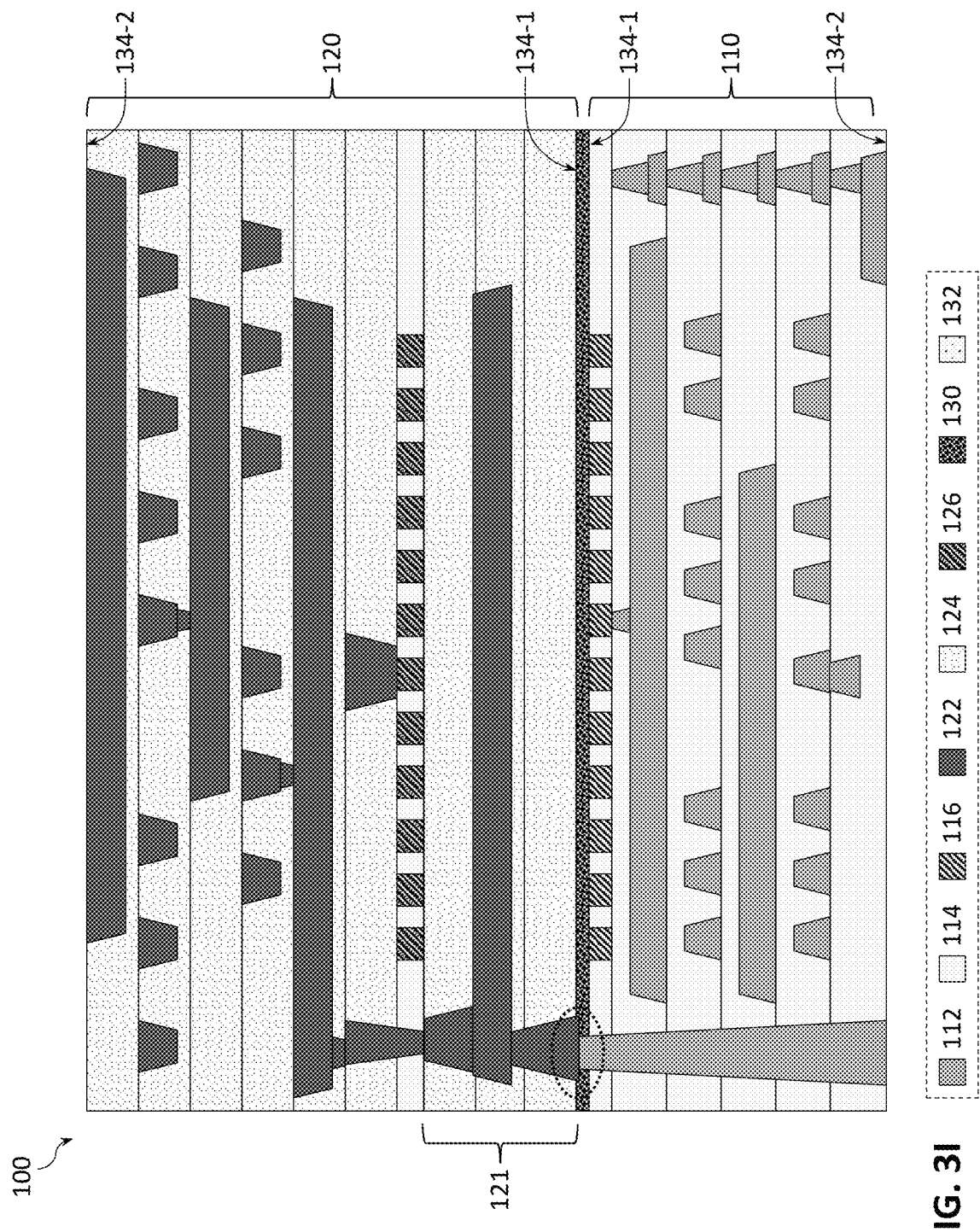
Figure 3J:
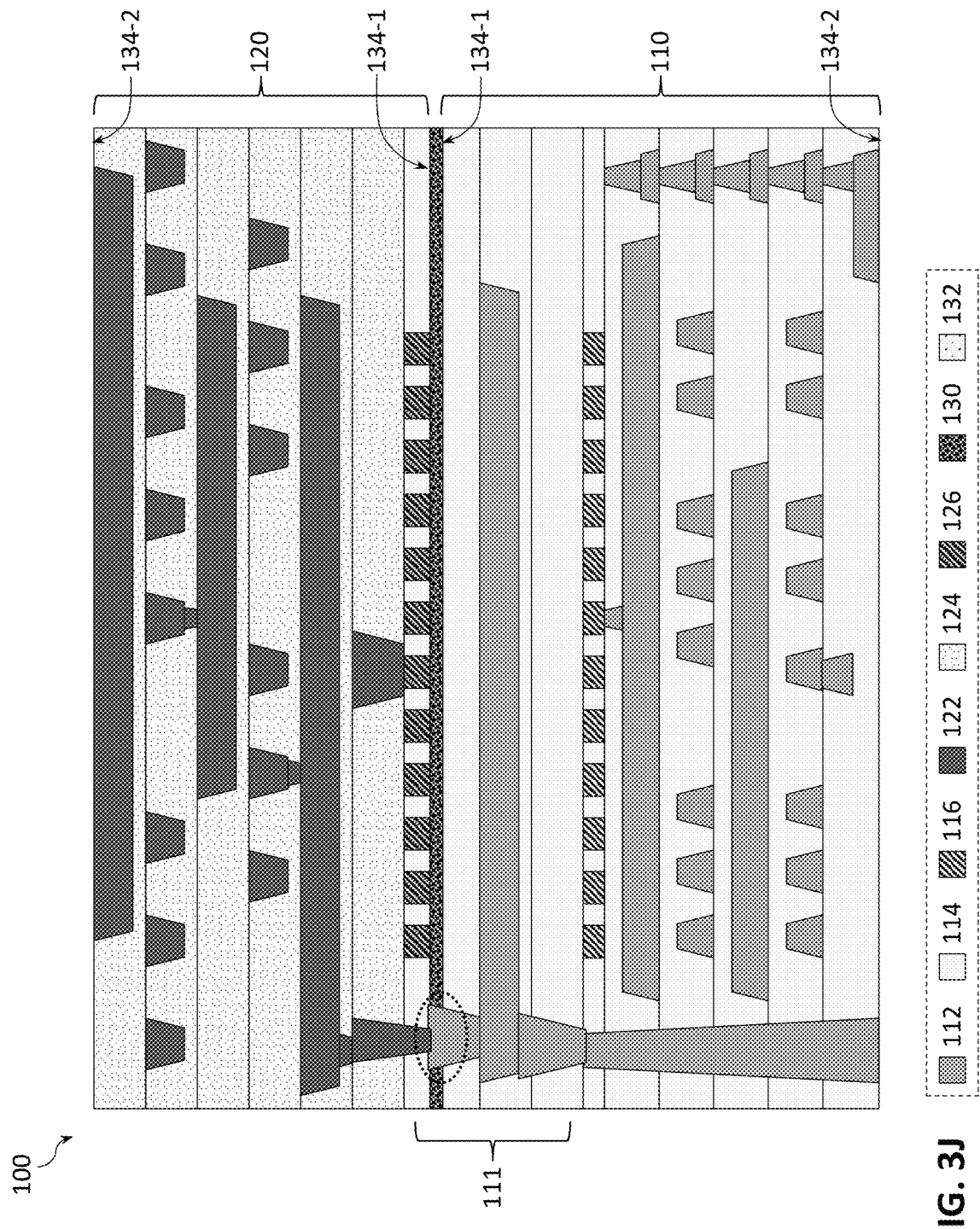
Figure 3K:
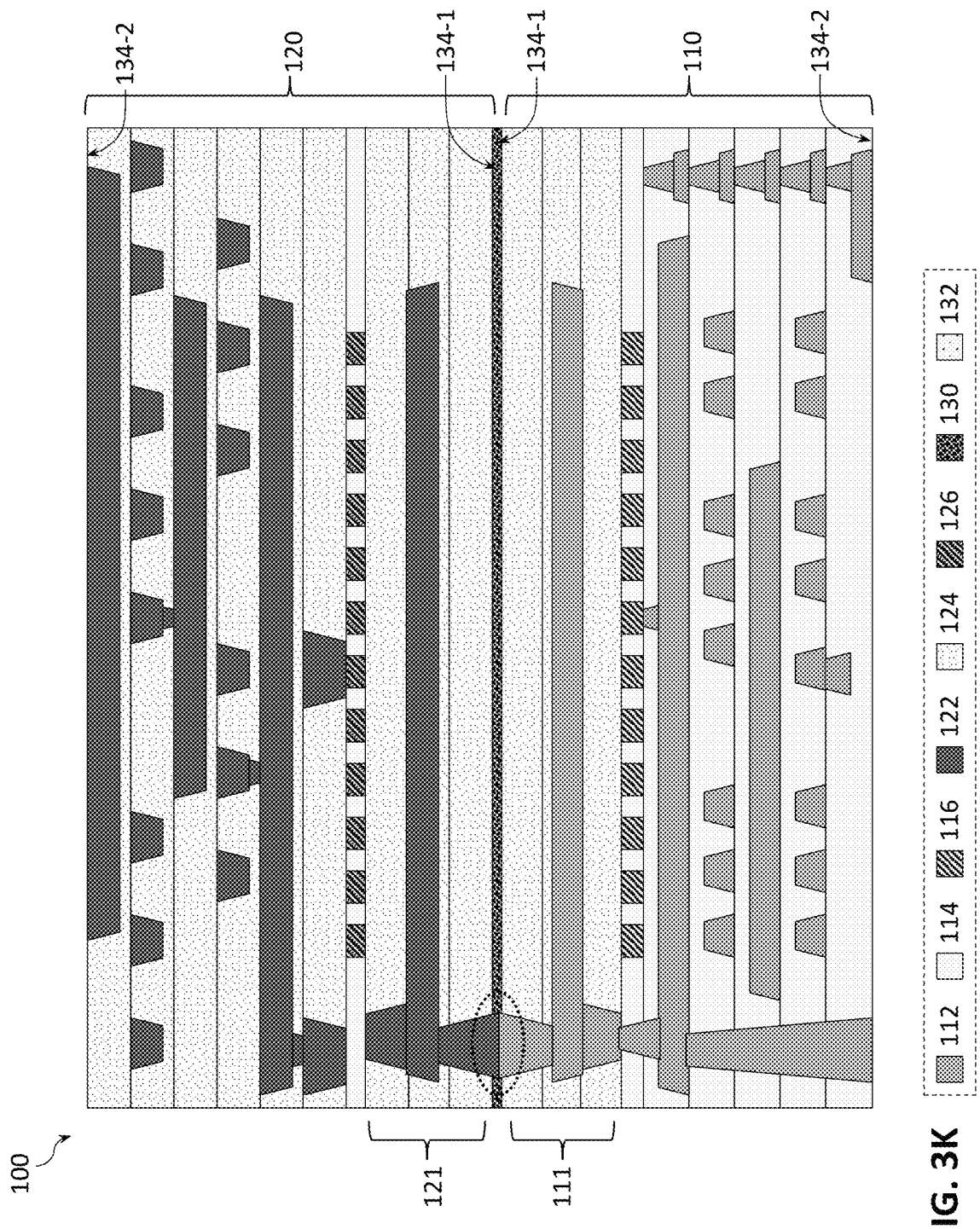

FIGS. 3I-3K illustrate embodiments of the b2b-bonded microelectronic assembly 100 where one or both of the IC structures 110 and 120 include backside interconnects.

In particular, FIG. 3I illustrates an embodiment of the b2b-bonded microelectronic assembly 100 where the IC structure 120 includes backside interconnects 122 in the portion 121, similar to the backside interconnects 122 described with reference to FIG. 2C. The dotted oval contour shown in FIG. 3I indicates an example electrical connection between one of the frontside interconnects 112 of the IC structure 110 and one of the backside interconnects 122 of the IC structure 120. Although not specifically shown, in other embodiments of the b2b-bonded microelectronic assembly 100 similar to that shown in FIG. 3I, one or more of the backside interconnects 122 of the IC structure 120 may be electrically coupled, at the bonding interface, to one or more devices of the device circuitry 116 of the IC structure 110.

FIG. 3J illustrates an embodiment of the b2b-bonded microelectronic assembly 100 where the IC structure 110 includes backside interconnects 112 in a portion 111, similar to the backside interconnects 122 described with reference to FIG. 2C. As can be seen in FIG. 3J, in such embodiments, the trapezoids of the cross-sectional side views of the interconnects 112 that are backside interconnects (i.e., those in the portion 111) are inverted with respect to those of the interconnects 112 which are not backside interconnects (i.e., frontside interconnects 112, those of the interconnects 112 that are outside of the portion 111). It should be noted that while FIG. 3J illustrates the backside interconnects 112 to be included in layers of the insulating material 114, in other embodiments, the backside interconnects 112 may be included in layers of an insulating material having a material composition different from the insulating material 114 used to surround the frontside interconnects 112, while yet in other embodiments, the backside interconnects 112 may be provided within a substrate or a support structure of the IC structure 110, e.g., a support structure similar to the support structure 132, described above. The dotted oval contour shown in FIG. 3J indicates an example electrical connection between one of the frontside interconnects 122 of the IC structure 120 and one of the backside interconnects 112 of the IC structure 110. Although not specifically shown, in other embodiments of the b2b-bonded microelectronic assembly 100 similar to that shown in FIG. 3J, one or more of the backside interconnects 112 of the IC structure 120 may be electrically coupled, at the bonding interface, to one or more devices of the device circuitry 126 of the IC structure 120.

FIG. 3K illustrates an embodiment of the b2b-bonded microelectronic assembly 100 that may be a combination of the embodiments shown in FIGS. 3I and 3J in that the IC structure 110 includes the backside interconnects 112 in the portion 111 and the IC structure 120 includes the backside interconnects 122 in the portion 121. The dotted oval contour shown in FIG. 3K indicates an example electrical connection between one of the backside interconnects 112 of the IC structure 110 and one of the backside interconnects 122 of the IC structure 120.

One characteristic feature that is specific to the b2b bonding as shown in FIGS. 3A-3K is that the cross-sectional trapezoidal shapes of the frontside interconnects 112 may be inverted with respect to those of the frontside interconnects 122. This is illustrated in FIGS. 3A-3K with the short sides of the trapezoidal cross-sections of the frontside interconnects 112 being closer to the back face 134-1 of the IC structure 110, and, therefore, to the bonding interface to the IC structure 120, than their long sides, and with the short sides of the trapezoidal cross-sections of the frontside interconnects 122 being closer to the bonding interface to the IC structure 110 than their long sides. One characteristic feature that is specific to the b2b bonding of the microelectronic assembly when the backside interconnects 122 are implemented is that the cross-sectional trapezoidal shapes of the frontside interconnects 112 may be oriented in the same manner (i.e., not inverted with respect to one another) as those of the backside interconnects 122, which can be seen in FIG. 3I and FIG. 3K. As shown in FIG. 3I and FIG. 3K, the short sides of the trapezoidal cross-sections of the frontside interconnects 112 are closer to the front of the IC structure 110, and, therefore, to the bonding interface to the IC structure 120, than their long sides, and the long sides of the trapezoidal cross-sections of the backside interconnects 122 are closer to the bonding interface to the IC structure 110 than their short sides. One characteristic feature that is specific to the b2b bonding of the microelectronic assembly when the backside interconnects 112 are implemented is that the cross-sectional trapezoidal shapes of the frontside interconnects 122 may be oriented in the same manner (i.e., not inverted with respect to one another) as those of the backside interconnects 112, which can be seen in FIG. 3J and FIG. 3K. As shown in FIG. 3J and FIG. 3K, the short sides of the trapezoidal cross-sections of the frontside interconnects 122 are closer to the front face 134-1 of the IC structure 120, and, therefore, to the bonding interface to the IC structure 110, than their long sides, and the long sides of the trapezoidal cross-sections of the backside interconnects 112 are closer to the bonding interface to the IC structure 120 than their short sides.

Characteristic features of the hybrid bonding described with reference to FIG. 1 besides the feature specific to the f2f bonding of FIG. 1 are applicable to various embodiments of the microelectronic assembly of FIG. 3 and, therefore, in the interests of brevity, are not repeated for FIG. 3.

While FIGS. 1-3 illustrate embodiments where two IC structures are bonded together (i.e., a pair of the IC structures 110 and 120), any of the embodiments described with reference to FIGS. 1-3 may be extended to the microelectronic assemblies 100 that include three or more IC structures bonded together in any combination as described herein. For example, in some embodiments, the microelectronic assembly 100 may include two IC structures bonded in an f2b bonding configuration, e.g., as shown in FIG. 2, and may further include a third IC structure bonded to the IC structure 120 so that the IC structure 120 and the third IC structure are bonded in an f2f bonding configuration according to any of the embodiments described herein (i.e., the backside 134-1 of the IC structure 120 would be bonded to the IC structure 110 according to any embodiments of FIG. 2, while the frontside 134-2 of the IC structure would be bonded to the frontside of the third IC structure in accordance with the f2f bonding configuration embodiments described herein). In another example, in some embodiments, the microelectronic assembly 100 may include two IC structures bonded in an f2f bonding configuration, e.g., as shown in FIG. 1, and may further include a third IC structure bonded to the IC structure 120 so that the IC structure 120 and the third IC structure are bonded in a b2b bonding configuration according to any of the embodiments described herein (i.e., the frontside 134-2 of the IC structure 120 would be bonded to the IC structure 110 according to any embodiments of FIG. 1, while the backside 134-1 of the IC structure would be bonded to the backside of the third IC structure in accordance with the b2b bonding configuration embodiments described herein). All such embodiments of three or more IC structures bonded together are within the scope of the present disclosure and may be included in further embodiments of the microelectronic assembly 100 as shown in FIGS. 1-3.

Figure 4:
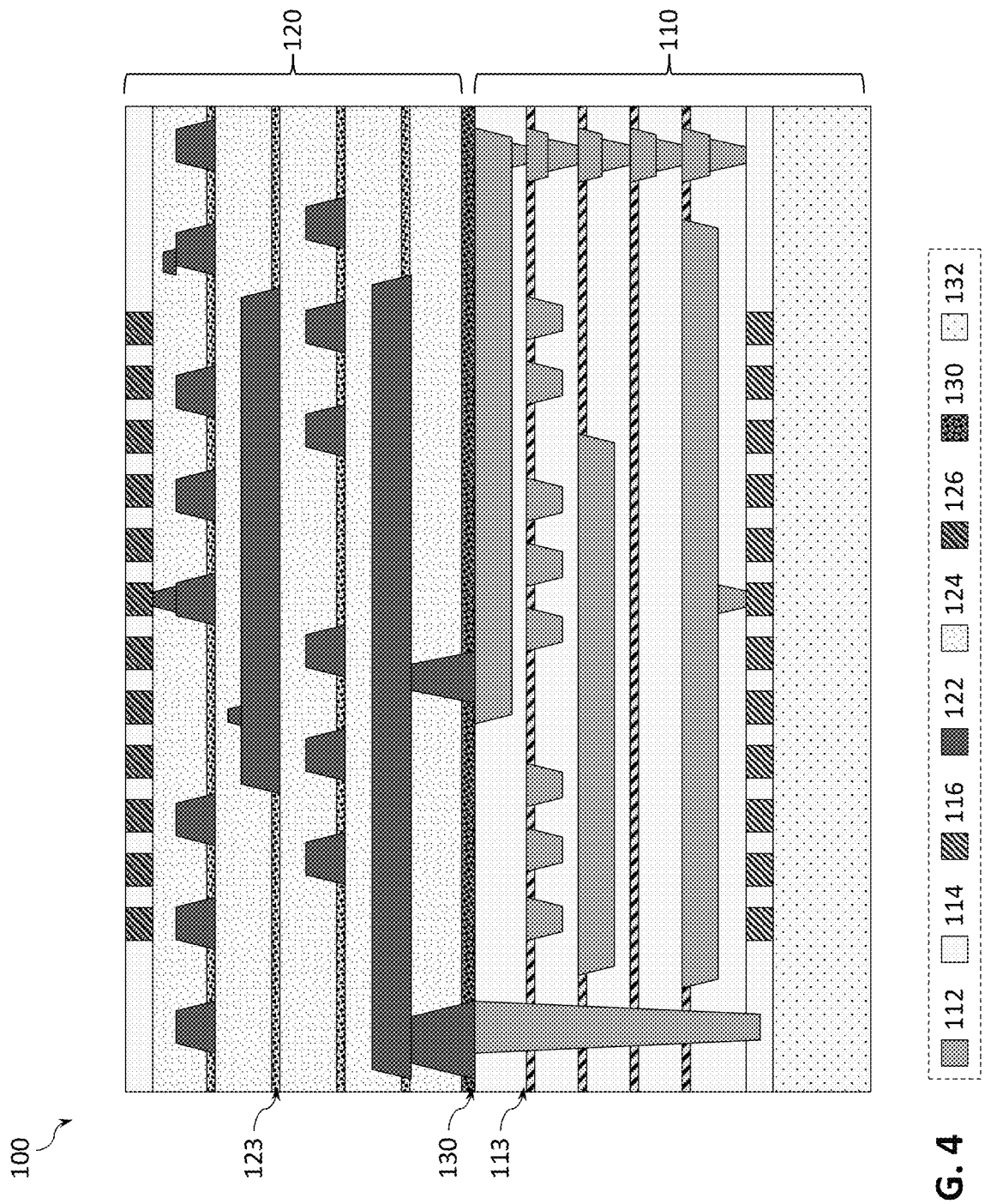
FIG. 4 illustrates a cross-sectional side view of a microelectronic assembly with different etch-stop materials in the first and second IC structures, in accordance with some embodiments.

FIG. 4 illustrates a cross-sectional side view of a microelectronic assembly 100 with different etch-stop materials in the first and second IC structures 110, 120, in accordance with some embodiments. The microelectronic assembly 100 shown in FIG. 4 is similar to that shown in FIG. 1A, except that it further illustrates layers of an etch-stop material 113 that may be included in the IC structure 110, e.g., between some or all pairs of metal layers of a metallization stack of the IC structure 110, as well as layers of an etch-stop material 123 that may be included in the IC structure 120, e.g., between some or all pairs of metal layers of a metallization stack of the IC structure 120. Such layers of etch-stop materials are commonly used in the field of semiconductor manufacturing, and may be provided at different locations of the IC structures 110, 120 than what is shown in FIG. 4, the locations being dependent on, e.g., specific processing techniques used to manufacture portions of these IC structures. Any location of the etch-stop materials 113, 123 within the IC structures 110, 120 as known in the art are possible and are within the scope of the present disclosure. What is unique about the etch-stop materials in context of hybrid manufacturing is that because the IC structures 110, 120 may be fabricated by different manufacturers, using different materials, or different manufacturing techniques, the material compositions of their etch-stop materials may be different. For example, the etch-stop material 113 may include a material with silicon and nitrogen (e.g., silicon nitride), while the etch-stop material 123 may include a material with silicon and carbon (e.g., silicon carbide), or one of the etch-stop materials 113, 123 may include a material with aluminum and oxygen (e.g., aluminum oxide). Furthermore, the bonding material 130 at the interface between the IC structures 110 and 120 may have a material composition different from one or both of the etch-stop material 113 and the etch-stop material 123. For example, in some embodiments, the bonding material 130 may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, would be a characteristic feature of the hybrid manufacturing as described herein. Using an etch-stop material at the interface between the IC structures 110 and 120 that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the IC structures 110 and 120 together. In addition, an etch-stop material at the interface between the IC structures 110 and 120 that includes include silicon, nitrogen, and carbon, where the atomic percentage of any of these materials may be at least 1%, may be advantageous in terms of improving etch-selectivity of this material with respect to the etch-stop materials 113, 123.

Although the etch-stop materials 113, 123 of FIG. 4 are not shown in FIGS. 1-3, any embodiments of the microelectronic assembly 100 as described with reference to FIGS. 1-3 may include any of the etch-stop materials 113, 123, in any suitable location, as described with reference to FIG. 4. Similarly, although some of the drawings after FIG. 4 illustrate the etch-stop materials 113, 123, any embodiments of the microelectronic assembly 100 as described with reference to these drawings may exclude one or both of the etch-stop materials 113, 123.

FIGS. 1-4 illustrate interconnects that may be included in the IC structures 110, 120 before these IC structures are bonded together. In some embodiments of hybrid manufacturing, the microelectronic assembly 100 may further include interconnects, such as conductive vias or conductive traces, provided in one or both of the IC structures 110, 120 after these IC structures have been bonded together. In the present disclosure, such interconnects are referred to as "after-bonding interconnects" and may include any combination of one or more after-bonding vias and/or after-bonding traces. Providing one or more after-bonding interconnects may provide significant advantages in terms of its ability to provide electrical connectivity between various components of the microelectronic assembly 100 and/or reduced resistance. Because of the reduced resistance, the after-bonding interconnects may be particularly suitable for routing power to various components of the microelectronic assembly 100, although they may also be used to route ground and/or signals to various components of the microelectronic assembly 100. Also because of the reduced resistance, the after-bonding interconnects may be referred to as "express interconnects" (e.g., an express via) because they may allow routing power, ground, and/or signals to various components of the microelectronic assembly 100 faster than what would be achieved with the interconnects 112 and 122 that were in the individual IC structures 110, 120 before they were bonded together.

Some embodiments of the microelectronic assembly 100 with after-bonding interconnects are shown in FIGS. 5-11. In particular, FIGS. 5-7 illustrate some embodiments of the microelectronic assembly 100 with an after-bonding via 140 formed from the top of the microelectronic assembly 100, FIGS. 8-10 illustrate some embodiments of the microelectronic assembly 100 with an after-bonding via 140 formed from the bottom of the microelectronic assembly 100, and FIG. 11 illustrate some embodiments of the microelectronic assembly 100 where an after-bonding via 140 extends through multiple pairs of IC structures 110 and 120 bonded together. While FIGS. 5-11 illustrate certain arrangements of various components of the IC structures 110 and 120, one or more of the after-bonding interconnects as described with reference to the after-bonding via 140 of FIGS. 5-11 may be provided in any embodiments of the microelectronic assembly 100 as described with reference to FIGS. 1-4. In other words, any embodiments described with reference to FIGS. 5-11 may be combined with any embodiments described with reference to FIGS. 1-4.

In various embodiments (e.g., for any embodiments of the microelectronic assembly 100 as described with reference to FIGS. 5-11), such after-bonding interconnects may include at least an electrically conductive fill material and, optionally, a liner material. In some embodiments, one characteristic feature of the hybrid bonding of the IC structures 110 and 120 may be that a material composition of the electrically conductive fill material of the after-bonding interconnects may be different from a material composition of the electrically conductive fill material 118 and/or a material composition of the electrically conductive fill material 128. Differences in material compositions of the electrically conductive fill materials 118 and 128, described above, are applicable to differences in material compositions of the electrically conductive fill materials of the after-bonding interconnects and the electrically conductive fill materials 118 and/or 128, and, therefore, in the interests of brevity, are not repeated. In some embodiments, another characteristic feature of the hybrid bonding of the IC structures 110 and 120 may be that a material composition of the liner of the after-bonding interconnects may be different from a material composition of the liner 119 and/or a material composition of the liner 129. Differences in material compositions of the liners 119 and 129, described above, are applicable to differences in material compositions of the liners of the after-bonding interconnects and the liners 119 and/or 129, and, therefore, in the interests of brevity, are not repeated.

FIGS. 5-11 illustrate some embodiments of the microelectronic assembly 100 with an after-bonding via 140 formed from the top, from the bottom, or extending through multiple bonded pairs of the microelectronic assembly 100 for different bonding configurations. For any of the embodiments of FIGS. 5-11 (e.g., irrespective of whether f2f, f2b, or b2b bonding is used), the after-bonding via 140 extending from the top or from the bottom of the microelectronic assembly 100 may stop at (i.e., may have a bottom that interfaces with) any of 1) an insulating material (e.g., the insulating material 114 or the insulating material 124), 2) any of the etch-stop materials that may be present in the microelectronic assembly 100 (e.g., any of the etch-stop materials 113, 123), 3) the bonding material 130 or the bonding interface between the different IC structures bonded together, and/or 4) any portions of the interconnects 112, 122 or other components of the IC structures 110, 120 (e.g., the device circuitry 116, 126). In some embodiments, the location/depth of the bottom of the after-bonding via 140 extending from the top or from the bottom of the microelectronic assembly 100 may be based on a particular etch process used to form the after-bonding via 140. For example, if an opening for the after-bonding via 140 is formed using a selective etch process with etchants that remove the insulating materials 114, 124, as well as the etch-stop material 123, but do not remove, e.g., the etch-stop material 113, then the after-bonding via 140 may have a bottom aligned with the top of the etch-stop material 113. In another example, if an opening for the after-bonding via 140 is formed using a selective etch process with etchants that remove the insulating materials 114, 124, as well as the etch-stop material 123, but do not remove the bonding material 130, then the after-bonding via 140 may have a bottom aligned with the top of the bonding material 130. To ensure this, respective materials are to be selected as being sufficiently etch-selective, where, as known in the art, two materials are described as being "sufficiently etch-selective" if etchants used to etch one material do not substantially etch the other material, and possibly vice versa. In other embodiments, some materials of the microelectronic assembly 100 may be sufficiently etch-selective with respect to one another and the after-bonding via 140 may still extend through them, which may be realized by using different etchants to form the opening for the after-bonding via 140 through different materials of the microelectronic assembly 100. In other embodiments, the location/depth of the bottom of the after-bonding via 140 may be based on the time of the etch, where, generally, the longer is the time of the etch, the deeper is the opening for the after-bonding via 140. In context of the embodiments of FIGS. 8-10 where the after-bonding via 140 is formed from the bottom of the microelectronic assembly 100, the bottom of the after-bonding via 140 refers to the end of the after-bonding via 140 that is opposite the bottom of the microelectronic assembly 100 shown in FIGS. 8-10.

FIGS. 5-7 illustrate some embodiments of the microelectronic assembly 100 with an after-bonding via 140 formed from the top of the microelectronic assembly 100 for, respectively, f2f, f2b, and b2b bonding configurations.

FIGS. 5A-5D illustrate cross-sectional side views of a microelectronic assembly 100 that is an f2f-bonded assembly with an after-bonding via 140 formed from the top, in accordance with some embodiments. The microelectronic assembly 100 shown in FIGS. 5A-5D is similar to that shown in FIG. 1, except that it further includes the after-bonding via 140 formed from the top of the microelectronic assembly 100. For the embodiments of FIGS. 5A-5D, the after-bonding via 140 may be referred to as a "top f2f after-bonding via 140."

For the f2f embodiments shown in FIG. 5, the "top" of the microelectronic assembly 100 is considered to be the backside 134-1 of the IC structure 120, while the "bottom" of the microelectronic assembly 100 is considered to be the backside 134-1 of the IC structure 110. Different ones of FIGS. 5A-5D illustrate embodiments of the microelectronic assembly 100 with the top f2f after-bonding vias 140 of different depths.

Figure 5A:
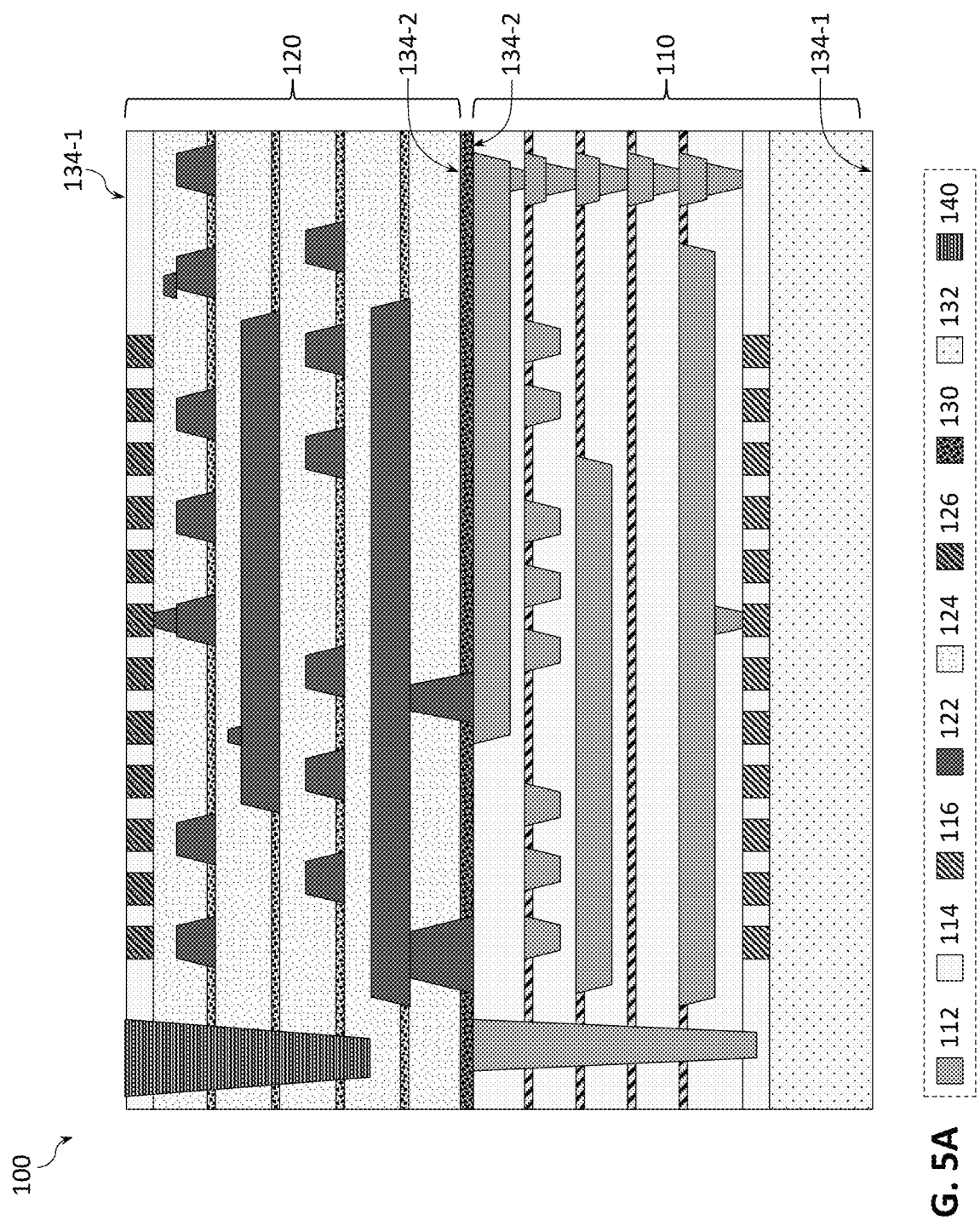
FIGS. 5A-5D illustrate cross-sectional side views of a microelectronic assembly that is an f2f-bonded assembly with an after-bonding via formed from the top, in accordance with some embodiments.

FIG. 5A illustrates an embodiment where the top f2f after-bonding via 140 extends from the top of the microelectronic assembly 100 towards the bottom of the microelectronic assembly 100 and stops before reaching the bonding material 130. Thus, FIG. 5A illustrates that the top f2f after-bonding via 140 may be such that it is a blind via in the top IC structure, e.g., in the IC structure 120. Although not specifically shown in the cross-section of FIG. 5A, the top f2f after-bonding via 140 may be electrically coupled to one or more components of the IC structure 120 (e.g., to one or more of the interconnects 122, devices of the device circuitry 126, etc.) to provide power, ground, and/or signal to these components. Furthermore, although also not specifically shown in the cross-section of FIG. 5A, in some embodiments, the top f2f after-bonding via 140 that is a blind via in the IC structure 120, e.g., as shown in FIG. 5A, may be electrically coupled to one or more components of the IC structure 110 (e.g., to one or more of the interconnects 112, devices of the device circuitry 116, etc.) to provide power, ground, and/or signal to these components of the IC structure 110, which may, e.g., be done by the top f2f after-bonding via 140 being electrically coupled to one or more interconnects 122, and one of more of those interconnects 122 being electrically coupled to one or more components of the IC structure 110.

Figure 5B:
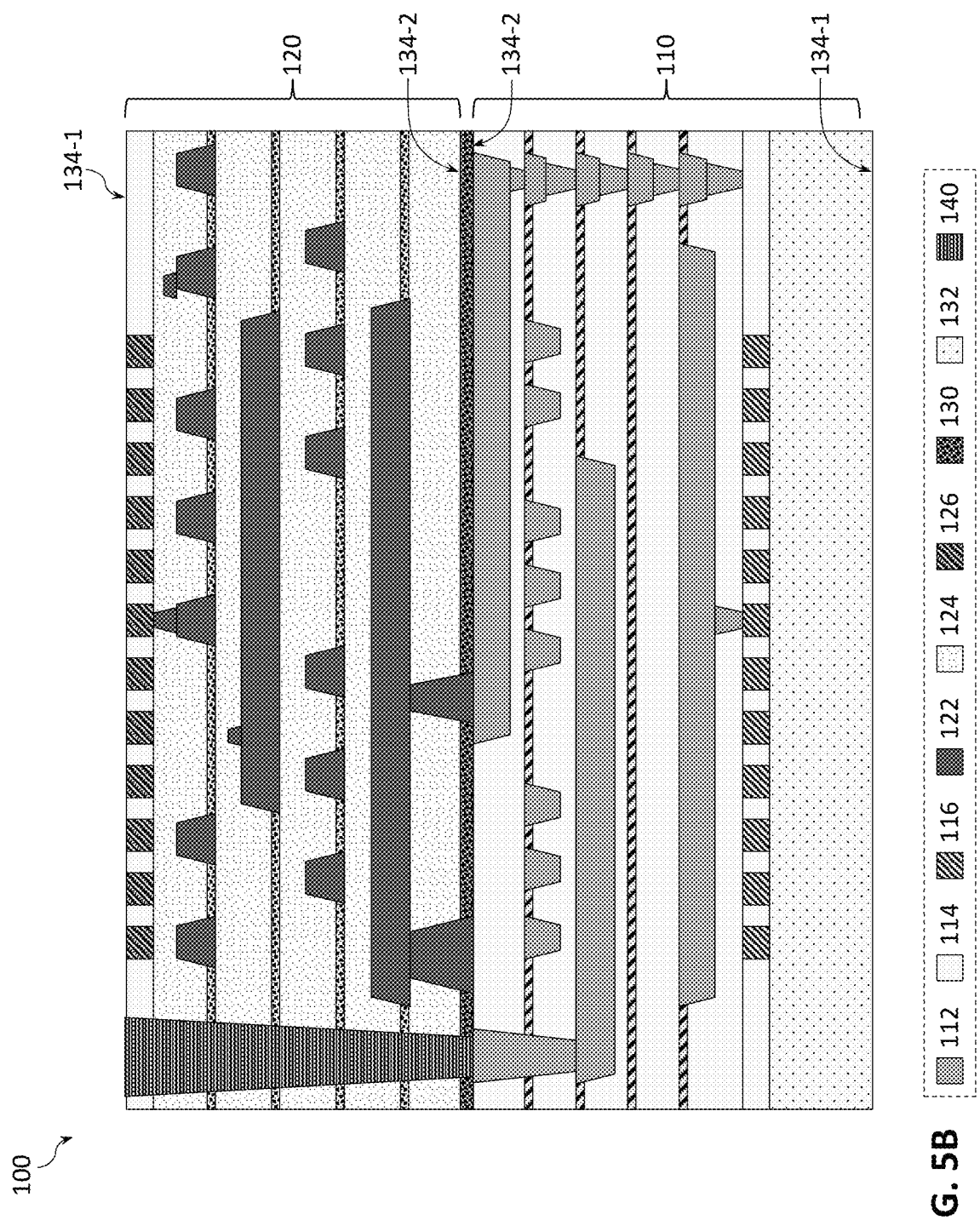

FIG. 5B illustrates an embodiment where the top f2f after-bonding via 140 extends from the top of the microelectronic assembly 100 towards the bottom of the microelectronic assembly 100 and stops when it encounters the interconnect 112. Such top f2f after-bonding via 140 may, e.g., be formed by forming an opening for the via using an etch that is selective to the materials of the interconnect 112, thus self-aligning the bottom of the top f2f after-bonding via 140 with the interconnect 112. In this manner, the top f2f after-bonding via 140 may be electrically coupled to the interconnect 112. Although not specifically shown in the cross-section of FIG. 5B, such top f2f after-bonding via 140 may be electrically coupled to one or more components of the IC structure 120 to provide power, ground, and/or signal to these components of the IC structure 120. By virtue of the top f2f after-bonding via 140 extending all through the IC structure 120 and making an electrical connection with the interconnect 112 of the IC structure 110, the top f2f after-bonding via 140 may further be electrically coupled to one or more components of the IC structure 110 that are coupled to said interconnect 112, to provide power, ground, and/or signal to these components of the IC structure 110.

Figure 5C:
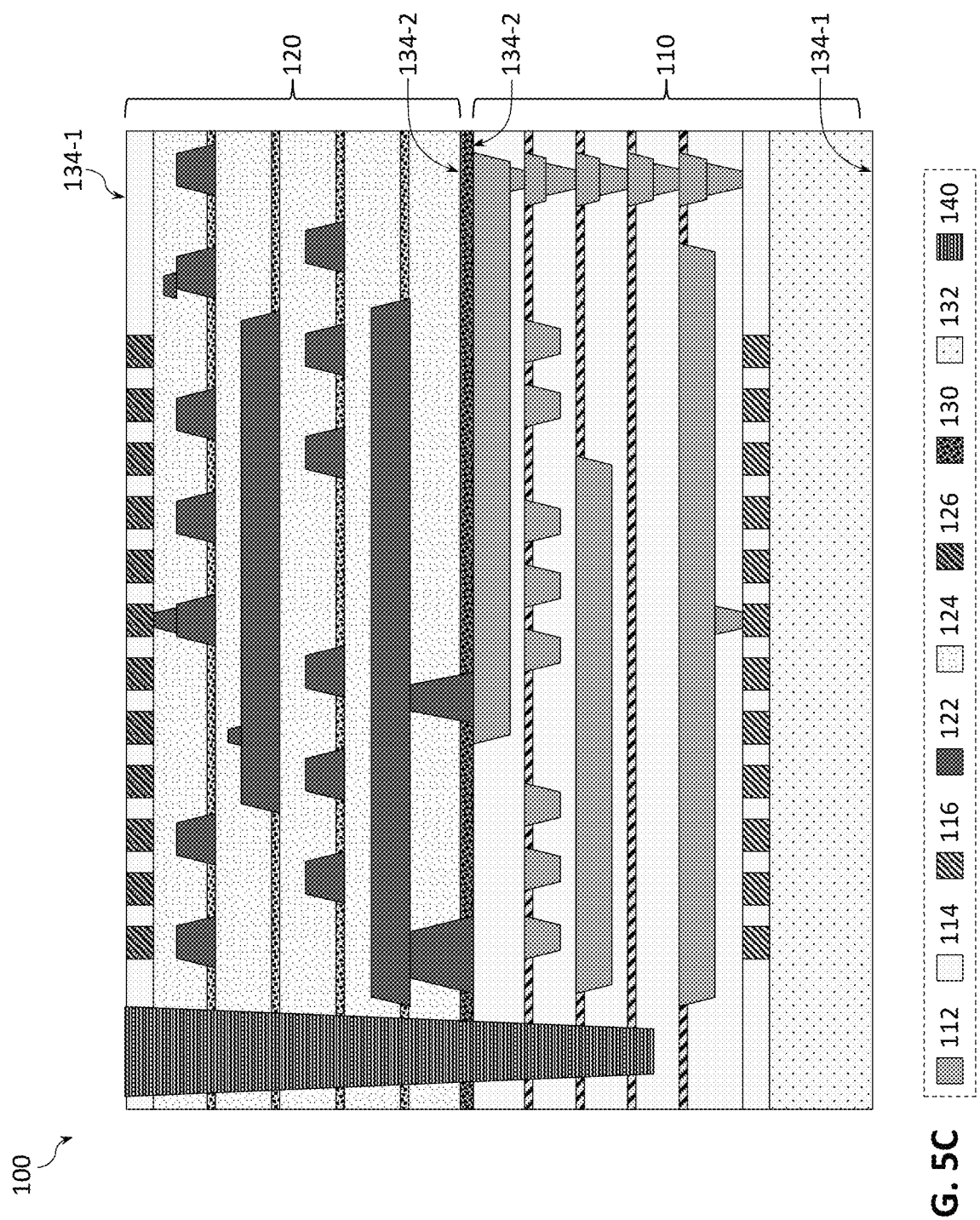

FIG. 5C illustrates an embodiment where the top f2f after-bonding via 140 extends from the top of the microelectronic assembly 100 towards the bottom of the microelectronic assembly 100, extends through all of the top IC structure of the microelectronic assembly 100 (e.g., the IC structure 120), the bonding material 130, and into the bottom IC structure of the microelectronic assembly 100 (e.g., the IC structure 110), and stops before reaching the bottom of the microelectronic assembly 100. Thus, FIG. 5C illustrates that the top f2f after-bonding via 140 may be such that it is a blind via extending through the top IC structure and into the bottom IC structure, e.g., from the IC structure 120 into the IC structure 110. Although not specifically shown in the cross-section of FIG. 5C, such top f2f after-bonding via 140 may be electrically coupled to one or more components of the IC structure 120 to provide power, ground, and/or signal to these components. Furthermore, although also not specifically shown in the cross-section of FIG. 5C, the top f2f after-bonding via 140 that extends all through the IC structure 120 and forms a blind via in the IC structure 110 as shown in FIG. 5C may further be electrically coupled to one or more components of the IC structure 110 to provide power, ground, and/or signal to these components of the IC structure 110.

Figure 5D:
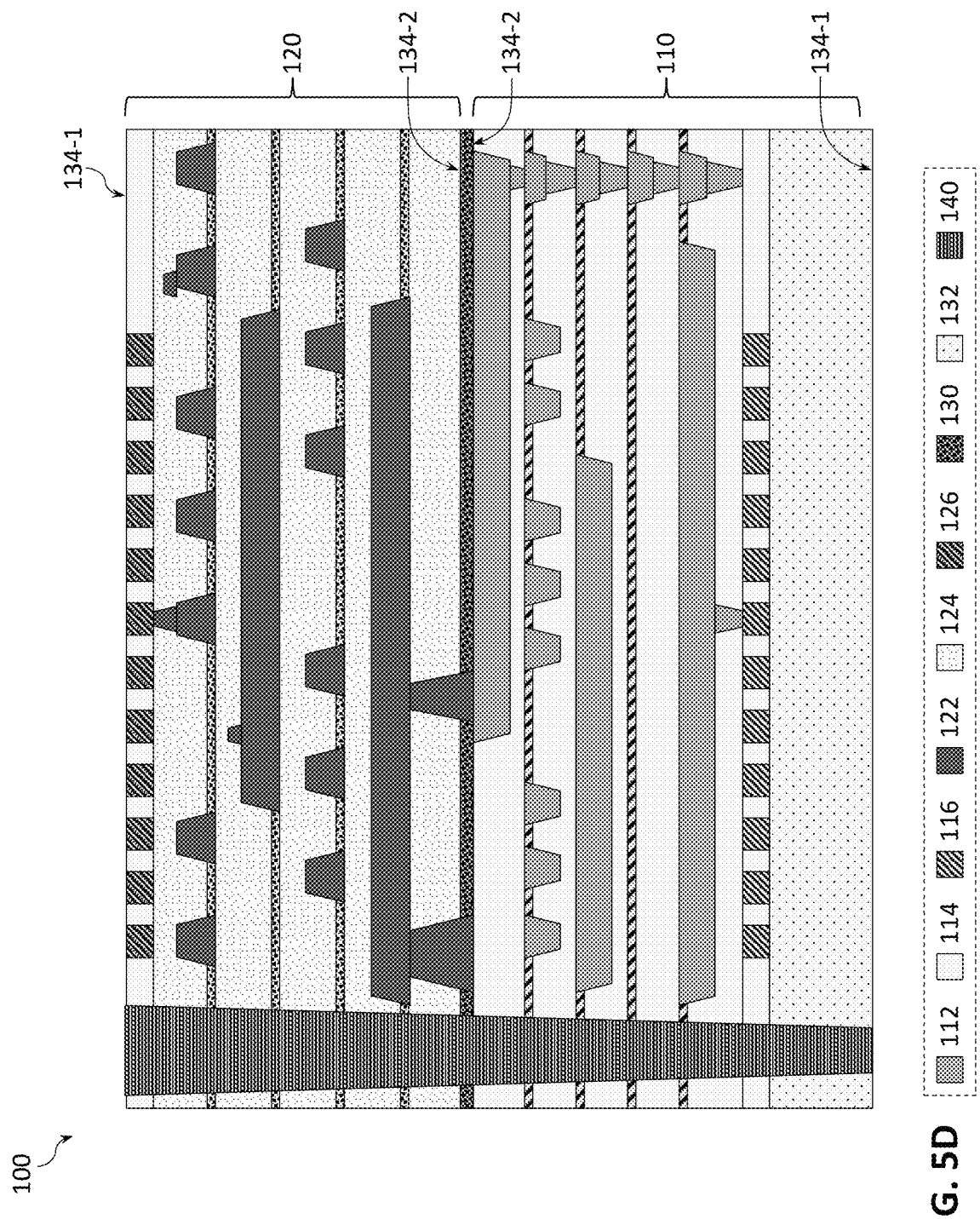

FIG. 5D illustrates an embodiment where the top f2f after-bonding via 140 extends from the top of the microelectronic assembly 100 all the way to the bottom of the microelectronic assembly 100. In this manner, the top f2f after-bonding via 140 is a TSV, extending between the opposing faces of the microelectronic assembly 100. An electrical connection may then be made to the top f2f after-bonding via 140 from one or both of the top and the bottom of the microelectronic assembly 100. Although not specifically shown in the cross-section of FIG. 5D, the top f2f after-bonding via 140 that is a TSV in the microelectronic assembly 100 may be electrically coupled to one or more components of the IC structure 120 to provide power, ground, and/or signal to these components of the IC structure 120 and/or may be electrically coupled to one or more components of the IC structure 110 to provide power, ground, and/or signal to these components of the IC structure 110.

In some embodiments, one characteristic feature that is specific to the top f2f after-bonding via 140 extending from the top of the f2f-bonded microelectronic assembly as shown in FIGS. 5A-5D may be that the cross-sectional trapezoidal shape of the top f2f after-bonding via 140 is inverted with respect to the trapezoidal shapes of the frontside interconnects 122. This is illustrated in FIGS. 5A-5D with the short side of the trapezoidal cross-section of the top f2f after-bonding via 140 being closer to the bottom of the microelectronic assembly 100, than its long side, and with the long sides of the trapezoidal cross-sections of the frontside interconnects 122 being closer to the bottom of the microelectronic assembly 100 than their short sides. In some embodiments, another characteristic feature that is specific to the top f2f after-bonding via 140 extending from the top of the f2f-bonded microelectronic assembly as shown in FIGS. 5A-5D may be that the cross-sectional trapezoidal shape of the top f2f after-bonding via 140 is oriented in the same manner (i.e., not inverted) as the trapezoidal shapes of the frontside interconnects 112. This is illustrated in FIGS. 5A-5D with the short side of the trapezoidal cross-section of the top f2f after-bonding via 140 being closer to the bottom of the microelectronic assembly 100, than its long side, and with the short sides of the trapezoidal cross-sections of the frontside interconnects 112 being closer to the bottom of the microelectronic assembly 100 than their long sides. Although not specifically shown in FIGS. 5A-5D, if the IC structure 120 included backside interconnects 122, then, in some embodiments, one characteristic feature that is specific to the top f2f after-bonding via 140 extending from the top of the f2f-bonded microelectronic assembly as shown in FIGS. 5A-5D could be that the cross-sectional trapezoidal shape of the top f2f after-bonding via 140 is oriented in the same manner (i.e., not inverted) as the trapezoidal shapes of the backside interconnects 122. This would be illustrated in FIGS. 5A-5D with the short side of the trapezoidal cross-section of the top f2f after-bonding via 140 being closer to the bottom of the microelectronic assembly 100, than its long side, and with the short sides of the trapezoidal cross-sections of the backside interconnects 122 being closer to the bottom of the microelectronic assembly 100 than their long sides. Furthermore, although not specifically shown in FIGS. 5A-5D, if the IC structure 110 included backside interconnects 112, then, in some embodiments, one characteristic feature that is specific to the top f2f after-bonding via 140 extending from the top of the f2f-bonded microelectronic assembly as shown in FIGS. 5A-5D could be that the cross-sectional trapezoidal shape of the top f2f after-bonding via 140 is inverted with respect to the trapezoidal shapes of the backside interconnects 112. This would be illustrated in FIGS. 5A-5D with the short side of the trapezoidal cross-section of the top f2f after-bonding via 140 being closer to the bottom of the microelectronic assembly 100, than its long side, and with the long sides of the trapezoidal cross-sections of the backside interconnects 112 being closer to the bottom of the microelectronic assembly 100 than their short sides.

FIGS. 6A-6D illustrate cross-sectional side views of a microelectronic assembly 100 that is an f2b-bonded assembly with an after-bonding via 140 formed from the top, in accordance with some embodiments. The microelectronic assembly 100 shown in FIGS. 6A-6D is similar to that shown in FIG. 2, except that it further includes the after-bonding via 140 formed from the top of the microelectronic assembly 100. For the embodiments of FIGS. 6A-6D, the after-bonding via 140 may be referred to as a "top f2b after-bonding via 140."

For the f2b embodiments shown in FIG. 6, the "top" of the microelectronic assembly 100 is considered to be the frontside 134-2 of the IC structure 120, while the "bottom" of the microelectronic assembly 100 is considered to be the backside 134-1 of the IC structure 110. Different ones of FIGS. 6A-6D illustrate embodiments of the microelectronic assembly 100 with the top f2b after-bonding via 140 of different depths.

Figure 6A:
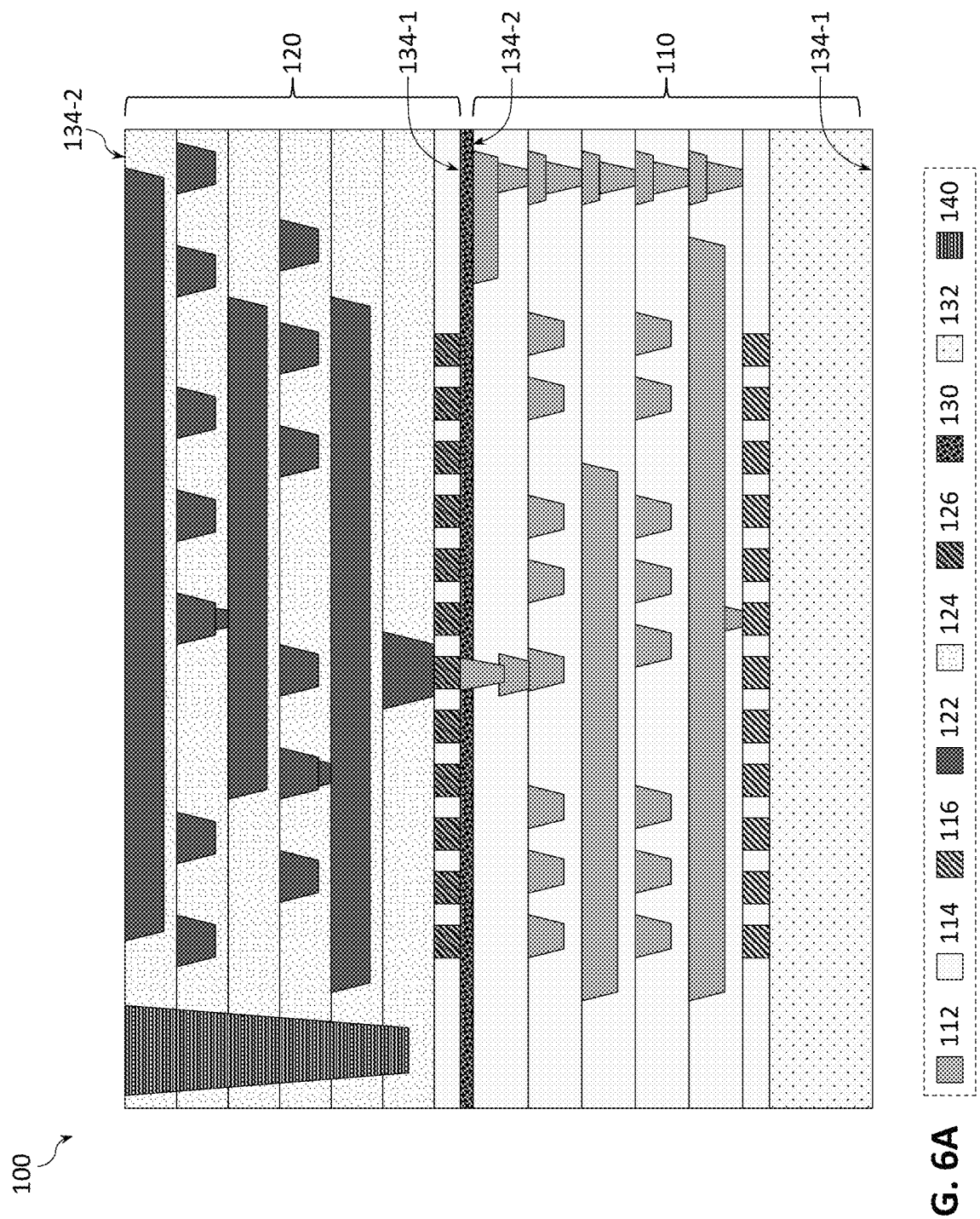
FIGS. 6A-6D illustrate cross-sectional side views of a microelectronic assembly that is an f2b-bonded assembly with an after-bonding via formed from the top, in accordance with some embodiments.

FIG. 6A illustrates an embodiment where the top f2b after-bonding via 140 extends from the top of the microelectronic assembly 100 towards the bottom of the microelectronic assembly 100 and stops before reaching the bonding material 130 (i.e., FIG. 6A is similar to FIG. 5A except that FIG. 6A illustrates the f2b bonding configuration). Thus, FIG. 6A illustrates that the top f2b after-bonding via 140 may be such that it is a blind via in the top IC structure, e.g., in the IC structure 120. Although not specifically shown in the cross-section of FIG. 6A, the top f2b after-bonding via 140 may be electrically coupled to one or more components of the IC structure 120 to provide power, ground, and/or signal to these components. Furthermore, although also not specifically shown in the cross-section of FIG. 6A, in some embodiments, the top f2b after-bonding via 140 that is a blind via in the IC structure 120, e.g., as shown in FIG. 6A, may be electrically coupled to one or more components of the IC structure 110 to provide power, ground, and/or signal to these components of the IC structure 110, which may, e.g., be done by the top f2b after-bonding via 140 being electrically coupled to one or more interconnects 122, and one of more of those interconnects 122 being electrically coupled to one or more components of the IC structure 110.

Figure 6B:
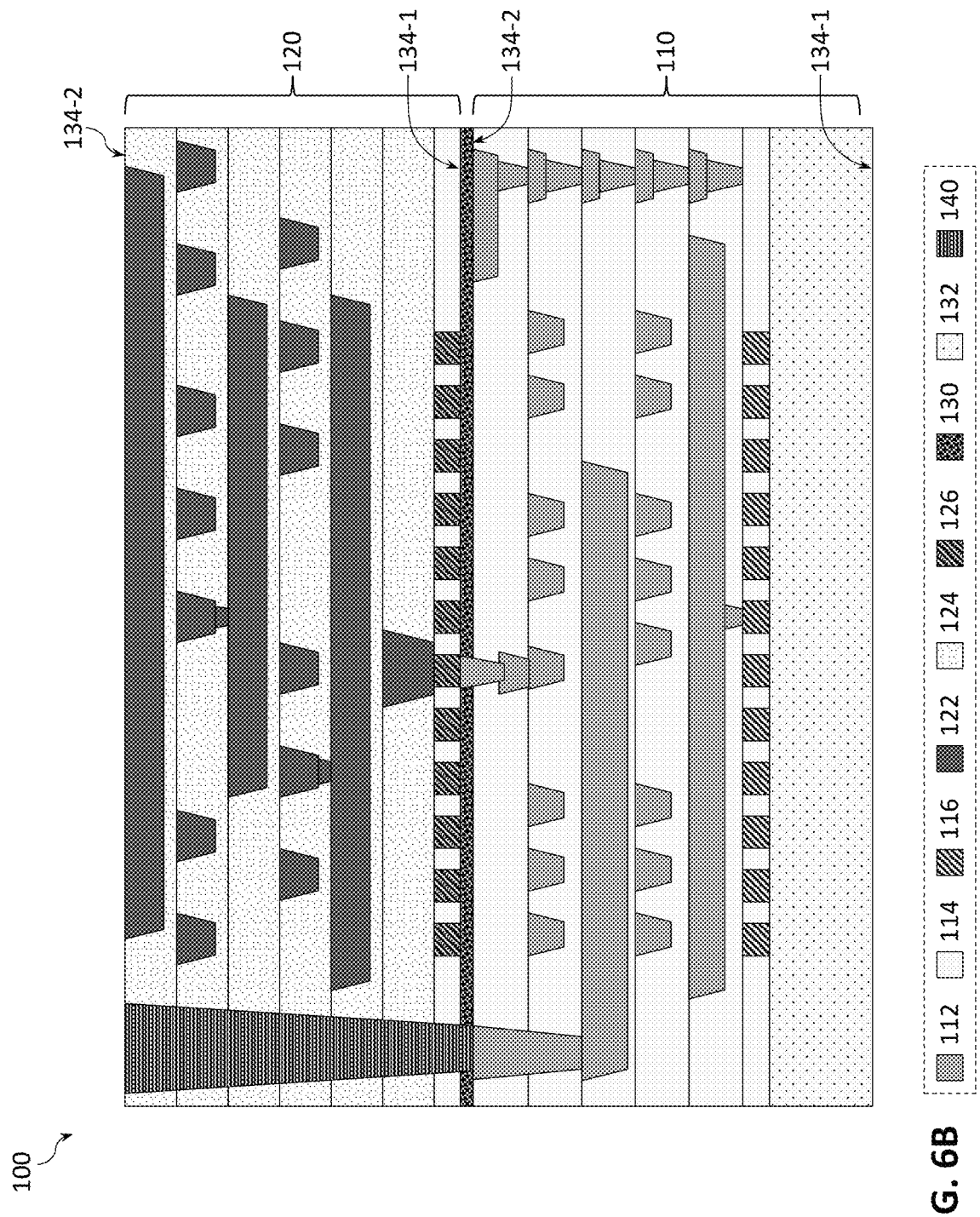

FIG. 6B illustrates an embodiment where the top f2b after-bonding via 140 extends from the top of the microelectronic assembly 100 towards the bottom of the microelectronic assembly 100 and stops when it encounters the interconnect 112 (i.e., FIG. 6B is similar to FIG. 5B except that FIG. 6B illustrates the f2b bonding configuration). Such top f2b after-bonding via 140 may, e.g., be formed by forming an opening for the via using an etch that is selective to the materials of the interconnect 112, thus self-aligning the bottom of the top f2b after-bonding via 140 with the interconnect 112. In this manner, the top f2b after-bonding via 140 may be electrically coupled to the interconnect 112. Although not specifically shown in the cross-section of FIG. 6B, such top f2b after-bonding via 140 may be electrically coupled to one or more components of the IC structure 120 to provide power, ground, and/or signal to these components of the IC structure 120. By virtue of the top f2b after-bonding via 140 extending all through the IC structure 120 and making an electrical connection with the interconnect 112 of the IC structure 110, the top f2b after-bonding via 140 may further be electrically coupled to one or more components of the IC structure 110 that are coupled to said interconnect 112, to provide power, ground, and/or signal to these components of the IC structure 110.

Figure 6C:
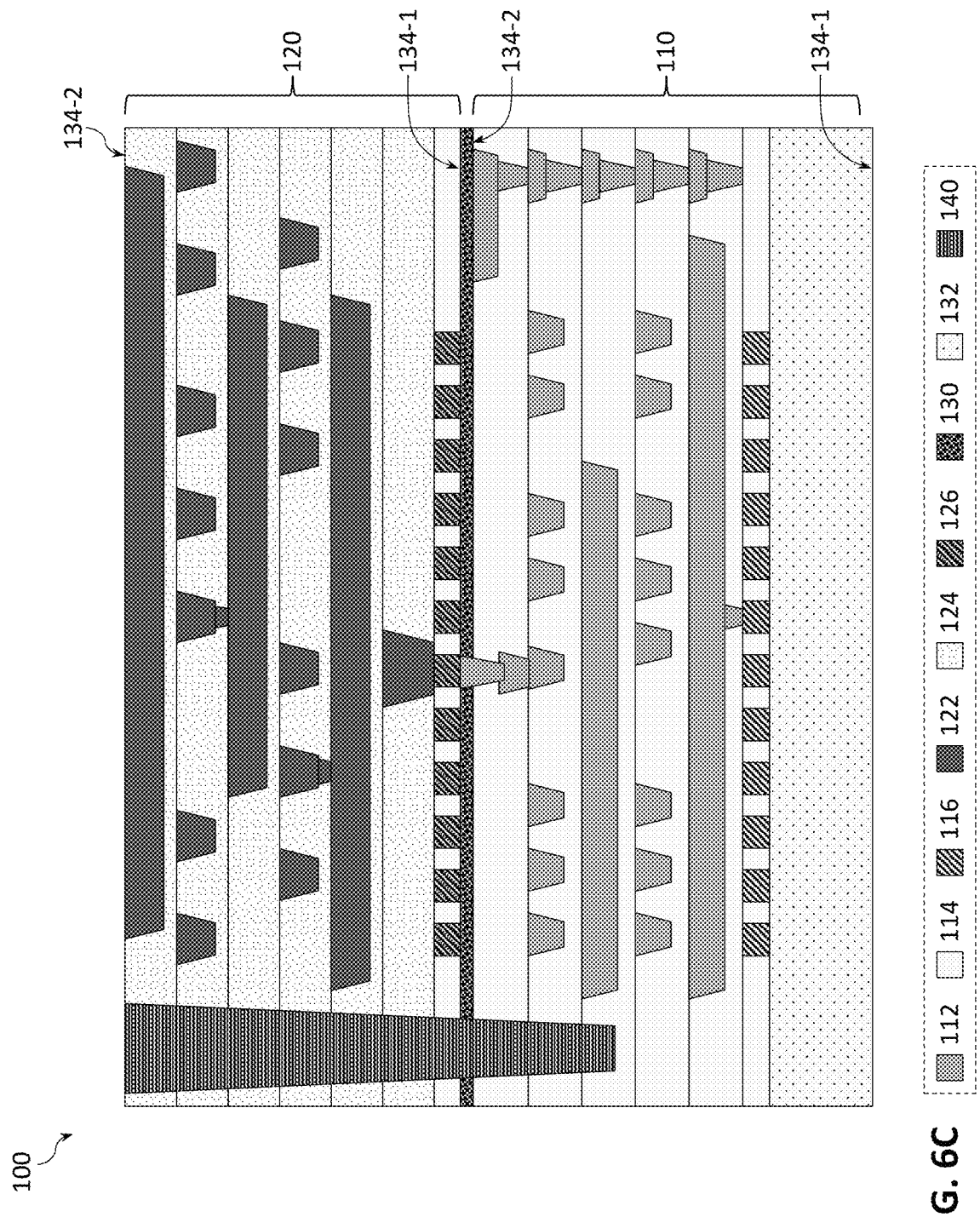

FIG. 6C illustrates an embodiment where the top f2b after-bonding via 140 extends from the top of the microelectronic assembly 100 towards the bottom of the microelectronic assembly 100, extends through all of the top IC structure of the microelectronic assembly 100 (e.g., the IC structure 120), the bonding material 130, and into the bottom IC structure of the microelectronic assembly 100 (e.g., the IC structure 110), and stops before reaching the bottom of the microelectronic assembly 100 (i.e., FIG. 6C is similar to FIG. 5C except that FIG. 6C illustrates the f2b bonding configuration). Thus, FIG. 6C illustrates that the top f2b after-bonding via 140 may be such that it is a blind via extending through the top IC structure and into the bottom IC structure, e.g., from the IC structure 120 into the IC structure 110. Although not specifically shown in the cross-section of FIG. 6C, such top f2b after-bonding via 140 may be electrically coupled to one or more components of the IC structure 120 to provide power, ground, and/or signal to these components. Furthermore, although also not specifically shown in the cross-section of FIG. 6C, the top f2b after-bonding via 140 that extends all through the IC structure 120 and forms a blind via in the IC structure 110 as shown in FIG. 6C may further be electrically coupled to one or more components of the IC structure 110 to provide power, ground, and/or signal to these components of the IC structure 110.

Figure 6D:
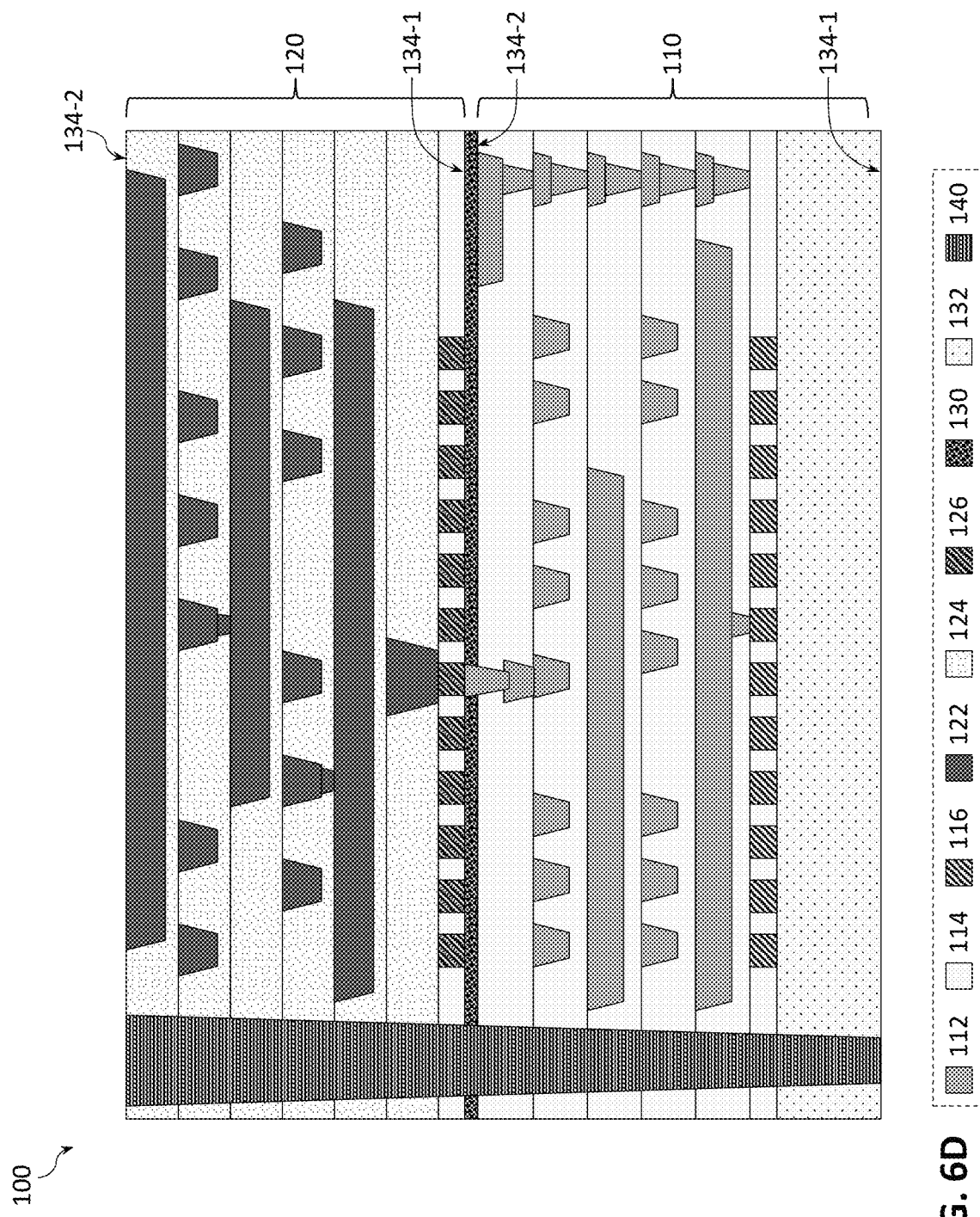

FIG. 6D illustrates an embodiment where the top f2b after-bonding via 140 extends from the top of the microelectronic assembly 100 all the way to the bottom of the microelectronic assembly 100 (i.e., FIG. 6D is similar to FIG. 5D except that FIG. 6D illustrates the f2b bonding configuration). In this manner, the top f2b after-bonding via 140 is a TSV, extending between the opposing faces of the microelectronic assembly 100. An electrical connection may then be made to the top f2b after-bonding via 140 from one or both of the top and the bottom of the microelectronic assembly 100. Although not specifically shown in the cross-section of FIG. 6D, the top f2b after-bonding via 140 that is a TSV in the microelectronic assembly 100 may be electrically coupled to one or more components of the IC structure 120 to provide power, ground, and/or signal to these components of the IC structure 120 and/or may be electrically coupled to one or more components of the IC structure 110 to provide power, ground, and/or signal to these components of the IC structure 110.

In some embodiments, one characteristic feature that is specific to the top f2b after-bonding via 140 extending from the top of the f2b-bonded microelectronic assembly as shown in FIGS. 6A-6D may be that the cross-sectional trapezoidal shape of the top f2b after-bonding via 140 is oriented in the same manner (i.e., not inverted) as the trapezoidal shapes of the frontside interconnects 122. This is illustrated in FIGS. 6A-6D with the short side of the trapezoidal cross-section of the top f2b after-bonding via 140 being closer to the bottom of the microelectronic assembly 100, than its long side, and with the short sides of the trapezoidal cross-sections of the frontside interconnects 122 being closer to the bottom of the microelectronic assembly 100 than their long sides. In some embodiments, another characteristic feature that is specific to the top f2b after-bonding via 140 extending from the top of the f2f-bonded microelectronic assembly as shown in FIGS. 6A-6D may be that the cross-sectional trapezoidal shape of the top f2b after-bonding via 140 is also oriented in the same manner (i.e., not inverted) as the trapezoidal shapes of the frontside interconnects 112. This is illustrated in FIGS. 6A-6D with the short side of the trapezoidal cross-section of the top f2b after-bonding via 140 being closer to the bottom of the microelectronic assembly 100, than its long side, and with the short sides of the trapezoidal cross-sections of the frontside interconnects 112 being closer to the bottom of the microelectronic assembly 100 than their long sides. Although not specifically shown in FIGS. 6A-6D, if the IC structure 120 included backside interconnects 122, then, in some embodiments, one characteristic feature that is specific to the top f2b after-bonding via 140 extending from the top of the f2f-bonded microelectronic assembly as shown in FIGS. 6A-6D could be that the cross-sectional trapezoidal shape of the top f2b after-bonding via 140 is inverted with respect to the trapezoidal shapes of the backside interconnects 122. This would be illustrated in FIGS. 6A-6D with the short side of the trapezoidal cross-section of the top f2b after-bonding via 140 being closer to the bottom of the microelectronic assembly 100, than its long side, and with the long sides of the trapezoidal cross-sections of the backside interconnects 122 being closer to the bottom of the microelectronic assembly 100 than their short sides. Furthermore, although not specifically shown in FIGS. 6A-6D, if the IC structure 110 included backside interconnects 112, then, in some embodiments, one characteristic feature that is specific to the top f2b after-bonding via 140 extending from the top of the f2f-bonded microelectronic assembly as shown in FIGS. 6A-6D could be that the cross-sectional trapezoidal shape of the top f2b after-bonding via 140 is also inverted with respect to the trapezoidal shapes of the backside interconnects 112. This would be illustrated in FIGS. 6A-6D with the short side of the trapezoidal cross-section of the top f2b after-bonding via 140 being closer to the bottom of the microelectronic assembly 100, than its long side, and with the long sides of the trapezoidal cross-sections of the backside interconnects 112 being closer to the bottom of the microelectronic assembly 100 than their short sides.

FIGS. 7A-7E illustrate cross-sectional side views of a microelectronic assembly 100 that is a b2b-bonded assembly with an after-bonding via 140 formed from the top, in accordance with some embodiments. The microelectronic assembly 100 shown in FIGS. 7A-7E is similar to that shown in FIG. 3, except that it further includes the after-bonding via 140 formed from the top of the microelectronic assembly 100. For the embodiments of FIGS. 7A-7E, the after-bonding via 140 may be referred to as a "top b2b after-bonding via 140."

For the b2b embodiments shown in FIG. 7, the "top" of the microelectronic assembly 100 is considered to be the frontside 134-2 of the IC structure 120, while the "bottom" of the microelectronic assembly 100 is considered to be the frontside 134-1 of the IC structure 110. Different ones of FIGS. 7A-7E illustrate embodiments of the microelectronic assembly 100 with the top b2b after-bonding via 140 of different depths.

Figure 7A:
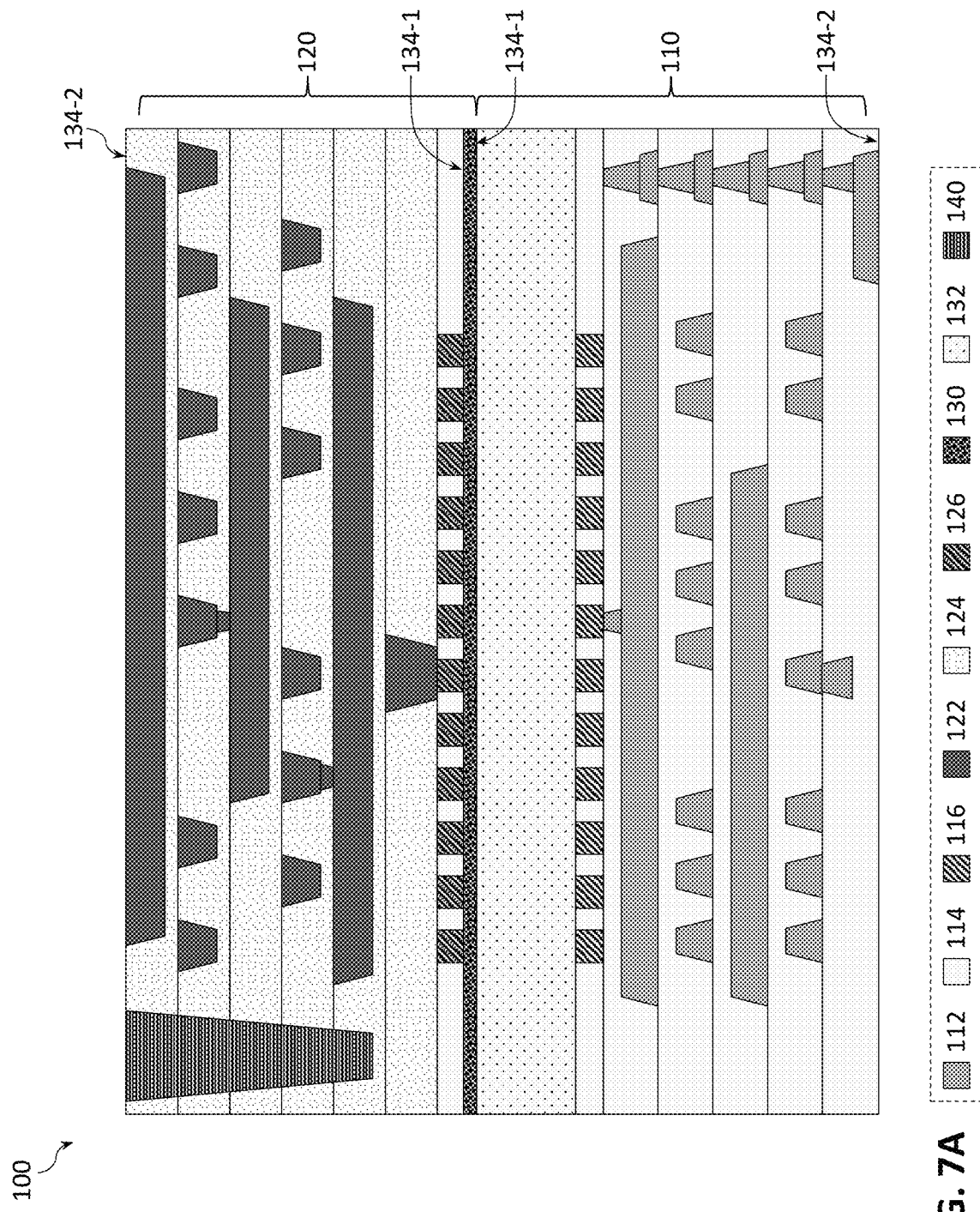
FIGS. 7A-7E illustrate cross-sectional side views of a microelectronic assembly that is an b2b-bonded assembly with an after-bonding via formed from the top, in accordance with some embodiments.

FIG. 7A illustrates an embodiment where the top b2b after-bonding via 140 extends from the top of the microelectronic assembly 100 towards the bottom of the microelectronic assembly 100 and stops before reaching the bonding material 130 (i.e., FIG. 7A is similar to FIGS. 5A and 6A except that FIG. 7A illustrates the b2b bonding configuration). Thus, FIG. 7A illustrates that the top b2b after-bonding via 140 may be such that it is a blind via in the top IC structure, e.g., in the IC structure 120. Although not specifically shown in the cross-section of FIG. 7A, the top b2b after-bonding via 140 may be electrically coupled to one or more components of the IC structure 120 to provide power, ground, and/or signal to these components. Furthermore, although also not specifically shown in the cross-section of FIG. 7A, in some embodiments, the top b2b after-bonding via 140 that is a blind via in the IC structure 120, e.g., as shown in FIG. 7A, may be electrically coupled to one or more components of the IC structure 110 to provide power, ground, and/or signal to these components of the IC structure 110, which may, e.g., be done by the top b2b after-bonding via 140 being electrically coupled to one or more interconnects 122, and one of more of those interconnects 122 being electrically coupled to one or more components of the IC structure 110.

Figure 7B:
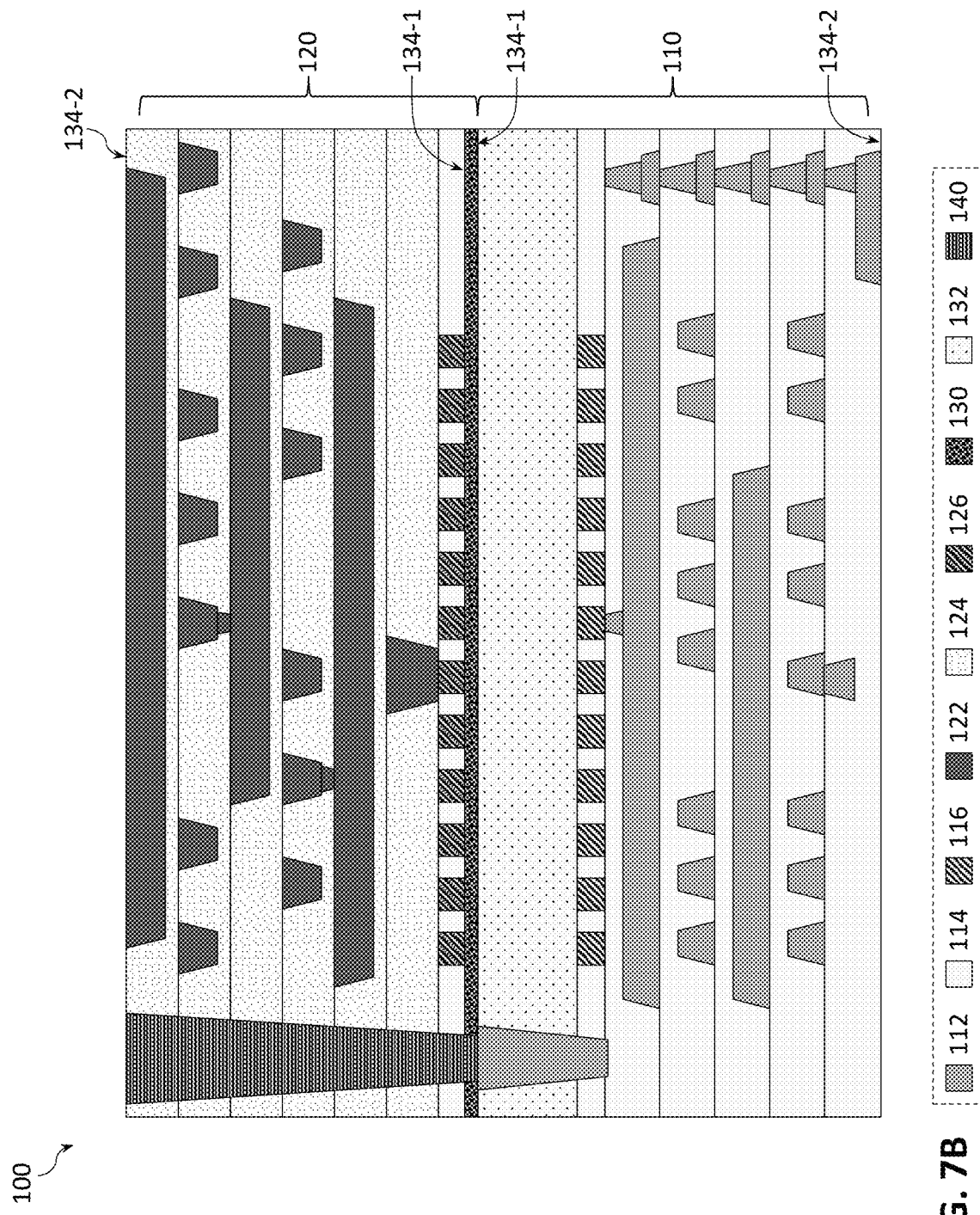

FIG. 7B illustrates an embodiment where the top b2b after-bonding via 140 extends from the top of the microelectronic assembly 100 towards the bottom of the microelectronic assembly 100 and stops when it encounters the backside interconnect 112 (i.e., FIG. 7B is similar to FIGS. 5B and 6B except that FIG. 7B illustrates the f2b bonding configuration and, therefore, in FIG. 7B the interconnect 112 is a backside interconnect while in FIGS. 5B and 6B the interconnect is a frontside interconnect). Such top b2b after-bonding via 140 may, e.g., be formed by forming an opening for the via using an etch that is selective to the materials of the backside interconnect 112, thus self-aligning the bottom of the top b2b after-bonding via 140 with the backside interconnect 112. In this manner, the top b2b after-bonding via 140 may be electrically coupled to the backside interconnect 112. Although not specifically shown in the cross-section of FIG. 7B, such top b2b after-bonding via 140 may be electrically coupled to one or more components of the IC structure 120 to provide power, ground, and/or signal to these components of the IC structure 120. By virtue of the top b2b after-bonding via 140 extending all through the IC structure 120 and making an electrical connection with the backside interconnect 112 of the IC structure 110, the top b2b after-bonding via 140 may further be electrically coupled to one or more components of the IC structure 110 that are coupled to said backside interconnect 112, to provide power, ground, and/or signal to these components of the IC structure 110.

Figure 7C:
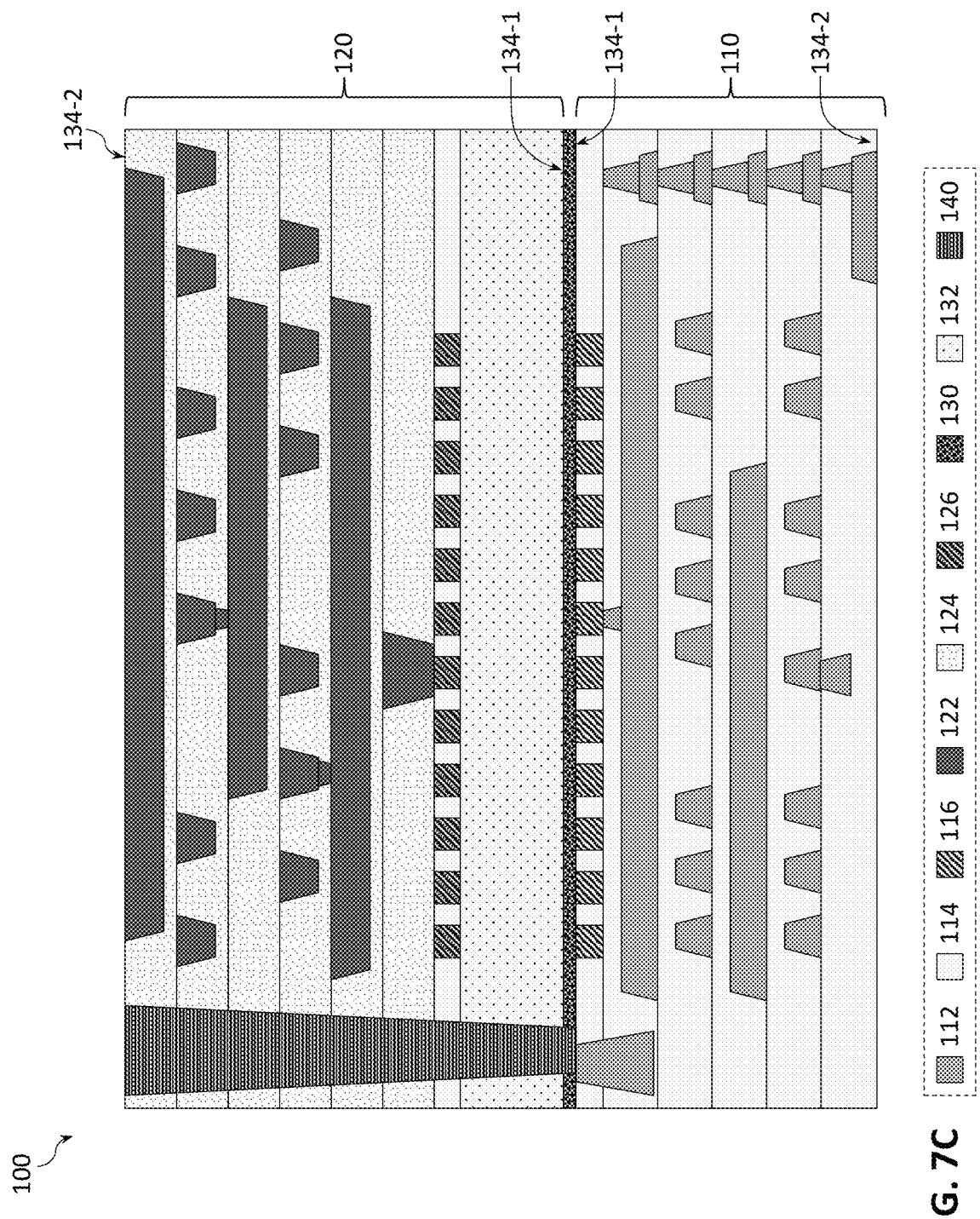

FIG. 7C illustrates an embodiment where the top b2b after-bonding via 140 extends from the top of the microelectronic assembly 100 towards the bottom of the microelectronic assembly 100 and stops when it encounters the frontside interconnect 112 (i.e., FIG. 7C is similar to FIG. 7B except that the bonding interface is at a different location and the interconnect 112 contacted by the top b2b after-bonding via 140 is a frontside interconnect). Such top b2b after-bonding via 140 may, e.g., be formed by forming an opening for the via using an etch that is selective to the materials of the frontside interconnect 112, thus self-aligning the bottom of the top b2b after-bonding via 140 with the frontside interconnect 112. In this manner, the top b2b after-bonding via 140 may be electrically coupled to the frontside interconnect 112. Although not specifically shown in the cross-section of FIG. 7C, such top b2b after-bonding via 140 may be electrically coupled to one or more components of the IC structure 120 to provide power, ground, and/or signal to these components of the IC structure 120. By virtue of the top b2b after-bonding via 140 extending all through the IC structure 120 and making an electrical connection with the frontside interconnect 112 of the IC structure 110, the top b2b after-bonding via 140 may further be electrically coupled to one or more components of the IC structure 110 that are coupled to said frontside interconnect 112, to provide power, ground, and/or signal to these components of the IC structure 110.

Figure 7D:
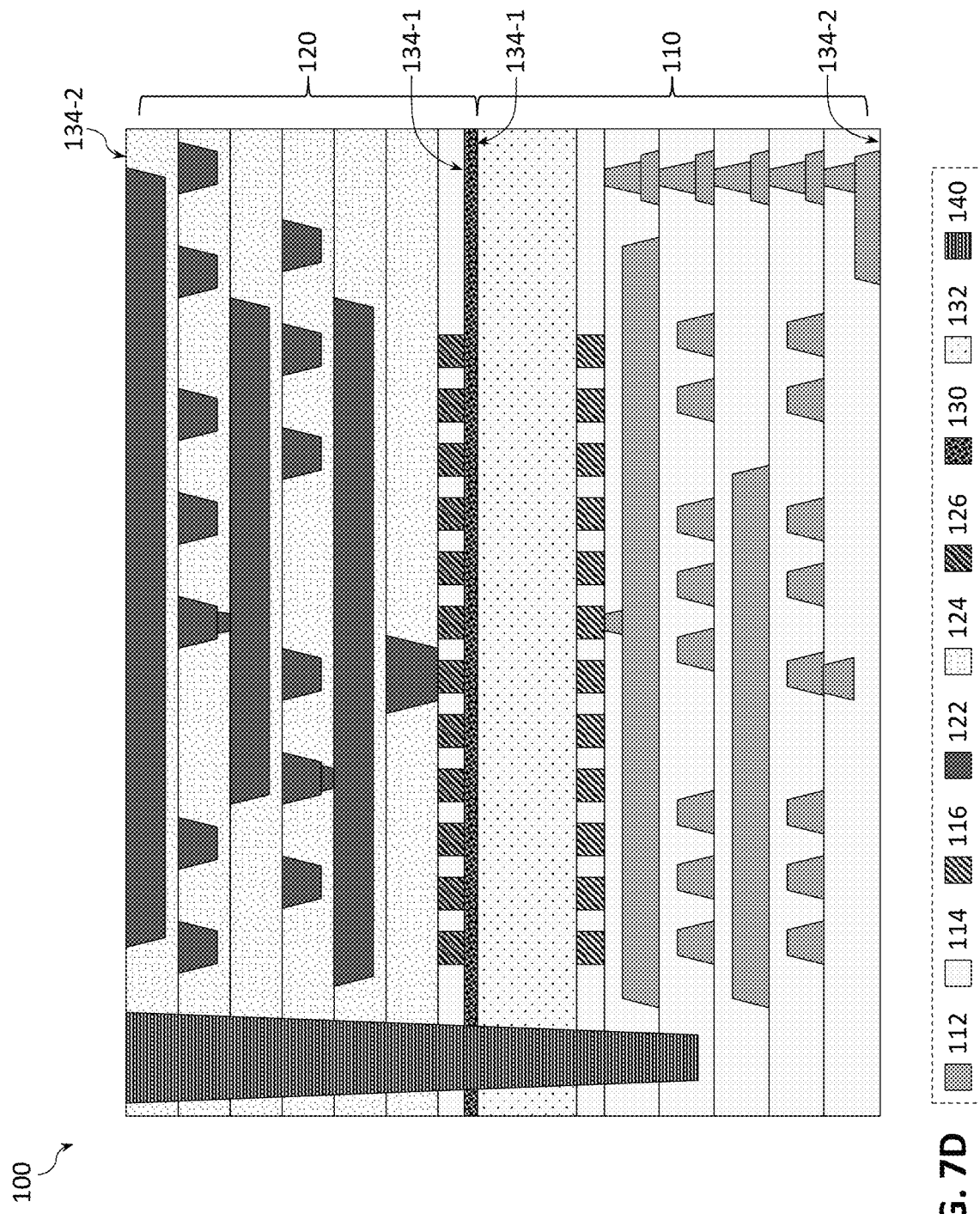

FIG. 7D illustrates an embodiment where the top b2b after-bonding via 140 extends from the top of the microelectronic assembly 100 towards the bottom of the microelectronic assembly 100, extends through all of the top IC structure of the microelectronic assembly 100 (e.g., the IC structure 120), the bonding material 130, and into the bottom IC structure of the microelectronic assembly 100 (e.g., the IC structure 110), and stops before reaching the bottom of the microelectronic assembly 100 (i.e., FIG. 7D is similar to FIGS. 5C and 6C except that FIG. 7D illustrates the f2b bonding configuration). Thus, FIG. 7D illustrates that the top b2b after-bonding via 140 may be such that it is a blind via extending through the top IC structure and into the bottom IC structure, e.g., from the IC structure 120 into the IC structure 110. Although not specifically shown in the cross-section of FIG. 7D, such top b2b after-bonding via 140 may be electrically coupled to one or more components of the IC structure 120 to provide power, ground, and/or signal to these components. Furthermore, although also not specifically shown in the cross-section of FIG. 7D, the top b2b after-bonding via 140 that extends all through the IC structure 120 and forms a blind via in the IC structure 110 as shown in FIG. 7D may further be electrically coupled to one or more components of the IC structure 110 to provide power, ground, and/or signal to these components of the IC structure 110.

Figure 7E:
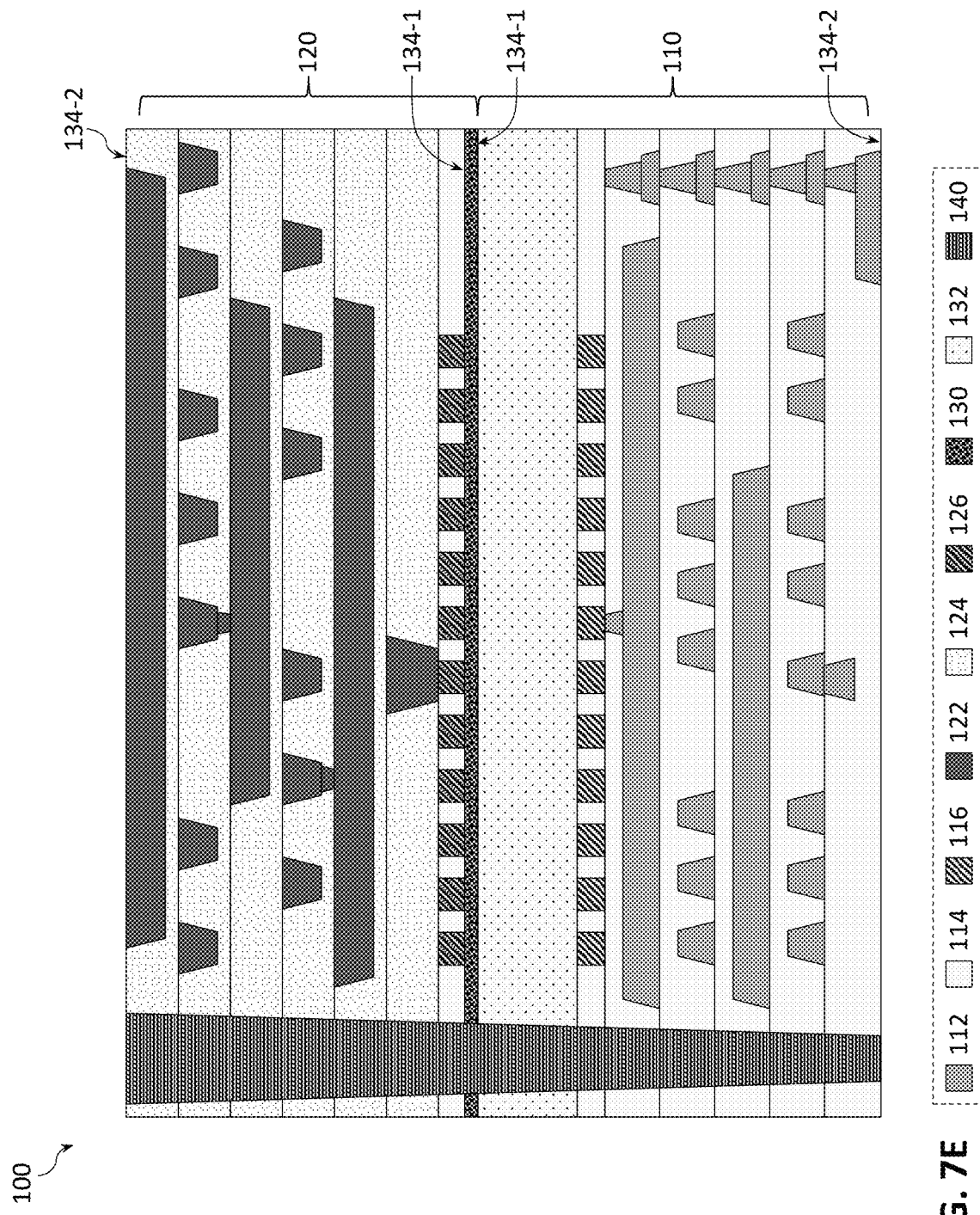

FIG. 7E illustrates an embodiment where the top b2b after-bonding via 140 extends from the top of the microelectronic assembly 100 all the way to the bottom of the microelectronic assembly 100 (i.e., FIG. 7E is similar to FIGS. 5D and 6D except that FIG. 7E illustrates the b2b bonding configuration). In this manner, the top b2b after-bonding via 140 is a TSV, extending between the opposing faces of the microelectronic assembly 100. An electrical connection may then be made to the top b2b after-bonding via 140 from one or both of the top and the bottom of the microelectronic assembly 100. Although not specifically shown in the cross-section of FIG. 7E, the top b2b after-bonding via 140 that is a TSV in the microelectronic assembly 100 may be electrically coupled to one or more components of the IC structure 120 to provide power, ground, and/or signal to these components of the IC structure 120 and/or may be electrically coupled to one or more components of the IC structure 110 to provide power, ground, and/or signal to these components of the IC structure 110.

In some embodiments, one characteristic feature that is specific to the top b2b after-bonding via 140 extending from the top of the b2b-bonded microelectronic assembly as shown in FIGS. 7A-7E may be that the cross-sectional trapezoidal shape of the top b2b after-bonding via 140 is oriented in the same manner (i.e., not inverted) as the trapezoidal shapes of the frontside interconnects 122. This is illustrated in FIGS. 7A-7E with the short side of the trapezoidal cross-section of the top b2b after-bonding via 140 being closer to the bottom of the microelectronic assembly 100, than its long side, and with the short sides of the trapezoidal cross-sections of the frontside interconnects 122 being closer to the bottom of the microelectronic assembly 100 than their long sides. In some embodiments, another characteristic feature that is specific to the top b2b after-bonding via 140 extending from the top of the f2f-bonded microelectronic assembly as shown in FIGS. 7A-7E may be that the cross-sectional trapezoidal shape of the top b2b after-bonding via 140 is inverted with respect to the trapezoidal shapes of the frontside interconnects 112. This is illustrated in FIGS. 7A-7E with the short side of the trapezoidal cross-section of the top b2b after-bonding via 140 being closer to the bottom of the microelectronic assembly 100, than its long side, and with the long sides of the trapezoidal cross-sections of the frontside interconnects 112 being closer to the bottom of the microelectronic assembly 100 than their short sides. Although not specifically shown in FIGS. 7A-7E, if the IC structure 120 included backside interconnects 122, then, in some embodiments, one characteristic feature that is specific to the top b2b after-bonding via 140 extending from the top of the f2f-bonded microelectronic assembly as shown in FIGS. 7A-7E could be that the cross-sectional trapezoidal shape of the top b2b afterbonding via 140 is inverted with respect to the trapezoidal shapes of the backside interconnects 122. This would be illustrated in FIGS. 7A-7E with the short side of the trapezoidal cross-section of the top b2b after-bonding via 140 being closer to the bottom of the microelectronic assembly 100, than its long side, and with the long sides of the trapezoidal cross-sections of the backside interconnects 122 being closer to the bottom of the microelectronic assembly 100 than their short sides. Furthermore, although not specifically shown in FIGS. 7A, 7C, 7D, and 7E (i.e., only shown in FIG. 7B), if the IC structure 110 included backside interconnects 112, then, in some embodiments, one characteristic feature that is specific to the top b2b after-bonding via 140 extending from the top of the f2f-bonded microelectronic assembly as shown in FIGS. 7A-7E could be that the cross-sectional trapezoidal shape of the top b2b afterbonding via 140 is oriented in the same manner (i.e., not inverted) as the trapezoidal shapes of the backside interconnects 112. This would be illustrated in FIGS. 7A, 7C, 7D, and 7E with the short side of the trapezoidal cross-section of the top b2b after-bonding via 140 being closer to the bottom of the microelectronic assembly 100, than its long side, and with the short sides of the trapezoidal cross-sections of the backside interconnects 112 being closer to the bottom of the microelectronic assembly 100 than their long sides.

While the top b2b after-bonding via 140 is shown in FIGS. 7A-7E for some specific examples of the b2b bonding configurations, descriptions of the top b2b after-bonding via 140, provided herein, are equally applicable to other embodiments of the b2b bonding configurations of the microelectronic assembly 100, e.g., to any of those described with reference to FIG. 3.

While each of FIGS. 5-7 illustrates a single top afterbonding via 140 extending from the top of the microelectronic assembly 100, in other embodiments, the microelectronic assembly 100 may include any number of two or more top after-bonding vias 140, which may be of same or different depths.

FIGS. 8-10 illustrate some embodiments of the microelectronic assembly 100 with an after-bonding via 140 formed from the bottom of the microelectronic assembly 100 for, respectively, f2f, f2b, and b2b bonding configurations. In some embodiments, the after-bonding via 140 extending from the bottom of the microelectronic assembly 100 may be fabricated by flipping a microelectronic assembly upside down (i.e., so that the backside of the microelectronic assembly is facing up), processing the backside of the flipped microelectronic assembly to form the after-bonding via 140 extending from the backside of the microelectronic assembly, and then flipping the microelectronic assembly upside down again (i.e., so that the backside of the microelectronic assembly is facing down and the frontside is facing up and so that the bonding via 140 extends from the bottom of the microelectronic assembly upwards, as shown in FIGS. 8-10).

FIGS. 8A-8D illustrate cross-sectional side views of a microelectronic assembly 100 that is an f2f-bonded assembly with an after-bonding via 140 formed from the bottom, in accordance with some embodiments. The microelectronic assembly 100 shown in FIGS. 8A-8D is similar to that shown in FIG. 1, except that it further includes the afterbonding via 140 formed from the bottom of the microelectronic assembly 100. For the embodiments of FIGS. 8A-8D, the after-bonding via 140 may be referred to as a "bottom f2f after-bonding via 140."

For the f2f embodiments shown in FIG. 8, the "top" of the microelectronic assembly 100 is considered to be the backside 134-1 of the IC structure 120, while the "bottom" of the microelectronic assembly 100 is considered to be the backside 134-1 of the IC structure 110. Different ones of FIGS. 8A-8D illustrate embodiments of the microelectronic assembly 100 with the bottom f2f after-bonding vias 140 of different depths.

Figure 8A:
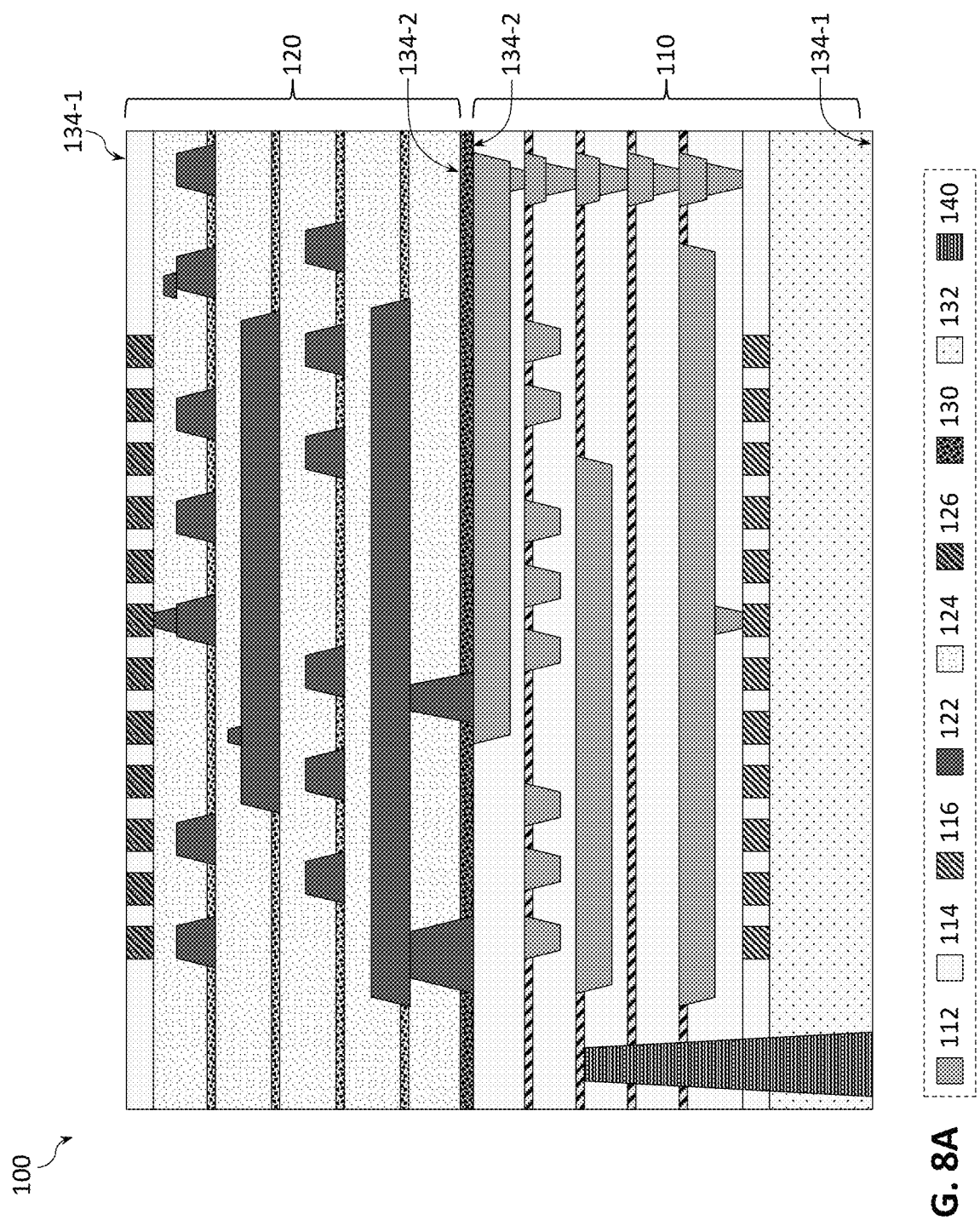
FIGS. 8A-8D illustrate cross-sectional side views of a microelectronic assembly that is an f2f-bonded assembly with an after-bonding via formed from the bottom, in accordance with some embodiments.

FIG. 8A illustrates an embodiment where the bottom f2f after-bonding via 140 extends from the bottom of the microelectronic assembly 100 towards the top of the microelectronic assembly 100 and stops before reaching the bonding material 130. Thus, FIG. 8A illustrates that the bottom f2f after-bonding via 140 may be such that it is a blind via in the bottom IC structure, e.g., in the IC structure 110. Although not specifically shown in the cross-section of FIG. 8A, the bottom f2f after-bonding via 140 may be electrically coupled to one or more components of the IC structure 110 (e.g., to one or more of the interconnects 112, devices of the device circuitry 116, etc.) to provide power, ground, and/or signal to these components. Furthermore, although also not specifically shown in the cross-section of FIG. 8A, in some embodiments, the bottom f2f afterbonding via 140 that is a blind via in the IC structure 110, e.g., as shown in FIG. 8A, may be electrically coupled to one or more components of the IC structure 120 (e.g., to one or more of the interconnects 122, devices of the device circuitry 126, etc.) to provide power, ground, and/or signal to these components of the IC structure 120, which may, e.g., be done by the bottom f2f after-bonding via 140 being electrically coupled to one or more interconnects 112, and one of more of those interconnects 112 being electrically coupled to one or more components of the IC structure 110.

Figure 8B:
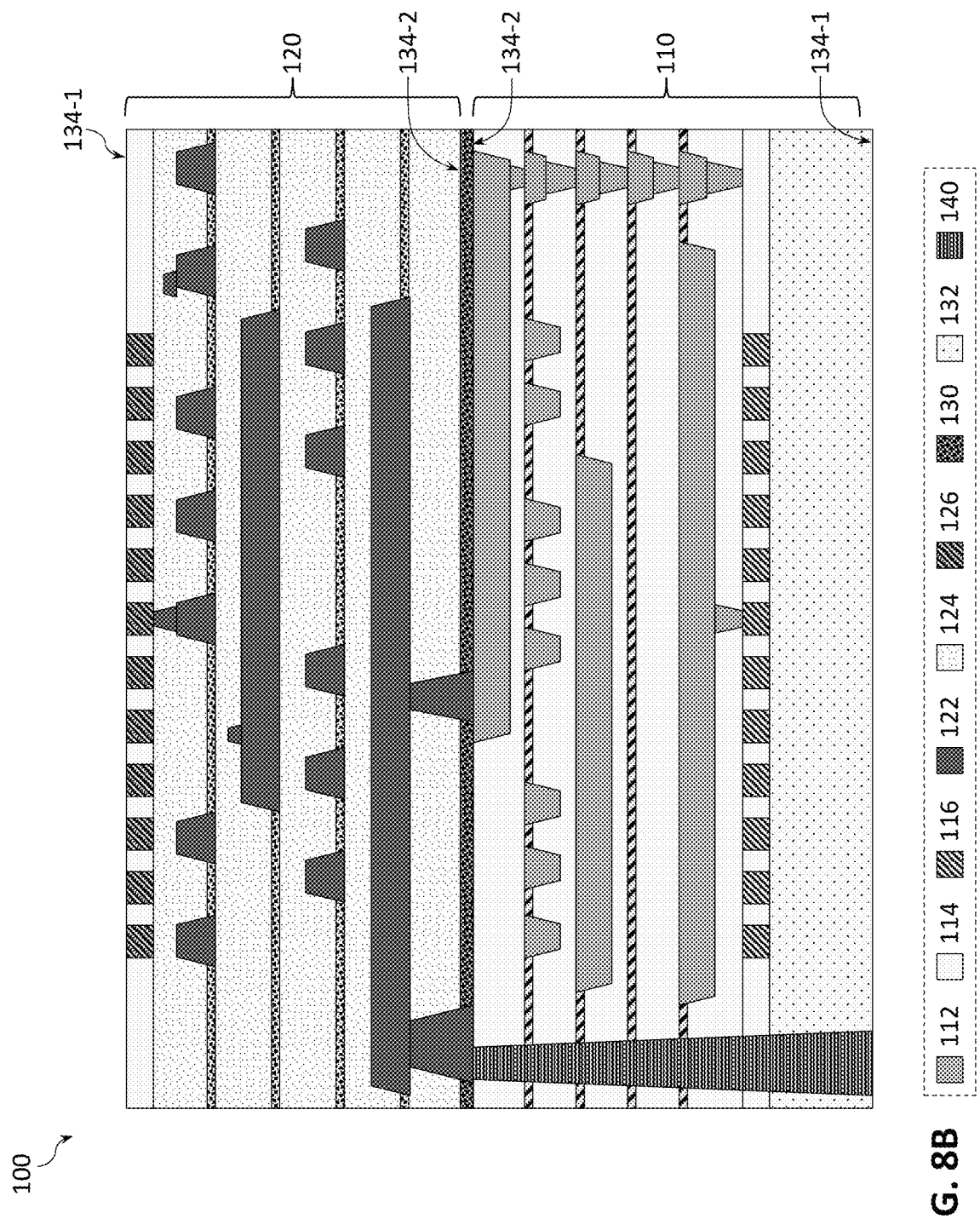

FIG. 8B illustrates an embodiment where the bottom f2f after-bonding via 140 extends from the bottom of the microelectronic assembly 100 towards the top of the microelectronic assembly 100 and stops when it encounters the interconnect 122. Such bottom f2f after-bonding via 140 may, e.g., be formed by forming an opening for the via using an etch that is selective to the materials of the interconnect 122, thus self-aligning the bottom of the bottom f2f afterbonding via 140 with the interconnect 122. In this manner, the bottom f2f after-bonding via 140 may be electrically coupled to the interconnect 122. Although not specifically shown in the cross-section of FIG. 8B, such bottom f2f after-bonding via 140 may be electrically coupled to one or more components of the IC structure 110 to provide power, ground, and/or signal to these components of the IC structure 110. By virtue of the bottom f2f after-bonding via 140 extending all through the IC structure 110 and making an electrical connection with the interconnect 122 of the IC structure 120, the bottom f2f after-bonding via 140 may further be electrically coupled to one or more components of the IC structure 120 that are coupled to said interconnect 122, to provide power, ground, and/or signal to these components of the IC structure 120.

Figure 8C:
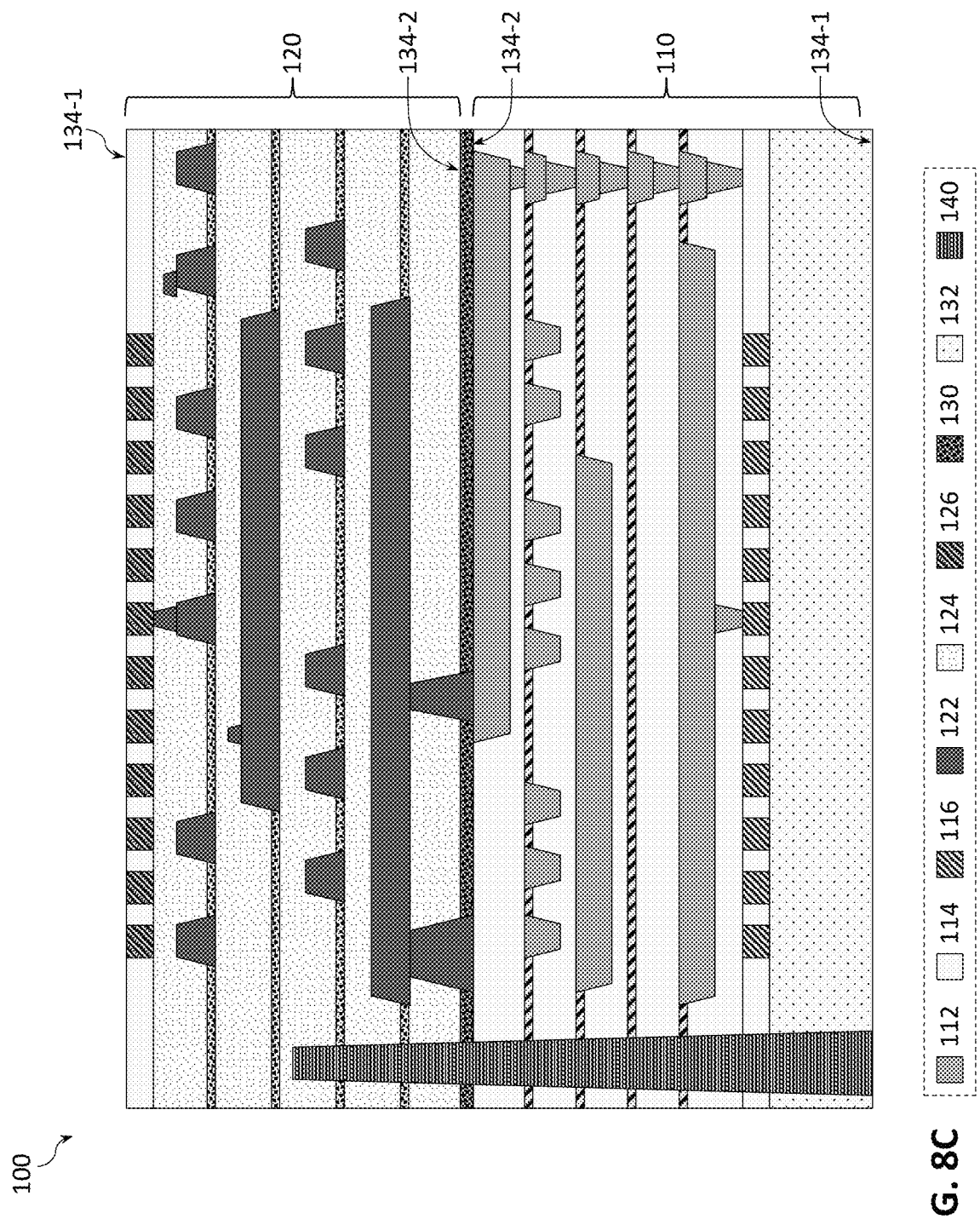

FIG. 8C illustrates an embodiment where the bottom f2f after-bonding via 140 extends from the bottom of the microelectronic assembly 100 towards the top of the microelectronic assembly 100, extends through all of the bottom IC structure of the microelectronic assembly 100 (e.g., the IC structure 110), the bonding material 130, and into the top IC structure of the microelectronic assembly 100 (e.g., the IC structure 120), and stops before reaching the top of the microelectronic assembly 100. Thus, FIG. 8C illustrates that the bottom f2f after-bonding via 140 may be such that it is a blind via extending through the bottom IC structure and into the top IC structure, e.g., from the IC structure 110 into the IC structure 120. Although not specifically shown in the cross-section of FIG. 8C, such bottom f2f after-bonding via 140 may be electrically coupled to one or more components of the IC structure 110 to provide power, ground, and/or signal to these components. Furthermore, although also not specifically shown in the cross-section of FIG. 8C, the bottom f2f after-bonding via 140 that extends all through the IC structure 110 and forms a blind via in the IC structure 120 as shown in FIG. 8C may further be electrically coupled to one or more components of the IC structure 120 to provide power, ground, and/or signal to these components of the IC structure 120.

Figure 8D:
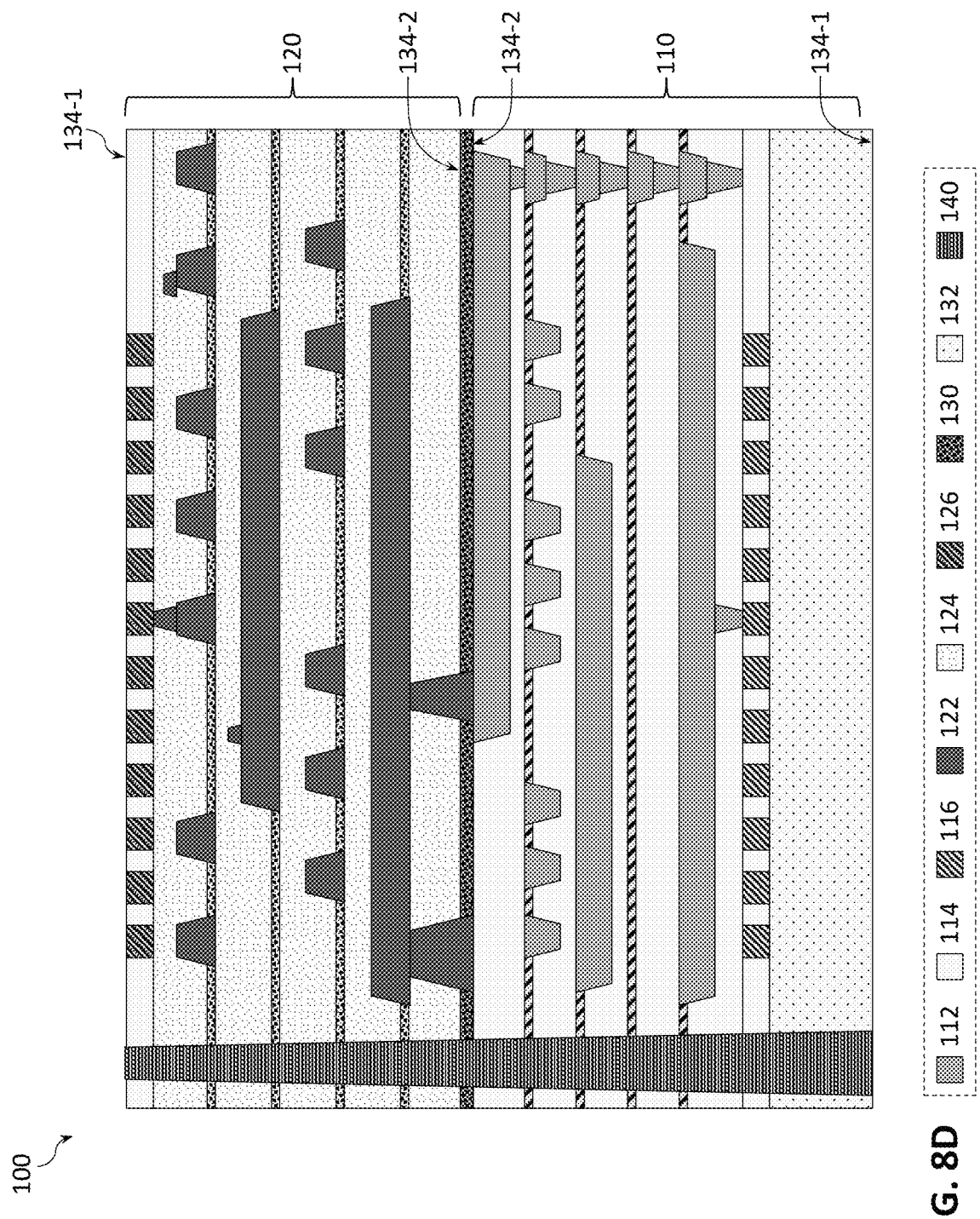

FIG. 8D illustrates an embodiment where the bottom f2f after-bonding via 140 extends from the bottom of the microelectronic assembly 100 all the way to the top of the microelectronic assembly 100. In this manner, the bottom f2f after-bonding via 140 is a TSV, extending between the opposing faces of the microelectronic assembly 100. An electrical connection may then be made to the bottom f2f after-bonding via 140 from one or both of the top and the bottom of the microelectronic assembly 100. Although not specifically shown in the cross-section of FIG. 8D, the bottom f2f after-bonding via 140 that is a TSV in the microelectronic assembly 100 may be electrically coupled to one or more components of the IC structure 110 to provide power, ground, and/or signal to these components of the IC structure 110 and/or may be electrically coupled to one or more components of the IC structure 120 to provide power, ground, and/or signal to these components of the IC structure 120.

In some embodiments, one characteristic feature that is specific to the bottom f2f after-bonding via 140 extending from the bottom of the f2f-bonded microelectronic assembly as shown in FIGS. 8A-8D may be that the cross-sectional trapezoidal shape of the bottom f2f after-bonding via 140 is oriented in the same manner (i.e., not inverted) as the trapezoidal shapes of the frontside interconnects 122. This is illustrated in FIGS. 8A-8D with the short side of the trapezoidal cross-section of the bottom f2f after-bonding via 140 being closer to the top of the microelectronic assembly 100, than its long side, and with the short sides of the trapezoidal cross-sections of the frontside interconnects 122 being closer to the top of the microelectronic assembly 100 than their long sides. In some embodiments, another characteristic feature that is specific to the bottom f2f after-bonding via 140 extending from the bottom of the f2f-bonded microelectronic assembly as shown in FIGS. 8A-8D may be that the cross-sectional trapezoidal shape of the bottom f2f after-bonding via 140 is inverted with respect to the trapezoidal shapes of the frontside interconnects 112. This is illustrated in FIGS. 8A-8D with the short side of the trapezoidal cross-section of the bottom f2f after-bonding via 140 being closer to the top of the microelectronic assembly 100, than its long side, and with the long sides of the trapezoidal cross-sections of the frontside interconnects 112 being closer to the top of the microelectronic assembly 100 than their short sides. Although not specifically shown in FIGS. 8A-8D, if the IC structure 120 included backside interconnects 122, then, in some embodiments, one characteristic feature that is specific to the bottom f2f after-bonding via 140 extending from the bottom of the f2f-bonded microelectronic assembly as shown in FIGS. 8A-8D could be that the cross-sectional trapezoidal shape of the bottom f2f after-bonding via 140 is inverted with respect to the trapezoidal shapes of the backside interconnects 122. This would be illustrated in FIGS. 8A-8D with the short side of the trapezoidal cross-section of the bottom f2f after-bonding via 140 being closer to the top of the microelectronic assembly 100, than its long side, and with the long sides of the trapezoidal cross-sections of the backside interconnects 122 being closer to the top of the microelectronic assembly 100 than their short sides. Furthermore, although not specifically shown in FIGS. 8A-8D, if the IC structure 110 included backside interconnects 112, then, in some embodiments, one characteristic feature that is specific to the bottom f2f after-bonding via 140 extending from the bottom of the f2f-bonded microelectronic assembly as shown in FIGS. 8A-8D could be that the cross-sectional trapezoidal shape of the bottom f2f after-bonding via 140 is oriented in the same manner (i.e., not inverted) as the trapezoidal shapes of the backside interconnects 112. This would be illustrated in FIGS. 8A-8D with the short side of the trapezoidal cross-section of the bottom f2f after-bonding via 140 being closer to the top of the microelectronic assembly 100, than its long side, and with the short sides of the trapezoidal cross-sections of the backside interconnects 112 being closer to the top of the microelectronic assembly 100 than their long sides.

FIGS. 9A-9D illustrate cross-sectional side views of a microelectronic assembly 100 that is an f2b-bonded assembly with an after-bonding via 140 formed from the bottom, in accordance with some embodiments. The microelectronic assembly 100 shown in FIGS. 9A-9D is similar to that shown in FIG. 2, except that it further includes the after-bonding via 140 formed from the bottom of the microelectronic assembly 100. For the embodiments of FIGS. 9A-9D, the after-bonding via 140 may be referred to as a "bottom f2b after-bonding via 140."

For the f2b embodiments shown in FIG. 9, the "top" of the microelectronic assembly 100 is considered to be the frontside 134-2 of the IC structure 120, while the "bottom" of the microelectronic assembly 100 is considered to be the backside 134-1 of the IC structure 110. Different ones of FIGS. 9A-9D illustrate embodiments of the microelectronic assembly 100 with the bottom f2b after-bonding via 140 of different depths.

Figure 9A:
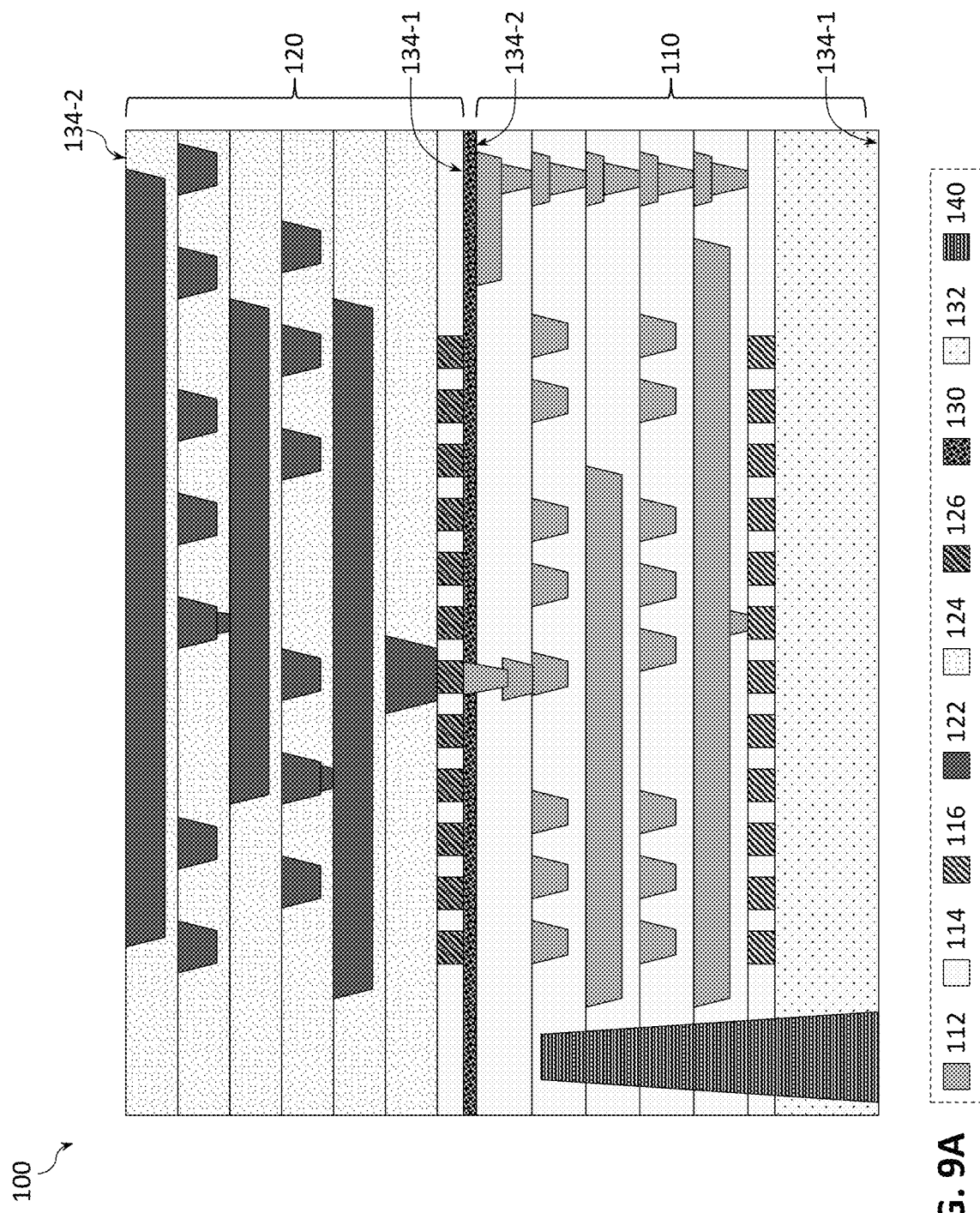
FIGS. 9A-9D illustrate cross-sectional side views of a microelectronic assembly that is an f2b-bonded assembly with an after-bonding via formed from the bottom, in accordance with some embodiments.

FIG. 9A illustrates an embodiment where the bottom f2b after-bonding via 140 extends from the bottom of the microelectronic assembly 100 towards the top of the microelectronic assembly 100 and stops before reaching the bonding material 130 (i.e., FIG. 9A is similar to FIG. 8A except that FIG. 9A illustrates the f2b bonding configuration). Thus, FIG. 9A illustrates that the bottom f2b after-bonding via 140 may be such that it is a blind via in the bottom IC structure, e.g., in the IC structure 110. Although not specifically shown in the cross-section of FIG. 9A, the bottom f2b after-bonding via 140 may be electrically coupled to one or more components of the IC structure 110 to provide power, ground, and/or signal to these components. Furthermore, although also not specifically shown in the cross-section of FIG. 9A, in some embodiments, the bottom f2b after-bonding via 140 that is a blind via in the IC structure 110, e.g., as shown in FIG. 9A, may be electrically coupled to one or more components of the IC structure 120 to provide power, ground, and/or signal to these components of the IC structure 120, which may, e.g., be done by the bottom f2b after-bonding via 140 being electrically coupled to one or more interconnects 112, and one of more of those interconnects 112 being electrically coupled to one or more components of the IC structure 120.

Figure 9B:
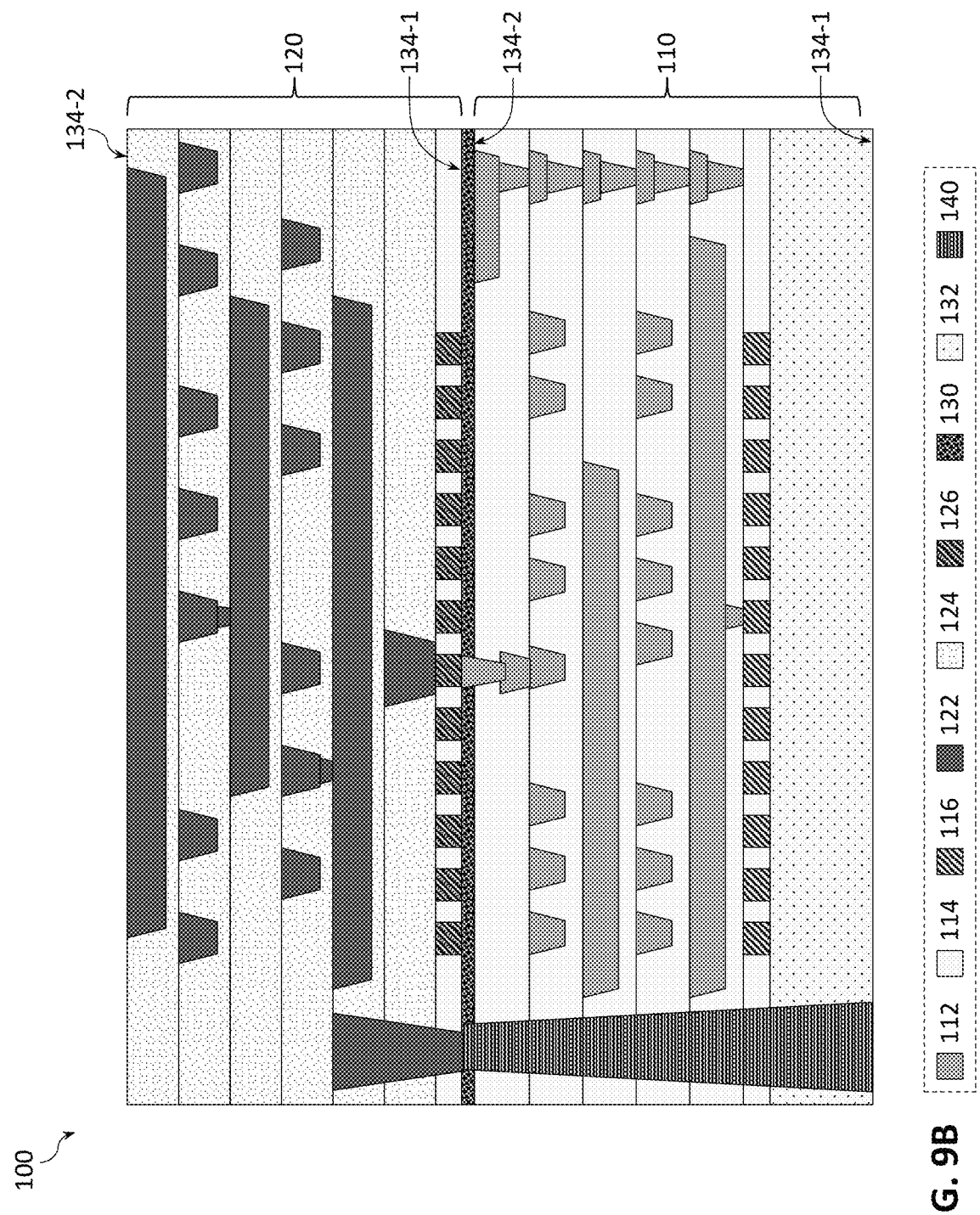

FIG. 9B illustrates an embodiment where the bottom f2b after-bonding via 140 extends from the bottom of the microelectronic assembly 100 towards the top of the microelectronic assembly 100 and stops when it encounters the interconnect 122 (i.e., FIG. 9B is similar to FIG. 8B except that FIG. 9B illustrates the f2b bonding configuration). Such bottom f2b after-bonding via 140 may, e.g., be formed by forming an opening for the via using an etch that is selective to the materials of the interconnect 122, thus self-aligning the bottom of the bottom f2b after-bonding via 140 with the interconnect 122. In this manner, the bottom f2b after-bonding via 140 may be electrically coupled to the interconnect 122. Although not specifically shown in the cross-section of FIG. 9B, such bottom f2b after-bonding via 140 may be electrically coupled to one or more components of the IC structure 110 to provide power, ground, and/or signal to these components of the IC structure 110. By virtue of the bottom f2b after-bonding via 140 extending all through the IC structure 110 and making an electrical connection with the interconnect 122 of the IC structure 120, the bottom f2b after-bonding via 140 may further be electrically coupled to one or more components of the IC structure 120 that are coupled to said interconnect 122, to provide power, ground, and/or signal to these components of the IC structure 120.

Figure 9C:
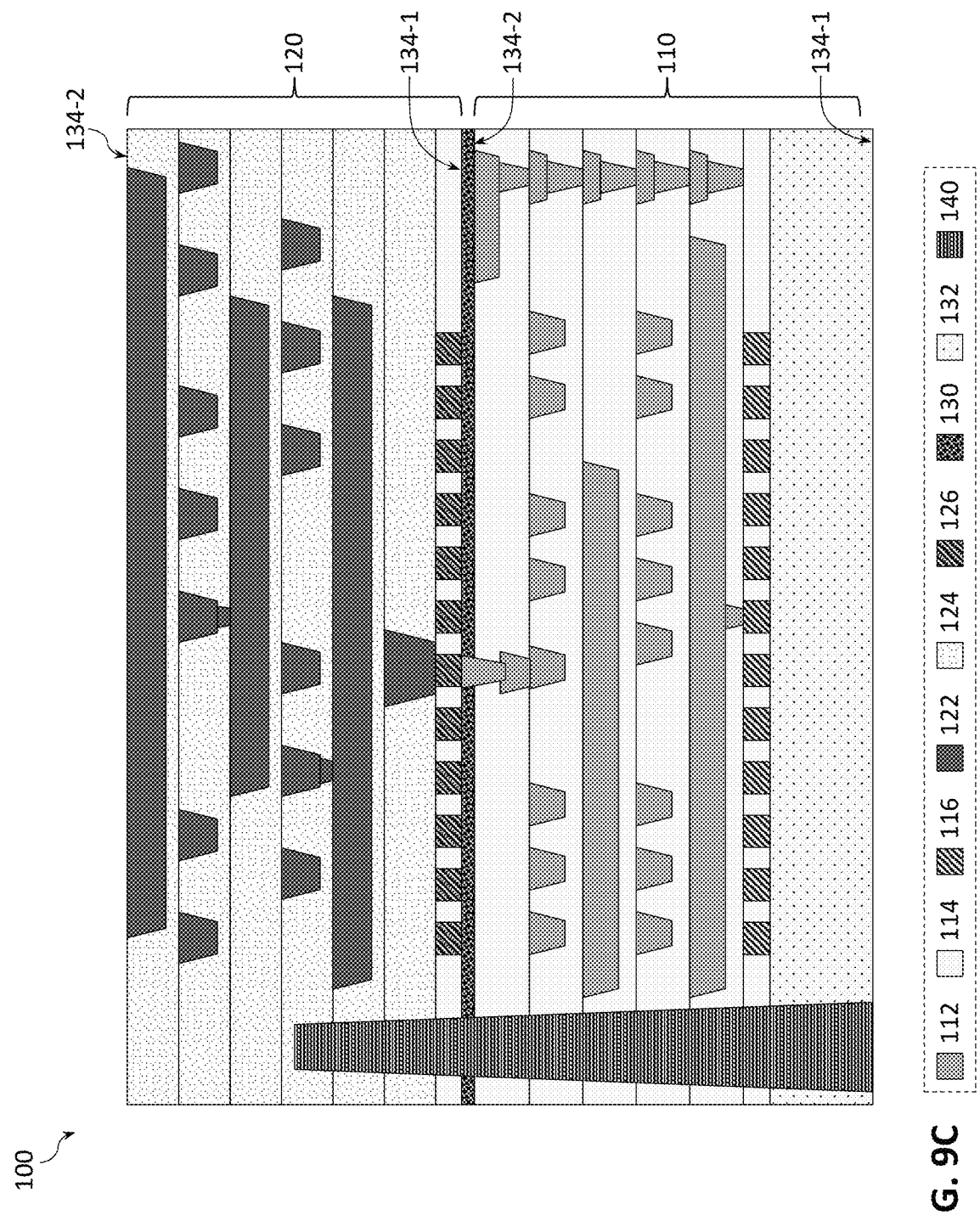

FIG. 9C illustrates an embodiment where the bottom f2b after-bonding via 140 extends from the bottom of the microelectronic assembly 100 towards the top of the microelectronic assembly 100, extends through all of the bottom IC structure of the microelectronic assembly 100 (e.g., the IC structure 110), the bonding material 130, and into the top IC structure of the microelectronic assembly 100 (e.g., the IC structure 120), and stops before reaching the top of the microelectronic assembly 100 (i.e., FIG. 9C is similar to FIG. 8C except that FIG. 9C illustrates the f2b bonding configuration). Thus, FIG. 9C illustrates that the bottom f2b after-bonding via 140 may be such that it is a blind via extending through the bottom IC structure and into the top IC structure, e.g., from the IC structure 110 into the IC structure 120. Although not specifically shown in the cross-section of FIG. 9C, such bottom f2b after-bonding via 140 may be electrically coupled to one or more components of the IC structure 110 to provide power, ground, and/or signal to these components. Furthermore, although also not specifically shown in the cross-section of FIG. 9C, the bottom f2b after-bonding via 140 that extends all through the IC structure 110 and forms a blind via in the IC structure 120 as shown in FIG. 9C may further be electrically coupled to one or more components of the IC structure 120 to provide power, ground, and/or signal to these components of the IC structure 120.

Figure 9D:
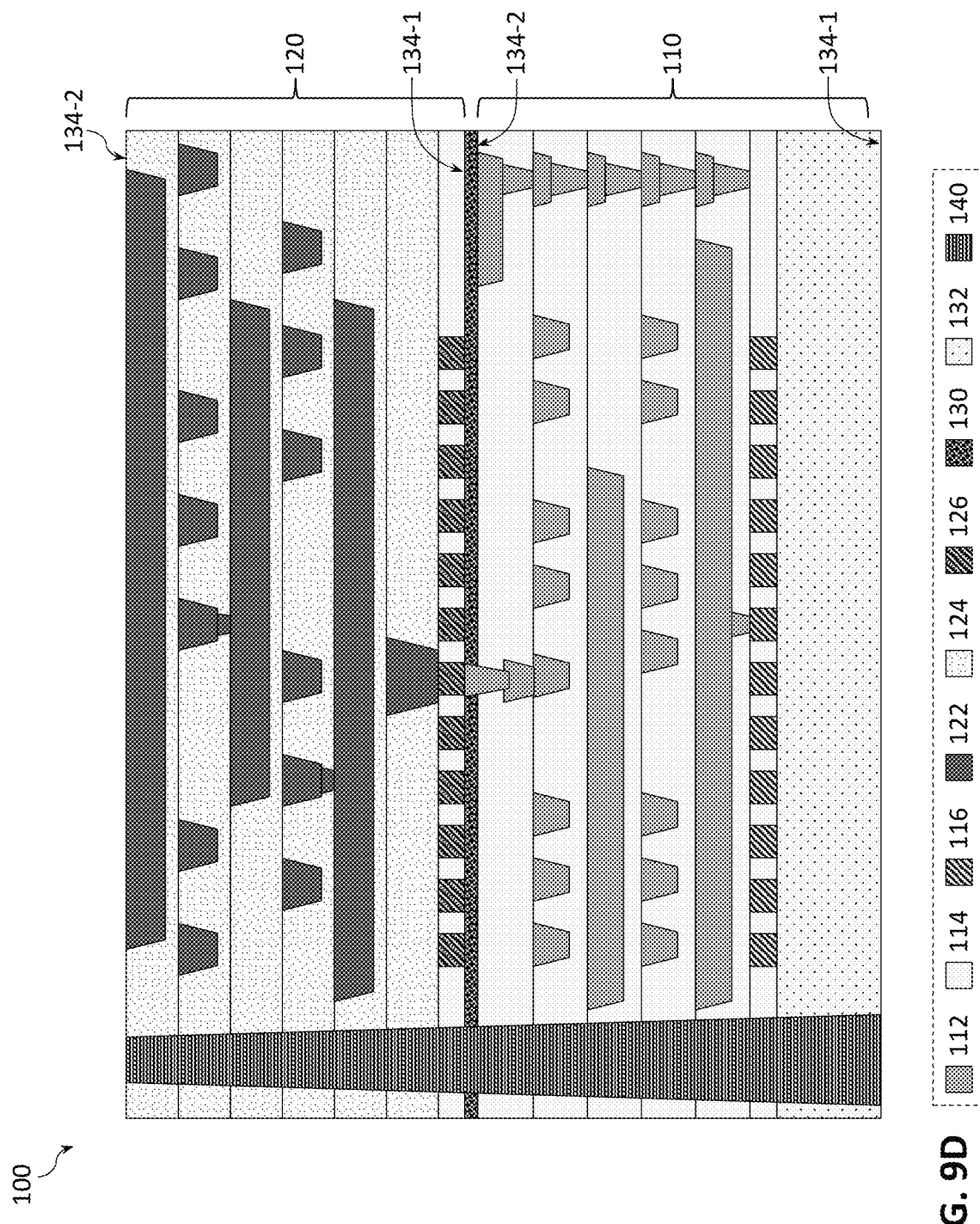

FIG. 9D illustrates an embodiment where the bottom f2b after-bonding via 140 extends from the bottom of the microelectronic assembly 100 all the way to the top of the microelectronic assembly 100 (i.e., FIG. 9D is similar to FIG. 8D except that FIG. 9D illustrates the f2b bonding configuration). In this manner, the bottom f2b after-bonding via 140 is a TSV, extending between the opposing faces of the microelectronic assembly 100. An electrical connection may then be made to the bottom f2b after-bonding via 140 from one or both of the top and the bottom of the microelectronic assembly 100. Although not specifically shown in the cross-section of FIG. 9D, the bottom f2b after-bonding via 140 that is a TSV in the microelectronic assembly 100 may be electrically coupled to one or more components of the IC structure 110 to provide power, ground, and/or signal to these components of the IC structure 110 and/or may be electrically coupled to one or more components of the IC structure 120 to provide power, ground, and/or signal to these components of the IC structure 120.

In some embodiments, one characteristic feature that is specific to the bottom f2b after-bonding via 140 extending from the bottom of the f2b-bonded microelectronic assembly as shown in FIGS. 9A-9D may be that the cross-sectional trapezoidal shape of the bottom f2b after-bonding via 140 is inverted with respect to the trapezoidal shapes of the frontside interconnects 122. This is illustrated in FIGS. 9A-9D with the short side of the trapezoidal cross-section of the bottom f2b after-bonding via 140 being closer to the top of the microelectronic assembly 100, than its long side, and with the long sides of the trapezoidal cross-sections of the frontside interconnects 122 being closer to the top of the microelectronic assembly 100 than their short sides. In some embodiments, another characteristic feature that is specific to the bottom f2b after-bonding via 140 extending from the bottom of the f2f-bonded microelectronic assembly as shown in FIGS. 9A-9D may be that the cross-sectional trapezoidal shape of the bottom f2b after-bonding via 140 is also inverted with respect to the trapezoidal shapes of the frontside interconnects 112. This is illustrated in FIGS. 9A-9D with the short side of the trapezoidal cross-section of the bottom f2b after-bonding via 140 being closer to the top of the microelectronic assembly 100, than its long side, and with the long sides of the trapezoidal cross-sections of the frontside interconnects 112 being closer to the top of the microelectronic assembly 100 than their short sides. Although not specifically shown in FIGS. 9A-9D, if the IC structure 120 included backside interconnects 122, then, in some embodiments, one characteristic feature that is specific to the bottom f2b after-bonding via 140 extending from the bottom of the f2f-bonded microelectronic assembly as shown in FIGS. 9A-9D could be that the cross-sectional trapezoidal shape of the bottom f2b after-bonding via 140 is oriented in the same manner (i.e., not inverted) as the trapezoidal shapes of the backside interconnects 122. This would be illustrated in FIGS. 9A-9D with the short side of the trapezoidal cross-section of the bottom f2b after-bonding via 140 being closer to the top of the microelectronic assembly 100, than its long side, and with the short sides of the trapezoidal cross-sections of the backside interconnects 122 being closer to the top of the microelectronic assembly 100 than their long sides. Furthermore, although not specifically shown in FIGS. 9A-9D, if the IC structure 110 included backside interconnects 112, then, in some embodiments, one characteristic feature that is specific to the bottom f2b after-bonding via 140 extending from the bottom of the f2f-bonded microelectronic assembly as shown in FIGS. 9A-9D could be that the cross-sectional trapezoidal shape of the bottom f2b after-bonding via 140 is also oriented in the same manner (i.e., not inverted) as the trapezoidal shapes of the backside interconnects 112. This would be illustrated in FIGS. 9A-9D with the short side of the trapezoidal cross-section of the bottom f2b after-bonding via 140 being closer to the top of the microelectronic assembly 100, than its long side, and with the short sides of the trapezoidal cross-sections of the backside interconnects 112 being closer to the top of the microelectronic assembly 100 than their long sides.

FIGS. 10A-10E illustrate cross-sectional side views of a microelectronic assembly 100 that is a b2b-bonded assembly with an after-bonding via 140 formed from the bottom, in accordance with some embodiments. The microelectronic assembly 100 shown in FIGS. 10A-10E is similar to that shown in FIG. 3, except that it further includes the after-bonding via 140 formed from the bottom of the microelectronic assembly 100. For the embodiments of FIGS. 10A-10E, the after-bonding via 140 may be referred to as a "bottom b2b after-bonding via 140."

For the b2b embodiments shown in FIG. 7, the "top" of the microelectronic assembly 100 is considered to be the frontside 134-2 of the IC structure 120, while the "bottom" of the microelectronic assembly 100 is considered to be the backside 134-2 of the IC structure 110. Different ones of FIGS. 10A-10E illustrate embodiments of the microelectronic assembly 100 with the bottom b2b after-bonding via 140 of different depths.

Figure 10A:
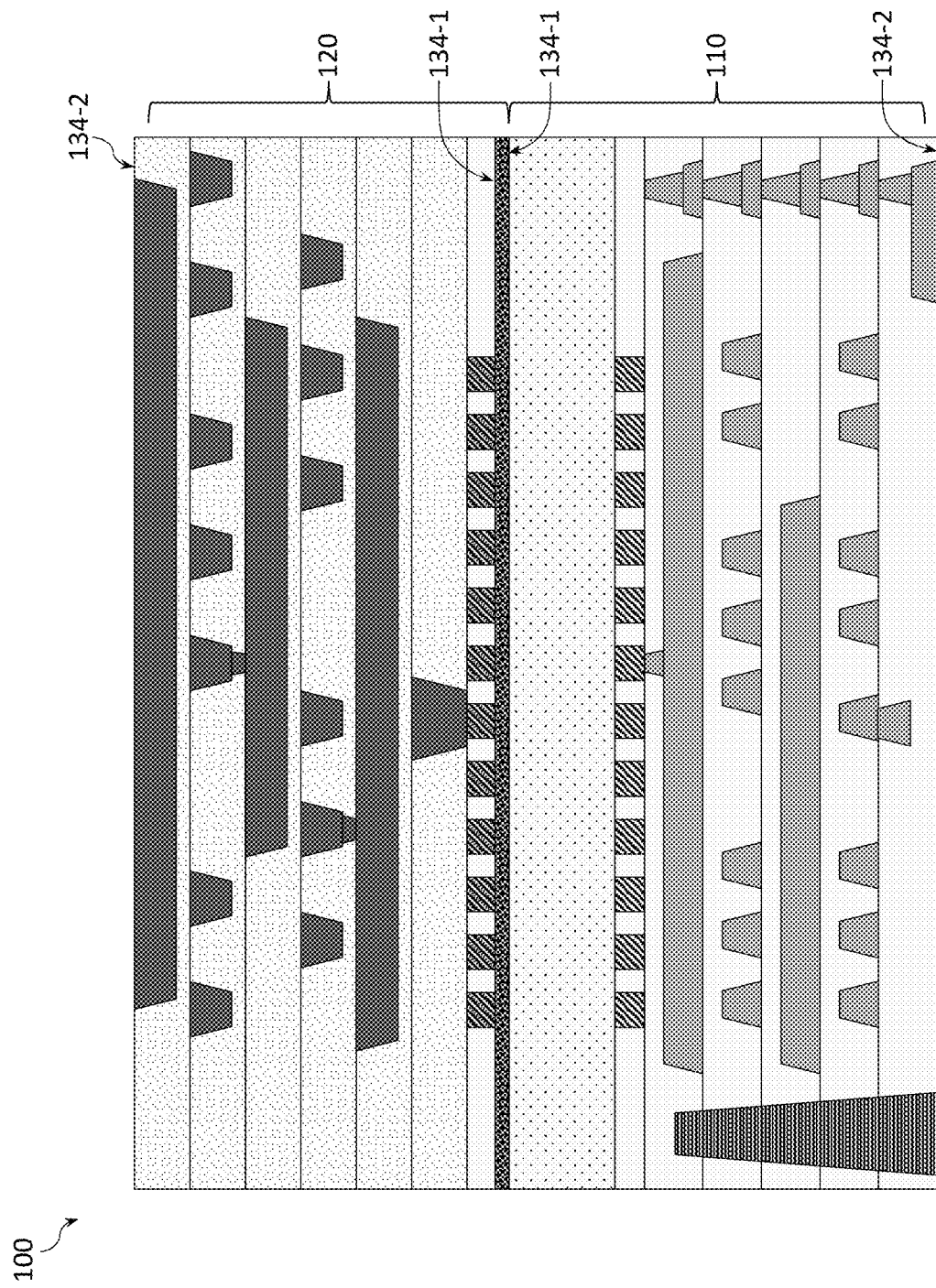
FIGS. 10A-10E illustrate cross-sectional side views of a microelectronic assembly that is an b2b-bonded assembly with an after-bonding via formed from the bottom, in accordance with some embodiments.

FIG. 10A illustrates an embodiment where the bottom b2b after-bonding via 140 extends from the bottom of the microelectronic assembly 100 towards the top of the microelectronic assembly 100 and stops before reaching the bonding material 130 (i.e., FIG. 10A is similar to FIGS. 8A and 9A except that FIG. 10A illustrates the b2b bonding configuration). Thus, FIG. 10A illustrates that the bottom b2b after-bonding via 140 may be such that it is a blind via in the bottom IC structure, e.g., in the IC structure 110. Although not specifically shown in the cross-section of FIG. 10A, the bottom b2b after-bonding via 140 may be electrically coupled to one or more components of the IC structure 110 to provide power, ground, and/or signal to these components. Furthermore, although also not specifically shown in the cross-section of FIG. 10A, in some embodiments, the bottom b2b after-bonding via 140 that is a blind via in the IC structure 110, e.g., as shown in FIG. 10A, may be electrically coupled to one or more components of the IC structure 120 to provide power, ground, and/or signal to these components of the IC structure 120, which may, e.g., be done by the bottom b2b after-bonding via 140 being electrically coupled to one or more interconnects 112, and one of more of those interconnects 112 being electrically coupled to one or more components of the IC structure 120.

Figure 10B:
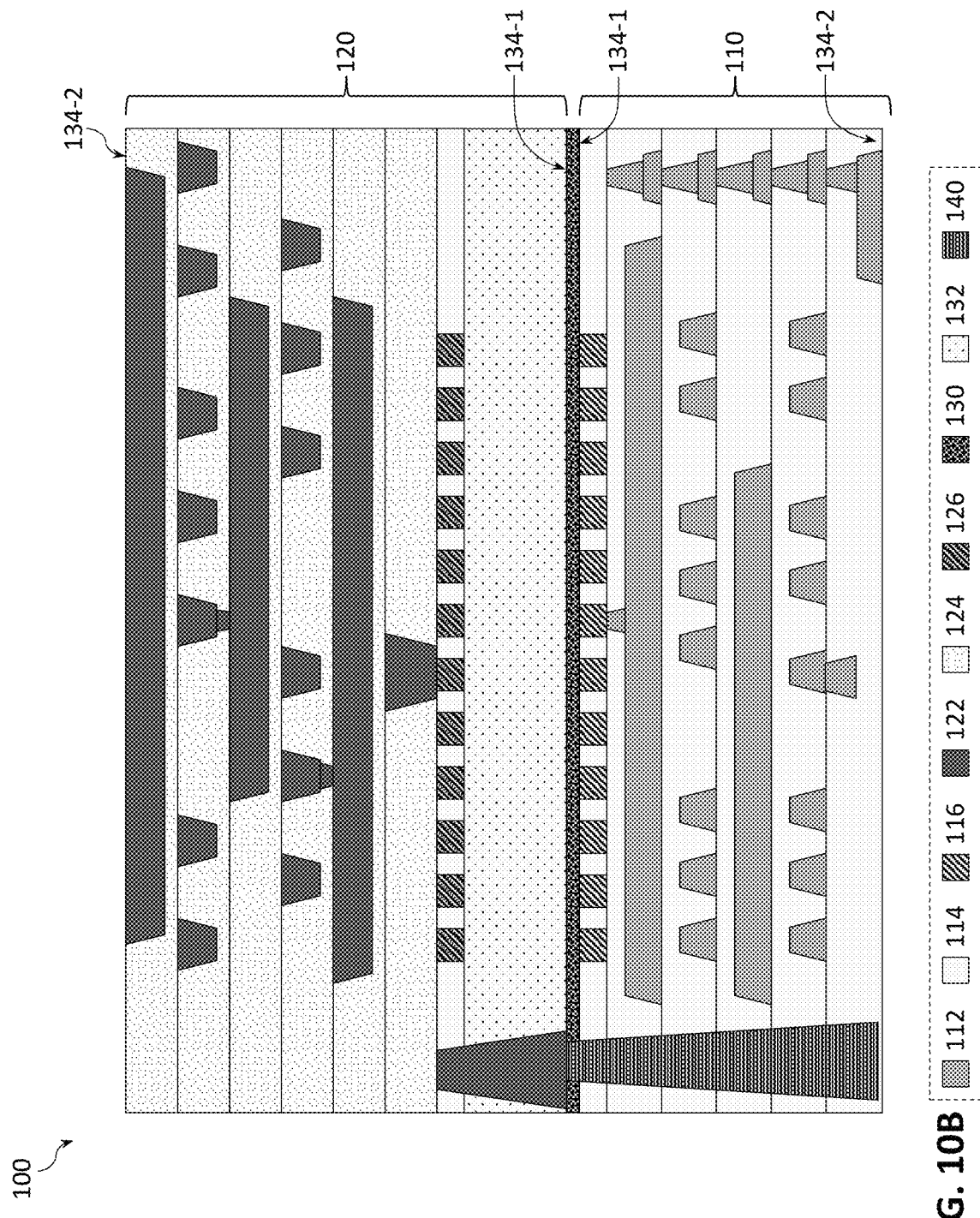
Figure 10C:
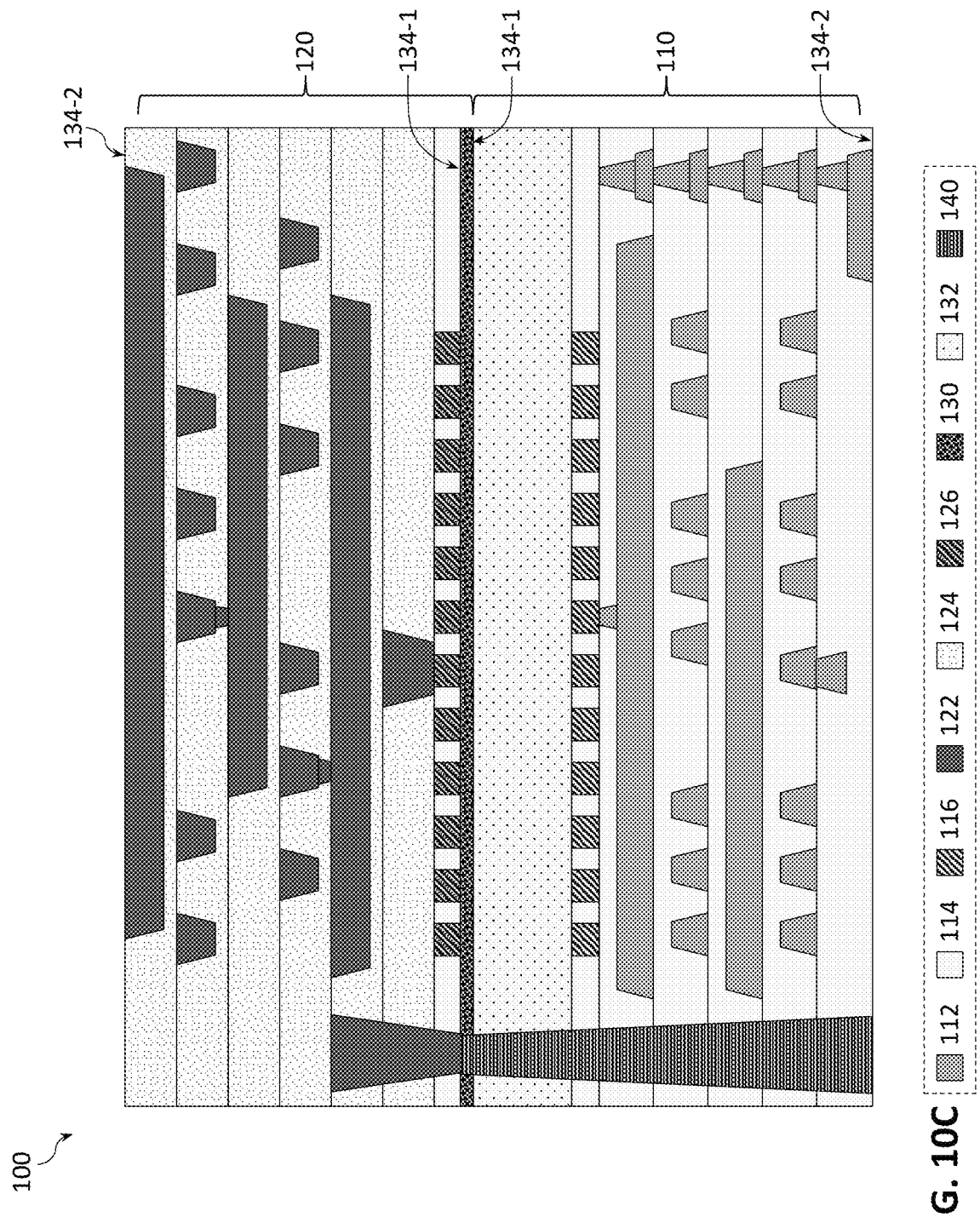

FIG. 10B illustrates an embodiment where the bottom b2b after-bonding via 140 extends from the bottom of the microelectronic assembly 100 towards the bottom of the microelectronic assembly 100 and stops when it encounters the backside interconnect 122 (i.e., FIG. 10B is similar to FIG. 10C except that the bonding interface is at a different location and the interconnect 122 contacted by the bottom b2b after-bonding via 140 is a backside interconnect). Such bottom b2b after-bonding via 140 may, e.g., be formed by forming an opening for the via using an etch that is selective to the materials of the backside interconnect 122, thus self-aligning the bottom of the bottom b2b after-bonding via 140 with the backside interconnect 122. In this manner, the bottom b2b after-bonding via 140 may be electrically coupled to the backside interconnect 122. Although not specifically shown in the cross-section of FIG. 10B, such bottom b2b after-bonding via 140 may be electrically coupled to one or more components of the IC structure 110 to provide power, ground, and/or signal to these components of the IC structure 110. By virtue of the bottom b2b after-bonding via 140 extending all through the IC structure 110 and making an electrical connection with the backside interconnect 122 of the IC structure 120, the bottom b2b after-bonding via 140 may further be electrically coupled to one or more components of the IC structure 120 that are coupled to said backside interconnect 122, to provide power, ground, and/or signal to these components of the IC structure 120.

FIG. 10C illustrates an embodiment where the bottom b2b after-bonding via 140 extends from the bottom of the microelectronic assembly 100 towards the top of the microelectronic assembly 100 and stops when it encounters the frontside interconnect 122. Such top b2b after-bonding via 140 may, e.g., be formed by forming an opening for the via using an etch that is selective to the materials of the frontside interconnect 122, thus self-aligning the bottom of the bottom b2b after-bonding via 140 with the frontside interconnect 122. In this manner, the bottom b2b after-bonding via 140 may be electrically coupled to the frontside interconnect 122. Although not specifically shown in the cross-section of FIG. 10C, such top b2b after-bonding via 140 may be electrically coupled to one or more components of the IC structure 110 to provide power, ground, and/or signal to these components of the IC structure 110. By virtue of the bottom b2b after-bonding via 140 extending all through the IC structure 110 and making an electrical connection with the frontside interconnect 122 of the IC structure 120, the bottom b2b after-bonding via 140 may further be electrically coupled to one or more components of the IC structure 120 that are coupled to said frontside interconnect 122, to provide power, ground, and/or signal to these components of the IC structure 120.

Figure 10D:
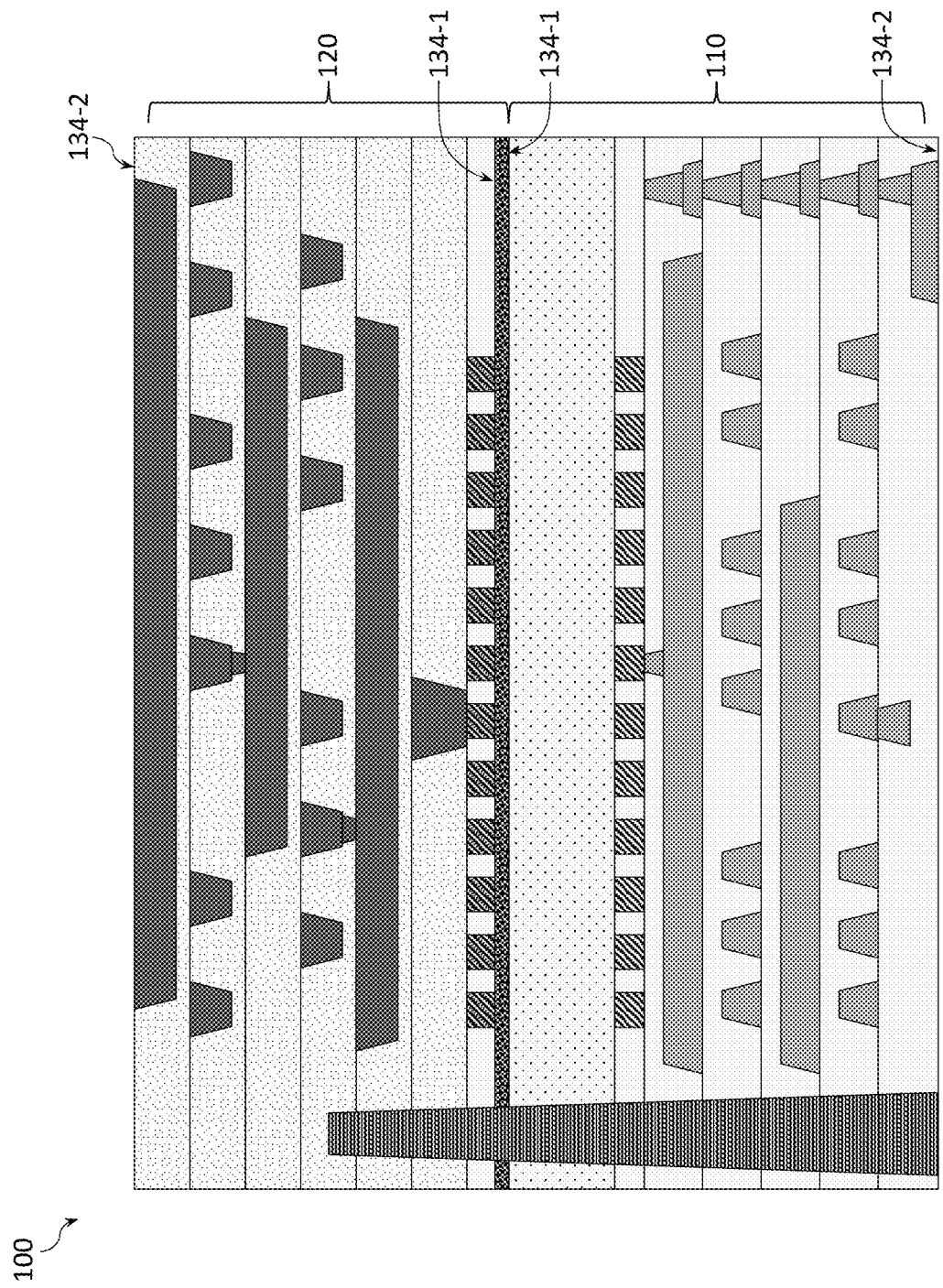

FIG. 10D illustrates an embodiment where the bottom b2b after-bonding via 140 extends from the bottom of the microelectronic assembly 100 towards the top of the microelectronic assembly 100, extends through all of the bottom IC structure of the microelectronic assembly 100 (e.g., the IC structure 110), the bonding material 130, and into the top IC structure of the microelectronic assembly 100 (e.g., the IC structure 120), and stops before reaching the top of the microelectronic assembly 100 (i.e., FIG. 10D is similar to FIGS. 8C and 9C except that FIG. 10D illustrates the f2b bonding configuration). Thus, FIG. 10D illustrates that the bottom b2b after-bonding via 140 may be such that it is a blind via extending through the bottom IC structure and into the top IC structure, e.g., from the IC structure 110 into the IC structure 120. Although not specifically shown in the cross-section of FIG. 10D, such bottom b2b after-bonding via 140 may be electrically coupled to one or more components of the IC structure 110 to provide power, ground, and/or signal to these components. Furthermore, although also not specifically shown in the cross-section of FIG. 10D, the bottom b2b after-bonding via 140 that extends all through the IC structure 110 and forms a blind via in the IC structure 120 as shown in FIG. 10D may further be electrically coupled to one or more components of the IC structure 120 to provide power, ground, and/or signal to these components of the IC structure 120.

Figure 10E:
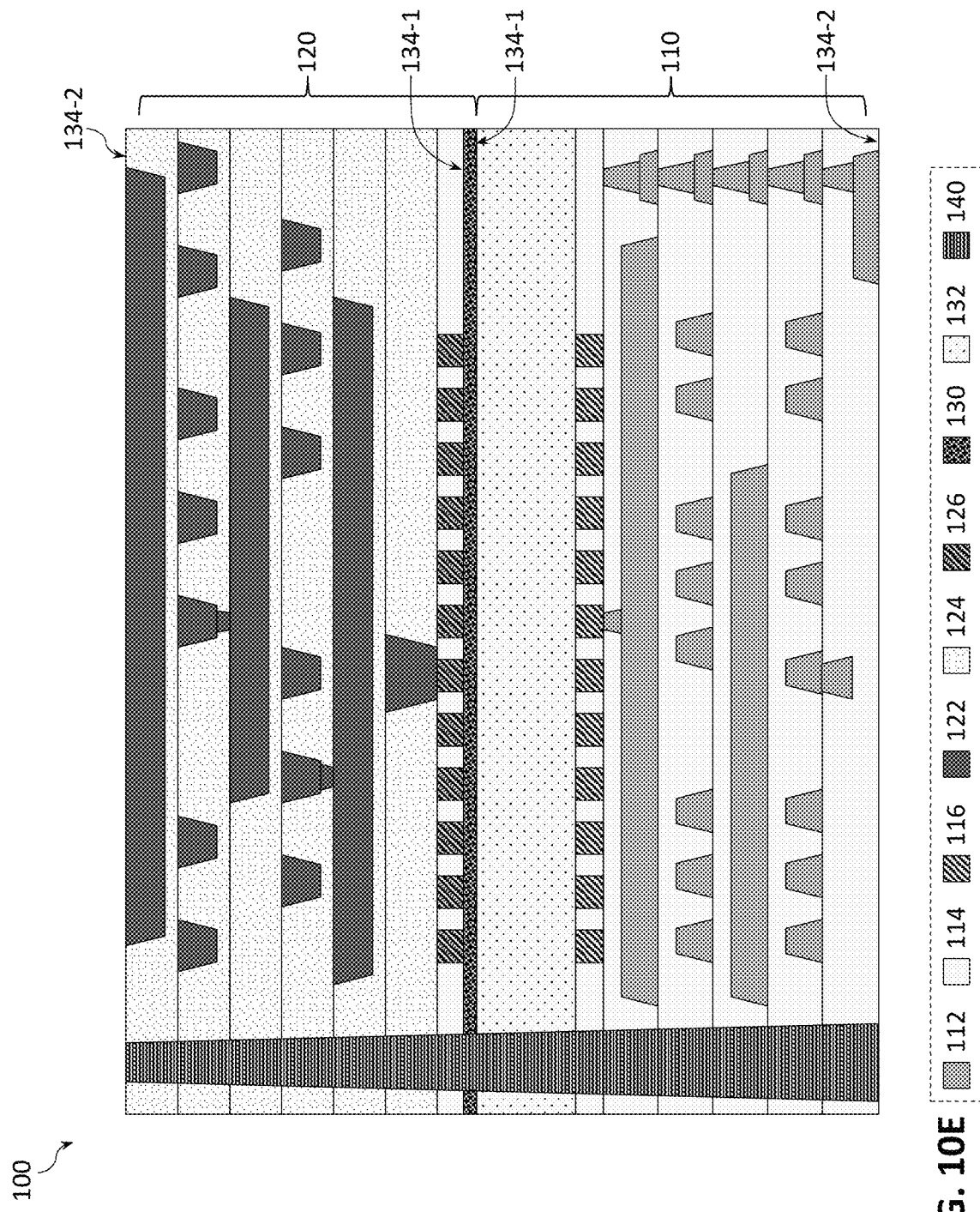

FIG. 10E illustrates an embodiment where the bottom b2b after-bonding via 140 extends from the bottom of the microelectronic assembly 100 all the way to the top of the microelectronic assembly 100 (i.e., FIG. 10E is similar to FIGS. 8D and 9D except that FIG. 10E illustrates the b2b bonding configuration). In this manner, the bottom b2b after-bonding via 140 is a TSV, extending between the opposing faces of the microelectronic assembly 100. An electrical connection may then be made to the bottom b2b after-bonding via 140 from one or both of the top and the bottom of the microelectronic assembly 100. Although not specifically shown in the cross-section of FIG. 10E, the bottom b2b after-bonding via 140 that is a TSV in the microelectronic assembly 100 may be electrically coupled to one or more components of the IC structure 110 to provide power, ground, and/or signal to these components of the IC structure 110 and/or may be electrically coupled to one or more components of the IC structure 120 to provide power, ground, and/or signal to these components of the IC structure 120.

In some embodiments, one characteristic feature that is specific to the bottom b2b after-bonding via 140 extending from the bottom of the b2b-bonded microelectronic assembly as shown in FIGS. 10A-10E may be that the cross-sectional trapezoidal shape of the bottom b2b after-bonding via 140 is inverted with respect to the trapezoidal shapes of the frontside interconnects 122. This is illustrated in FIGS. 10A-10E with the short side of the trapezoidal cross-section of the bottom b2b after-bonding via 140 being closer to the top of the microelectronic assembly 100, than its long side, and with the long sides of the trapezoidal cross-sections of the frontside interconnects 122 being closer to the top of the microelectronic assembly 100 than their short sides. In some embodiments, another characteristic feature that is specific to the bottom b2b after-bonding via 140 extending from the bottom of the f2f-bonded microelectronic assembly as shown in FIGS. 10A-10E may be that the cross-sectional trapezoidal shape of the bottom b2b after-bonding via 140 is oriented in the same manner (i.e., not inverted) as the trapezoidal shapes of the frontside interconnects 112. This is illustrated in FIGS. 10A-10E with the short side of the trapezoidal cross-section of the bottom b2b after-bonding via 140 being closer to the top of the microelectronic assembly 100, than its long side, and with the short sides of the trapezoidal cross-sections of the frontside interconnects 112 being closer to the top of the microelectronic assembly 100 than their long sides. Although not specifically shown in FIGS. 10A, 10C, 10D, and 10E (i.e., only shown in FIG. 10B), if the IC structure 120 included backside interconnects 122, then, in some embodiments, one characteristic feature that is specific to the bottom b2b after-bonding via 140 extending from the bottom of the f2f-bonded microelectronic assembly as shown in FIGS. 10A-10E could be that the cross-sectional trapezoidal shape of the bottom b2b after-bonding via 140 is oriented in the same manner (i.e., not inverted) as the trapezoidal shapes of the backside interconnects 122. This would be illustrated in FIGS. 10A, 10C, 10D, and 10E with the short side of the trapezoidal cross-section of the bottom b2b after-bonding via 140 being closer to the top of the microelectronic assembly 100, than its long side, and with the short sides of the trapezoidal cross-sections of the backside interconnects 122 being closer to the top of the microelectronic assembly 100 than their long sides. Furthermore, although not specifically shown in FIGS. 10A-10E, if the IC structure 110 included backside interconnects 112, then, in some embodiments, one characteristic feature that is specific to the bottom b2b after-bonding via 140 extending from the bottom of the f2f-bonded microelectronic assembly as shown in FIGS. 10A-10E could be that the cross-sectional trapezoidal shape of the bottom b2b after-bonding via 140 is inverted with respect to the trapezoidal shapes of the backside interconnects 112. This would be illustrated in FIGS. 10A-10E with the short side of the trapezoidal cross-section of the bottom b2b after-bonding via 140 being closer to the top of the microelectronic assembly 100, than its long side, and with the long sides of the trapezoidal cross-sections of the backside interconnects 112 being closer to the top of the microelectronic assembly 100 than their short sides.

While the bottom b2b after-bonding via 140 is shown in FIGS. 10A-10E for some specific examples of the b2b bonding configurations, descriptions of the bottom b2b after-bonding via 140, provided herein, are equally applicable to other embodiments of the b2b bonding configurations of the microelectronic assembly 100, e.g., to any of those described with reference to FIG. 3.

While each of FIGS. 8-10 illustrates a single bottom after-bonding via 140 extending from the bottom of the microelectronic assembly 100, in other embodiments, the microelectronic assembly 100 may include any number of two or more bottom after-bonding vias 140, which may be of same or different depths. In addition, various embodiments of the microelectronic assembly 100 as described herein may include any number and any combination of top after-bonding vias 140 and bottom after-bonding vias 140, of any depth in accordance with a design. For example, any embodiments of the microelectronic assembly 100 described with reference to FIGS. 8-10 may further include one or more top after-bonding vias 140 extending from the top of the microelectronic assembly 100 according to any embodiments of the microelectronic assembly 100 described with reference to FIGS. 5-7. Furthermore, while FIGS. 5-10 illustrate embodiments where an after-bonding via 140 extends, at most, through two IC structures bonded together (i.e., through a pair of the IC structures 110 and 120), any of the embodiments described with reference to FIGS. 5-10 may be extended to the microelectronic assemblies 100 that include multiple such pairs of IC structures bonded together where one or more after-bonding vias 140, which may be extending from the top, from the bottom, or both, may extend through three or more IC structures. Some non-limiting examples of such embodiments are shown in FIGS. 11A-11C.

Figure 11A:
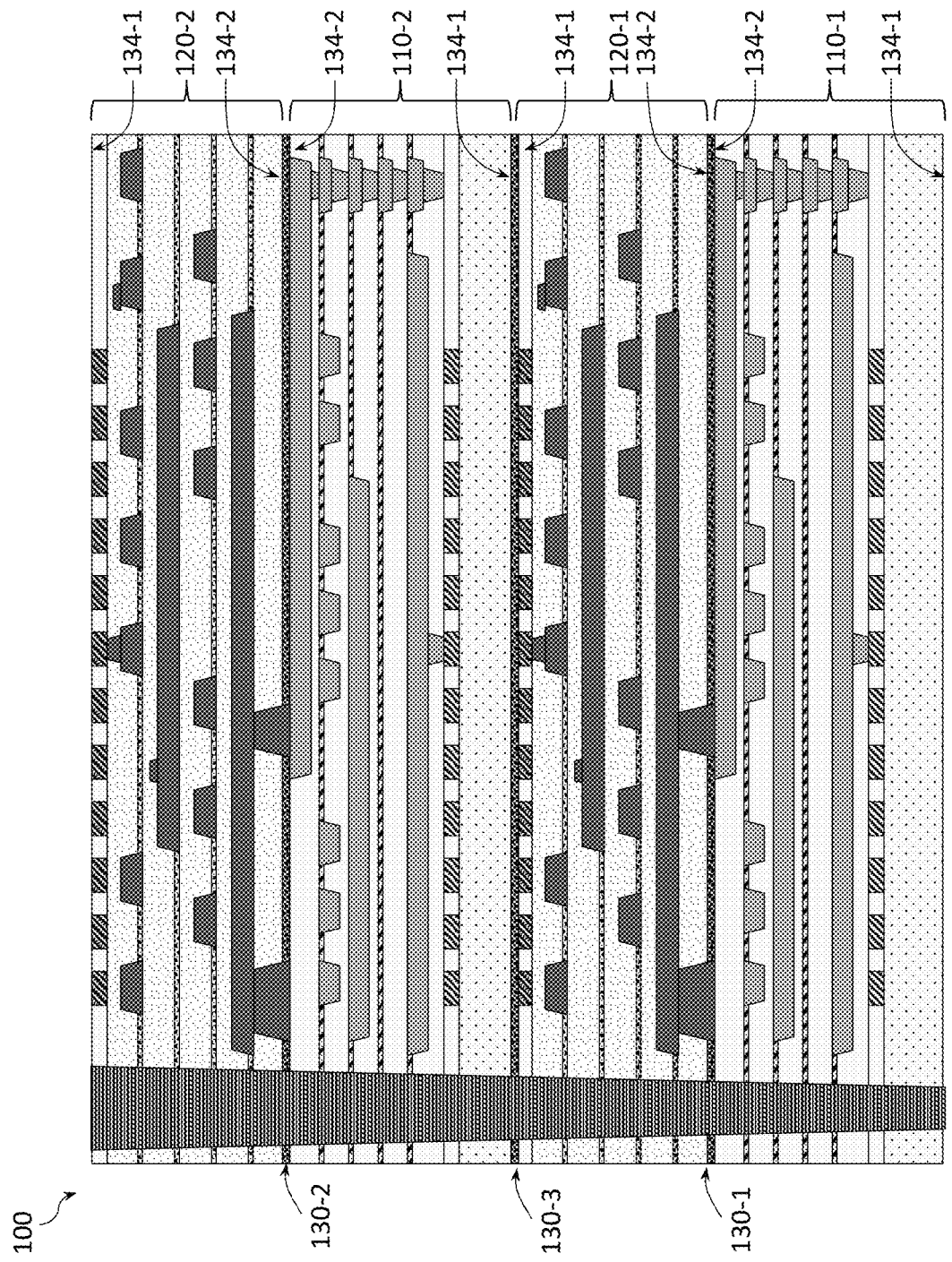
Figure 11C:
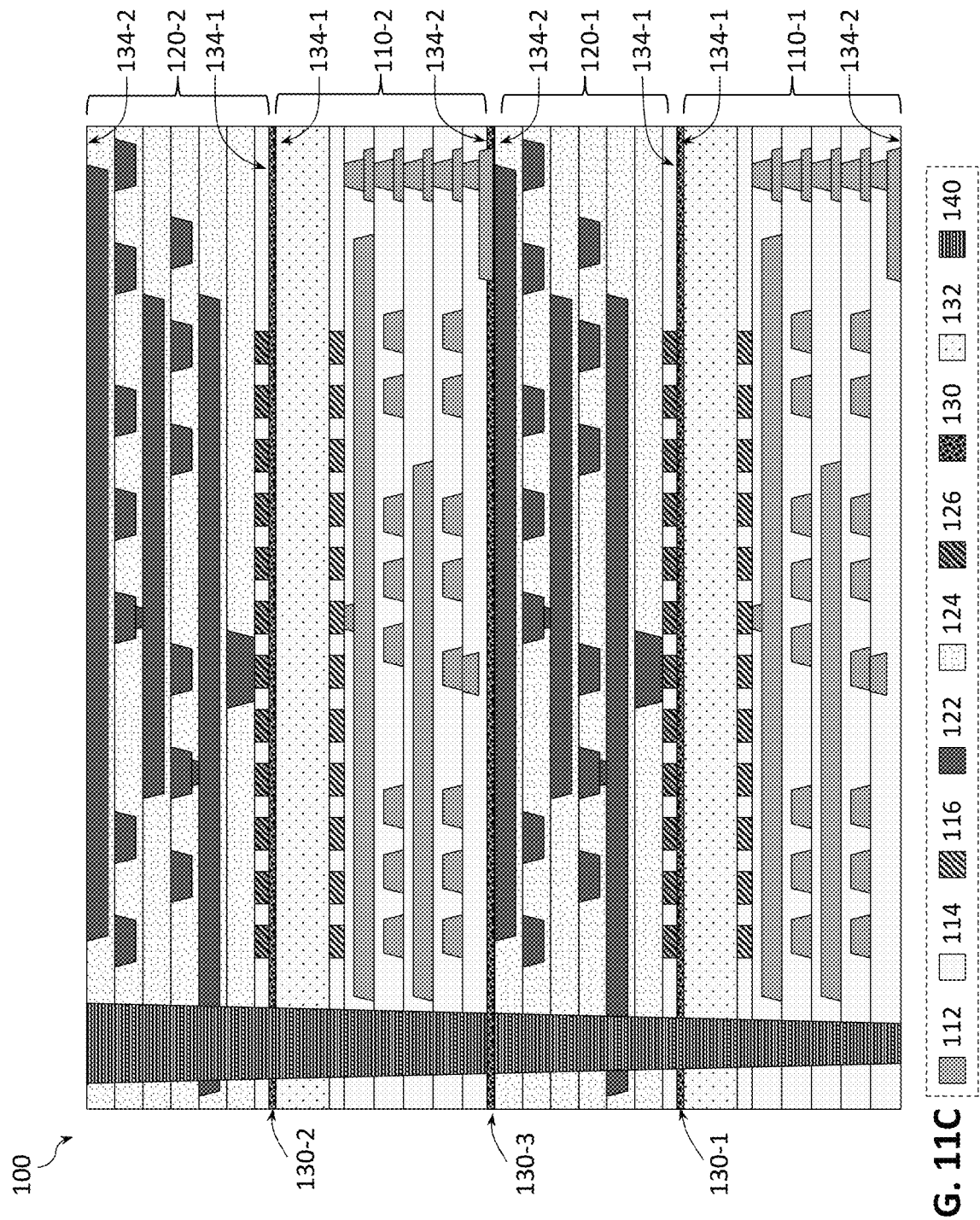

FIGS. 11A-11C illustrate cross-sectional side views of a microelectronic assembly 100 with an after-bonding via 140 extending through a plurality of pairs of bonded IC structures, in accordance with some embodiments.

As described above with reference to FIGS. 1-3, in some embodiments, the microelectronic assembly 100 may include three or more IC structures bonded together according to any bonding configurations described herein. FIGS. 11A-11C illustrate some examples of such embodiments where three pairs of IC structures 110, 120 are bonded together (i.e., where four IC structures are bonded together, forming three pairs). However, descriptions provided for FIGS. 11A-11C are equally applicable to embodiments of the microelectronic assemblies 100 where only three IC structures are bonded together (e.g., such embodiments may be envisioned by eliminating either the top or the bottom IC structure in the examples shown in FIGS. 11A-11C) or where more than four IC structures are bonded together. Furthermore, while FIGS. 11A-11C illustrate embodiments where the after-bonding via 140 extends from the top of the microelectronic assembly 100, further embodiments of the microelectronic assembly 100 as described with reference to FIGS. 11A-11C may include the after-bonding via 140 that, instead of extending from the top, extends from the bottom of the microelectronic assembly 100, as well as embodiments where any combination of two or more after-bonding vias 140, extending from the top and/or from the bottom, to different depths, are included. The backside 134-1 and the frontside 134-2 of each of the IC structures shown in FIGS. 11A-11C are labeled in accordance with the convention used in the previous drawings.

FIG. 11A illustrates a cross-sectional side view of a microelectronic assembly 100 that includes two pairs of f2f-bonded IC structures bonded together, thus forming three pairs of IC structures in total, and further including an after-bonding via 140 formed from the top, in accordance with some embodiments. The first pair is formed by the IC structures 110-1 and 120-1, bonded in an f2f bonding configuration similar to that shown, e.g., in FIG. 1, with the bonding material/interface 130-1 (i.e., the IC structures 110-1 and 120-1 of FIG. 11A are instances of the IC structures 110 and 120 of FIG. 1 and the bonding material 130-1 of FIG. 11A is one instance of the bonding material 130 of FIG. 1). The second pair is formed by the IC structures 110-2 and 120-2, also bonded in an f2f bonding configuration similar to that shown, e.g., in FIG. 1, with the bonding material/interface 130-2 (i.e., the IC structures 110-2 and 120-2 of FIG. 11A are other instances of the IC structures 110 and 120 of FIG. 1 and the bonding material 130-2 of FIG. 11A is another instance of the bonding material 130 of FIG. 1). Furthermore, as shown in FIG. 11A, the IC structure 120-1 of the first pair and the IC structure 110-2 of the second pair may be bonded in a b2b bonding configuration with the bonding material/interface 130-3 (i.e., the bonding material 130-3 of FIG. 11A is one instance of the bonding material 130 of the b2b bonding configuration embodiments of FIG. 3), thus forming a third pair of IC structures bonded together. All embodiments of the f2f and b2b bonding arrangements described above are applicable to the respective pairs of IC structures shown in FIG. 11A and, therefore, in the interests of brevity, are not repeated here. For example, while FIG. 11A illustrates the support structure 132 included as a part of the IC structure 110-2 having the backside 134-1 bonded to the backside 134-1 of the IC structure 120-1, in other embodiments, the support structure 132 may not be included in the IC structure 110-2, or it may be included in the IC structure 120-1.

FIG. 11B illustrates a cross-sectional side view of a microelectronic assembly 100 that includes two pairs of f2b-bonded IC structures bonded together, thus forming three pairs of IC structures in total, and further including an after-bonding via 140 formed from the top, in accordance with some embodiments. The first pair is formed by the IC structures 110-1 and 120-1, bonded in an f2b bonding configuration similar to that shown, e.g., in FIG. 2, with the bonding material/interface 130-1 (i.e., the IC structures 110-1 and 120-1 of FIG. 11B are instances of the IC structures 110 and 120 of FIG. 2 and the bonding material 130-1 of FIG. 11B is one instance of the bonding material 130 of FIG. 2). The second pair is formed by the IC structures 110-2 and 120-2, also bonded in an f2b bonding configuration similar to that shown, e.g., in FIG. 2, with the bonding material/interface 130-2 (i.e., the IC structures 110-2 and 120-2 of FIG. 11B are other instances of the IC structures 110 and 120 of FIG. 2 and the bonding material 130-2 of FIG. 11B is another instance of the bonding material 130 of FIG. 2). Furthermore, as shown in FIG. 11B, the IC structure 120-1 of the first pair and the IC structure 110-2 of the second pair may also be bonded in an f2b bonding configuration with the bonding material/interface 130-3 (i.e., the bonding material 130-3 of FIG. 11B is yet another instance of the bonding material 130 of the f2b bonding configuration embodiments of FIG. 2), thus forming a third pair of IC structures bonded together. All embodiments of the f2b bonding arrangements described above are applicable to the respective pairs of IC structures shown in FIG. 11B and, therefore, in the interests of brevity, are not repeated here.

FIG. 11C illustrates a cross-sectional side view of a microelectronic assembly 100 that includes two pairs of b2b-bonded IC structures bonded together, thus forming three pairs of IC structures in total, and further including an after-bonding via 140 formed from the top, in accordance with some embodiments. The first pair is formed by the IC structures 110-1 and 120-1, bonded in a b2b bonding configuration similar to that shown, e.g., in FIG. 3, with the bonding material/interface 130-1 (i.e., the IC structures 110-1 and 120-1 of FIG. 11C are instances of the IC structures 110 and 120 of FIG. 3 and the bonding material 130-1 of FIG. 11C is one instance of the bonding material 130 of FIG. 3). The second pair is formed by the IC structures 110-2 and 120-2, also bonded in a b2b bonding configuration similar to that shown, e.g., in FIG. 3, with the bonding material/interface 130-2 (i.e., the IC structures 110-2 and 120-2 of FIG. 11C are other instances of the IC structures 110 and 120 of FIG. 3 and the bonding material 130-2 of FIG. 11C is another instance of the bonding material 130 of FIG. 3). Furthermore, as shown in FIG. 11C, the IC structure 120-1 of the first pair and the IC structure 110-2 of the second pair may be bonded in an f2f bonding configuration with the bonding material/interface 130-3 (i.e., the bonding material 130-3 of FIG. 11C is one instance of the bonding material 130 of the f2f bonding configuration embodiments of FIG. 1), thus forming a third pair of IC structures bonded together. All embodiments of the f2f and b2b bonding arrangements described above are applicable to the respective pairs of IC structures shown in FIG. 11C and, therefore, in the interests of brevity, are not repeated here.

While the after-bonding via 140 is shown in FIGS. 11A-11C to extend as a TSV between the top and the bottom of the microelectronic assembly 100, in other embodiments of FIGS. 11A-11C, the after-bonding via 140 may be a blind via having a bottom that ends in any of the IC structures of the microelectronic assembly 100 and on any of the materials, as described with reference to FIGS. 5-10. Furthermore, the after-bonding via 140 may be electrically coupled to any component of one or more of the IC structures shown in FIGS. 11A-11C. Still further, besides what is shown in FIGS. 11A-11C, other arrangements of a plurality of the IC structures with one or more after-bonding vias 140 are possible and are within the scope of the present disclosure.

Example Packages with Microelectronic Assemblies Fabricated Using Hybrid Manufacturing Any embodiments of one or more microelectronic assemblies 100 as described herein may be included in an IC package. Some examples of such IC packages are shown in FIGS. 12A-12H, illustrating IC packages that may include one or more microelectronic assemblies 100 fabricated using hybrid manufacturing, in accordance with some embodiments.

Figure 12A:
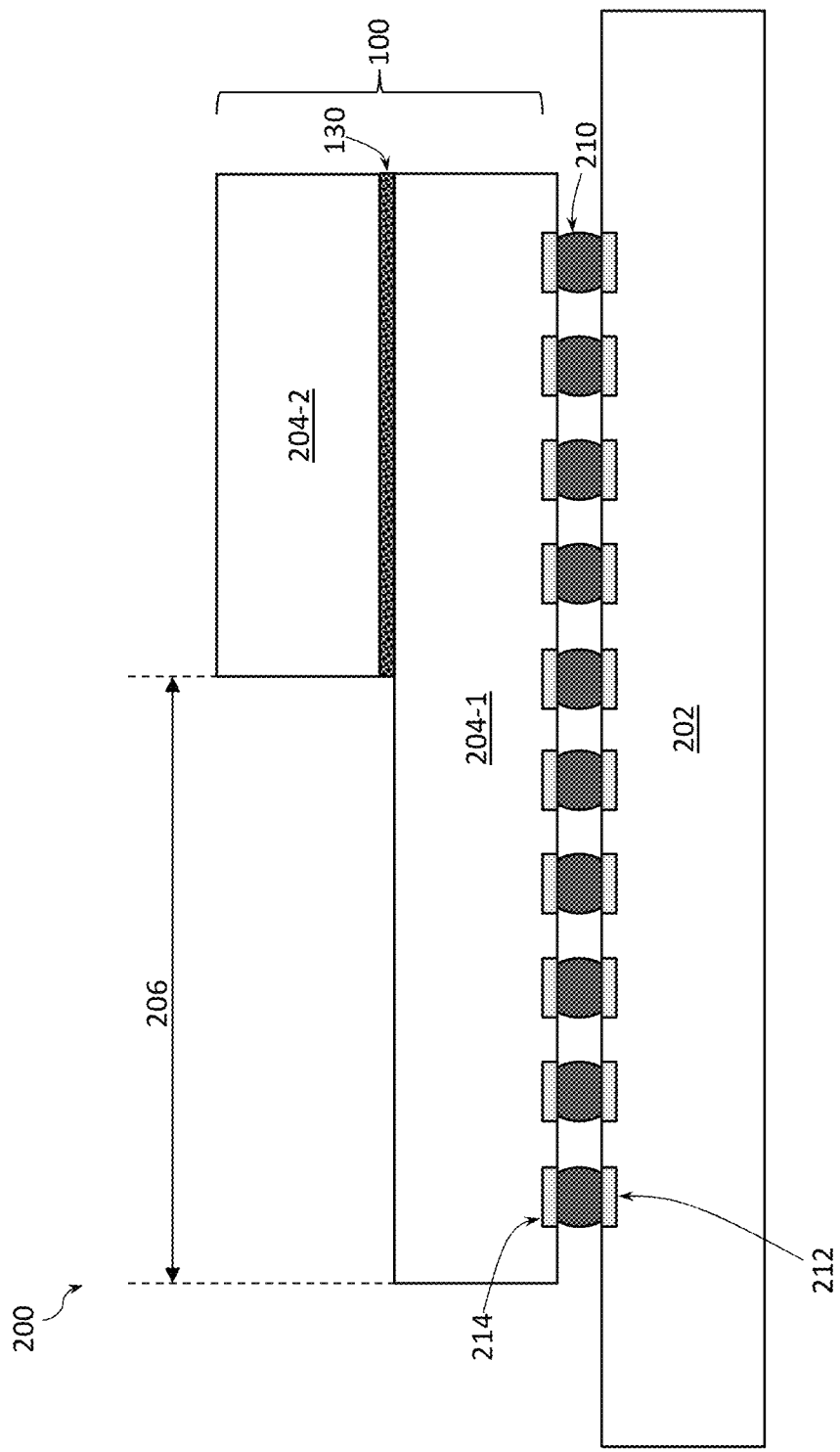
FIGS. 12A-12H illustrate IC packages that may include one or more microelectronic assemblies fabricated using hybrid manufacturing, in accordance with some embodiments.

FIG. 12A illustrates an IC package 200 that includes a package substrate 202, a die 204-1, and a die 204-2, according to some embodiments.

The package substrate 202 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 202 may be a dielectric material, such as an organic dielectric material, a fire retardant grade 4 material (FR-4), bismaleimide triazine (BT) resin, polyimide materials, glass reinforced epoxy matrix materials, or low-k and ultra-low-k dielectric (e.g., carbon-doped dielectrics, fluorine-doped dielectrics, porous dielectrics, and organic polymeric dielectrics). In particular, when the package substrate 202 is formed using standard printed circuit board (PCB) processes, the package substrate 202 may include FR-4, and the conductive pathways in the package substrate 202 may be formed by patterned sheets of copper separated by build-up layers of the FR-4. The conductive pathways in the package substrate 202 may be bordered by liner materials, such as adhesion liners and/or barrier liners, as suitable.

In some embodiments, the package substrate 202 may be a lower density medium and any of the dies 204 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

In some embodiments, the die 204-1 may include any of the IC structures disclosed herein and the die 204-2 may include any other of the IC structures disclosed herein so that the IC structure of the die 204-1 is bonded to the IC structure of the die 204-2 using hybrid bonding as described herein, with the bonding material/interface 130 as described herein shown in the illustration of FIG. 12A. For example, in some embodiments, the die 204-1 may include the IC structure 110 while the die 204-2 may include the IC structure 120, or vice versa, with the IC structures 110 and 120 of these dies being bonded to form a microelectronic assembly 100 according to any embodiments of the present disclosure. In other embodiments, any of the dies 204-1 and 204-2 may include a stack of two or more IC structures bonded together as described herein, with the IC structures of these dies being bonded to form a microelectronic assembly 100 according to any embodiments of the present disclosure. For example, in some embodiments, the die 204-1 may include a stack of the IC structure 110-1 bonded to the IC structure 120-1, while the die 204-2 may include a stack of the IC structure 110-2 bonded to the IC structure 120-2, and the IC structure 120-1 of the stack of the die 204-1 may be bonded to the IC structurer 110-2 of the stack of the die 204-2 with the bonding material/interface 130 that is shown in FIG. 12A. For example, such dies 204-1 and 204-2 may include IC structures of the microelectronic assembly 100 according to any embodiments of FIGS. 11A-11C. In general, any of the dies 204-1 and 204-2 may include any number of one or more IC structures bonded with other IC structures, either within the same die or with the IC structures of the other die, to form the microelectronic assembly 100 according to any of the hybrid bonding embodiments described herein. Example structures that may be included in the dies 204 disclosed herein are discussed below with reference to FIG. 14.

In various embodiments of the IC package 200, the different dies 204 (as shown in any of FIGS. 12A-12H) may include any suitable circuitry. For example, in some embodiments, the die 204-1 may be an active or passive die, and the die 204-2 may include input/output circuitry, high-bandwidth memory, and/or enhanced dynamic random-access memory (EDRAM). Because the dies 204-1 and 204-2 include the IC structures 110 and/or 120 as described herein, descriptions of the circuits and devices that the IC structures 110, 120 may include, or be a part of, provided above, are applicable to the dies 204-1 and 204-2. For example, in some embodiments, the die 204-1 may include a power delivery circuitry and the die 204-2 may include a memory device, e.g., a high-bandwidth memory device, or, in other embodiments, the die 204-1 may include input/output circuitry and the die 204-2 may include a field programmable gate array logic. In some embodiments, any of the dies 204 may include one or more device layers including transistors (e.g., as discussed below with reference to FIG. 14.

In some embodiments, one of the dies 204-1 and 204-2 may have a smaller footprint than the other, e.g., shown in the example of FIG. 12A with the die 204-2 being narrower than the die 204-1. For example, in some embodiments, a width of the die 204-1 may be larger than a width of the die 204-2 by a distance 206. In some embodiments, the distance 206 may be between about 0.5 millimeters and 5 millimeters (e.g., between about 0.75 millimeters and 2 millimeters, or approximately 1 millimeter). Although the die 204-2 is shown to be aligned with the die 204-1 on the right side, as the IC structures 110 and 120 are shown to be aligned in various ones of FIGS. 1-11, there does not have to be such alignment in various embodiments of the IC packages 200 and in various embodiments of the microelectronic assemblies 100 as described herein.

As shown in FIG. 12A, the package substrate 202 may be coupled to the die 204-1 by die-to-package substrate (DTPS) interconnects 210. In particular, the top surface of the package substrate 202 may include a set of conductive contacts 212, and the bottom surface of the die 204-1 may include a set of conductive contacts 214; the conductive contacts 214 at the bottom surface of the die 204-1 may be electrically and mechanically coupled to the conductive contacts 212 at the top surface of the package substrate 202 by the DTPS interconnects 210. Any of the conductive contacts disclosed herein (e.g., the conductive contacts 212, 214, 222, 224, 232, 234, etc.) may include bond pads, posts, or any other suitable conductive contacts, for example.

Figure 12B:
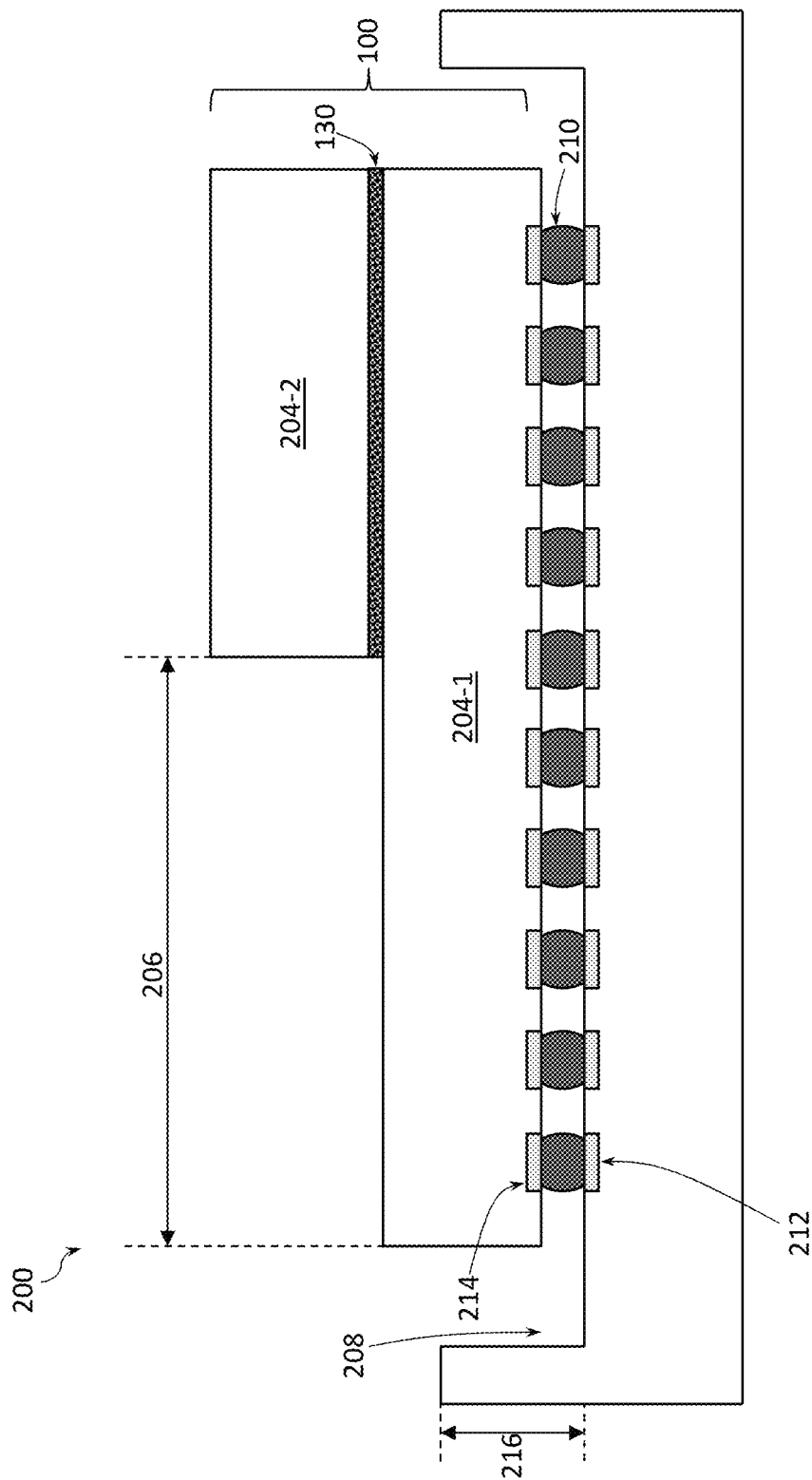

In the embodiment of FIG. 12A, the die 204-1 is not be disposed in a recess in the package substrate 202, but, in other embodiments of the IC package 200, the top surface of the package substrate 202 may include a recess 208 in which the die 204-1 is at least partially disposed and the conductive contacts 212 to which the die 204-1 is coupled may be located at the bottom of the recess 208, as shown in FIG. 12B. For example, in some embodiments, the recess 208 may be laser-drilled down to a planar metal stop in the package substrate 202 (not shown); once the metal stop is reached, the metal stop may be removed to expose the conductive contacts 212 at the bottom of the recess 208. In some embodiments, the recess 208 may be formed by a mechanical drill. In some embodiments, a depth 216 of the recess 208 may be between about 10 microns and 200 microns (e.g., between about 10 microns and 30 microns, between about 30 microns and 100 microns, between about 60 microns and 80 microns, or approximately 75 microns). In some embodiments, the depth 216 may be equal to a certain number of layers of the dielectric material in the package substrate 202. For example, the depth 216 may be approximately equal to between one and five layers of the dielectric material in the package substrate 202 (e.g., two or three layers of the dielectric material). In some embodiments, the depth 216 may be equal to the thickness of a solder resist material (not shown) on the top surface of the package substrate 202. In some embodiments, the top surface of the die 204-1 may extend higher than the top surface of the package substrate 202, as illustrated in FIG. 12B. In other embodiments, the top surface of the die 204-1 may be substantially coplanar with the top surface of the package substrate 202, or may be recessed below the top surface of the package substrate 202.

The rest of the descriptions provided with respect to FIG. 12A are applicable to, and may be combined with, the embodiment of FIG. 12B (and vice versa), and, therefore, in the interests of brevity, are not repeated.

The DTPS interconnects 210 disclosed herein may take any suitable form. In some embodiments, a set of DTPS interconnects 210 may include solder (e.g., solder bumps or balls that are subject to a thermal reflow to form the DTPS interconnects 210). DTPS interconnects 210 that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects 210 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

Figure 12C:
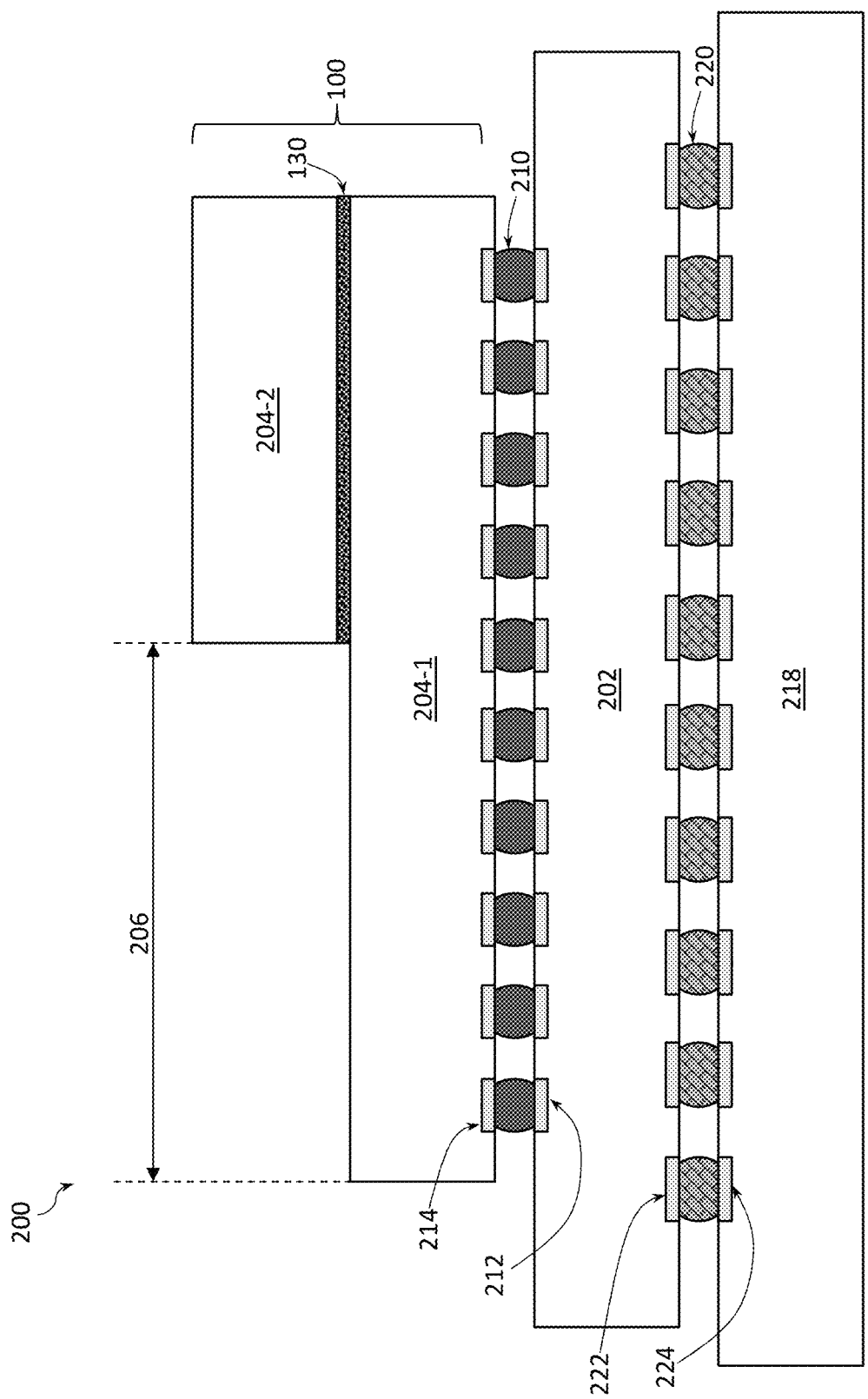

FIG. 12C illustrates that, in some embodiments, the IC package 200 may also include a circuit board 218. The package substrate 202 may be coupled to the circuit board 218 by second-level interconnects 220 at the bottom surface of the package substrate 202. In particular, the package substrate 202 may include conductive contacts 222 at its bottom surface, and the circuit board 218 may include conductive contacts 224 at its top surface. The second-level interconnects 220 may electrically and mechanically couple the conductive contacts 224 and the conductive contacts 222. The second-level interconnects 220 illustrated in FIG. 12C are solder balls (e.g., for a ball grid array arrangement), but any suitable second-level interconnects 220 may be used (e.g., pins in a pin grid array arrangement or lands in a land grid array arrangement) in other embodiments of the IC package 200. The circuit board 218 may be a motherboard, for example, and may have other components attached to it (not shown). The circuit board 218 may include conductive pathways and other conductive contacts (not shown) for routing power, ground, and signals through the circuit board 218, as known in the art. In some embodiments, the second-level interconnects 220 may not couple the package substrate 202 to a circuit board 218, but may instead couple the package substrate 202 to another IC package, an interposer, or any other suitable component.

In some embodiments, one or more of the conductive pathways in the package substrate 202 may extend between one or more conductive contacts 212 at the top surface of the package substrate 202 and one or more conductive contacts 222 at the bottom surface of the package substrate 202, as shown in FIG. 12C. In some embodiments, one or more of the conductive pathways in the package substrate 202 may extend between one or more conductive contacts 212 at the bottom of the recess 208 as shown in FIG. 12B and one or more conductive contacts 222 at the bottom surface of the package substrate 202. In some embodiments, one or more of the conductive pathways in the package substrate 202 may extend between different conductive contacts 212 at the top surface of the package substrate 202. In some embodiments, one or more of the conductive pathways in the package substrate 202 may extend between different conductive contacts 222 at the bottom surface of the package substrate 202. The rest of the descriptions provided with respect to FIG. 12A and FIG. 12B are applicable to, and may be combined with, the embodiment of FIG. 12C (and vice versa), and, therefore, in the interests of brevity, are not repeated.

In some embodiments, the die 204-1 of the IC package 200 as described herein may be a single-sided die (in the sense that the die 204-1 only has conductive contacts 214 on a single surface), as, e.g., shown in FIGS. 12A-12C. In other embodiments, the die 204-1 of the IC package 200 as described herein may be a double-sided (or "multi-level," or "omni-directional") die (in the sense that the die 204-1 has conductive contacts 214 on one surface and further conductive contacts on the opposing surface). One example of such implementation is shown in FIG. 12D.

Figure 12D:
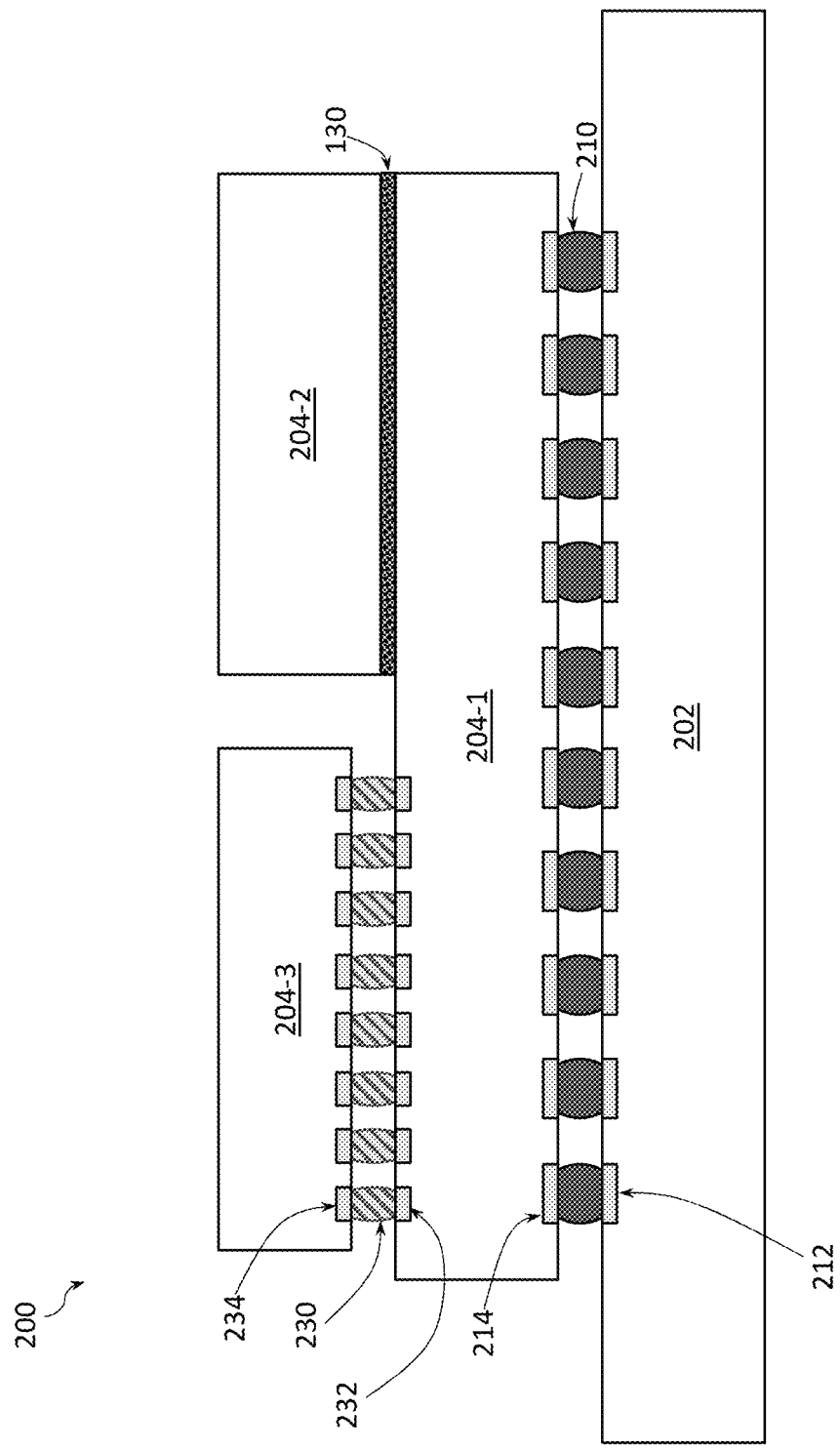

FIG. 12D illustrates that, in some embodiments, the IC package 200 may further include a die 204-3. In some embodiments, the die 204-3 may be electrically and mechanically coupled to the die 204-1 by die-to-die (DTD) interconnects 230. In particular, the top surface of the die 204-1 may include a set of conductive contacts 232, and the bottom surface of the die 204-3 may include a set of conductive contacts 234. One or more of the conductive contacts 234 at the bottom surface of the die 204-3 may be electrically and mechanically coupled to some of the conductive contacts 232 at the top surface of the die 204-1 by the DTD interconnects 230. FIG. 12D illustrates that the pitch of the DTD interconnects 230 may be different from the pitch of the DTPS interconnects 210 in some embodiments (in other embodiments, these pitches may be substantially the same). In some embodiments, the die 204-3 of the IC package 200 may be a single-sided die (in the sense that the die 204-3 only has conductive contacts 234 on a single surface), as shown in FIG. 12D. In other embodiments (not specifically shown), the die 204-3 of the IC package 200 as described herein may be a double-sided die (in the sense that the die 204-3 has conductive contacts 234 on one surface and further conductive contacts on the opposing surface, the latter configured to couple the die 204-3 to further components). Although not specifically shown in FIG. 12D, in some embodiments, the die 204-3 may be electrically and mechanically coupled to the package substrate 202 by DTPS interconnects similar to how the die 204-1 is coupled to the package substrate 202 by the DTPS interconnects 210.

The DTD interconnects 230 disclosed herein may take any suitable form. The DTD interconnects 230 may have a finer pitch than the DTPS interconnects 210 in an IC package. In some embodiments, the dies 204 on either side of a set of DTD interconnects 230 may be unpackaged dies, and/or the DTD interconnects 230 may include small conductive bumps or pillars (e.g., copper bumps or pillars) attached to the respective conductive contacts 232, 234 by solder. The DTD interconnects 230 may have too fine a pitch to couple to the package substrate 202 directly (e.g., to fine to serve as DTPS interconnects 210). In some embodiments, a set of DTD interconnects 230 may include solder. DTD interconnects 230 that include solder may include any appropriate solder material, such as any of the materials discussed above. In some embodiments, a set of DTD interconnects 230 may include an anisotropic conductive material, such as any of the materials discussed above. In some embodiments, the DTD interconnects 230 may be used as data transfer lanes, while the DTPS interconnects 210 may be used for power and ground lines, among others.

In some embodiments, some or all of the DTD interconnects 230 in an IC package 200 may be metal-to-metal interconnects (e.g., copper-to-copper interconnects, or plated interconnects). In such embodiments, the conductive contacts 232, 234 on either side of the DTD interconnect 230 may be bonded together (e.g., under elevated pressure and/or temperature) without the use of intervening solder or an anisotropic conductive material. In some embodiments, a thin cap of solder may be used in a metal-to-metal interconnect to accommodate planarity, and this solder may become an intermetallic compound during processing. In some metal-to-metal interconnects that utilize hybrid bonding, a dielectric material (e.g., silicon oxide, silicon nitride, silicon carbide, or an organic layer) may be present between the metals bonded together (e.g., between copper pads or posts that provide the associated conductive contacts 232, 234). In some embodiments, one side of a DTD interconnect 230 may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 230 in an IC package 200 may be solder interconnects that include a solder with a higher melting point than a solder included in some or all of the DTPS interconnects 210. For example, when the DTD interconnects 230 in a IC package 200 are formed before the DTPS interconnects 210 are formed, solder-based DTD interconnects 230 may use a higher-temperature solder (e.g., with a melting point above 200 degrees Celsius), while the DTPS interconnects 210 may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium.

In the IC packages 200 disclosed herein, some or all of the DTPS interconnects 210 may have a larger pitch than some or all of the DTD interconnects 230. DTD interconnects 230 may have a smaller pitch than DTPS interconnects 210 due to the greater similarity of materials in the different dies 204 on either side of a set of DTD interconnects 230 than between the die 204 and the package substrate 202 on either side of a set of DTPS interconnects 210. In particular, the differences in the material composition of a die 204 and a package substrate 202 may result in differential expansion and contraction of the die 204 and the package substrate 202 due to heat generated during operation (as well as the heat applied during various manufacturing operations). To mitigate damage caused by this differential expansion and contraction (e.g., cracking, solder bridging, etc.), the DTPS interconnects 210 may be formed larger and farther apart than DTD interconnects 230, which may experience less thermal stress due to the greater material similarity of the pair of dies 204 on either side of the DTD interconnects. In some embodiments, the DTPS interconnects 210 disclosed herein may have a pitch between about 80 microns and 300 microns, while the DTD interconnects 230 disclosed herein may have a pitch between about 7 microns and 100 microns.

The rest of the descriptions provided with respect to FIG. 12A-12C are applicable to, and may be combined with, the embodiment of FIG. 12D (and vice versa), and, therefore, in the interests of brevity, are not repeated.

Figure 12E:
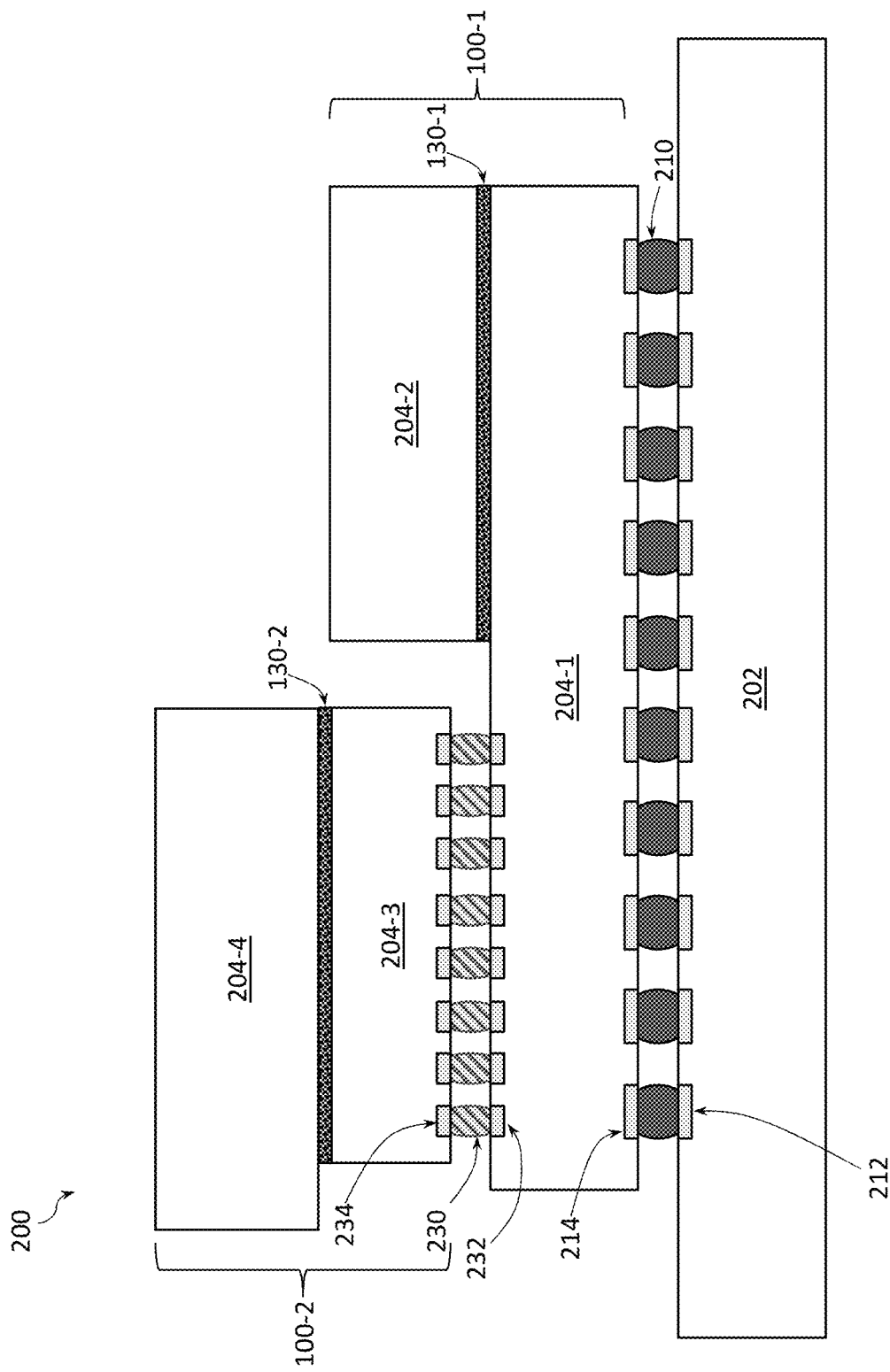

FIG. 12E illustrates that, in some embodiments, the IC package 200 may further include a die 204-4, bonded to the die 204-3 using hybrid bonding as described herein. In some embodiments, the die 204-3 may include any of the IC structures disclosed herein and the die 204-4 may include any other of the IC structures disclosed herein so that the IC structure of the die 204-3 is bonded to the IC structure of the die 204-4 using hybrid bonding as described herein, with the bonding material/interface 130-2 as described herein shown in the illustration of FIG. 12E. For example, in some embodiments, the die 204-3 may include the IC structure 110 while the die 204-4 may include the IC structure 120, or vice versa, with the IC structures 110 and 120 of these dies being bonded to form a microelectronic assembly 100-2 according to any embodiments of the present disclosure. In other embodiments, any of the dies 204-3 and 204-4 may include a stack of two or more IC structures bonded together as described herein, with the IC structures of these dies being bonded to form a microelectronic assembly 100-2 according to any embodiments of the present disclosure. For example, in some embodiments, the die 204-3 may include a stack of the IC structure 110-1 bonded to the IC structure 120-1, while the die 204-4 may include a stack of the IC structure 110-2 bonded to the IC structure 120-2, and the IC structure 120-1 of the stack of the die 204-3 may be bonded to the IC structurer 110-2 of the stack of the die 204-4 with the bonding material/interface 130-2 that is shown in FIG. 12E. For example, such dies 204-3 and 204-4 may include IC structures of the microelectronic assembly 100 according to any embodiments of FIGS. 11A-11C. In general, any of the dies 204-3 and 204-4 may include any number of one or more IC structures bonded with other IC structures, either within the same die or with the IC structures of the other die, to form the microelectronic assembly 100-2 according to any of the hybrid bonding embodiments described herein. The microelectronic assembly 100 and the bonding material 130 as were shown in FIG. 12A have been re-labeled in FIG. 12E as, respectively, the microelectronic assembly 100-1 and the bonding material 130-1, to differentiate between different instances of the microelectronic assembly 100 and the bonding material 130 as shown in FIG. 12E.

In some embodiments, one of the dies 204-3 and 204-4 may have a smaller footprint than the other, e.g., shown in the example of FIG. 12E with the die 204-3 being narrower than the die 204-4. For example, in some embodiments, a width of the die 204-4 may be larger than a width of the die 204-3 by a distance that may be between about 0.5 millimeters and 5 millimeters (e.g., between about 0.75 millimeters and 2 millimeters, or approximately 1 millimeter).

Although the die 204-4 is shown to be aligned with the die 204-3 on the right side, there does not have to be such alignment in various embodiments of the IC packages 200 as described herein. The rest of the descriptions provided with respect to FIG. 12A-12D are applicable to, and may be combined with, the embodiment of FIG. 12E (and vice versa), and, therefore, in the interests of brevity, are not repeated.

Figure 12F:
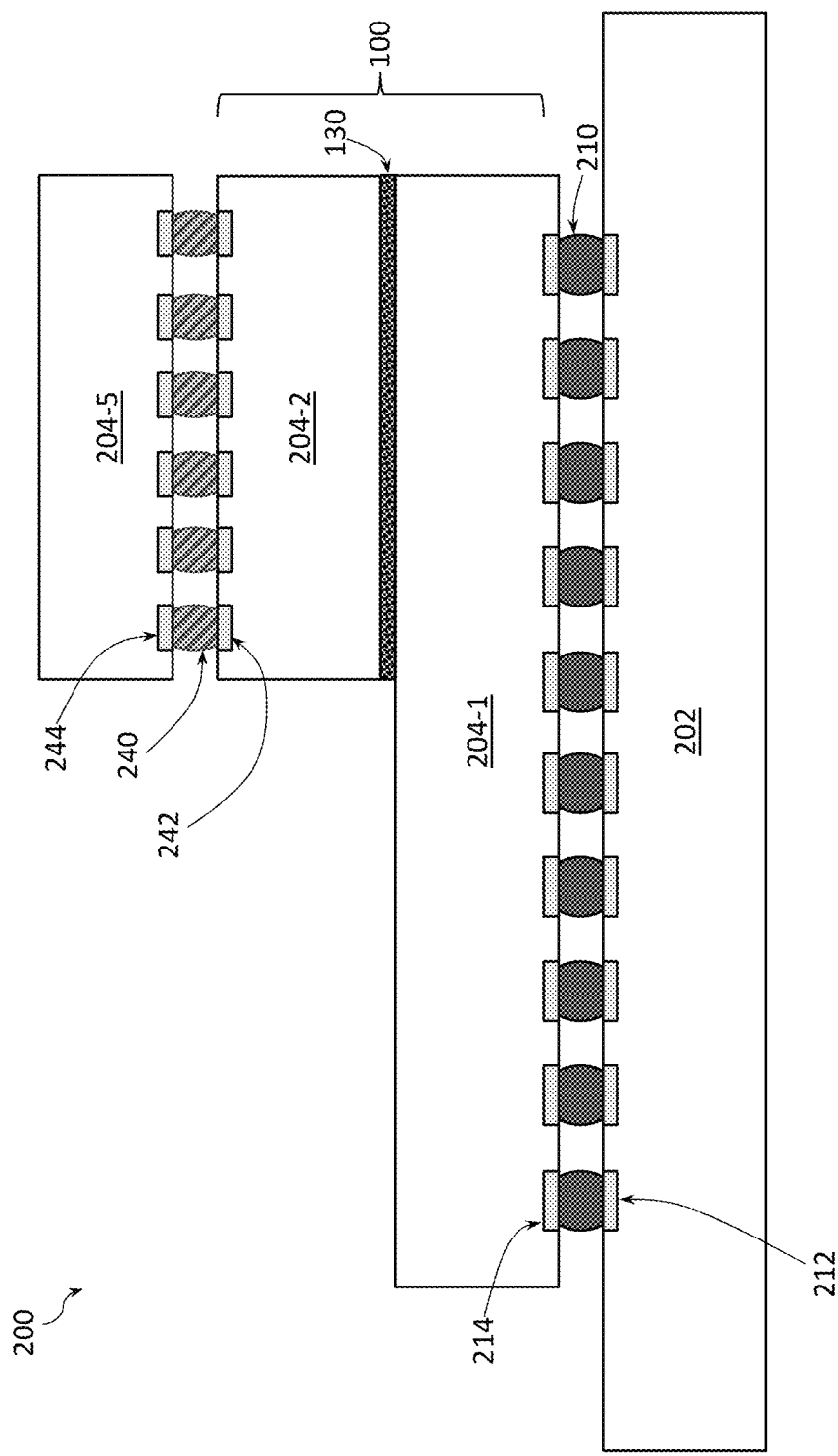

FIG. 12F illustrates that, in some embodiments, the IC package 200 may further include a die 204-5. In some embodiments, the die 204-5 may be electrically and mechanically coupled to the die 204-2 by DTD interconnects 240, similar to the DTD interconnects 230, described above. In particular, the top surface of the die 204-2 may include a set of conductive contacts 242, and the bottom surface of the die 204-5 may include a set of conductive contacts 244. One or more of the conductive contacts 244 at the bottom surface of the die 204-5 may be electrically and mechanically coupled to some of the conductive contacts 242 at the top surface of the die 204-2 by the DTD interconnects 240. FIG. 12F illustrates that the pitch of the DTD interconnects 240 may be different from the pitch of the DTPS interconnects 210 in some embodiments (in other embodiments, these pitches may be substantially the same). In some embodiments, the die 204-5 of the IC package 200 may be a single-sided die (in the sense that the die 204-5 only has conductive contacts 244 on a single surface), as shown in FIG. 12F. In other embodiments (not specifically shown), the die 204-5 of the IC package 200 as described herein may be a double-sided die (in the sense that the die 204-5 has conductive contacts 244 on one surface and further conductive contacts on the opposing surface, the latter configured to couple the die 204-5 to further components). Although not specifically shown in FIG. 12F, in some embodiments, the die 204-5 may be electrically and mechanically coupled to the package substrate 202 by DTPS interconnects similar to how the die 204-1 is coupled to the package substrate 202 by the DTPS interconnects 210. The rest of the descriptions provided with respect to FIG. 12A-12E a are applicable to, and may be combined with, the embodiment of FIG. 12F (and vice versa), and, therefore, in the interests of brevity, are not repeated.

Figure 12G:
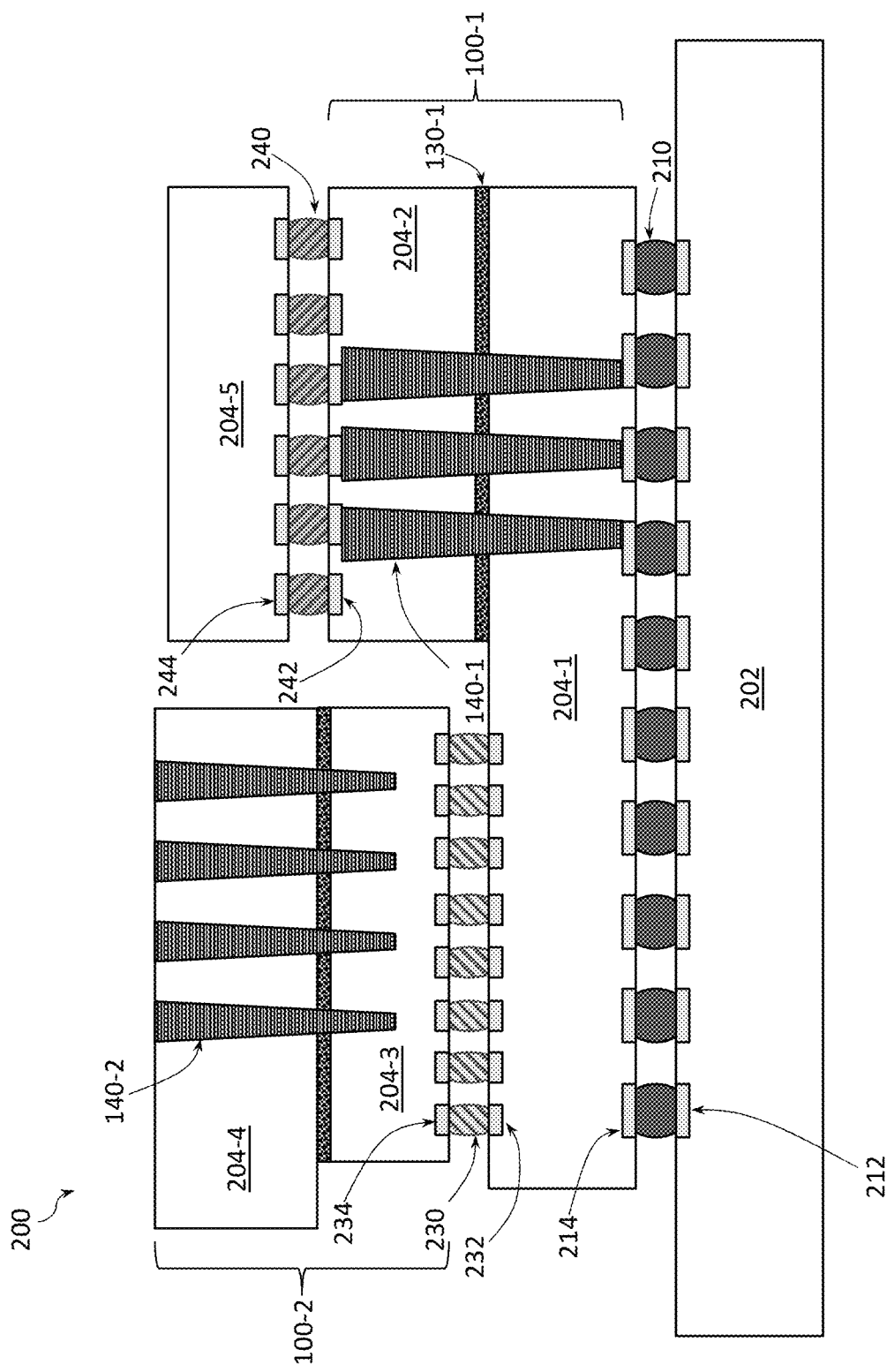

FIG. 12G illustrates an embodiment of the IC package 200 that includes the dies 204-3 and 204-4 as shown in FIG. 12E and the die 204-5 as shown in FIG. 12F. FIG. 12G further illustrates after-bonding vias 140-1 provided in the microelectronic assembly 100-1 and after-bonding vias 140-2 provided in the microelectronic assembly 100-2. Also a certain number and certain arrangements of the dies 204 and the after-bonding vias 140 are shown in FIG. 12G, this is purely for illustrative purposes and in other embodiments, other arrangements of the dies 204 and the after-bonding vias 140 are possible and within the scope of the present disclosure. Any of the after-bonding vias 140 shown in FIG. 12G may be implemented according to any of the embodiments of the after-bonding vias 140 as described herein, e.g., according to any of the embodiments of FIGS. 5-11.

FIG. 12G is intended to illustrate two features that may be implemented in various embodiments of the IC package 200.

One feature is that, in general, any of the after-bonding vias 140 in the one or more of the microelectronic assemblies 100 included in the IC package 200 may, but do not have to, couple to conductive contacts that couple the dies to other components via, e.g., DTD interconnects or DTPS interconnects. For example, FIG. 12G illustrates that at least some of the after-bonding vias 140-1 may be coupled to one or more of the conductive contacts 214 at the bottom of the microelectronic assembly 100-1 and to one or more of the conductive contacts 242 at the top of the microelectronic assembly 100-1. Although not specifically shown, in further embodiments of FIG. 12G, at least some of the after-bonding vias 140-1 may not be coupled to the conductive contacts vias 214 and/or to the conductive contacts 242. FIG. 12G further illustrates that at least some of the after-bonding vias 140-2 may not be coupled to any of the conductive contacts. Although not specifically shown, in further embodiments of FIG. 12G, at least some of the after-bonding vias 140-2 may be coupled to one or more of the conductive contacts 234.

Another feature is that, in general, the pitch of various interconnects between different dies 204 of the IC package 200 may be any suitable pitch and, in some embodiments, some or all of the pitches may be different, or some or all of the pitches may be the same. For example, in various embodiments, the pitch of the after-bonding vias 140-1 may be 1) different or the same as the pitch of the DTPS interconnects 210, and/or 2) different or the same as the pitch of the DTD interconnects 230 and/or 240, and/or 3) different or the same as the pitch of the after-bonding vias 140-2. In another example, in various embodiments, the pitch of the after-bonding vias 140-2 may be 1) different or the same as the pitch of the DTPS interconnects 210, and/or 2) different or the same as the pitch of the DTD interconnects 230 and/or 240, and/or 3) different or the same as the pitch of the after-bonding vias 140-1. In yet another embodiments, the pitch of the DTPS interconnects 210 may be 1) different or the same as the pitch of the after-bonding vias 140-1, and/or 2) different or the same as the pitch of the DTD interconnects 230 and/or 240, and/or 3) different or the same as the pitch of the after-bonding vias 140-2. Although not specifically shown in FIG. 12, in various further embodiments of the IC package 200, any of the dies 204 may be a mixed-pitch die (in the sense that any of the dies 204 may have multiple sets of conductive contacts and/or multiple sets of the after-bonding vias 140 with different pitch). The rest of the descriptions provided with respect to FIG. 12A-12F a are applicable to, and may be combined with, the embodiment of FIG. 12G (and vice versa), and, therefore, in the interests of brevity, are not repeated.

Figure 12H:
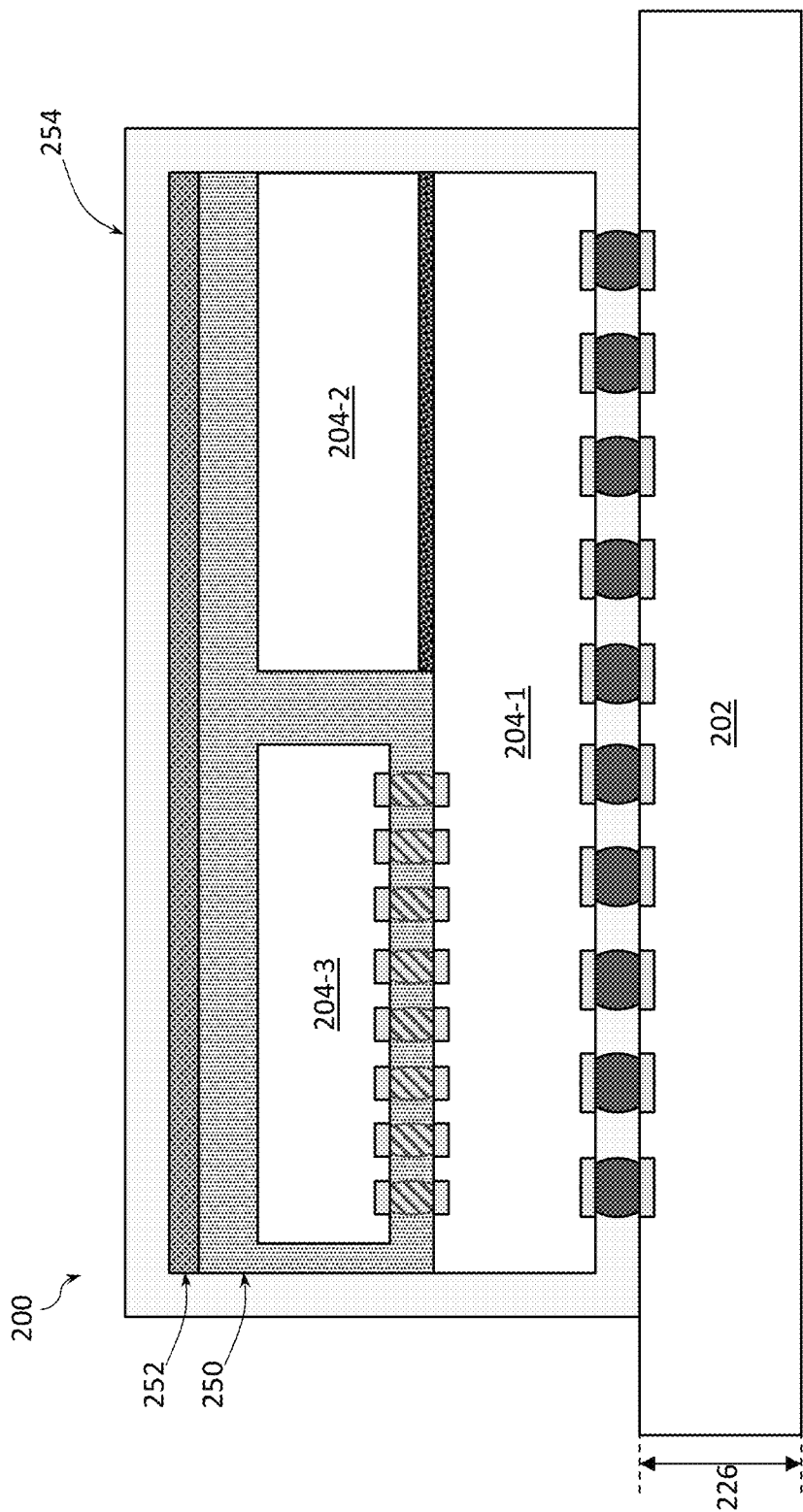

FIG. 12H illustrates an embodiment of the IC package 200 that may further include one or more of a mold material 250, a thermal interface material (TIM) 252, and a heat spreader 254. Although the mold material 250, the TIM 252, and the heat spreader 254 are shown for the example of the IC package 200 as shown in FIG. 12D (where not all of the reference numerals shown in FIG. 12D are shown in FIG. 12H in order to not clutter the drawing), one or more of the mold material 250, the TIM 252, and the heat spreader 254 may be used with any other embodiments of the IC package 200 as described herein.

The mold material 250 may extend around one or more of the dies 204 on the package substrate 202. In some embodiments, the mold material 250 may extend above one or more of the dies 204 on the package substrate 202. In some embodiments, the mold material 250 may extend between one or more of the dies 204 and the package substrate 202 around the associated DTPS interconnects 210. In such embodiments, the mold material 250 may serve as an underfill material. In some embodiments, the mold material 250 may extend between different ones of the dies 204 around the associated DTD interconnects 230. In such embodiments, the mold material 250 may serve as an underfill material. The mold material 250 may include multiple different mold materials (e.g., an underfill material, and a different overmold material). The mold material 250 may be an insulating material, such as an appropriate epoxy material. In some embodiments, the mold material 250 may include an underfill material that is an epoxy flux that assists with soldering the die 204-1 to the package substrate 202 when forming the DTPS interconnects 210, and then polymerizes and encapsulates the DTPS interconnects 210. The mold material 250 may be selected to have a coefficient of thermal expansion (CTE) that may mitigate or minimize the stress between the dies 204 and the package substrate 202 arising from uneven thermal expansion in the IC package 200. In some embodiments, the CTE of the mold material 250 may have a value that is intermediate to the CTE of the package substrate 202 (e.g., the CTE of the dielectric material of the package substrate 202) and a CTE of the dies 204.

The TIM 252 may include a thermally conductive material (e.g., metal particles) in a polymer or other binder. The TIM 252 may be a thermal interface material paste or a thermally conductive epoxy (which may be a fluid when applied and may harden upon curing, as known in the art). The TIM 252 may provide a path for heat generated by the dies 204 to readily flow to the heat spreader 254, where it may be spread and/or dissipated. Some embodiments of the IC package 200 of FIG. 12H may include a sputtered backside metallization (not shown) across the mold material 250 and the dies 204. In such embodiments, the TIM 252 (e.g., a solder TIM) may be disposed on this backside metallization.

The heat spreader 254 may be used to move heat away from the dies 204 (e.g., so that the heat may be more readily dissipated by a heat sink or other thermal management device). The heat spreader 254 may include any suitable thermally conductive material (e.g., metal, appropriate ceramics, etc.), and may include any suitable features (e.g., fins). In some embodiments, the heat spreader 254 may be an integrated heat spreader.

The rest of the descriptions provided with respect to FIG. 12A-12G a are applicable to, and may be combined with, the embodiment of FIG. 12H (and vice versa), and, therefore, in the interests of brevity, are not repeated.

In some embodiments of FIG. 12, the die 204-1 may provide high density interconnect routing in a localized area of the IC package 200. In some embodiments, the presence of the die 204-1 may support direct chip attach of fine-pitch semiconductor dies (e.g., the dies 204-2 and 204-3) that cannot be attached entirely directly to the package substrate 202. In particular, as discussed above, the die 204-1 may support trace widths and spacings that are not achievable in the package substrate 202. The proliferation of wearable and mobile electronics, as well as Internet of Things (loT) applications, are driving reductions in the size of electronic systems, but limitations of the PCB manufacturing process and the mechanical consequences of thermal expansion during use have meant that chips having fine interconnect pitch cannot be directly mounted to a PCB. Various embodiments of the IC packages 200 disclosed herein may be capable of supporting chips with high density interconnects and chips with low-density interconnects without sacrificing performance or manufacturability.

In various embodiments of FIG. 12, any of the dies 204-3 and 204-5 may be a single-sided, single-pitch die; in other embodiments, any of the dies 204-3 and 204-5 may be a double-sided die, and additional components may be disposed on the top surface of any of the dies 204-3 and 204-5. Additional passive components, such as surface-mount resistors, capacitors, and/or inductors, may be disposed on the top surface or the bottom surface of the package substrate 202, or embedded in the package substrate 202. More generally, any suitable number of the dies 204 in an IC package 200 may be double-sided dies 204.

The elements of the IC package 200 may have any suitable dimensions. Only a subset of the accompanying figures are labeled with reference numerals representing dimensions, but this is simply for clarity of illustration, and any of the IC packages 200 disclosed herein may have components having the dimensions discussed herein. For example, in some embodiments, a thickness 226 (labeled in FIG. 12H) of the package substrate 202 may be between about 0.1 millimeters and 1.4 millimeters (e.g., between about 0.1 millimeters and 0.35 millimeters, between about 0.25 millimeters and 0.8 millimeters, or approximately 1 millimeter).

Example Devices

The microelectronic assemblies manufactured according to hybrid manufacturing and IC packages that include such microelectronic assemblies, disclosed herein, may be included in any suitable electronic device. FIGS. 13-16 illustrate various examples of apparatuses that may include one or more of the microelectronic assemblies and IC packages disclosed herein.

Figure 14:
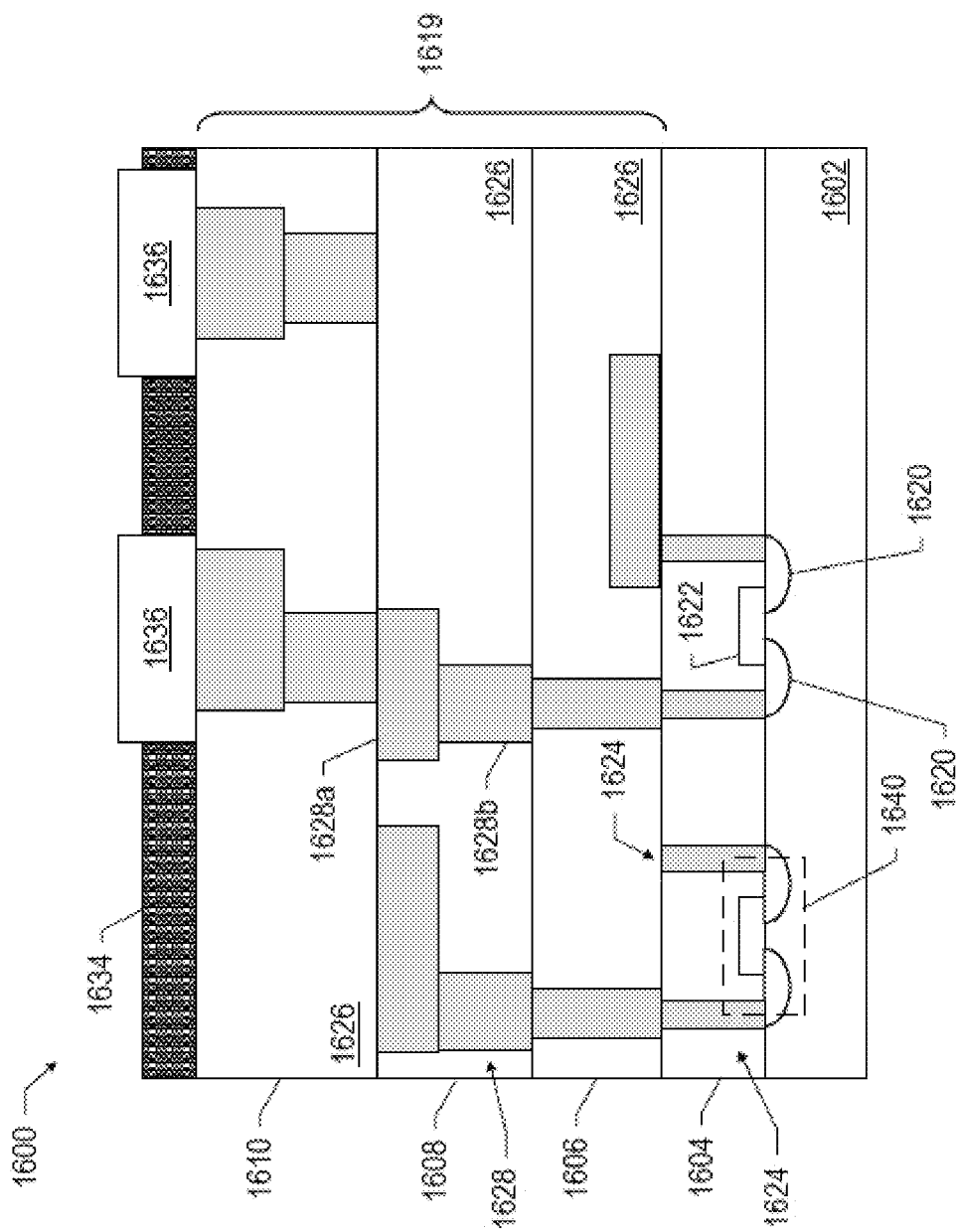
FIG. 14 is a cross-sectional side view of an IC device that may be included in a microelectronic assembly fabricated using hybrid manufacturing in accordance with any of the embodiments disclosed herein.

FIGS. 13A and 13B are top views of, respectively, a wafer and dies that may be included in one or more of the microelectronic assemblies 100 fabricated using hybrid manufacturing in accordance with any of the embodiments disclosed herein. In some embodiments, the dies 1502 may be included in an IC package (e.g., the IC package 200 as shown in FIG. 12) and/or in an IC device (e.g., the IC device 1600 as shown in FIG. 14), in accordance with any of the embodiments disclosed herein. For example, any of the dies 1502 may serve as the die 204 shown in FIG. 12 and/or any of the dies 1502 may serve as the IC device 1600 shown in FIG. 14. The wafer 1500 may be composed of semiconductor material and may include one or more dies 1502 having IC structures formed on a surface of the wafer 1500. Each of the dies 1502 may be a repeating unit of a semiconductor product that includes any suitable IC (e.g., ICs including IC structures to be included in microelectronic assemblies fabricated using hybrid manufacturing as described herein, e.g., ICs including the IC structures 110 and/or 120 as described herein). After the fabrication of the semiconductor product is complete (e.g., after manufacture of one or more of the IC structures to be included in microelectronic assemblies fabricated using hybrid manufacturing as described herein, e.g., ICs including the IC structures 110 and/or 120 as described herein), the wafer 1500 may undergo a singulation process in which each of the dies 1502 is separated from one another to provide discrete "chips" of the semiconductor product. In particular, devices that include one or more IC structures to be included in microelectronic assemblies fabricated using hybrid manufacturing as described herein, e.g., ICs including the IC structures 110 and/or 120 as disclosed herein may take the form of the wafer 1500 (e.g., not singulated) or the form of the die 1502 (e.g., singulated). The die 1502 may include one or more transistors (e.g., some of the transistors 1640 of FIG. 14, discussed below), supporting circuitry to route electrical signals to the transistors, passive components (e.g., signal traces, resistors, capacitors, or inductors), and/or any other IC components. The die 1502 may include supporting circuitry to route electrical signals to various memory cells, transistors, capacitors, as well as any other IC components. In some embodiments, the wafer 1500 or the die 1502 may implement or include a memory device (e.g., a static random-access memory (SRAM) device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 16) or other logic that is configured to store information in the memory devices or execute instructions stored in the memory array.

FIG. 14 is a cross-sectional side view of an IC device 1600 that may be included in any of the microelectronic assemblies 100 disclosed herein (e.g., in any of the IC structures 110 and/or 120). One or more of the IC devices 1600 may be included in one or more dies 1502 (FIG. 13). One or more of the IC devices 1600 may be included in one or more of the IC structures 110 and/or the IC structures 120 as described herein, e.g., in the IC package 200 (FIG. 12). One or more of the IC devices 1600 may be included in one or more dies 1502 (FIG. 13). The IC device 1600 may be formed on a die substrate 1602 (e.g., the wafer 1500 of FIG. 13) and may be included in a die (e.g., the die 1502 of FIG. 13). The die substrate 1602 may be a semiconductor substrate composed of semiconductor material systems including, for example, N-type or P-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 13) or a wafer (e.g., the wafer 1500 of FIG. 13).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 14 and may include a wide variety of other types and configurations such as, for example, planar transistors, non-planar transistors, or a combination of both. Non-planar transistors may include fin-based field-effect transistors (FinFET transistors), such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one P-type work function metal or N-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor

1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 14 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 14. Although a particular number of interconnect layers 1606-1610 is depicted in FIG. 14, embodiments of the present disclosure include IC devices having more or fewer interconnect layers than depicted.

In some embodiments, the interconnect structures 1628 may include lines (or traces) 1628*a* and/or vias 1628*b* filled with an electrically conductive material such as a metal. The lines 1628*a* may be arranged to route electrical signals in a direction of a plane that is substantially parallel with a surface of the die substrate 1602 upon which the device layer 1604 is formed. For example, the lines 1628*a* may route electrical signals in a direction in and out of the page from the perspective of FIG. 14. The vias 1628*b* may be arranged to route electrical signals in a direction of a plane that is substantially perpendicular to the surface of the die substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 14. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 14, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components. The conductive contacts 1636 may serve as the conductive contacts 122 or 124, as appropriate.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636. These additional conductive contacts may serve as the conductive contacts 122 or 124, as appropriate.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device

1600 from the conductive contacts 1636. These additional conductive contacts may serve as the conductive contacts 122 or 124, as appropriate.

Figure 15:
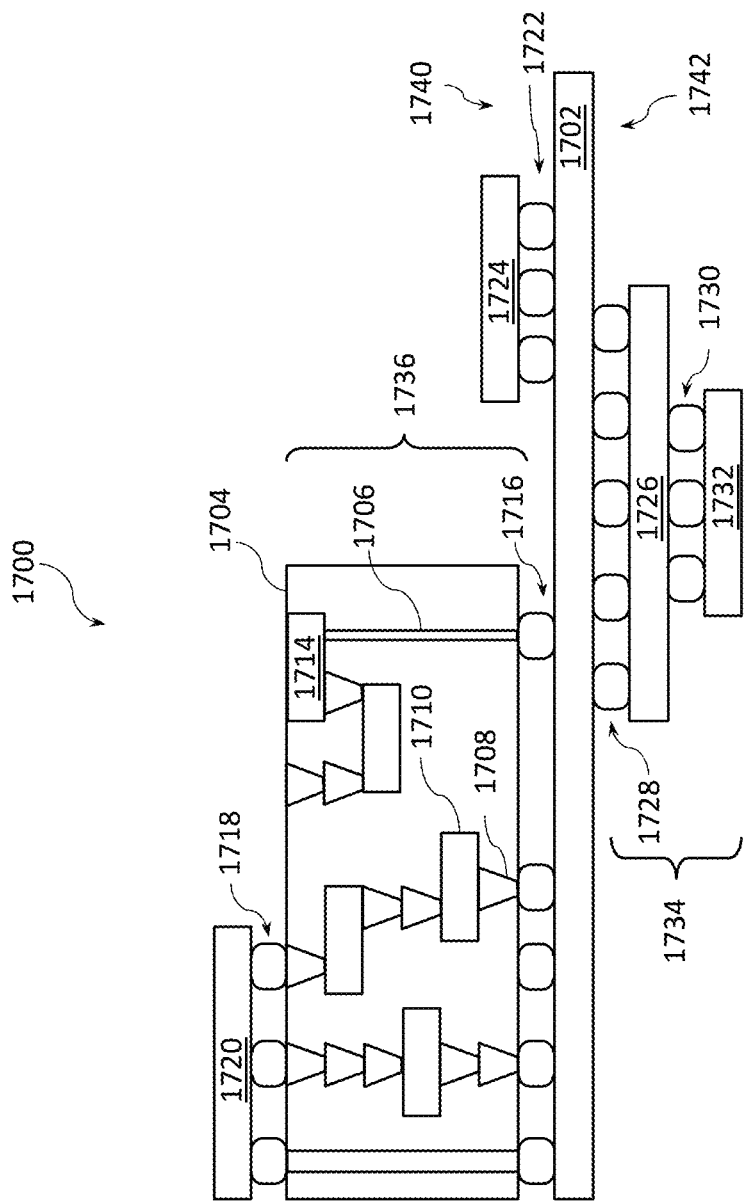
FIG. 15 is a cross-sectional side view of an IC device assembly that may include one or more microelectronic assemblies fabricated using hybrid manufacturing, in accordance with various embodiments.

FIG. 15 is a cross-sectional side view of an IC device assembly 1700 that may include components having one or more microelectronic assemblies fabricated using hybrid manufacturing in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of one or more microelectronic assemblies fabricated using hybrid manufacturing in accordance with any of the embodiments disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 15 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (e.g., as shown in FIG. 15), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. The IC package 1720 may be or include, for example, a die (the die 1502 of FIG. 13B), an IC device, or any other suitable component. In particular, the IC package 1720 may include one or more microelectronic assemblies 100 fabricated using hybrid manufacturing and/or one or more IC packages 200 as described herein. Although a single IC package 1720 is shown in FIG. 15, multiple IC packages may be coupled to the interposer 1704; indeed, additional interposers may be coupled to the interposer 1704. The interposer 1704 may provide an intervening substrate used to bridge the circuit board 1702 and the IC package 1720. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 15, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include any number of metal lines 1710, vias 1708, and TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 15 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 16:
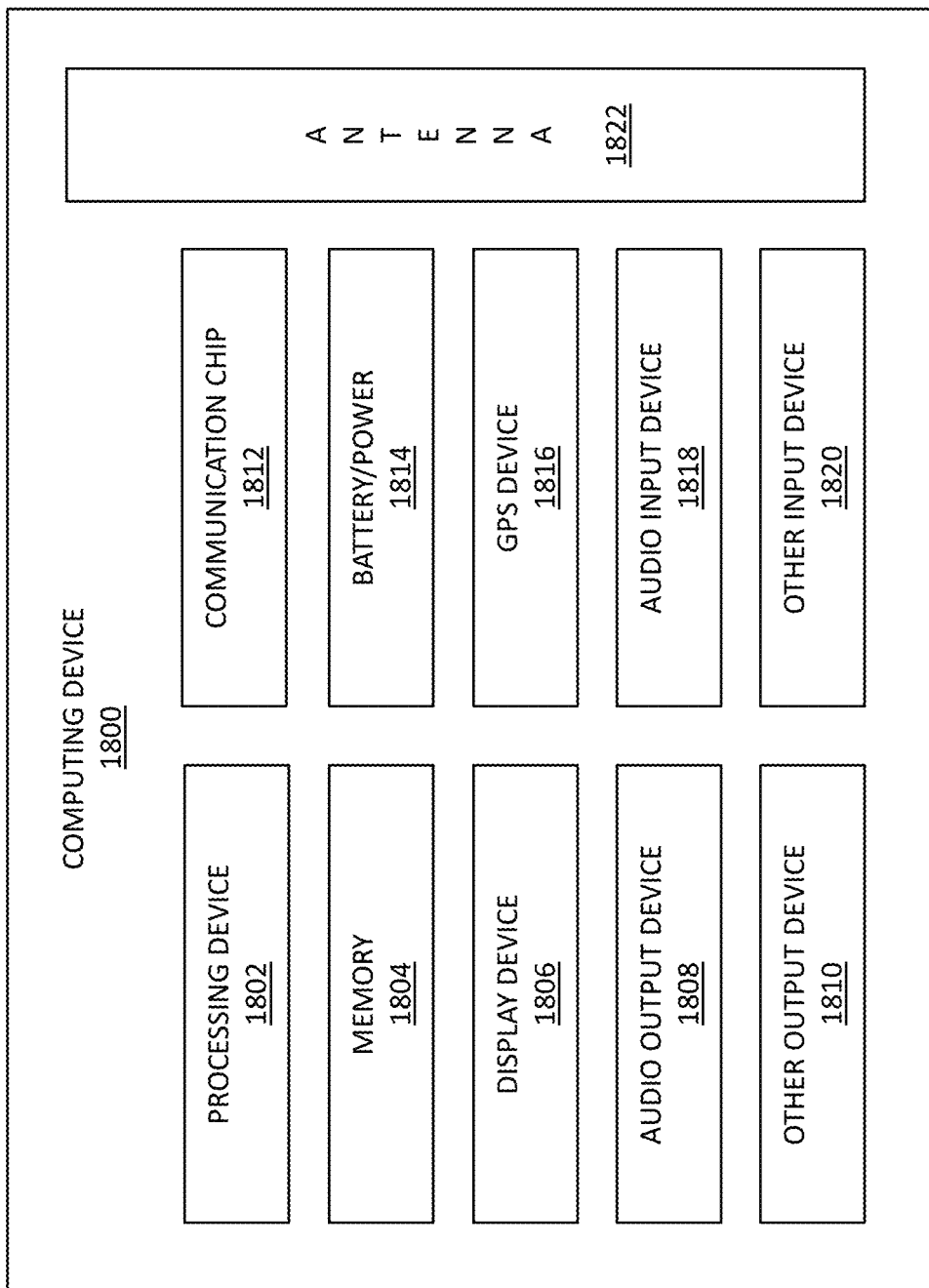
FIG. 16 is a block diagram of an example computing device that may include one or more microelectronic assemblies fabricated using hybrid manufacturing or IC devices or packages with such microelectronic assemblies, in accordance with various embodiments.

FIG. 16 is a block diagram of an example computing device 1800 that may include one or more components with one or more microelectronic assemblies 100 fabricated using hybrid manufacturing in accordance with any of the embodiments disclosed herein. For example, any suitable ones of the components of the computing device 1800 may include an IC package (e.g., the IC package 1720, shown in FIG. 15 and/or the IC package 200 shown in FIG. 12) including one or more microelectronic assemblies 100 fabricated using hybrid manufacturing in accordance with any of the embodiments disclosed herein. Any of the components of the computing device 1800 may include an IC device 1400 (e.g., as shown in FIG. 14). Any of the components of the computing device 1800 may include an IC device assembly 1700 (e.g., as shown in FIG. 15).

A number of components are illustrated in FIG. 16 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system on a chip (SoC) die.

Additionally, in various embodiments, the computing device 1800 may not include one or more of the components illustrated in FIG. 16, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1818 or an audio output device 1808, but may include audio input or output device interface circuitry (e.g., connectors and supporting circuitry) to which an audio input device 1818 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802.

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1818 (or corresponding interface circuitry, as discussed above). The audio input device 1818 may include any device that generates a signal representative of a sound, such as microphones, microphone arrays, or digital instruments (e.g., instruments having a musical instrument digital interface (MIDI) output).

The computing device 1800 may include a GPS device 1816 (or corresponding interface circuitry, as discussed above). The GPS device 1816 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example A1 provides a microelectronic assembly that includes a first IC structure that has first interconnects, and a second IC structure that has second interconnects, the second IC structure bonded to the first IC structure, where at least some of the first interconnects include a liner and an electrically conductive fill material, at least some of the second interconnects include a liner and an electrically conductive fill material, and a material composition of the liner of the first interconnects is different from a material composition of the liner of the second interconnects. For example, the liner of the first interconnects may be a liner having one or more of tantalum, tantalum nitride, titanium nitride, and tungsten carbide, while the liner of the second interconnects may be a liner having one or more of tantalum, tantalum nitride, and cobalt. In any of these liners, any of the materials may be included in the amount of between about 5% and 50%, indicating that these materials are included by intentional alloying of materials, in contrast to potential unintentionally doping or impurities being included, which would be less than about 0.1% for any of these metals.

Example A2 provides the microelectronic assembly according to example A1, where a thickness of the liner of the first interconnects is different from a thickness of the liner of the second interconnects, e.g., at least about 5% different, at least about 10% different, or at least 5-50% different. For example, the liner of the first interconnects may have a thickness between about 1 and 6 nanometers, including all values and ranges therein, while the liner of the second interconnects may have a thickness between about 4 and 10 nanometers, including all values and ranges therein.

Example A3 provides the microelectronic assembly according to examples A1 or A2, where a material composition of the electrically conductive fill material of the first interconnects is different from a material composition of the electrically conductive fill material of the second interconnects. For example, the electrically conductive fill material of the first interconnects may include copper (Cu), while the electrically conductive fill material of the second interconnects may include tungsten (W), aluminum (Al), ruthenium (Ru), cobalt (Co), or AlCu (e.g., in proportions of between 1:1 to 1:100).

Example A4 provides the microelectronic assembly according to any one of examples A1-A3, where the microelectronic assembly further includes a bonding interface where a face of the first IC structure is bonded to a face of the second IC structure. Further, in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side. Still further, for each trapezoid of the first interconnects, the long side is closer to the bonding interface than the short side, and, for each trapezoid of the second interconnects, the long side is closer to the bonding interface than the short side.

Example A5 provides the microelectronic assembly according to any one of examples A1-A3, where the microelectronic assembly further includes a bonding interface where a face of the first IC structure is bonded to a face of the second IC structure; in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side; for each trapezoid of the first interconnects, the long side is closer to the bonding interface than the short side; and, for each trapezoid of the second interconnects, the short side is closer to the bonding interface than the long side.

Example A6 provides the microelectronic assembly according to any one of examples A1-A3, where the microelectronic assembly further includes a bonding interface where a face of the first IC structure is bonded to a face of the second IC structure; in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side; for each trapezoid of the first interconnects, the short side is closer to the bonding interface than the long side; and, for each trapezoid of the second interconnects, the short side is closer to the bonding interface than the long side.

Example A7 provides the microelectronic assembly according to any one of the preceding examples A, where the second IC structure is bonded to the first IC structure so that at least a portion of the electrically conductive fill material of at least one of the first interconnects is in contact with at least a portion of the electrically conductive fill material of at least one of the second interconnects.

Example A8 provides the microelectronic assembly according to any one of the preceding examples A, where the second IC structure is bonded to the first IC structure by an adhesive material between at least portions of the first IC structure and the second IC structure. For example, the adhesive material may be an etch-stop material between the two IC structures. In some embodiments, bonding of the first and second IC structures may be realized by bringing the adhesive material in contact with the first and second IC structures and applying a pressure at moderately high temperatures (e.g., between about 50 and 200 degrees Celsius). Subsequently, the backside portion of a wafer of one of the IC structures may be grinded to reveal the metal layers or active devices such as transistors at the backside.

Example A9 provides the microelectronic assembly according to any one of the preceding examples A, further including an etch-stop material in at least portions where the second IC structure is bonded to the first IC structure, the etch-stop material including silicon, nitrogen, and carbon. The atomic percentage of any of these materials may be at least 1%, e.g., between about 1% and 50%, indicating that these elements are added deliberately, as opposed to being accidental impurities which are typically in concentration below about 0.1%.

Example A10 provides the microelectronic assembly according to any one of the preceding examples A, where a pitch of at least some of the first interconnects is different from a pitch of at least some of the second interconnects, e.g., at least about 5% different, or at least about 10% different.

Example A11 provides the microelectronic assembly according to any one of the preceding examples A, where each of the first IC structure and the second IC structure has a first face and an opposing second face (e.g., one of the first and second faces being the frontside of the IC structure and the other being the backside of the IC structure); the second IC structure is bonded to the first IC structure by having the first face of the second IC structure being bonded to the first face of the first IC structure (which may include f2f, f2b, or b2b bonding); and the microelectronic assembly further includes a via extending from the second face of the second IC structure to the first face of the second IC structure, through a bonding interface between the second IC structure and the first IC structure, and into the first IC structure.

Example A12 provides the microelectronic assembly according to example A11, where the via extends to the second face of the first IC structure.

Example A13 provides a microelectronic assembly that includes a first IC structure, including first interconnects; and a second IC structure, including second interconnects; and a bonding interface where a face of the first IC structure is bonded to a face of the second IC structure. In such an assembly, in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side; for each trapezoid of the first interconnects, the long side is closer to the bonding interface than the short side; and for each trapezoid of the second interconnects, the long side is closer to the bonding interface than the short side.

Example A14 provides the microelectronic assembly according to example A13, where a material composition of an electrically conductive fill material of the first interconnects is different from a material composition of an electrically conductive fill material of the second interconnects.

Example A15 provides the microelectronic assembly according to examples A13 or A14, where the second IC structure is bonded to the first IC structure so that at least a portion of the electrically conductive fill material of at least one of the first interconnects is in contact with at least a portion of the electrically conductive fill material of at least one of the second interconnects.

Example A16 provides the microelectronic assembly according to any one of examples A13-A15, where the second IC structure is bonded to the first IC structure by an adhesive material between at least portions of the first IC structure and the second IC structure.

Example A17 provides the microelectronic assembly according to any one of examples A13-A16, further including an etch-stop material in at least portions where the second IC structure is bonded to the first IC structure, the etch-stop material including silicon, nitrogen, and carbon.

Example A18 provides the microelectronic assembly according to any one of examples A13-A17, where a pitch of at least some of the first interconnects is different from a pitch of at least some of the second interconnects, e.g., at least about 5% different, or at least about 10% different.

Example A19 provides the microelectronic assembly according to any one of examples A13-A18, where each of the first IC structure and the second IC structure has a first face and an opposing second face; the face of the first IC structure that is bonded to the face of the second IC structure is the first face of the first IC structure; the face of the second IC structure that is bonded to the face of the first IC structure is the first face of the second IC structure; and the microelectronic assembly further includes a via extending from the second face of the second IC structure to the first face of the second IC structure, through the bonding interface, and into the first IC structure.

Example A20 provides the microelectronic assembly according to example A19, where the via extends to the second face of the first IC structure.

Example A21 provides a microelectronic assembly that includes a first IC structure, including first interconnects; a second IC structure, including second interconnects, the second IC structure bonded to the first IC structure; and an etch-stop material in at least portions of a bonding interface where the second IC structure is bonded to the first IC structure, the etch-stop material including silicon, nitrogen, and carbon, where an atomic percentage of each of silicon, nitrogen, and carbon within the etch-stop material is at least about 1%, e.g., at least about 5%, e.g., between about 1% and 50%, indicating that these elements are added deliberately, as opposed to being accidental impurities which are typically in concentration below about 0.1%.

Example A22 provides the microelectronic assembly according to example A21, where a material composition of an electrically conductive fill material of the first interconnects is different from a material composition of an electrically conductive fill material of the second interconnects.

Example A23 provides the microelectronic assembly according to examples A21 or A22, where the second IC structure is bonded to the first IC structure so that at least a portion of the electrically conductive fill material of at least one of the first interconnects is in contact with at least a portion of the electrically conductive fill material of at least one of the second interconnects.

Example A24 provides the microelectronic assembly according to any one of examples A21-A23, where the second IC structure is bonded to the first IC structure by an adhesive material between at least portions of the first IC structure and the second IC structure.

Example A25 provides the microelectronic assembly according to any one of examples A21-A24, where a pitch of at least some of the first interconnects is different from a pitch of at least some of the second interconnects, e.g., at least about 5% different, or at least about 10% different.

Example A26 provides the microelectronic assembly according to any one of examples A21-A25, where in a plane that is substantially perpendicular to the bonding interface, a cross-section of each of the first interconnects and the second interconnects is a trapezoid that includes two parallel sides, one of which is a short side and another one of which is a long side; for each trapezoid of the first interconnects, the long side is closer to the bonding interface than the short side; and for each trapezoid of the second interconnects, the long side is closer to the bonding interface than the short side.

Example A27 provides the microelectronic assembly according to any one of examples A21-A25, where in a plane that is substantially perpendicular to the bonding interface, a cross-section of each of the first interconnects and the second interconnects is a trapezoid that includes two parallel sides, one of which is a short side and another one of which is a long side; for each trapezoid of the first interconnects, the long side is closer to the bonding interface than the short side; and for each trapezoid of the second interconnects, the short side is closer to the bonding interface than the long side.

Example A28 provides the microelectronic assembly according to any one of examples A21-A25, where in a plane that is substantially perpendicular to the bonding interface, a cross-section of each of the first interconnects and the second interconnects is a trapezoid that includes two parallel sides, one of which is a short side and another one of which is a long side; for each trapezoid of the first interconnects, the short side is closer to the bonding interface than the long side; and for each trapezoid of the second interconnects, the short side is closer to the bonding interface than the long side.

Example A29 provides the microelectronic assembly according to any one of examples A21-A28, where each of the first IC structure and the second IC structure has a first face and an opposing second face (e.g., one of the first and second face being the front and the other being the back), the second IC structure is bonded to the first IC structure by having the first face of the second IC structure being bonded to the first face of the first IC structure (which may include f2f, f2b, or b2b bonding), and the microelectronic assembly further includes a via extending from the second face of the second IC structure to the first face of the second IC structure, through a bonding interface between the second IC structure and the first IC structure, and into the first IC structure.

Example A30 provides the microelectronic assembly according to example A29, where the via extends to the second face of the first IC structure.

Example A31 provides the microelectronic assembly according to any one of the preceding examples A, where the first interconnects are integrated in one or more insulating layers of a metallization stack of the first IC structure, and the second interconnects are integrated in one or more insulating layers of a metallization stack of the second IC structure.

Example A32 provides the microelectronic assembly according to any one of the preceding examples A, where at least one of the first IC structure and the second IC structure further includes or is a part of a central processing unit.

Example A33 provides the microelectronic assembly according to any one of the preceding examples A, where at least one of the first IC structure and the second IC structure further includes or is a part of a memory device, e.g., a high-bandwidth memory device.

Example A34 provides the microelectronic assembly according to any one of the preceding examples A, where at least one of the first IC structure and the second IC structure further includes or is a part of a logic circuit.

Example A35 provides the microelectronic assembly according to any one of the preceding examples A, where at least one of the first IC structure and the second IC structure further includes or is a part of input/output circuitry.

Example A36 provides the microelectronic assembly according to any one of the preceding examples A, where at least one of the first IC structure and the second IC structure further includes or is a part of a field programmable gate array transceiver.

Example A37 provides the microelectronic assembly according to any one of the preceding examples A, where at least one of the first IC structure and the second IC structure further includes or is a part of a field programmable gate array logic.

Example A38 provides the microelectronic assembly according to any one of the preceding examples A, where at least one of the first IC structure and the second IC structure further includes or is a part of a power delivery circuitry.

Example A39 provides the microelectronic assembly according to any one of the preceding examples A, where at least one of the first IC structure and the second IC structure further includes or is a part of a III-V amplifier.

Example A40 provides the microelectronic assembly according to any one of the preceding examples A, where at least one of the first IC structure and the second IC structure further includes or is a part of Peripheral Component Interconnect Express circuitry or Double Data Rate transfer circuitry.

Example A41 provides the microelectronic assembly according to any one of the preceding examples A, where at least one of the first IC structure and the second IC structure further includes front-end transistors.

Example A42 provides the microelectronic assembly according to any one of the preceding examples A, where at least one of the first IC structure and the second IC structure further includes back-end transistors.

Example A43 provides the microelectronic assembly according to any one of the preceding examples A, where at least one of the first IC structure and the second IC structure includes TFTs.

Example A44 provides an IC package that includes a microelectronic assembly according to any one of the preceding examples A; and a further IC component, coupled to the IC die.

Example A45 provides the IC package according to example A44, where the further IC component includes one of a package substrate, an interposer, or a further IC die.

Example A46 provides a computing device that includes a carrier substrate and a microelectronic assembly, coupled to the carrier substrate, where the microelectronic assembly is a microelectronic assembly according to any one of the preceding examples A (e.g., according to any one of examples A1-A43) or the microelectronic assembly is included in the IC package according to any one of examples A44-A45.

Example A47 provides the computing device according to example A46, where the computing device is a wearable or handheld computing device.

Example A48 provides the computing device according to examples A46 or A47, where the computing device further includes one or more communication chips and an antenna.

Example A49 provides the computing device according to any one of examples A46-A48, where the carrier substrate is a motherboard.

Example A50 provides a method of manufacturing a microelectronic assembly, the method including providing the microelectronic assembly according to any one of the preceding examples A.

Example B1 provides a microelectronic assembly that includes a first IC structure, including first interconnects, the first IC structure having a first face and an opposing second face (e.g., one of the first and second faces being the frontside of the IC structure and the other being the backside of the IC structure); a second IC structure, including second interconnects, the second IC structure having a first face and an opposing second face (e.g., one of the first and second faces being the frontside of the IC structure and the other being the backside of the IC structure); a bonding interface where the second face of the first IC structure is bonded to the first face of the second IC structure using an adhesive material; and a via extending from the second face of the second IC structure, through one or more layers of the second interconnects, towards the first IC structure. In such an assembly, a cross-section of each of the first interconnects, the second interconnects, and the via is a trapezoid that includes two parallel sides, one of which is a short side and another one of which is a long side; for each trapezoid of the second interconnects, the short side is closer to the second face of the second IC structure than the long side; and, for the via, the short side is farther away from the second face of the second IC structure than the long side (the long side may be at the second face of the second IC structure since the via extends from the second face of the second IC structure).

Example B2 provides the microelectronic assembly according to example B1, where, for each trapezoid of the first interconnects, the short side is closer to the first face of the first IC structure than the long side.

Example B3 provides the microelectronic assembly according to example B1, where, for each trapezoid of the first interconnects, the long side is closer to the first face of the first IC structure than the short side.

Example B4 provides the microelectronic assembly according to any one of examples B1-B3, where the via extends into the first IC structure.

Example B5 provides the microelectronic assembly according to example B4, where the via extends through one or more layers of the first interconnects, towards but not reaching the first face of the first IC structure (i.e., the via is a blind via).

Example B6 provides the microelectronic assembly according to example B4, where the via extends to the first face of the first IC structure (i.e., the via is a through-via that extends through both the first and second IC structures).

Example B7 provides the microelectronic assembly according to any one of the preceding examples B, where the first IC structure further includes a support structure (e.g., a substrate, a wafer, or a die) that houses/supports the first interconnects, the support structure having a first face and an opposing second face, and the first interconnects are in one or more layers of a metallization stack provided over the second face of the support structure.

Example B8 provides the microelectronic assembly according to example B7, where the first face of the first IC structure is the first face of the support structure.

Example B9 provides the microelectronic assembly according to any one of the preceding examples B, where the first IC structure further includes one or more transistors proximate to the first face of the first IC structure.

Example B10 provides the microelectronic assembly according to any one of the preceding examples B, where the second IC structure further includes one or more transistors proximate to the second face of the second IC structure.

Example B11 provides a microelectronic assembly that includes a first IC structure and a second IC structure. The first IC structure includes a support structure (e.g., a substrate, a wafer, or a die), having a first face (e.g., bottom face) and an opposing second face (e.g., top face), a met- allization stack, having a first face (e.g., bottom face) and an opposing second face (e.g., top face), the first face of the metallization stack provided over the second face of the support structure, and first interconnects, provided in one or more layers of the metallization stack. The second IC structure includes second interconnects, the second IC structure having a first face (e.g., bottom face) and an opposing second face (e.g., top face), where first face of the second IC structure is bonded to the second face of the metallization stack of the first IC structure using an adhesive material. The assembly further includes a via extending from the first face of the support structure of the first IC structure, through the one or more layers of the metallization stack, towards the second IC structure. In such an assembly, a cross-section of each of the first interconnects, the second interconnects, and the via is a trapezoid that includes two parallel sides, one of which is a short side and another one of which is a long side; for each trapezoid of the first interconnects, the short side is closer to the first face of the support structure than the long side; and, for the via, the short side is farther away from the first face of the support structure than the long side (the short side may be at the first face of the support structure since the via extends from the first face of the support structure).

Example B12 provides the microelectronic assembly according to example B11, where, for each trapezoid of the second interconnects, the short side is closer to the second face of the second IC structure than the long side.

Example B13 provides the microelectronic assembly according to example B11, where, for each trapezoid of the second interconnects, the long side is closer to the second face of the second IC structure than the short side.

Example B14 provides the microelectronic assembly according to any one of examples B11-B13, where the via extends into the second IC structure.

Example B15 provides the microelectronic assembly according to example B14, where the via extends through one or more layers of the second interconnects, towards but not reaching the second face of the second IC structure (i.e., the via is a blind via).

Example B16 provides the microelectronic assembly according to example B14, where the via extends to the second face of the second IC structure (i.e., the via is a through-via that extends through both the first and second IC structures).

Example B17 provides the microelectronic assembly according to any one of examples B11-B16, where the first IC structure further includes one or more transistors proximate to the second face of the support structure.

Example B18 provides the microelectronic assembly according to any one of examples B11-B17, where the second IC structure further includes one or more transistors proximate to the second face of the second IC structure.

Example B19 provides a microelectronic assembly that includes a first IC structure, including first interconnects, the first IC structure having a first face (e.g., bottom face) and an opposing second face (e.g., top face); a second IC structure, including second interconnects, the second IC structure having a first face (e.g., bottom face) and an opposing second face (e.g., top face); a bonding interface where the second face of the first IC structure is bonded to the first face of the second IC structure using an adhesive material; and a via extending from the second face of the second IC structure to the first face of the second IC structure, through a bonding interface between the second IC structure and the first IC structure, and into the first IC structure.

Example B20 provides the microelectronic assembly according to example B19, where, in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side; for each trapezoid of the first interconnects, the long side is closer to the bonding interface than the short side; and for each trapezoid of the second interconnects, the long side is closer to the bonding interface than the short side.

Example B21 provides the microelectronic assembly according to example B19, where, in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side; for each trapezoid of the first interconnects, the long side is closer to the bonding interface than the short side; and for each trapezoid of the second interconnects, the short side is closer to the bonding interface than the long side.

Example B22 provides the microelectronic assembly according to example B19, where, in a plane that is substantially perpendicular to the bonding interface (or in a plane that is substantially perpendicular to a support structure providing mechanical stability for the microelectronic assembly), a cross-section of each of the first interconnects and the second interconnects is a trapezoid that includes two parallel sides, one of which is a short side and another one of which is a long side; for each trapezoid of the first interconnects, the short side is closer to the bonding interface than the long side; and for each trapezoid of the second interconnects, the short side is closer to the bonding interface than the long side.

Example B23 provides the microelectronic assembly according to any one of examples B19-B22, where the first IC structure further includes a support structure (e.g., a substrate, a wafer, or a die), the support structure having a first face (e.g., bottom face) and an opposing second face (e.g., top face), the first IC structure further includes a metallization stack, having a first face (e.g., bottom face) and an opposing second face (e.g., top face), the first face of the metallization stack provided over the second face of the support structure, the first interconnects are in the metallization stack, the first face of the first IC structure is the first face of the support structure, the first face of the metallization stack is over the second face of the support structure, and the second face of the first IC structure is the second face of the metallization stack.

Example B24 provides the microelectronic assembly according to any one of examples B19-B22, where the second IC structure further includes a support structure (e.g., a substrate, a wafer, or a die), the support structure having a first face (e.g., bottom face) and an opposing second face (e.g., top face), the second IC structure further includes a metallization stack, having a first face (e.g., bottom face) and an opposing second face (e.g., top face), the first face of the metallization stack provided over the second face of the support structure, the second interconnects are in the metallization stack, the second face of the second IC structure is the first face of the support structure, the first face of the metallization stack is over the second face of the support structure, and the first face of the second IC structure is the second face of the metallization stack.

Example B25 provides the microelectronic assembly according to any one of examples B19-B24, where the bonding interface includes an etch-stop material in at least portions where the second face of the first IC structure is bonded to the first face of the second IC structure, the etch-stop material including silicon, nitrogen, and carbon, where an atomic percentage of each of silicon, nitrogen, and carbon within the etch-stop material is at least about 1%. The atomic percentage of any of these materials may be at least 1%, e.g., between about 1% and 50%, indicating that these elements are added deliberately, as opposed to being accidental impurities which are typically in concentration below about 0.1%.

Example B26 provides the microelectronic assembly according to any one of examples B19-B25, where at least some of the first interconnects include a liner and an electrically conductive fill material, at least some of the second interconnects include a liner and an electrically conductive fill material, and a material composition of the liner of the first interconnects is different from a material composition of the liner of the second interconnects.

Example B27 provides the microelectronic assembly according to example B26, where a thickness of the liner of the first interconnects is different from a thickness of the liner of the second interconnects, e.g., at least about 5% different, at least about 10% different, or at least 5-50% different.

Example B28 provides the microelectronic assembly according to examples B26 or B27, where a material composition of the electrically conductive fill material of the first interconnects is different from a material composition of the electrically conductive fill material of the second interconnects.

Example B29 provides the microelectronic assembly according to any one of examples B19-B28, where a material composition of the via is different from a material composition of an electrically conductive fill material of the first interconnects or a material composition of an electrically conductive fill material of the second interconnects.

Example B30 provides the microelectronic assembly according to any one of examples B19-B29, where the via extends to the first face of the first IC structure.

Example B31 provides the microelectronic assembly according to any one of the preceding examples B, where the first interconnects are integrated in one or more insulating layers of a metallization stack of the first IC structure, and the second interconnects are integrated in one or more insulating layers of a metallization stack of the second IC structure.

Example B32 provides the microelectronic assembly according to any one of the preceding examples B, where at least one of the first IC structure and the second IC structure further includes or is a part of a central processing unit.

Example B33 provides the microelectronic assembly according to any one of the preceding examples B, where at least one of the first IC structure and the second IC structure further includes or is a part of a memory device, e.g., a high-bandwidth memory device.

Example B34 provides the microelectronic assembly according to any one of the preceding examples B, where at least one of the first IC structure and the second IC structure further includes or is a part of a logic circuit.

Example B35 provides the microelectronic assembly according to any one of the preceding examples B, where at least one of the first IC structure and the second IC structure further includes or is a part of input/output circuitry.

Example B36 provides the microelectronic assembly according to any one of the preceding examples B, where at least one of the first IC structure and the second IC structure further includes or is a part of a field programmable gate array transceiver.

Example B37 provides the microelectronic assembly according to any one of the preceding examples B, where at least one of the first IC structure and the second IC structure further includes or is a part of a field programmable gate array logic.

Example B38 provides the microelectronic assembly according to any one of the preceding examples B, where at least one of the first IC structure and the second IC structure further includes or is a part of a power delivery circuitry.

Example B39 provides the microelectronic assembly according to any one of the preceding examples B, where at least one of the first IC structure and the second IC structure further includes or is a part of a III-V amplifier.

Example B40 provides the microelectronic assembly according to any one of the preceding examples B, where at least one of the first IC structure and the second IC structure further includes or is a part of Peripheral Component Interconnect Express circuitry or Double Data Rate transfer circuitry.

Example B41 provides the microelectronic assembly according to any one of the preceding examples B, where at least one of the first IC structure and the second IC structure further includes front-end transistors.

Example B42 provides the microelectronic assembly according to any one of the preceding examples B, where at least one of the first IC structure and the second IC structure further includes back-end transistors.

Example B43 provides the microelectronic assembly according to any one of the preceding examples B, where at least one of the first IC structure and the second IC structure includes TFTs.

Example B44 provides an IC package that includes a microelectronic assembly according to any one of the preceding examples B; and a further IC component, coupled to the IC die.

Example B45 provides the IC package according to example B44, where the further IC component includes one of a package substrate, an interposer, or a further IC die.

Example B46 provides a computing device that includes a carrier substrate and a microelectronic assembly, coupled to the carrier substrate, where the microelectronic assembly is a microelectronic assembly according to any one of the preceding examples B (e.g., according to any one of examples B1-B43) or the microelectronic assembly is included in the IC package according to any one of examples B44-B45.

Example B47 provides the computing device according to example B46, where the computing device is a wearable or handheld computing device.

Example B48 provides the computing device according to examples B46 or B47, where the computing device further includes one or more communication chips and an antenna.

Example B49 provides the computing device according to any one of examples B46-B48, where the carrier substrate is a motherboard.

Example B50 provides a method of manufacturing a microelectronic assembly, the method including providing the microelectronic assembly according to any one of the preceding examples B.

Example C1 provides an IC package that includes a package substrate having a first face and an opposing second face; and a microelectronic assembly, coupled to the package substrate by package interconnects, where the microelectronic assembly includes a first IC structure having a first face and an opposing second face, where the first face of the first IC structure is at least partially between the second face of the package substrate and the second face of the first IC structure, and the first face of the first IC structure is coupled to the second face of the package substrate by the package interconnects; a second IC structure having a first face and an opposing second face, where the first face of the second IC structure is at least partially between the second face of the first IC structure and the second face of the second IC structure; a bonding material, bonding the second face of the first IC structure to the first face of the second IC structure; and an electrically conductive via having at least a portion in the first IC structure, at least a portion in the second IC structure, and extending through the bonding material.

Example C2 provides the IC package according to example C1, where the via is configured to provide electrical coupling between one or more components of the first IC structure and one or more components of the second IC structure.

Example C3 provides the IC package according to examples C1 or C2, where the package interconnects include die-to-package interconnects.

Example C4 provides the IC package according to any one of the preceding examples C, where the package interconnects include solder.

Example C5 provides the IC package according to any one of the preceding examples C, where the package interconnects include an anisotropic conductive material.

Example C6 provides the IC package according to any one of the preceding examples C, where the via is one of a plurality of vias, and each via of the plurality of vias has at least a portion in the first IC structure, at least a portion in the second IC structure, and extends through the bonding material.

Example C7 provides the IC package according to example C6, where a pitch of the plurality of vias is different from a pitch of the package interconnects.

Example C8 provides the IC package according to any one of the preceding examples C, where the first IC structure includes a plurality of interconnects integrated in one or more insulating layers of a metallization stack of the first IC structure, and the second IC structure includes a plurality of interconnects integrated in one or more insulating layers of a metallization stack of the second IC structure.

Example C9 provides the IC package according to example C8, where, in a plane that is substantially perpendicular to the package substrate, a cross-section of each of the plurality of interconnects of the first IC structure and the plurality of interconnects of the second IC structure is a trapezoid that includes two parallel sides, one of which is a short side and another one of which is a long side; for each trapezoid of the plurality of interconnects of the first IC structure, the long side is closer to the bonding interface than the short side; and, for each trapezoid of the plurality of interconnects of the second IC structure, the long side is closer to the bonding interface than the short side.

Example C10 provides the IC package according to example C8, where, in a plane that is substantially perpendicular to the package substrate, a cross-section of each of the plurality of interconnects of the first IC structure and the plurality of interconnects of the second IC structure is a trapezoid that includes two parallel sides, one of which is a short side and another one of which is a long side; for each trapezoid of the plurality of interconnects of the first IC structure, the long side is closer to the bonding interface than the short side; and, for each trapezoid of the plurality of interconnects of the second IC structure, the short side is closer to the bonding interface than the long side.

Example C11 provides the IC package according to example C8, where, in a plane that is substantially perpendicular to the package substrate, a cross-section of each of the plurality of interconnects of the first IC structure and the plurality of interconnects of the second IC structure is a trapezoid that includes two parallel sides, one of which is a short side and another one of which is a long side; for each trapezoid of the plurality of interconnects of the first IC structure, the short side is closer to the bonding interface than the long side; and, for each trapezoid of the plurality of interconnects of the second IC structure, the short side is closer to the bonding interface than the long side.

Example C12 provides the IC package according to any one of examples C8-C11, where the portion of the via in the second IC structure is coupled to one or more of the plurality of interconnects of the second IC structure.

Example C13 provides the IC package according to any one of examples C8-C12, where the portion of the via in the first IC structure is coupled to one or more of the plurality of interconnects of the first IC structure.

Example C14 provides the IC package according to any one of examples C8-C13, where the portion of the via in the first IC structure is coupled to one or more of the package interconnects.

Example C15 provides the IC package according to any one of the preceding examples C, where the bonding material includes an etch-stop material in at least portions where the second face of the first IC structure is bonded to the first face of the second IC structure, the etch-stop material including silicon, nitrogen, and carbon, where an atomic percentage of each of silicon, nitrogen, and carbon within the etch-stop material is at least about 1%, e.g., at least about 5%, e.g., between about 1% and 50%, indicating that these elements are added deliberately, as opposed to being accidental impurities which are typically in concentration below about 0.1%.

Example C16 provides the IC package according to any one of the preceding examples C, where a surface area of the first face of the second IC structure is different from a surface area of the second face of the first IC structure.

Example C17 provides the IC package according to any one of the preceding examples C, further including a third IC structure having a first face and an opposing second face, where the first face of the third IC structure is at least partially between the second face of the first IC structure and the second face of the third IC structure, and the first face of the third IC structure is coupled to the second face of the first IC structure by DTD interconnects.

Example C18 provides the IC package according to example C17, where the DTD interconnects include solder.

Example C19 provides the IC package according to examples C17 or C18, where the DTD interconnects include an anisotropic conductive material.

Example C20 provides the IC package according to any one of examples C17-C19, where the DTD interconnects are plated interconnects.

Example C21 provides the IC package according to any one of examples C17-C20, where the DTD interconnects are copper-to-copper interconnects.

Example C22 provides the IC package according to any one of examples C17-C21, where the via is one of a plurality of vias, each via of the plurality of vias has at least a portion in the first IC structure, at least a portion in the second IC structure, and extends through the bonding material, and a pitch of the plurality of vias is different from a pitch of the DTD interconnects.

Example C23 provides the IC package according to any one of examples C17-C21, where the IC package further includes a fourth third IC structure having a first face and an opposing second face, where the first face of the fourth IC structure is at least partially between the second face of the third IC structure and the second face of the fourth IC structure, a further bonding material, bonding the second face of the third IC structure to the first face of the fourth IC structure, and a further electrically conductive via having at least a portion in the third IC structure, at least a portion in the fourth IC structure, and extending through the further bonding material.

Example C24 provides the IC package according to example C23, where the further via is configured to provide electrical coupling between one or more components of the third IC structure and one or more components of the fourth IC structure.

Example C25 provides the IC package according to examples C23 or C24, where the via is one of a plurality of vias, each via of the plurality of vias has at least a portion in the first IC structure, at least a portion in the second IC structure, and extends through the bonding material, the further via is one of a plurality of further vias, each further via of the plurality of further vias has at least a portion in the third IC structure, at least a portion in the fourth IC structure, and extends through the further bonding material, and a pitch of the plurality of vias is different from a pitch of the plurality of further vias.

Example C26 provides the IC package according to any one of examples C23-C25, where the portion of the further via in the third IC structure is coupled to one or more of the DTD interconnects.

Example C27 provides the IC package according to any one of the preceding examples C, further including a mold material, at least partially enclosing at least the second IC structure.

Example C28 provides the IC package according to any one of the preceding examples C, further including a heat spreader, configured to dissipate heat from one or more of the first IC structure and the second IC structure.

Example C29 provides the IC package according to any one of the preceding examples C, where the package substrate includes one or more of a ceramic material and an organic material.

Example C30 provides the IC package according to any one of the preceding examples C, where the package substrate is a PCB.

Example C31 provides an IC package that includes a package substrate having a first face and an opposing second face; and a microelectronic assembly, coupled to the package substrate by package interconnects, where the microelectronic assembly includes a first IC structure having a first face and an opposing second face, where the first face of the first IC structure is at least partially between the second face of the package substrate and the second face of the first IC structure, and the first face of the first IC structure is coupled to the second face of the package substrate by the package interconnects, and a second IC structure having a first face and an opposing second face, where the first face of the second IC structure is at least partially between the second face of the first IC structure and the second face of the second IC structure, and the second face of the first IC structure is bonded to the first face of the second IC structure. In such a microelectronic assembly, the first IC structure includes first interconnects, the second IC structure includes second interconnects, and a material composition of an electrically conductive fill material of the first interconnects is different from a material composition of an electrically conductive fill material of the second interconnects.

Example C32 provides the IC package according to example C31, where the first interconnects further include a liner, and the second interconnects do not include a liner.

Example C33 provides the IC package according to example C31, where the second interconnects further include a liner, and the first interconnects do not include a liner.

Example C34 provides the IC package according to example C31, where the first interconnects further include a liner and an electrically conductive fill material, the second interconnects further include a liner and an electrically conductive fill material, and a material composition of the liner of the first interconnects is different from a material composition of the liner of the second interconnects.

Example C35 provides the microelectronic assembly according to example C34, where a thickness of the liner of the first interconnects is different from a thickness of the liner of the second interconnects.

Example C36 provides the IC package according to any one of examples C31-C35, further including a bonding material, bonding the second face of the first IC structure to the first face of the second IC structure.

Example C37 provides the microelectronic assembly according to example C36, where the bonding material includes silicon, nitrogen, and carbon, where an atomic percentage of each of silicon, nitrogen, and carbon within the bonding material is at least about 1%, e.g., at least about 5%, e.g., between about 1% and 50%, indicating that these elements are added deliberately, as opposed to being accidental impurities which are typically in concentration below about 0.1%.

Example C38 provides the IC package according to any one of C31-C37, where the first IC structure includes a plurality of interconnects integrated in one or more insulating layers of a metallization stack of the first IC structure, and the second IC structure includes a plurality of interconnects integrated in one or more insulating layers of a metallization stack of the second IC structure.

Example C39 provides the IC package according to example C38, where, in a plane that is substantially perpendicular to the package substrate, a cross-section of each of the plurality of interconnects of the first IC structure and the plurality of interconnects of the second IC structure is a trapezoid that includes two parallel sides, one of which is a short side and another one of which is a long side; for each trapezoid of the plurality of interconnects of the first IC structure, the long side is closer to the bonding interface than the short side; and, for each trapezoid of the plurality of interconnects of the second IC structure, the long side is closer to the bonding interface than the short side.

Example C40 provides the IC package according to example C38, where, in a plane that is substantially perpendicular to the package substrate, a cross-section of each of the plurality of interconnects of the first IC structure and the plurality of interconnects of the second IC structure is a trapezoid that includes two parallel sides, one of which is a short side and another one of which is a long side; for each trapezoid of the plurality of interconnects of the first IC structure, the long side is closer to the bonding interface than the short side; and, for each trapezoid of the plurality of interconnects of the second IC structure, the short side is closer to the bonding interface than the long side.

Example C41 provides the IC package according to example C38, where, in a plane that is substantially perpendicular to the package substrate, a cross-section of each of the plurality of interconnects of the first IC structure and the plurality of interconnects of the second IC structure is a trapezoid that includes two parallel sides, one of which is a short side and another one of which is a long side; for each trapezoid of the plurality of interconnects of the first IC structure, the short side is closer to the bonding interface than the long side; and, for each trapezoid of the plurality of interconnects of the second IC structure, the short side is closer to the bonding interface than the long side.

Example C42 provides the IC package according to any one of examples C31-C41, where the package interconnects include die-to-package interconnects.

Example C43 provides the IC package according to any one of examples C31-C42, where the package interconnects include solder.

Example C44 provides the IC package according to any one of examples C31-C44, where the package interconnects include an anisotropic conductive material.

Example C45 provides the IC package according to any one of examples C31-C44, where a surface area of the first face of the second IC structure is different from a surface area of the second face of the first IC structure.

Example C46 provides the IC package according to any one of examples C31-C45, further including a third IC structure having a first face and an opposing second face, where the first face of the third IC structure is at least partially between the second face of the first IC structure and the second face of the third IC structure, and the first face of the third IC structure is coupled to the second face of the first IC structure by DTD interconnects.

Example C47 provides the IC package according to example C46, where the DTD interconnects include solder.

Example C48 provides the IC package according to examples C46 or C47, where the DTD interconnects include an anisotropic conductive material.

Example C49 provides the IC package according to any one of examples C46-C48, where the DTD interconnects are plated interconnects.

Example C50 provides the IC package according to any one of examples C46-C49, where the DTD interconnects are copper-to-copper interconnects.

Example C51 provides the IC package according to any one of examples C46-C50, where the via is one of a plurality of vias, each via of the plurality of vias has at least a portion in the first IC structure, at least a portion in the second IC structure, and extends through the bonding material, and a pitch of the plurality of vias is different from a pitch of the DTD interconnects.

Example C52 provides the IC package according to any one of examples C46-C51, where the IC package further includes a fourth third IC structure having a first face and an opposing second face, where the first face of the fourth IC structure is at least partially between the second face of the third IC structure and the second face of the fourth IC structure; a further bonding material, bonding the second face of the third IC structure to the first face of the fourth IC structure; and a further electrically conductive via having at least a portion in the third IC structure, at least a portion in the fourth IC structure, and extending through the further bonding material.

Example C53 provides the IC package according to any one of examples C31-C52, further including a mold material, at least partially enclosing at least the second IC structure.

Example C54 provides the IC package according to any one of examples C31-C53, further including a heat spreader, configured to dissipate heat from one or more of the first IC structure and the second IC structure.

Example C55 provides the IC package according to any one of examples C31-C54, where the package substrate includes one or more of a ceramic material and an organic material.

Example C56 provides the IC package according to any one of examples C31-C55, where the package substrate is a PCB.

Example C57 provides the IC package according to any one of examples C31-C56, where the first IC structure includes a plurality of interconnects integrated in one or more insulating layers of a metallization stack of the first IC structure, and the second IC structure includes a plurality of interconnects integrated in one or more insulating layers of a metallization stack of the second IC structure.

Example C58 provides the IC package according to any one of examples C31-C57, where at least one of the first IC structure and the second IC structure further includes or is a part of a central processing unit.

Example C59 provides the IC package according to any one of the preceding examples C, where at least one of the first IC structure and the second IC structure further includes or is a part of a memory device, e.g., a high-bandwidth memory device.

Example C60 provides the IC package according to any one of the preceding examples C, where at least one of the first IC structure and the second IC structure further includes or is a part of a logic circuit.

Example C61 provides the IC package according to any one of the preceding examples C, where at least one of the first IC structure and the second IC structure further includes or is a part of input/output circuitry.

Example C62 provides the IC package according to any one of the preceding examples C, where at least one of the first IC structure and the second IC structure further includes or is a part of a field programmable gate array transceiver.

Example C63 provides the IC package according to any one of the preceding examples C, where at least one of the first IC structure and the second IC structure further includes or is a part of a field programmable gate array logic.

Example C64 provides the IC package according to any one of the preceding examples C, where at least one of the first IC structure and the second IC structure further includes or is a part of a power delivery circuitry.

Example C65 provides the IC package according to any one of the preceding examples C, where at least one of the first IC structure and the second IC structure further includes or is a part of a III-V amplifier.

Example C66 provides the IC package according to any one of the preceding examples C, where at least one of the first IC structure and the second IC structure further includes or is a part of Peripheral Component Interconnect Express circuitry or Double Data Rate transfer circuitry.

Example C67 provides the IC package according to any one of the preceding examples C, where at least one of the first IC structure and the second IC structure further includes front-end transistors.

Example C68 provides the IC package according to any one of the preceding examples C, where at least one of the first IC structure and the second IC structure further includes back-end transistors.

Example C69 provides the IC package according to any one of the preceding examples C, where at least one of the first IC structure and the second IC structure includes TFTs.

Example C70 provides the IC package according to any one of the preceding examples C, where the microelectronic assembly is a microelectronic assembly according to any one of the preceding examples A or a microelectronic assembly according to any one of the preceding examples B.

Example C71 provides a computing device that includes an IC package according to any one of the preceding examples C.

Example C72 provides the computing device according to example C71, where the computing device is a wearable or handheld computing device.

Example C73 provides the computing device according to examples C71 or C72, where the computing device further includes one or more communication chips and an antenna.

Example C74 provides a method of manufacturing an IC package, the method including providing the IC package according to any one of the preceding examples C.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:
1. A microelectronic assembly, comprising:
 a first integrated circuit (IC) structure, comprising first interconnects;
 a second IC structure, comprising second interconnects, wherein each of the first IC structure and the second IC structure has a first face and an opposing second face;
 a bonding interface at an interface between the first face of the first IC structure and the first face of the second IC structure; and
 a via extending through at least a portion of the second IC structure, the bonding interface, and at least a portion of the first IC structure,
 wherein:
  at least some of the first interconnects include a liner and an electrically conductive fill material,
  at least some of the second interconnects include a liner and an electrically conductive fill material,
  a material composition of the liner of the first interconnects is different from a material composition of the liner of the second interconnects,
  in a plane that is substantially perpendicular to the bonding interface, a cross-section of the via has a tapered shape that includes two opposite sides, wherein a first side of the two opposite sides is shorter than a second side of the two opposite sides, and
  for the cross-section of the via, either the second side is in the second IC structure and the first side is in the first IC structure, or the first side is in the second IC structure and the second side is in the first IC structure.

2. The microelectronic assembly according to claim 1, wherein a thickness of the liner of the first interconnects is different from a thickness of the liner of the second interconnects.

3. The microelectronic assembly according to claim 1, wherein a material composition of the electrically conductive fill material of the first interconnects is different from a material composition of the electrically conductive fill material of the second interconnects.

4. The microelectronic assembly according to claim 1, wherein:
- in the plane that is substantially perpendicular to the bonding interface, a cross-section of each of the first interconnects and the second interconnects is substantially a trapezoid that includes two opposite sides, one of which is a short side and another one of which is a long side,
- for the cross-section of an individual one of the first interconnects, the long side is closer to the bonding interface than the short side, and
- for the cross-section of an individual one of the second interconnects, the long side is closer to the bonding interface than the short side.

5. The microelectronic assembly according to claim 1, wherein:
- in the plane that is substantially perpendicular to the bonding interface, a cross-section of each of the first interconnects and the second interconnects is substantially a trapezoid that includes two opposite sides, one of which is a short side and another one of which is a long side,
- for the cross-section of an individual one of the first interconnects, the long side is closer to the bonding interface than the short side, and
- for the cross-section of an individual one of the second interconnects, the short side is closer to the bonding interface than the long side.

6. The microelectronic assembly according to claim 1, wherein:
- In the plane that is substantially perpendicular to the bonding interface, a cross-section of each of the first interconnects and the second interconnects is substantially a trapezoid that includes two opposite sides, one of which is a short side and another one of which is a long side,
- for the cross-section of an individual one of the first interconnects, the short side is closer to the bonding interface than the long side, and
- for the cross-section of an individual one of the second interconnects, the short side is closer to the bonding interface than the long side.

7. The microelectronic assembly according to claim 1, wherein at least a portion of the electrically conductive fill material of at least one of the first interconnects is in contact with at least a portion of the electrically conductive fill material of at least one of the second interconnects.

8. The microelectronic assembly according to claim 1, further comprising an adhesive material between at least portions of the first IC structure and the second IC structure.

9. The microelectronic assembly according to claim 1, further comprising a material in at least portions of a bonding interface between the second IC structure and the first IC structure, the material including silicon, nitrogen, and carbon, where an atomic percentage of each of silicon, nitrogen, and carbon within the material is at least about 1%.

10. The microelectronic assembly according to claim 1, wherein a pitch of at least some of the first interconnects is different from a pitch of at least some of the second interconnects.

11. The microelectronic assembly according to claim 1, wherein, for the cross-section of the via, the second side is at the second face of the second IC structure and the first side is in the first IC structure, wherein the first side is in the first IC structure by being at the second face of the first IC structure.

12. The microelectronic assembly according to claim 1, wherein, for the cross-section of the via, the second side is at the second face of the second IC structure and the first side is in the first IC structure, and the first side is at a distance from the second face of the first IC structure.

13. The microelectronic assembly according to claim 1, wherein, for the cross-section of the via, the first side is at the second face of the second IC structure and the second side is in the first IC structure, wherein the second side is in the first IC structure by being at the second face of the first IC structure.

14. The microelectronic assembly according to claim 1, wherein, for the cross-section of the via, the first side is at the second face of the second IC structure and the second side is in the first IC structure, and the second side is at a distance from the second face of the first IC structure.

15. A microelectronic assembly, comprising:
- a first integrated circuit (IC) structure, comprising first interconnects; and
- a second IC structure, comprising second interconnects;
- a bonding interface between a face of the first IC structure and a face of the second IC structure; and
- a via extending through at least a portion of the second IC structure, the bonding interface, and at least a portion of the first IC structure, wherein:
- in a plane that is substantially perpendicular to the bonding interface, each of a cross-section of an individual one of the first interconnects, a cross-section of an individual one of the second interconnects, and a cross-section of the via includes two opposite sides, wherein a first side of the two opposite sides is shorter than a second side of the two opposite sides,
- for the cross-section of the via, either the second side is in the second IC structure and the first side is in the first IC structure, or the first side is in the second IC structure and the second side is in the first IC structure,
- for the cross-section of the individual one of the first interconnects, the second side is closer to the bonding interface than the first side, and
- for the cross-section of the individual one of the second interconnects, the second side is closer to the bonding interface than the first side.

16. The microelectronic assembly according to claim 15, wherein a material composition of an electrically conductive fill material of at least one of the first interconnects is different from a material composition of an electrically conductive fill material of at least one of the second interconnects.

17. The microelectronic assembly according to claim 15, wherein the bonding interface includes an adhesive material between at least portions of the first IC structure and the second IC structure.

18. The microelectronic assembly according to claim 15, wherein the bonding interface includes silicon, nitrogen, and carbon, where an atomic percentage of each of silicon, nitrogen, and carbon within the bonding interface is at least about 1%.

19. A microelectronic assembly, comprising:
a first integrated circuit (IC) structure, comprising first interconnects;
a second IC structure, comprising second interconnects;
a bonding interface between the first IC structure and the second IC structure, wherein at least a portion of the bonding interface includes a material that includes silicon, nitrogen, and carbon, where an atomic percentage of each of silicon, nitrogen, and carbon within the material is at least about 1%; and
a via extending through the second IC structure, through the bonding interface, and at least partially into the first IC structure,
wherein:
in a plane that is substantially perpendicular to the bonding interface, a cross-section of the via has a tapered shape that includes two opposite sides, wherein a first side of the two opposite sides is shorter than a second side of the two opposite sides, and
for the cross-section of the via, either the second side is in the second IC structure and the first side is in the first IC structure, or the first side is in the second IC structure and the second side is in the first IC structure.

20. The microelectronic assembly according to claim 19, wherein:
in the plane that is substantially perpendicular to the bonding interface, a cross-section of each of the first interconnects and the second interconnects includes two opposite sides, one of which is a short side and another one of which is a long side,
for the cross-section of an individual one of the first interconnects, the long side is closer to the bonding interface than the short side, and
for the cross-section of an individual one of the second interconnects, the long side is closer to the bonding interface than the short side.

21. The microelectronic assembly according to claim 19, wherein:
in the plane that is substantially perpendicular to the bonding interface, a cross-section of each of the first interconnects and the second interconnects includes two opposite sides, one of which is a short side and another one of which is a long side,
for the cross-section of an individual one of the first interconnects, the long side is closer to the bonding interface than the short side, and
for the cross-section of an individual one of the second interconnects, the short side is closer to the bonding interface than the long side.

22. The microelectronic assembly according to claim 19, wherein:
in the plane that is substantially perpendicular to the bonding interface, a cross-section of each of the first interconnects and the second interconnects includes two opposite sides, one of which is a short side and another one of which is a long side,
for the cross-section of an individual one of the first interconnects, the short side is closer to the bonding interface than the long side, and
for the cross-section of an individual one of the second interconnects, the short side is closer to the bonding interface than the long side.

23. A microelectronic assembly, comprising:
a first integrated circuit (IC) structure, comprising first interconnects; and
a second IC structure, comprising second interconnects;
a bonding interface between a face of the first IC structure and a face of the second IC structure; and
a via extending through at least a portion of the second IC structure, the bonding interface, and at least a portion of the first IC structure,
wherein:
in a plane that is substantially perpendicular to the bonding interface, each of a cross-section of an individual one of the first interconnects, a cross-section of an individual one of the second interconnects, and a cross-section of the via includes two opposite sides, wherein a first side of the two opposite sides is shorter than a second side of the two opposite sides,
for the cross-section of the via, either the second side is in the second IC structure and the first side is in the first IC structure, or the first side is in the second IC structure and the second side is in the first IC structure,
for the cross-section of the individual one of the first interconnects, the first side is closer to the bonding interface than the second side, and
for the cross-section of the individual one of the second interconnects, the second side is closer to the bonding interface than the first side.

24. The microelectronic assembly according to claim 23, wherein at least one of:
the bonding interface includes silicon, nitrogen, and carbon, where an atomic percentage of each of silicon, nitrogen, and carbon within the bonding interface is at least about 1%, or
at least one of the first interconnects includes a liner and an electrically conductive fill material, at least one of the second interconnects include a liner and an electrically conductive fill material, and a material composition of the liner of the at least one of the first interconnects is different from a material composition of the liner of the at least one of the second interconnects.

25. A microelectronic assembly, comprising:
a first integrated circuit (IC) structure, comprising first interconnects; and
a second IC structure, comprising second interconnects;
a bonding interface between a face of the first IC structure and a face of the second IC structure; and
a via extending through at least a portion of the second IC structure, the bonding interface, and at least a portion of the first IC structure,
wherein:
in a plane that is substantially perpendicular to the bonding interface, each of a cross-section of an individual one of the first interconnects, a cross-section of an individual one of the second interconnects, and a cross-section of the via includes two opposite sides, wherein a first side of the two opposite sides is shorter than a second side of the two opposite sides,
for the cross-section of the via, either the second side is in the second IC structure and the first side is in the first IC structure, or the first side is in the second IC structure and the second side is in the first IC structure, for the cross-section of the individual one of the first interconnects, the first side is closer to the bonding interface than the second side, and for the cross-section of the individual one of the second interconnects, the first side is closer to the bonding interface than the second side.

26. The microelectronic assembly according to claim 25, wherein at least one of:

the bonding interface includes silicon, nitrogen, and carbon, where an atomic percentage of each of silicon, nitrogen, and carbon within the bonding interface is at least about 1%, or at least one of the first interconnects includes a liner and an electrically conductive fill material, at least one of the second interconnects include a liner and an electrically conductive fill material, and a material composition of the liner of the at least one of the first interconnects is different from a material composition of the liner of the at least one of the second interconnects.

* * * * *

UNITED STATES PATENT AND TRADEMARK OFFICE
CERTIFICATE OF CORRECTION

PATENT NO. : 11,756,886 B2
APPLICATION NO. : 17/114537
DATED : September 12, 2023
INVENTOR(S) : Wilfred Gomes et al.

It is certified that error appears in the above-identified patent and that said Letters Patent is hereby corrected as shown below:

In the Claims

In Column 79, Claim 6, Line 42, delete "In" and insert -- in --, therefor.

Signed and Sealed this
Seventeenth Day of October, 2023

Katherine Kelly Vidal
*Director of the United States Patent and Trademark Office*